US011407774B2

(12) United States Patent
Hatakeyama et al.

(10) Patent No.: US 11,407,774 B2
(45) Date of Patent: Aug. 9, 2022

(54) POLYCYCLIC AROMATIC COMPOUND

(71) Applicants: Kwansei Gakuin Educational Foundation, Nishinomiya (JP); SK Materials JNC Co., Ltd., Gyeonggi-do (KR)

(72) Inventors: Takuji Hatakeyama, Sanda (JP); Kohei Matsui, Sanda (JP); Yusuke Watanabe, Sanda (JP); Daisuke Baba, Ichihara (JP); Yasuyuki Sasada, Ichihara (JP); Motoki Yanai, Ichihara (JP); Toshiaki Ikuta, Ichihara (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 604 days.

(21) Appl. No.: 16/331,135

(22) PCT Filed: Aug. 25, 2017

(86) PCT No.: PCT/JP2017/030542
§ 371 (c)(1),
(2) Date: Mar. 6, 2019

(87) PCT Pub. No.: WO2018/047639
PCT Pub. Date: Mar. 15, 2018

(65) Prior Publication Data
US 2019/0256538 A1 Aug. 22, 2019

(30) Foreign Application Priority Data

Sep. 7, 2016 (JP) .............................. JP2016-174208

(51) Int. Cl.
$\;\;\;\;$ *C07F 9/00* $\;\;\;\;$ (2006.01)
$\;\;\;\;$ *C07F 9/6584* $\;\;\;\;$ (2006.01)
$\;\;\;\;$ *C07F 5/02* $\;\;\;\;$ (2006.01)
$\;\;\;\;$ *H01L 51/00* $\;\;\;\;$ (2006.01)
$\;\;\;\;$ *H01L 51/50* $\;\;\;\;$ (2006.01)
$\;\;\;\;$ *F21S 2/00* $\;\;\;\;$ (2016.01)
$\;\;\;\;$ *H01L 29/786* $\;\;\;\;$ (2006.01)
$\;\;\;\;$ *H01L 51/05* $\;\;\;\;$ (2006.01)
$\;\;\;\;$ *G09F 9/30* $\;\;\;\;$ (2006.01)
$\;\;\;\;$ *C09K 11/06* $\;\;\;\;$ (2006.01)

(52) U.S. Cl.
CPC .............. *C07F 9/6584* (2013.01); *C07F 5/02* (2013.01); *C07F 9/65842* (2013.01); *C09K 11/06* (2013.01); *F21S 2/00* (2013.01); *G09F 9/30* (2013.01); *H01L 29/786* (2013.01); *H01L 51/0067* (2013.01); *H01L 51/0072* (2013.01); *H01L 51/05* (2013.01); *H01L 51/50* (2013.01); *H01L 51/5016* (2013.01); *H01L 51/5092* (2013.01); *H01L 51/006* (2013.01); *H01L 51/0052* (2013.01); *H01L 51/0061* (2013.01); *H01L 51/0073* (2013.01); *H01L 51/5056* (2013.01); *H01L 51/5072* (2013.01); *Y02E 10/549* (2013.01)

(58) Field of Classification Search
CPC ... H01L 51/50; H01L 29/786; H01L 51/0067; H01L 51/0072; H01L 51/05; H01L 51/5016; H01L 51/5092; H01L 51/0052; H01L 51/006; H01L 51/0061; H01L 51/0073; H01L 51/5056; H01L 51/5072; H01L 51/008; H01L 51/5012; C07F 5/027; C07F 9/6584; C07F 5/02; C07F 9/65842; C07F 7/081; C09K 11/06; F21S 2/00; G09F 9/30; Y02E 10/549
USPC ........ 428/690; 252/500, 582, 301.16, 301.26
See application file for complete search history.

(56) References Cited

U.S. PATENT DOCUMENTS

| | | | | |
|---|---|---|---|---|
| 10,680,186 B2* | 6/2020 | Hatakeyama | ........ | C09K 11/025 |
| 10,689,402 B2* | 6/2020 | Hatakeyama | ....... | H01L 51/0052 |
| 11,136,341 B2* | 10/2021 | Hatakeyama | ....... | H01L 51/0072 |
| 2014/0005399 A1* | 1/2014 | Hatakeyama | .......... | H05B 33/14 546/13 |
| 2015/0236274 A1* | 8/2015 | Hatakeyama | ....... | H01L 51/0052 257/40 |
| 2016/0049600 A1 | 2/2016 | Hatakeyama et al. | | |
| 2016/0285006 A1* | 9/2016 | Itoi | ...................... | C07D 491/16 |
| 2021/0202851 A1* | 7/2021 | Nakanotani | .......... | C07D 209/86 |
| 2022/0006012 A1* | 1/2022 | Hatakeyama | ....... | H01L 51/0052 |
| 2022/0037591 A1* | 2/2022 | Hatakeyama | ........... | C07F 5/027 |
| 2022/0077398 A1* | 3/2022 | Hatakeyama | ........... | C07F 5/027 |

FOREIGN PATENT DOCUMENTS

| | | |
|---|---|---|
| CN | 103429599 A | 12/2013 |
| CN | 105431439 A | 3/2016 |
| EP | 3 109 253 A1 | 12/2016 |
| EP | 3 345 911 A1 | 7/2018 |

(Continued)

OTHER PUBLICATIONS

Office Action dated Apr. 25, 2021 in CN 201780054119.9, with English translation.
Office Action dated Jul. 6, 2021 in JP 2018-538354 with English translation.
PCT International Search Report (with English Translation) and Written Opinion (Japanese Language only) issued in corresponding International Application No. PCT/JP2017/030542 dated Nov. 7, 2017.

(Continued)

Primary Examiner — Douglas J McGinty
(74) Attorney, Agent, or Firm — Foley & Lardner LLP

(57) ABSTRACT

By providing a novel polycyclic aromatic compound in which a plurality of aromatic rings is linked via a nitrogen atom, a boron atom, or the like, options of a material for an organic EL element are increased. In addition, by using the novel polycyclic aromatic compound as a material for an organic electroluminescent element, an excellent organic EL element is provided.

22 Claims, 3 Drawing Sheets

(56) References Cited

FOREIGN PATENT DOCUMENTS

| JP | 2001-172232 | A |   | 6/2001 |            |
|----|-------------|---|---|--------|------------|
| JP | 2005-170911 | A |   | 6/2005 |            |
| JP | 2012-234873 | A |   | 11/2012 |           |
| JP | 2012234873  | A | * | 11/2012 |           |
| JP | 2016-181637 | A |   | 10/2016 |           |
| KR | 10-2015-033272 | A |   | 4/2015 |         |
| WO | WO-2004-061047 | A2 |   | 7/2004 |         |
| WO | WO-2011-107186 | A2 |   | 9/2011 |         |
| WO | WO-2012-118164 | A2 |   | 9/2012 |         |
| WO | WO-2015-102118 | A1 |   | 7/2015 |         |
| WO | WO-2020208051 | A1 | * | 10/2020 | H01L 51/008 |
| WO | WO-2021122740 | A1 | * | 6/2021  | H01L 51/0059 |

OTHER PUBLICATIONS

Nakajima, Kiichi et al. "Kyudenshiteki C-H Hosoka Hanno o Katsuyo shita Gan-BN Takan Hokozoku Kagobutsu no Gosei to Bussei", 95$^{th}$ Annual Meeting of the Chemical Society of Japan in spring Koen Yokoshu IV, 2015, p. 1094, 3 D3-06, Compound 3.

Matsui, Kohei et al. 96$^{th}$ Annual Meeting of the Chemical Society of Japan in Spring Koen Yokoshu, Mar. 10, 2016, 3F1-36, Compound 2.

Matsui, Kohei Matsui et al. Dai 27 Kai Symposium on Physical Organic Chemistry Koen Yoshishu, Sep. 1, 2016, p. 283, Compound 2.

Matsui, Kohei et al. 5$^{th}$ JACI GSC Symposium Presentation material, and abstract thereof.

Office Action dated Mar. 2, 2021 in JP 2018-538354, with English machine translation.

Office Action dated Dec. 21, 2021 in CN 201780054119.9, with English translation.

Decision to Grant a Patent dated Dec. 14, 2021 to the corresponding Japanese Patent application No. 2018-538354, with English machine translation.

* cited by examiner

POLYCYCLIC AROMATIC COMPOUND

CROSS-REFERENCE TO RELATED APPLICATIONS

This application is a National Phase of International Patent Application No. PCT/JP2017/030542 filed on Aug. 25, 2017, which claims priority to Japanese Patent Application No. 2016-174208 filed on Sep. 7, 2016. The contents of these applications are herein incorporated by reference in their entirety.

TECHNICAL FIELD

The present invention relates to a polycyclic aromatic compound, and an organic electroluminescent element, an organic field effect transistor, and an organic thin film solar cell using the polycyclic aromatic compound, as well as a display apparatus and a lighting apparatus.

BACKGROUND ART

Conventionally, a display apparatus employing a luminescent element that is electroluminescent can be subjected to reduction of power consumption and thickness reduction, and therefore various studies have been conducted thereon. Furthermore, an organic electroluminescent element formed from an organic material has been studied actively because weight reduction or size expansion is easily achieved. Particularly, active research has been hitherto conducted on development of an organic material having luminescence characteristics for blue light, which is one of the three primary colors of light, and development of an organic material having charge transport capability for holes, electrons, and the like (having a potential for serving as a semiconductor or a superconductor), irrespective of whether the organic material is a high molecular weight compound or a low molecular weight compound.

An organic EL element has a structure having a pair of electrodes composed of a positive electrode and a negative electrode, and a single layer or a plurality of layers disposed between the pair of electrodes and containing an organic compound. The layer containing an organic compound includes a light emitting layer and a charge transport/injection layer for transporting or injecting charges such as holes or electrons. Various organic materials suitable for these layers have been developed.

As a material for a light emitting layer, for example, a benzofluorene-based compound has been developed (WO 2004/061047 A). Furthermore, as a hole transport material, for example, a triphenylamine-based compound has been developed (JP 2001-172232 A). Furthermore, as an electron transport material, for example, an anthracene-based compound has been developed (JP 2005-170911 A).

Furthermore, in recent years, a material obtained by improving a triphenylamine derivative has also been reported as a material used in an organic EL element or an organic thin film solar cell (WO 2012/118164 A). This material is characterized in that flatness thereof has been increased by linking aromatic rings constituting triphenylamine with reference to N,N'-diphenyl-N,N'-bis(3-methylphenyl)-1,1'-biphenyl-4,4'-diamine (TPD) which has been already put to practical use. In this literature, for example, evaluation of charge transporting characteristics of a NO-linked compound (compound 1 of page 63) has been made. However, there is no description on a method for manufacturing a material other than the NO-linked compound. If elements to be linked are different, overall electron states of compounds are different. Therefore, characteristics obtained from a material other than the NO-linked compound are not known. Examples of such a compound are also found elsewhere (WO 2011/107186 A and WO 2015/102118 A). For example, since a compound having a conjugated structure involving higher energy of triplet exciton (T1) can emit phosphorescent light having a shorter wavelength, the compound is useful as a material for a blue light emitting layer. Furthermore, there is also a demand for a novel compound having a conjugated structure with high T1 as each of an electron transport material and a hole transport material with a light emitting layer interposed therebetween.

A host material for an organic EL element is generally a molecule in which a plurality of existing aromatic rings of benzene, carbazole, and the like is linked to one another via a single bond, a phosphorus atom, or a silicon atom. This is because a large HOMO-LUMO gap required for a host material (band gap Eg in a thin film) is secured by linking many aromatic rings each having a relatively small conjugated system. Furthermore, a host material for an organic EL element, using a phosphorescent material or a thermally activated delayed fluorescent material needs high triplet excitation energy ($E_T$). However, the triplet excitation energy ($E_T$) can be increased by localizing SOMO1 and SOMO2 in a triplet excited state (T1) by linking a donor-like or acceptor-like aromatic ring or substituent to a molecule, and thereby reducing an exchange interaction between the two orbitals. However, an aromatic ring having a small conjugated system does not have sufficient redox stability, and an element using a molecule obtained by linking existing aromatic rings as a host material does not have a sufficient lifetime. Meanwhile, a polycyclic aromatic compound having an extended π-conjugated system generally has excellent redox stability. However, since the HOMO-LUMO gap (band gap Eg in a thin film) or triplet excitation energy ($E_T$) is low, the polycyclic aromatic compound has been considered to be unsuitable as a host material.

CITATION LIST

Patent Literature

Patent Literature 1: WO 2004/061047 A
Patent Literature 2: JP 2001-172232 A
Patent Literature 3: JP 2005-170911 A
Patent Literature 4: WO 2012/118164 A
Patent Literature 5: WO 2011/107186 A
Patent Literature 6: WO 2015/102118 A

SUMMARY OF INVENTION

Technical Problem

As described above, various materials have been developed as a material used for an organic EL element. However, in order to increase a selection range of the material for the organic EL element, it is desired to develop a material formed from a compound different from conventional compounds. Particularly, organic EL characteristics obtained from a material other than the NO-linked system compounds reported in Patent Literatures 1 to 6, and manufacturing methods thereof are not known.

Solution to Problem

The present inventors conducted intensive studies in order to solve the problems described above. As a result, the present inventors have found a novel polycyclic aromatic compound in which a plurality of aromatic rings is linked via a nitrogen atom, a boron atom, or the like and have succeeded in manufacturing the same. In addition, the present inventors have found that an excellent organic EL element is obtained by disposing a layer containing this polycyclic aromatic compound between a pair of electrodes to constitute an organic EL element and have completed the present invention. That is, the present invention provides such a polycyclic aromatic compound as described below and further provides a material for an organic EL element containing such a polycyclic aromatic compound as described below.

Item 1: A polycyclic aromatic compound represented by the following general formula (1).

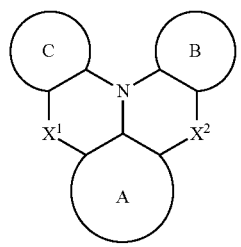

(1)

(In the above formula (1), ring A, ring B, and ring C each independently represent an aryl ring or a heteroaryl ring, at least one hydrogen atom in ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, or a substituted or unsubstituted diarylphosphine sulfide, at least one of ring A, ring B, and ring C may be fused with a cycloalkyl, $X^1$ and $X^2$ each independently represent a divalent group represented by any one of the following formulas (X-1) to (X-12), both $X^1$ and $X^2$ do not represent a divalent group represented by formula (X-2),

(X-1)

(X-2)

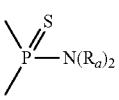
(X-3)

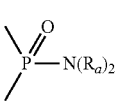
(X-4)

(X-5)

(X-6)

(X-7)

(X-8)

(X-9)

(X-10)

(X-11)

(X-12)

in formulas (X-1) to (X-12), Ar's each independently represent a substituted or unsubstituted aryl, a substituted or unsubstituted heteroaryl, or a substituted or unsubstituted alkyl, $R_a$'s each independently represent a substituted or unsubstituted alkyl or a substituted or unsubstituted cycloalkyl, and Ar may be bonded to ring A, ring B, and/or ring C by a linking group, provided that when both $X^1$ and $X^2$ represent a divalent group represented by formula (X-1), Ar is not bonded to ring A, ring B, and/or ring C by a linking group via a nitrogen atom, and when at least one of $X^1$ and $X^2$ represents a divalent group represented by formula (X-6) or (X-8), Ar in $X^1$ and $X^2$ is not bonded to ring A, ring B, and/or ring C, ring B and ring C may be bonded to each other by a divalent group of any one of formulas (X-3) to (X-7), and at least one hydrogen atom in the polycyclic aromatic compound represented by formula (1) may be substituted by cyano, a halogen atom, or a deuterium atom.)

Item 2: The polycyclic aromatic compound described in item 1, in which ring A, ring B, and ring C each independently represent an aryl ring or a heteroaryl ring, at least one hydrogen atom in ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted alkoxy, or a substituted or unsubstituted aryloxy, each of ring A, ring B, and ring C has a 5-membered or 6-membered ring sharing a bond with a fused bicyclic structure at the center of the above formula (1) constituted by "N", $X^1$, and $X^2$, $X^1$ and $X^2$ each independently represent a divalent group represented by any one of the above formulas (X-1) to (X-12), both $X^1$ and $X^2$ do not represent a divalent group represented by formula (X-2), in formulas (X-1) to (X-12), Ar's each independently represent an aryl that may be substituted by an alkyl, a heteroaryl that may be substituted by an alkyl, or an alkyl that may be substituted by an alkyl, $R_a$'s each independently represent an alkyl or a cycloalkyl, Ar may be bonded to ring A, ring B, and/or ring C by a linking group via a carbon atom or a linking group via a boron atom, provided that when both $X^1$ and $X^2$ represent a divalent group represented by formula (X-1), Ar is not bonded to ring A, ring B, and/or ring C by a linking group via a nitrogen atom, and when at least one of $X^1$ and $X^2$ represents a divalent group represented by formula (X-6) or (X-8), Ar in $X^1$ and $X^2$ is not bonded to ring A, ring B, and/or ring C, ring B and ring C may be bonded to each other by a divalent group of any one of formulas (X-3) to (X-7), and at least one hydrogen atom in the polycyclic aromatic compound represented by formula (1) may be substituted by cyano, a halogen atom, or a deuterium atom.

Item 3: The polycyclic aromatic compound described in item 1, represented by the following general formula (2).

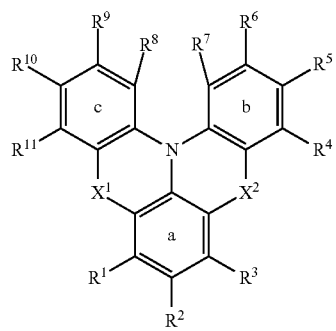

(2)

(In the above formula (2), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, $X^1$ and $X^2$ each independently represent a divalent group represented by any one of the above formulas (X-1) to (X-12), both $X^1$ and $X^2$ do not represent a divalent group represented by formula (X-2), in formulas (X-1) to (X-12), Ar's each independently represent an aryl that may be substituted by an alkyl, a heteroaryl that may be substituted by an alkyl, or an alkyl that may be substituted by an alkyl, $R_a$'s each independently represent an alkyl or a cycloalkyl, Ar may be bonded to ring a, ring b, and/or ring c by a linking group via a carbon atom or a linking group via a boron atom, provided that when both $X^1$ and $X^2$ represent a divalent group represented by formula (X-1), Ar is not bonded to ring a, ring b, and/or ring c by a linking group via a nitrogen atom, and when at least one of $X^1$ and $X^2$ represents a divalent group represented by formula (X-6) or (X-8), Ar in $X^1$ and $X^2$ is not bonded to ring a, ring b, and/or ring c, ring b and ring c may be bonded to each other by a divalent group of any one of formulas (X-3) to (X-7), and at least one hydrogen atom in the polycyclic aromatic compound represented by formula (2) may be substituted by cyano, a halogen atom, or a deuterium atom.)

Item 4: The polycyclic aromatic compound described in item 3, represented by the following general formula (3).

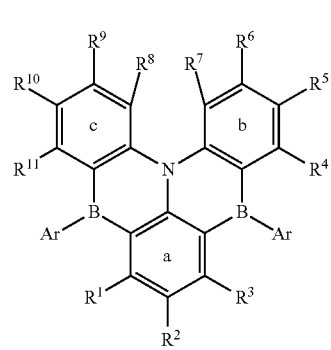

(3)

(In the above formula (3), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (3) may be substituted by cyano, a halogen atom, or a deuterium atom.)

Item 5: The polycyclic aromatic compound described in item 3, represented by the following general formula (4).

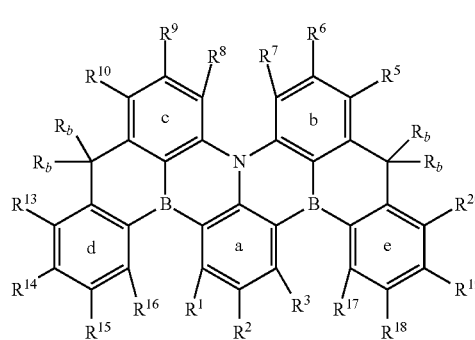

(4)

(In the above formula (4), $R^1$ to $R^3$, $R^5$ to $R^{10}$, and $R^{13}$ to $R^{20}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^3$, $R^5$ to $R^{10}$, and $R^{13}$ to $R^{20}$ may be bonded to each other to form an aryl ring or a heteroaryl ring together with ring a, ring b, ring c, ring d, or ring e, at least one hydrogen atom in the ring thus formed may be substituted by an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, $R^1$ and $R^{16}$ may be bonded to each other to link ring a and ring d to each other by a linking group >C(—$R_b$)$_2$, and $R^3$ and $R^{17}$ may be bonded to each other to link ring a and ring e to each other by a linking group >C(—$R_b$)$_2$, $R_b$'s each independently represent a hydrogen atom or an alkyl, and at least one hydrogen atom in the polycyclic aromatic compound represented by formula (4) may be substituted by cyano, a halogen atom, or a deuterium atom.)

Item 6: The polycyclic aromatic compound described in item 3, represented by the following general formula (5).

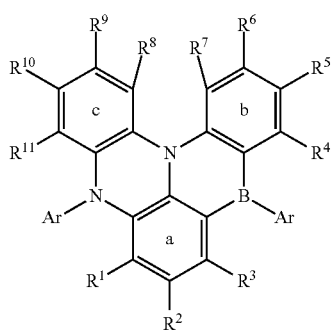

(5)

(In the above formula (5), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (5) may be substituted by cyano, a halogen atom, or a deuterium atom.)

Item 7: The polycyclic aromatic compound described in item 3, represented by the following general formula (6).

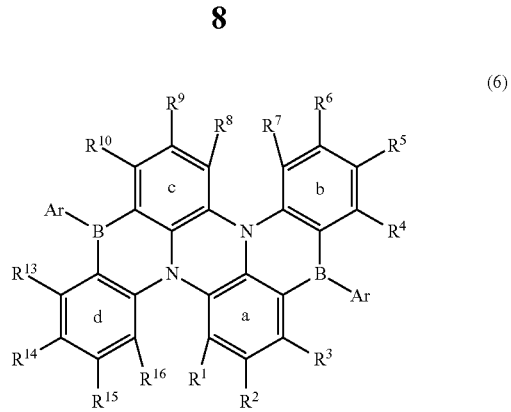

(6)

(In the above formula (6)

$R^1$ to $R^{10}$ and $R^{13}$ to $R^{16}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{10}$ and $R^{13}$ to $R^{16}$ may be bonded to each other to form an aryl ring or a heteroaryl ring together with ring a, ring b, ring c, or ring d, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (6) may be substituted by cyano, a halogen atom, or a deuterium atom.)

Item 8: The polycyclic aromatic compound described in item 3, represented by the following general formula (7).

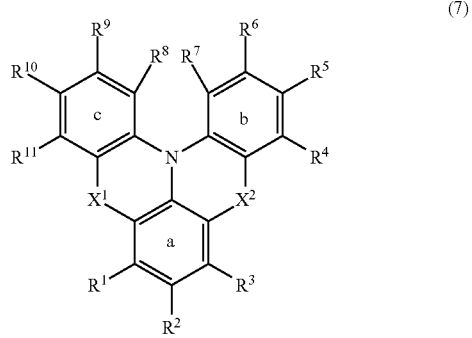

(7)

(In the above formula (7)

$R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, X¹ and X² each independently represent a divalent group represented by any one of the above formulas (X-3) to (X-7), in formulas (X-3) to (X-7), Ar represents an aryl that may be substituted by an alkyl, a heteroaryl that may be substituted by an alkyl, or an alkyl that may be substituted by an alkyl, and $R_a$'s each independently represent an alkyl or a cycloalkyl, and at least one hydrogen atom in the polycyclic aromatic compound represented by formula (7) may be substituted by cyano, a halogen atom, or a deuterium atom.)

Item 9: The polycyclic aromatic compound described in item 3, represented by the following general formula (8).

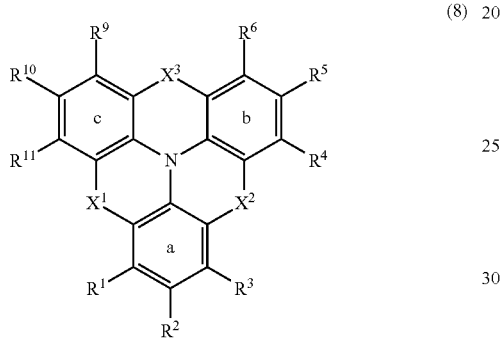
(8)

(In the above formula (8), $R^1$ to $R^6$ and $R^9$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^6$ and $R^9$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, X¹, X², and X³ each independently represent a divalent group represented by any one of the above formulas (X-3) to (X-7), in formulas (X-3) to (X-7), Ar represents an aryl that may be substituted by an alkyl, a heteroaryl that may be substituted by an alkyl, or an alkyl that may be substituted by an alkyl, and $R_a$'s each independently represent an alkyl or a cycloalkyl, and at least one hydrogen atom in the polycyclic aromatic compound represented by formula (8) may be substituted by cyano, a halogen atom, or a deuterium atom.)

Item 10: The polycyclic aromatic compound described in item 1, represented by any one of the following chemical structural formulas.

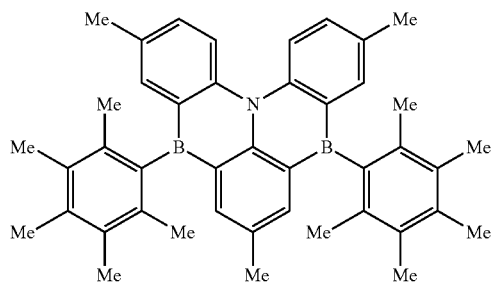
(1-3-1)

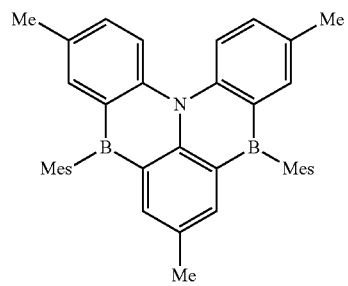
(1-3-2)

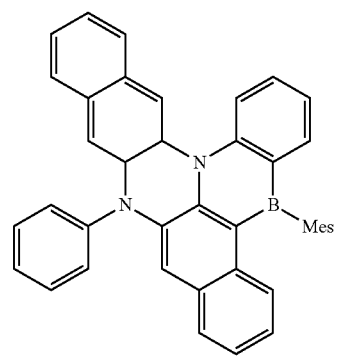
(1-5-1)

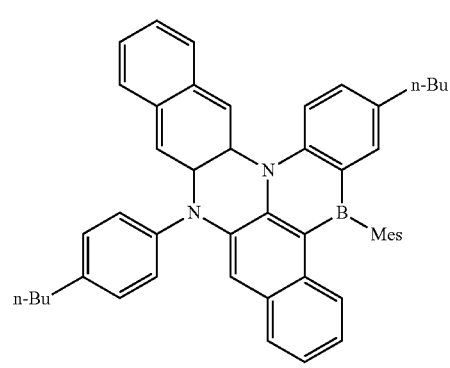
(1-5-4)

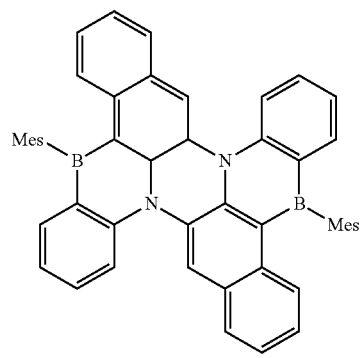
(1-6-1)

-continued (1-6-4)

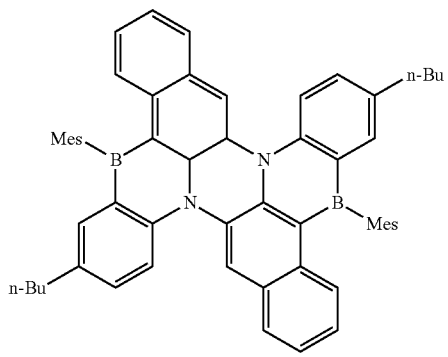

(1-6-2)

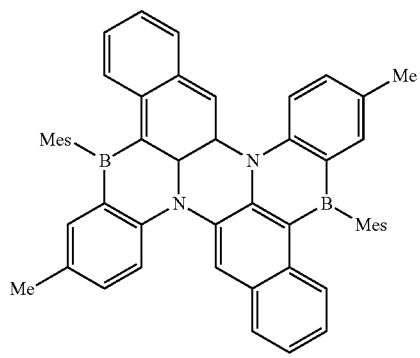

(1-8-1)

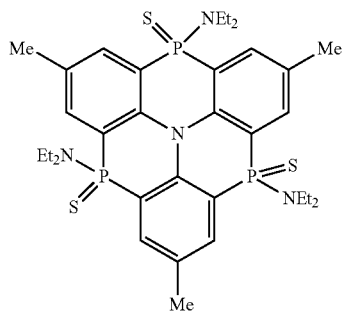

(1-7-1)

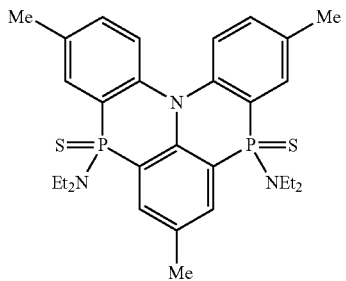

(1-8-20)

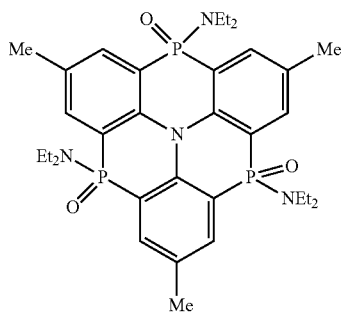

-continued (1-7-75)

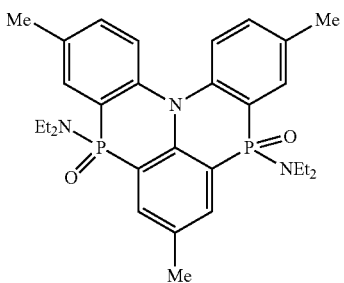

In the formula, Me represents a methyl group, Mes represents a mesityl group, n-Bu represents a n-butyl group and Et represents an ethyl group.

Item 11: A material for an organic device, comprising the polycyclic aromatic compound described in any one of items 1 to 10.

Item 12: The material for an organic device described in item 11, in which the material for an organic device is a material for an organic electroluminescent element, a material for an organic field effect transistor, or a material for an organic thin film solar cell.

Item 13: The material for an organic electroluminescent element described in item 12, in which the material for an organic electroluminescent element is a material for a light emitting layer.

Item 14: The material for an organic electroluminescent element described in item 12, in which the material for an organic electroluminescent element is a material for an electron injection layer or a material for an electron transport layer.

Item 15: The material for an organic electroluminescent element described in item 12, in which the material for an organic electroluminescent element is a material for a hole injection layer or a material for a hole transport layer.

Item 16: An organic electroluminescent element, comprising: a pair of electrodes composed of a positive electrode and a negative electrode; and a light emitting layer disposed between the pair of electrodes and containing the material for a light emitting layer described in item 13.

Item 17: An organic electroluminescent element comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer described in item 14.

Item 18: An organic electroluminescent element comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer described in item 15.

Item 19: The organic electroluminescent element described in any one of items 16 to 18, further comprising an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

Item 20: The organic electroluminescent element described in item 19, in which the electron transport layer and/or the electron injection layer further comprise/comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 21: A display apparatus comprising the organic electroluminescent element described in any one of items 16 to 20.

Item 22: A lighting apparatus comprising the organic electroluminescent element described in any one of items 16 to 20.

Advantageous Effects of Invention

According to a preferable embodiment of the present invention, a novel polycyclic aromatic compound that can be used as, for example, a material for an organic EL element can be provided, and an excellent organic EL element can be provided by using this polycyclic aromatic compound.

Specifically, the present inventors have found that a polycyclic aromatic compound in which aromatic rings are linked to each other via a hetero element such as nitrogen, boron, or phosphorus has a large HOMO-LUMO gap (band gap Eg in a thin film) and high triplet excitation energy ($E_T$). It is considered that this is because a decrease in the HOMO-LUMO gap that comes along with extension of a conjugated system is suppressed due to low aromaticity of a 6-membered ring containing a hetero element, and SOMO1 and SOMO2 in a triplet excited state (T1) are localized by electronic perturbation of the hetero element. Furthermore, the polycyclic aromatic compound containing a hetero element according to the present invention reduces an exchange interaction between the two orbitals due to the localization of SOMO1 and SOMO2 in the triplet excited state (T1), and therefore an energy difference between the triplet excited state (T1) and a singlet excited state (S1) is small. In addition, the polycyclic aromatic compound exhibits thermally activated delayed fluorescence, and therefore is also useful as a fluorescent material for an organic EL element. Furthermore, a material having high triplet excitation energy ($E_T$) is also useful as an electron transport layer or a hole transport layer of a phosphorescence organic EL element or an organic EL element using thermally activated delayed fluorescence. In addition, these polycyclic aromatic compounds can arbitrarily shift energy of HOMO and LUMO by introducing a substituent, and therefore ionization potential or electron affinity can be optimized in accordance with a peripheral material.

DESCRIPTION OF EMBODIMENTS

1. Polycyclic Aromatic Compound

Figure 1:
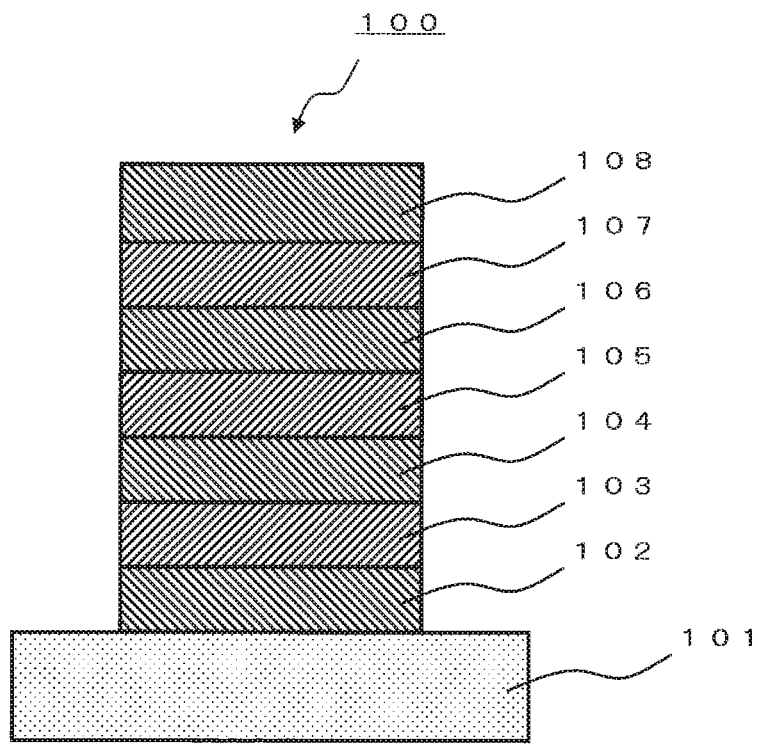
FIG. 1 is a schematic cross-sectional view illustrating an organic EL element according to the present embodiment.

The invention of the present application is a polycyclic aromatic compound represented by the following general formula (1), and is particularly preferably a polycyclic aromatic compound represented by the following general formula (2).

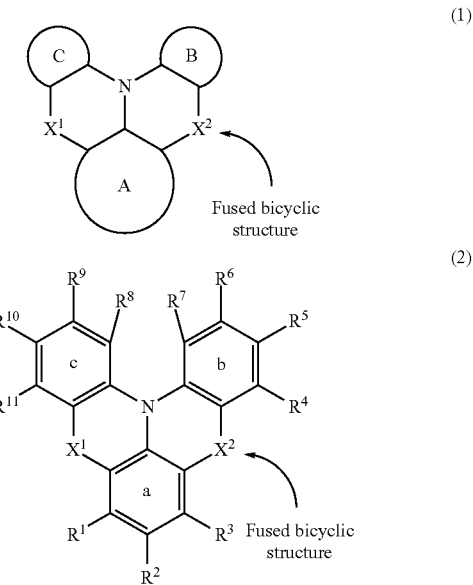

Ring A, ring B, and ring C in general formula (1) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (amino group having an aryl and a heteroaryl), a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, a substituted or unsubstituted diarylphosphine sulfide, or cyano. In a case where these groups have substituents, examples of the substituents include an aryl, a heteroaryl, and an alkyl.

At least one of ring A, ring B, and ring C may be fused with a cycloalkyl.

Furthermore, the aryl ring or heteroaryl ring preferably has a 5-membered ring or 6-membered ring sharing a bond with a fused bicyclic structure at the center of general formula (1) constituted by "N", $X^1$, and $X^2$ (hereinafter, this structure is also referred to as "structure D").

Here, the "fused bicyclic structure (structure D)" means a structure in which two saturated hydrocarbon rings that are configured to include "N", $X^1$ and $X^2$ and indicated at the center of general formula (1) are fused. Furthermore, the "6-membered ring sharing a bond with a fused bicyclic structure" means, for example, ring a (benzene ring (6-membered ring)) fused to the structure D as represented by the above general formula (2). Furthermore, the phrase "aryl ring or heteroaryl ring (which is ring A) has this 6-membered ring" means that ring A is formed only from this 6-membered ring, or ring A is formed such that other rings and the like are further fused to this 6-membered ring so as to include this 6-membered ring. In other words, the "aryl ring or heteroaryl ring (which is ring A) having a 6-membered ring" referred to herein means that the 6-membered ring constituting the entirety or a part of ring A is fused to the structure D. Similar description applies to the "ring B (ring b)", "ring C (ring c)", and the "5-membered ring".

Ring A (or ring B or ring C) in general formula (1) corresponds to ring a and its substituents $R^1$ to $R^3$ in general formula (2) (or ring b and its substituents $R^4$ to $R^7$, or ring c and its substituents $R^8$ to $R^{11}$). That is, general formula (2) corresponds to a structure in which "rings A to C having 6-membered rings" have been selected as rings A to C of general formula (1). For this meaning, the rings of general formula (2) are represented by small letters a to c.

In general formula (2), adjacent groups among the substituents $R^1$ to $R^{11}$ of ring a, ring b, and ring c may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl. Therefore, in a polycyclic aromatic compound represented by general formula (2), a ring structure constituting the compound changes as represented by the following formulas (2-1) and (2-2) according to a mutual bonding form of substituents in ring a, ring b, and ring c. Ring A', ring B', and ring C' in each formula correspond to ring A, ring B, and ring C in general formula (1), respectively.

Ring A', ring B' and, ring C' in the above formulas (2-1) and (2-2) each represent, to be described in connection with general formula (2), an aryl ring or a heteroaryl ring formed by bonding adjacent groups among the substituents $R^1$ to $R^{11}$ together with ring a, ring b, and ring c, respectively (may also be referred to as a fused ring obtained by fusing another ring structure to ring a, ring b, or ring c). Incidentally, although not indicated in the formula, there is also a compound in which all of ring a, ring b, and ring c have been changed to ring A', ring B' and ring C'. Furthermore, as apparent from the above formulas (2-1) and (2-2), for example, $R^3$ of ring a and $R^4$ of ring b, $R^7$ of ring b and $R^8$ of ring c, $R^{11}$ of ring c and $R^1$ of ring a, and the like do not correspond to "adjacent groups", and these groups are not bonded to each other. That is, the term "adjacent groups" means adjacent groups on the same ring.

The compounds represented by the above formulas (2-1) and (2-2) correspond, for example, to compounds represented by formulas (1-5-1), (1-5-37), (1-5-41), (1-5-80), (1-5-110), and the like among compounds listed as specific compounds described later. Examples of these compounds include a compound having ring A' (or ring B' or ring C') formed by fusing a benzene ring, an indane ring (substituted by dimethyl in the following example), an indole ring, a pyrrole ring, a benzofuran ring, or a benzothiophene ring to a benzene ring which is ring a (or ring b or ring c). The fused ring A' (or fused ring B' or fused ring C') thus formed is a naphthalene ring, a fluorene ring (substituted by dimethyl in the following example), a carbazole ring, an indole ring, a dibenzofuran ring, a dibenzothiophene ring, or the like.

$X^1$ and $X^2$ in general formula (1) each independently represent a divalent group represented by any one of the following formulas (X-1) to (X-12), and both $X^1$ and $X^2$ do not represent a divalent group represented by formula (X-2).

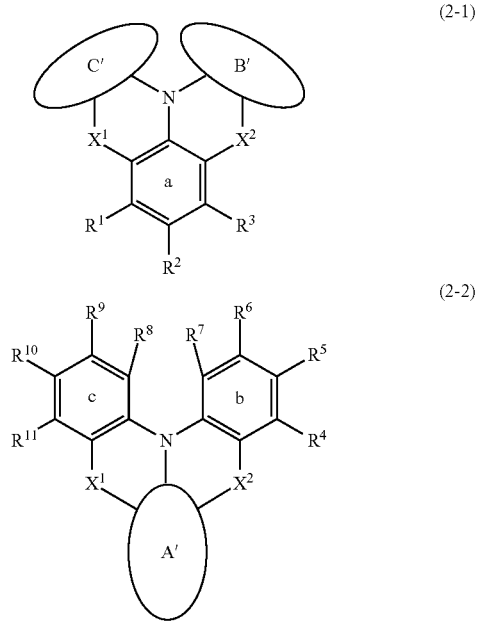

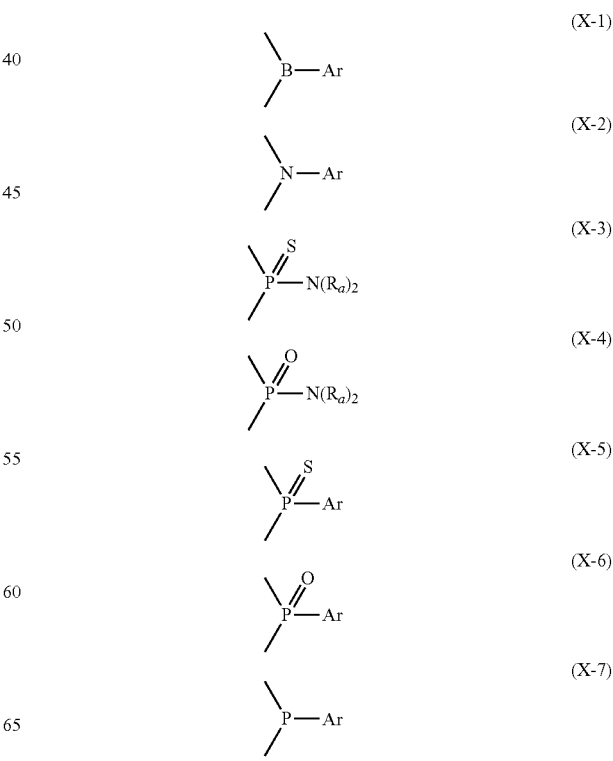

-continued

 (X-8)

 (X-9)

 (X-10)

 (X-11)

 (X-12)

In formulas (X-1) to (X-12), Ar's each independently represent a substituted or unsubstituted aryl, a substituted or unsubstituted heteroaryl, or a substituted or unsubstituted alkyl, and $R_a$'s each independently represent a substituted or unsubstituted alkyl or a substituted or unsubstituted cycloalkyl.

Furthermore, Ar may be bonded to ring A, ring B, and/or ring C by a linking group, provided that when both $X^1$ and $X^2$ represent a divalent group represented by formula (X-1), Ar is not bonded to ring A, ring B, and/or ring C by a linking group via a nitrogen atom, and when at least one of $X^1$ and $X^2$ represents a divalent group represented by formula (X-6) or (X-8), Ar in $X^1$ and $X^2$ is not bonded to ring A, ring B, and/or ring C.

Here, the "linking group" is preferably a linking group via a carbon atom (for example, >C($R_b$)$_2$), a linking group via a boron atom (for example, >B—Ar), a linking group via an oxygen atom, (for example, >O), a linking group via a sulfur atom (for example, >S), or a linking group via a phosphorus atom (for example, the same groups as the groups represented by the above formulas (X-3) to (X-7) or "—P="). Among these linking groups, a linking group via a carbon atom or a linking group via a boron atom is more preferable. Examples of bonding via a carbon atom include a compound of formula (4) described later. Examples of bonding via a boron atom include a compound of formula (6) described later. Note that $R_b$ in the ">C($R_b$)$_2$" represents a hydrogen atom or an alkyl, Ar in the ">B—Ar" is the same as Ar in formula (X-1), and represents an aryl that may be substituted by an alkyl, a heteroaryl that may be substituted by an alkyl, or an alkyl that may be substituted by an alkyl. The same description applies to a case where $X^1$ and $X^2$ in general formula (2) are bonded to ring a, ring b, and/or ring c.

Here, the definition that "Ar is bonded to ring A, ring B, and/or ring C by a linking group" for general formula (1) corresponds to the definition that "Ar is bonded to ring a, ring b, and/or ring c by a linking group via a carbon atom or a linking group via a boron atom" for general formula (2).

This definition can be expressed by a compound having a ring structure represented by the following formula (2-3-1), in which $X^1$ and $X^2$ are incorporated into the fused rings C' and B', respectively. That is, for example, the compound is a compound having ring B' (or ring C') formed by fusing another ring to a benzene ring which is ring b (or ring c) in general formula (2) so as to incorporate $X^2$ (or $X^1$). The fused ring B' (or fused ring C') thus formed is, for example, a phenoxazine ring, a phenothiazine ring, an acridine ring, or a phenophosphazine ring.

Furthermore, the above definition can be expressed by a compound having a ring structure in which $X^1$ and/or $X^2$ are/is incorporated into the fused ring A', represented by the following formula (2-3-2) or (2-3-3). That is, for example, the compound is a compound having ring A' formed by fusing another ring to a benzene ring which is ring a in general formula (2) so as to incorporate $X^1$ (and/or $X^2$). The fused ring A' thus formed is, for example, a phenoxazine ring, a phenothiazine ring, an acridine ring, or a phenophosphazine ring.

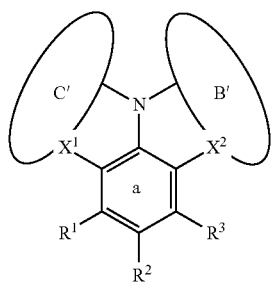 (2-3-1)

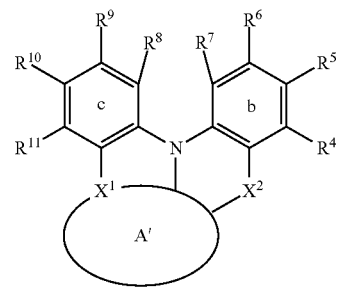 (2-3-2)

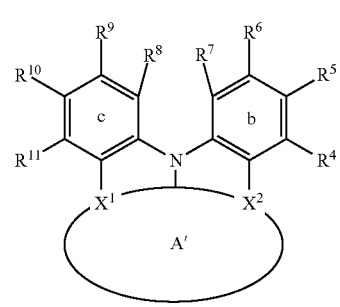 (2-3-3)

Furthermore, the definition that "ring B and ring C may be bonded to each other by a divalent group of any one of formulas (X-3) to (X-7)" for general formula (1) corresponds to the definition that "ring b and ring c may be bonded to each other by a divalent group of any one of formulas (X-3) to (X-7)" for general formula (2). Examples of a bonded compound include a compound of formula (8) described later.

The "aryl ring" as ring A, ring B, or ring C of general formula (1) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with ring a, ring b, or ring c" defined for general formula (2). Furthermore, ring a (or ring b or ring c) is already constituted by a benzene ring having 6 carbon atoms, and therefore the carbon number of 9 in total of a fused ring obtained by fusing a 5-membered ring to this benzene ring is a lower limit of the carbon number.

Specific examples of the "aryl ring" include a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring, and a phenanthrene ring which are fused tricyclic systems; a triphenylene ring, a pyrene ring, and a naphthacene ring which are fused tetracyclic systems; and a perylene ring and a pentacene ring which are fused pentacyclic systems.

The "heteroaryl ring" as ring A, ring B, or ring C of general formula (1) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 hetero atoms selected from an oxygen atom, a sulfur atom, and a nitrogen atom in addition to a carbon atom as a ring-constituting atom. Incidentally, this "heteroaryl ring" corresponds to the "heteroaryl ring formed by bonding adjacent groups among $R^1$ to $R^{11}$ together with ring a, ring b, or ring c" defined for general formula (2). Furthermore, ring a (or ring b or ring c) is already constituted by a benzene ring having 6 carbon atoms, and therefore the carbon number of 6 in total of a fused ring obtained by fusing a 5-membered ring to this benzene ring is a lower limit of the carbon number.

Specific examples of the "heteroaryl ring" include a pyrrole ring, an oxazole ring, an isoxazole ring, a thiazole ring, an isothiazole ring, an imidazole ring (unsubstituted, substituted by an alkyl such as methyl, or substituted by an aryl such as phenyl), an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a naphthobenzofuran ring, a thiophene ring, a benzothiophene ring, a dibenzothiophene ring, a naphthobenzothiophene ring, a furazan ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "cycloalkyl", a substituted or unsubstituted "alkoxy", a substituted or unsubstituted "aryloxy", a substituted or unsubstituted "arylsulfonyl", a substituted or unsubstituted "diarylphosphine", a substituted or unsubstituted "diarylphosphine oxide", a substituted or unsubstituted "diarylphosphine sulfide", or cyano, which is a primary substituent. Examples of the aryl of the "aryl", "heteroaryl", and "diarylamino", the heteroaryl of the "diheteroarylamino", the aryl and heteroaryl of the "arylheteroarylamino", the aryl of the "aryloxy", the aryl of the "arylsulfonyl", the aryl of the "diarylphosphine", the aryl of the "diarylphosphine oxide", and the aryl of the "diarylphosphine sulfide" as primary substituents include a monovalent group of the "aryl ring" or "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. The alkyl is preferably an alkyl having 1 to 18 carbon atoms (branched alkyl having 3 to 18 carbon atoms), more preferably an alkyl having 1 to 12 carbon atoms (branched alkyl having 3 to 12 carbon atoms), still more preferably an alkyl having to 6 carbon atoms (branched alkyl having 3 to 6 carbon atoms), and particularly preferably an alkyl having 1 to 4 carbon atoms (branched alkyl having 3 or 4 carbon atoms).

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the "cycloalkyl" as the primary substituent include a cycloalkyl having 3 to 12 carbon atoms. A preferable cycloalkyl is a cycloalkyl having 3 to 10 carbon atoms. A more preferable cycloalkyl is a cycloalkyl having 3 to 8 carbon atoms. A still more preferable cycloalkyl is a cycloalkyl having 3 to 6 carbon atoms. This description can also be cited as description for a cycloalkyl which can be fused to at least one of ring A, ring B, and ring C.

Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

Furthermore, examples of the "alkoxy" as the primary substituent include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 or 4 carbon atoms) is particularly preferable.

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

A least one hydrogen atom in each of the substituted or unsubstituted "aryl", the substituted or unsubstituted "heteroaryl", the substituted or unsubstituted "diarylamino", the substituted or unsubstituted "diheteroarylamino", the substituted or unsubstituted "arylheteroarylamino", the substituted or unsubstituted "alkyl", the substituted or unsubstituted "cycloalkyl", the substituted or unsubstituted "alkoxy", the substituted or unsubstituted "aryloxy", the substituted or unsubstituted "arylsulfonyl", the substituted or unsubstituted "diarylphosphine", the substituted or unsubstituted "diarylphosphine oxide", and the substituted or unsubstituted "diarylphosphine sulfide", which are primary substituents, may be substituted by a secondary substituent, as described by the phrase substituted or unsubstituted. Examples of this secondary substituent include an aryl, a heteroaryl, and an alkyl, and for the details thereof, reference can be made to the above description on the monovalent group of the "aryl ring" or "heteroaryl ring" and the "alkyl" as the primary substituent. Furthermore, regarding the aryl or heteroaryl as the secondary substituent, an aryl or heteroaryl in which at least one hydrogen atom is substituted by an aryl such as a phenyl (specific examples are described above), or an alkyl such as methyl (specific examples are described above), is also included in the aryl or heteroaryl as the secondary substituent. For example, when the secondary substituent is a carbazolyl group, a carbazolyl group in which at least one hydrogen atom at the 9-position is substituted by an aryl such as a phenyl, or an alkyl such as methyl, is also included in the heteroaryl as the secondary substituent.

Examples of the aryl, the heteroaryl, the aryl of the diarylamino, the heteroaryl of the diheteroarylamino, the aryl and heteroaryl of the arylheteroarylamino, or the aryl of the aryloxy in $R^1$ to $R^{11}$ of general formula (2) include the monovalent groups of the "aryl ring" or "heteroaryl ring" described in general formula (1). Furthermore, regarding the alkyl or alkoxy for $R^1$ to $R^{11}$, reference can be made to the description on the "alkyl" or "alkoxy" as the primary substituent in the above description of general formula (1). In addition, the same also applies to the aryl, heteroaryl, or alkyl as the substituents for these groups. Furthermore, similar description applies to the heteroaryl, the diarylamino, the diheteroarylamino, the arylheteroarylamino, the alkyl, the alkoxy, or the aryloxy in a case of forming an aryl ring or a heteroaryl ring by bonding adjacent groups among $R^1$ to $R^{11}$ together with ring a, ring b, or ring c, as a substituent on these rings, and the aryl, the heteroaryl, or the alkyl as a further substituent.

Ar of formulas (X-1), (X-2), and (X-5) to (X-12) in $X^1$ and $X^2$ of general formula (1) represents an aryl, a heteroaryl, or an alkyl that may be substituted by the secondary substituent described above, and at least one hydrogen atom in the aryl, the heteroaryl, or the alkyl may be substituted by, for example, an alkyl. Examples of this aryl, heteroaryl, or alkyl include those described above. Particularly, an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl) are preferable. This description also applies to $X^1$ and $X^2$ in general formula (2).

$R_a$ of formulas (X-3) and (X-4) in $X^1$ and $X^2$ of general formula (1) represents an alkyl or a cycloalkyl that may be substituted by the secondary substituent described above, and at least one hydrogen atom in the alkyl or cycloalkyl may be substituted by, for example, an alkyl. Examples of this alkyl or cycloalkyl include those described above.

$R_b$ of the ">C($R_b$)$_2$" as a linking group in general formula (1) represents a hydrogen atom or an alkyl, and examples of this alkyl include those described above. Particularly, an alkyl having 1 to 4 carbon atoms (for example, methyl or ethyl) is preferable. Ar in the linking group ">B—Ar" is the same as Ar in formula (X-1), and represents an aryl that may be substituted by an alkyl, a heteroaryl that may be substituted by an alkyl, or an alkyl that may be substituted by an alkyl. Examples of this alkyl, aryl, or heteroaryl include those described above. This description also applies to the linking group in general formula (2).

Furthermore, all or some of hydrogen atoms in a chemical structure of a polycyclic aromatic compound represented by general formula (1) or (2) may be cyanos, halogen atoms, or deuterium atoms. For example, in formula (1), hydrogen atoms in ring A, ring B, and ring C (rings A to C are aryl rings or heteroaryl rings), substituents on rings A to C, Ar or $R_a$ in $X^1$ and $X^2$, and a linking group may be substituted by cyanos, halogen atoms, or deuterium atoms. Among these forms, a form in which all or some of hydrogen atoms in the aryl or heteroaryl are substituted by cyanos, halogen atoms, or deuterium atoms may be mentioned. The halogen is fluorine, chlorine, bromine, or iodine, preferably fluorine, chlorine, or bromine, and more preferably chlorine.

In the invention of the present application, a polycyclic aromatic compound represented by any one of the following general formulas (3) to (8) is more preferable.

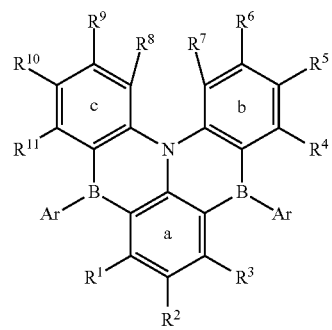

(3)

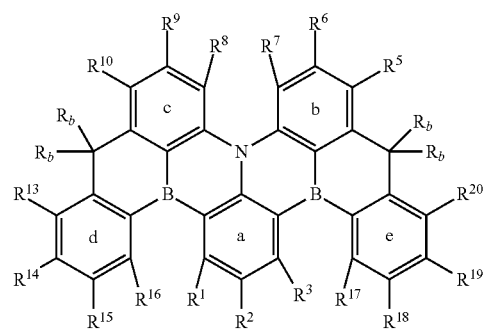

(4)

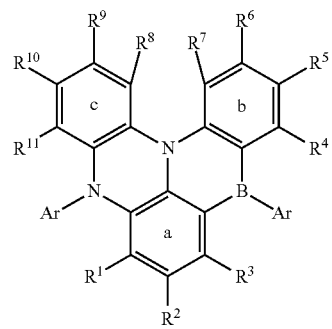

(5)

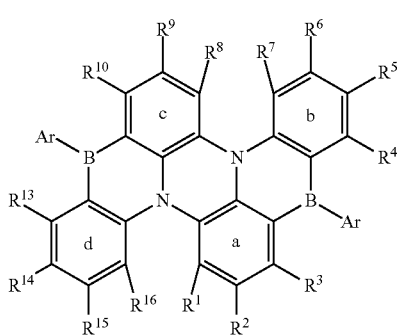

(6)

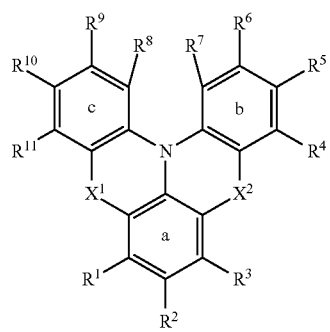

(7)

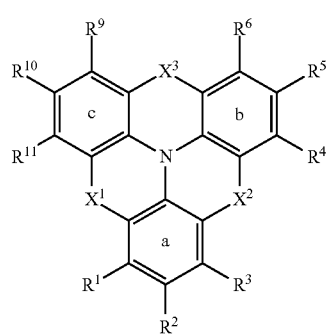

(8)

The above formula (3) represents an N—$B_2$-based compound, in which the group of formula (X-1) is selected as each of $X^1$ and $X^2$. The description of R to $R^{11}$ and Ar in formula (2) can be cited for $R^1$ to $R^{11}$ and Ar. However, Ar is not bonded to ring a, ring b, and/or ring c.

The above formula (4) represents an N—$B_2$—C cross-linked compound, in which the group of formula (X-1) is selected as each of $X^1$ and $X^2$, Ar in formula (X-1) represents a benzene ring (d ring or e ring) or an aryl ring or a heteroaryl ring partially containing a benzene ring, and the benzene ring moiety is bonded to ring b and ring c by a linking group ">$C(R_b)_2$". Furthermore, $R^1$ and $R^{16}$ may be bonded to each other to link ring a and ring d by a linking group >$C(-R_b)_2$, and $R^3$ and $R^{17}$ may be bonded to each other to link ring a and ring e by a linking group >$C(-R_b)_2$. The description of $R^1$ to $R^{11}$ in formula (2) can be cited for $R^1$ to $R^3$ and $R^5$ to $R^{10}$. The description of $R^1$ to $R^{11}$ in formula (2) can also be cited for $R^{13}$ to $R^{20}$. However, when adjacent groups among $R^{13}$ to $R^{20}$ are bonded to each other, an aryl ring or a heteroaryl ring is formed together with ring d or ring e.

The above formula (5) represents an N—NB-based compound, in which the group of formula (X-1) and the group of formula (X-2) are selected as $X^1$ and $X^2$. The description of $R^1$ to $R^{11}$ and Ar in formula (2) can be cited for $R^1$ to $R^{11}$ and Ar. However, Ar is not bonded to ring a, ring b, and/or ring c.

The above formula (6) represents an N—NB—B cross-linked compound, in which the group of formula (X-1) and the group of formula (X-2) are selected as $X^1$ and $X^2$, Ar in formula (X-2) represents a benzene ring (d ring) or an aryl ring or a heteroaryl ring partially containing a benzene ring, and the benzene ring moiety is bonded to ring c by a linking group ">B—Ar". The description of $R^1$ to $R^{11}$ in formula (2) can be cited for $R^1$ to $R^{10}$ and Ar. However, Ar is not bonded to ring a, ring b, ring c, and/or ring d. The description of $R^1$ to $R^{11}$ in formula (2) can also be cited for $R^{13}$ to $R^{16}$. When adjacent groups among $R^{13}$ to $R^{16}$ are bonded to each other, an aryl ring or a heteroaryl ring is formed together with ring d.

The above formula (7) represents an N—$P_2$-based compound, in which any one of the groups of formulas (X-3) to (X-7) is selected as each of $X^1$ and $X^2$. The description of $R^1$ to $R^{11}$ in formula (2) can be cited for $R^1$ to $R^{11}$. However, Ar in formulas (X-5) to (X-7) is not bonded to ring a, ring b, and/or ring c.

The above formula (8) represents an N—$P_2$—P cross-linked compound, in which $X^3$ for bonding ring b and ring c is further introduced into the structure of the compound of formula (7). The $X^3$ is selected from the groups of formulas (X-3) to (X-7) similarly to $X^1$ and $X^2$. The description in formula (2) can be cited for the description of each symbol.

More specific examples of the polycyclic aromatic compound of the present invention include compounds represented by the following chemical structural formulas. Incidentally, in the chemical structural formulas, Me represents a methyl group, Et represents an ethyl group, nPr represents a n-propyl group, $^i$Pr represents an isopropyl group, $^n$Bu represents a n-butyl group, $^t$Bu represents a t-butyl group, D represents a deuterium atom, and Ph represents a phenyl group.

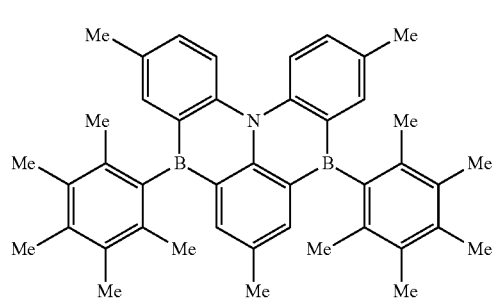

(1-3-1)

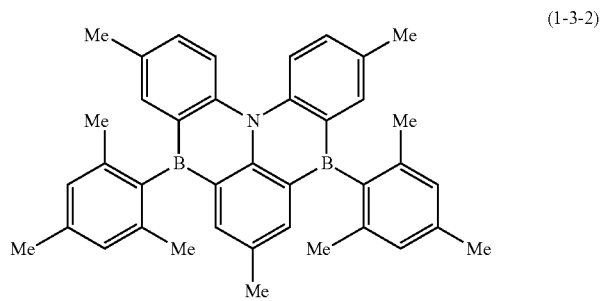

(1-3-2)

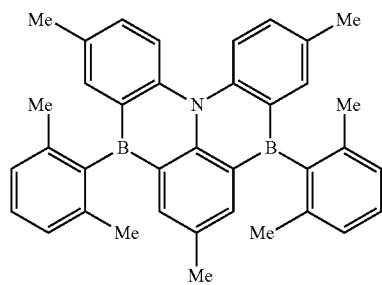
(1-3-3)
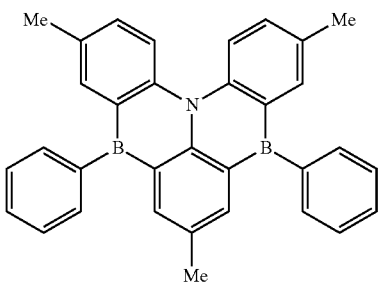
(1-3-4)
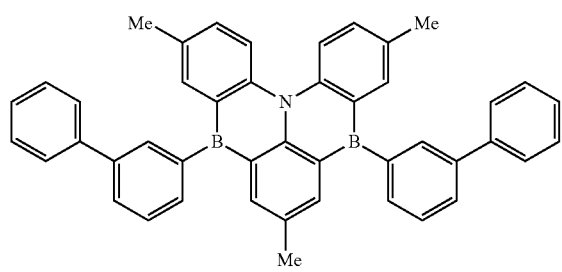
(1-3-5)
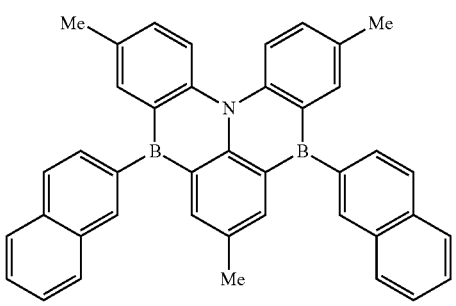
(1-3-6)
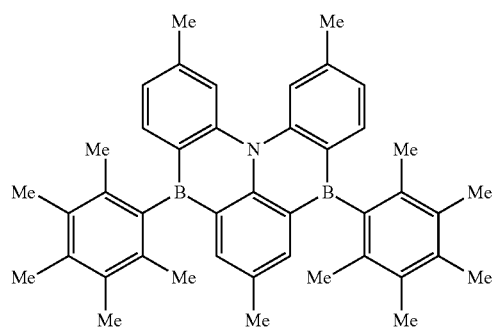
(1-3-7)
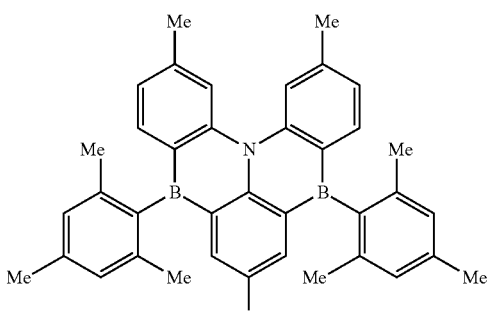
(1-3-8)
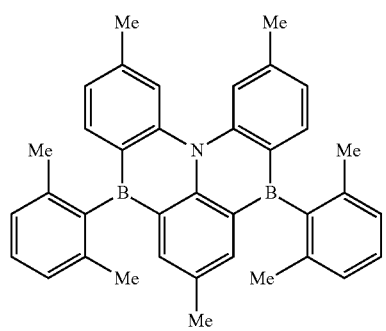
(1-3-9)
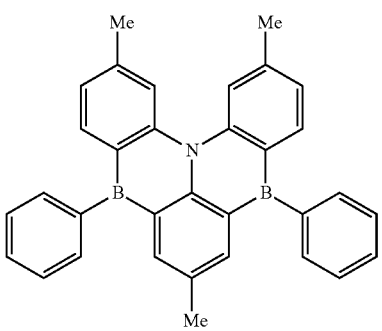
(1-3-10)
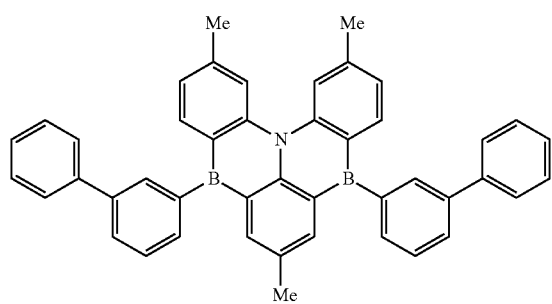
(1-3-11)
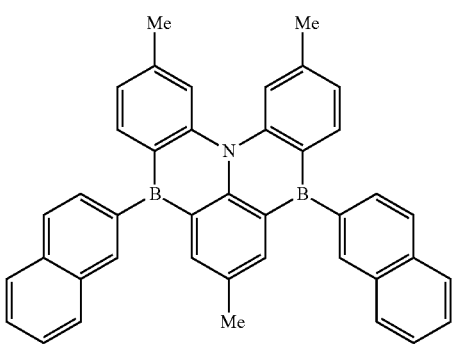
(1-3-12)

-continued
(1-3-13) 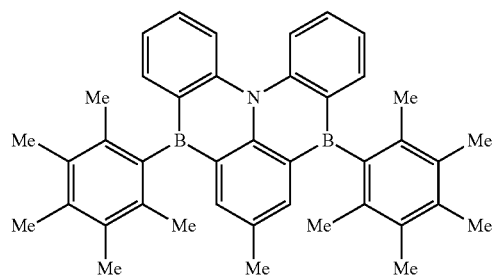
(1-3-14) 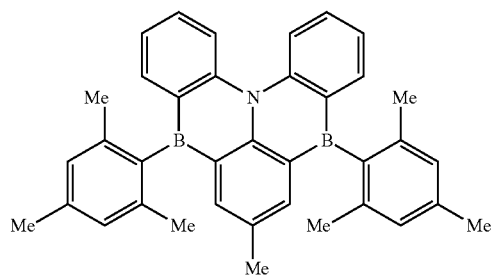
(1-3-15) 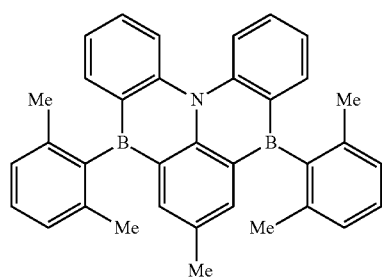
(1-3-16) 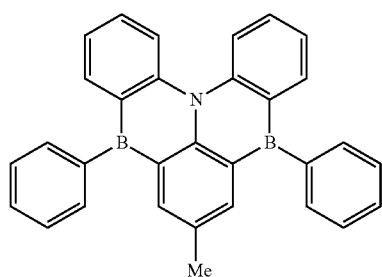
(1-3-17) 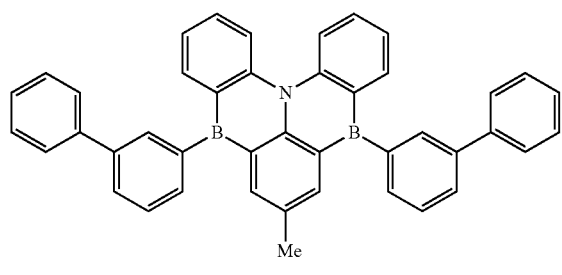
(1-3-18) 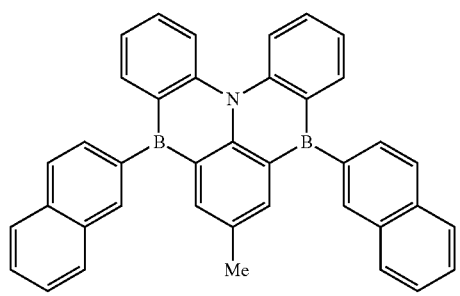
(1-3-25) 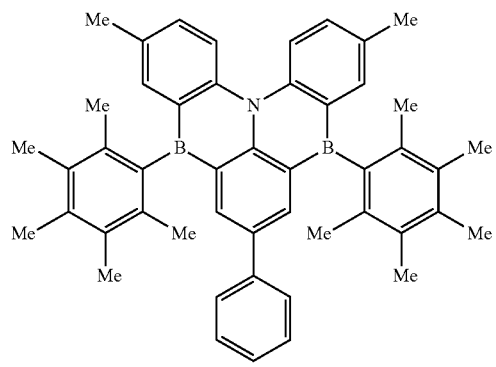
(1-3-26) 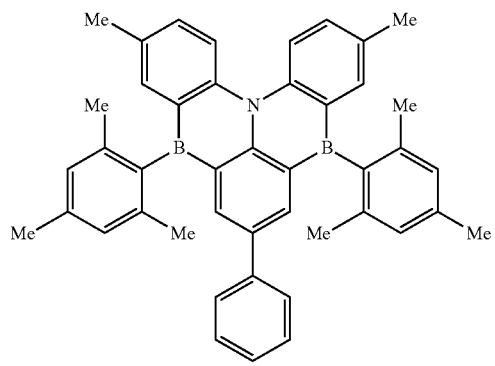
(1-3-27) 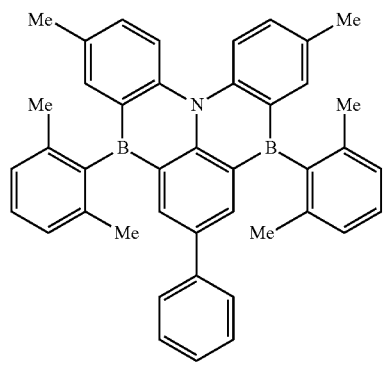
(1-3-28) 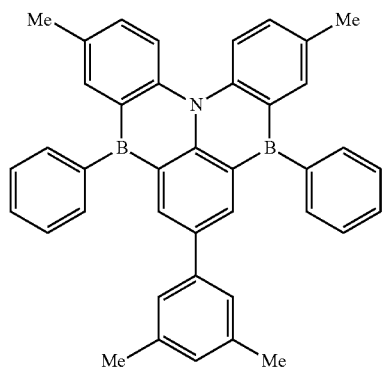

-continued
(1-3-29)
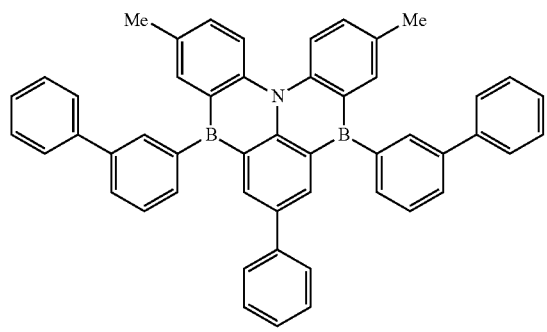
(1-3-30)
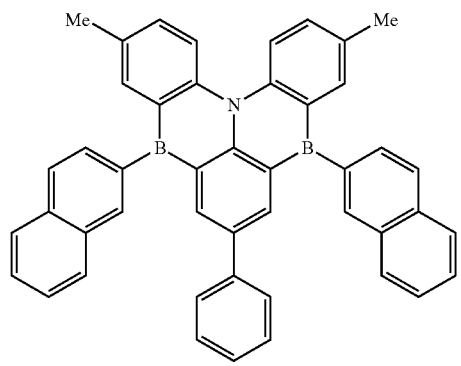
(1-3-31)
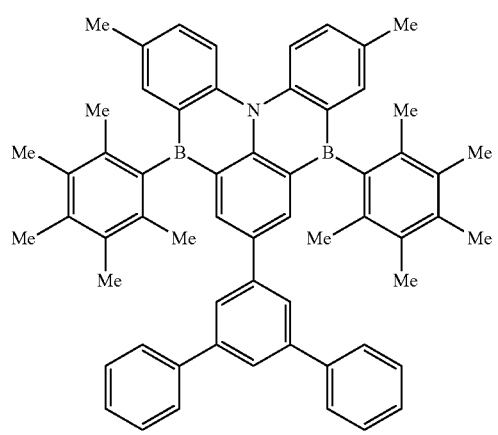
(1-3-32)
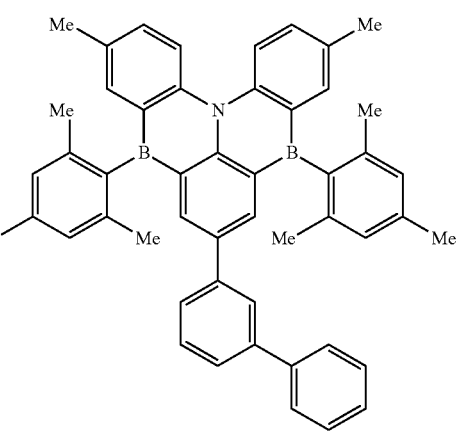
(1-3-33)
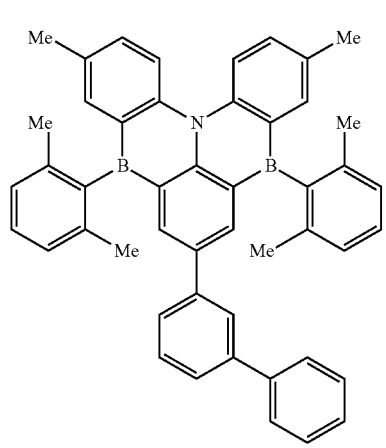
(1-3-34)
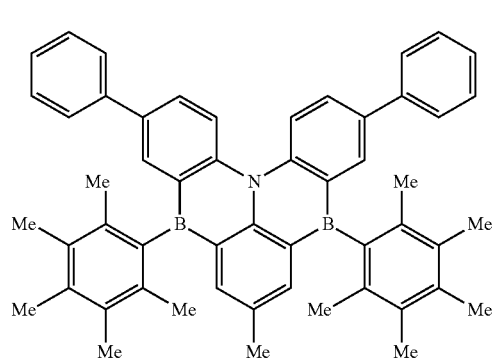
(1-3-35)
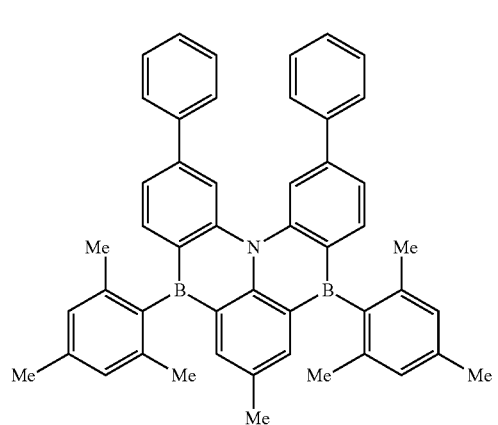
(1-3-36)
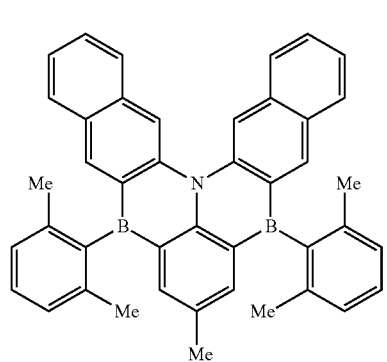

-continued
(1-3-37)
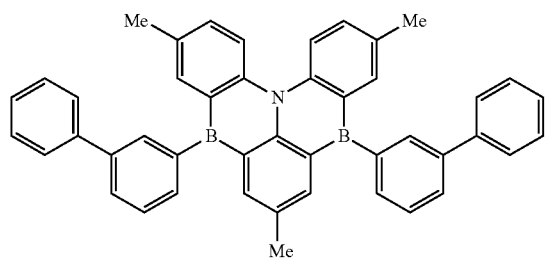
(1-3-38)
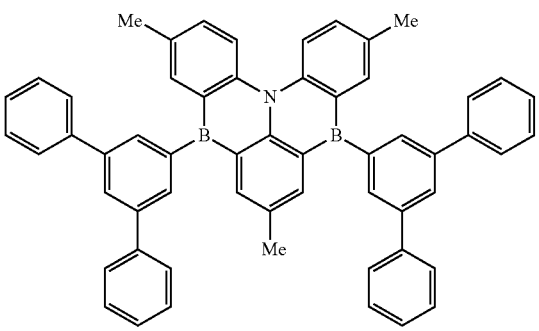
(1-3-45)
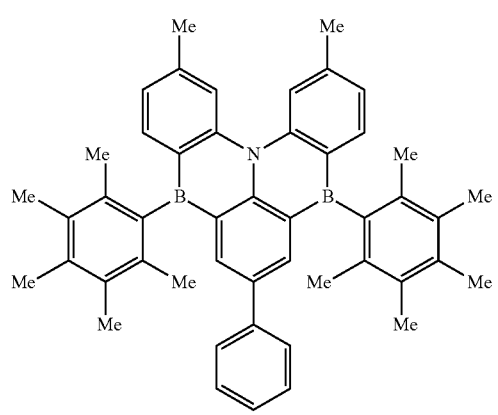
(1-3-46)
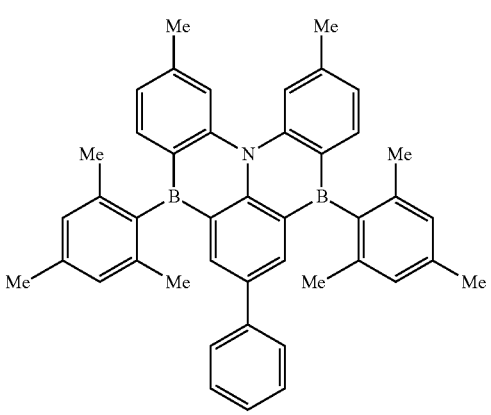
(1-3-47)
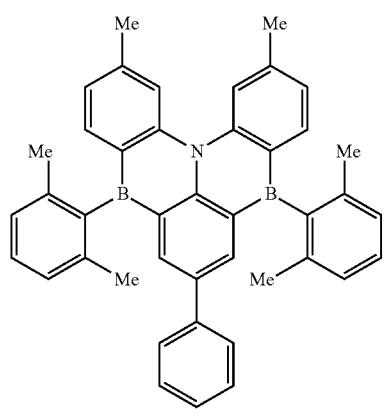
(1-3-48)
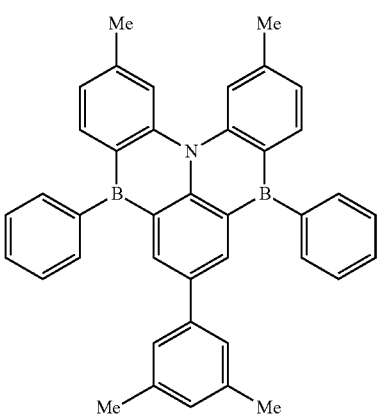
(1-3-49)
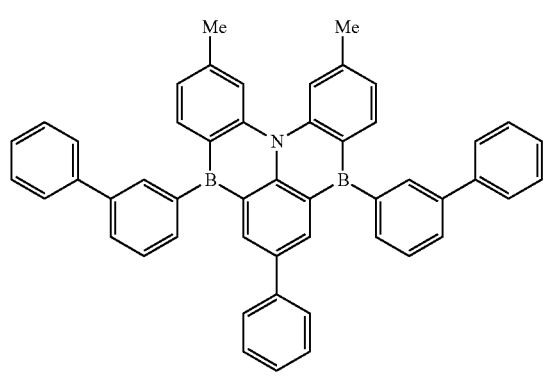
(1-3-50)
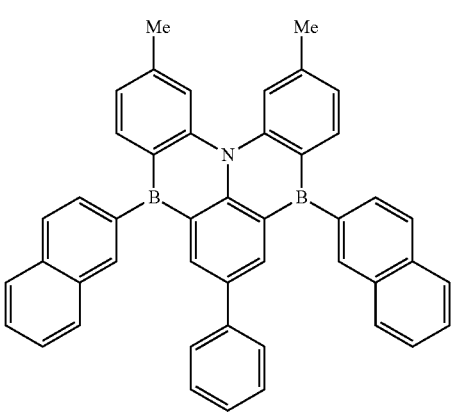

(1-3-51) 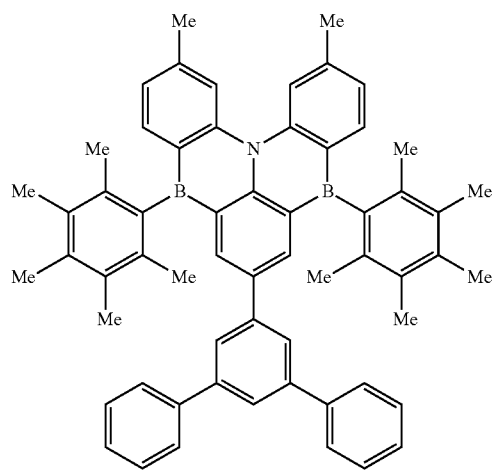
(1-3-52) 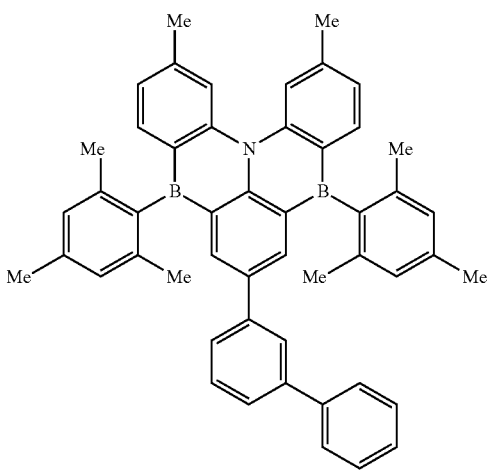
(1-3-53) 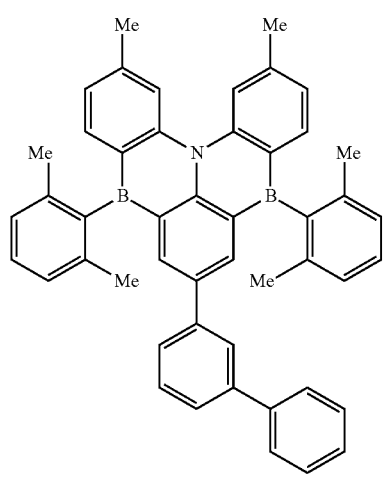
(1-3-54) 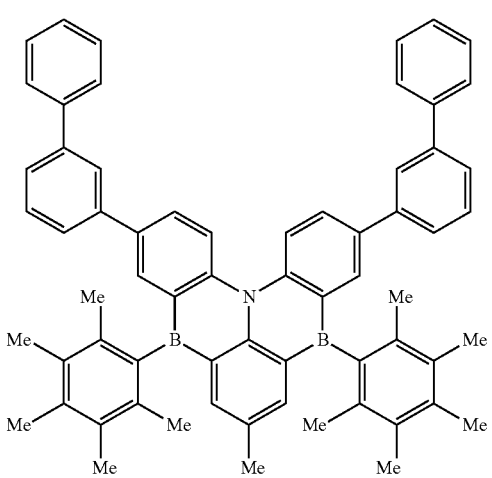
(1-3-55) 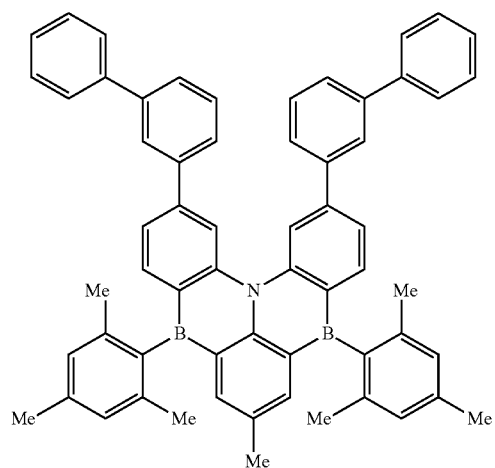
(1-3-56) 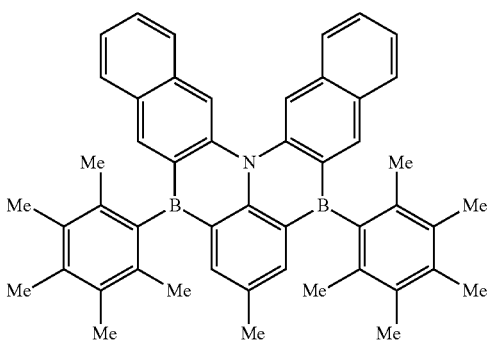

-continued
(1-3-57)
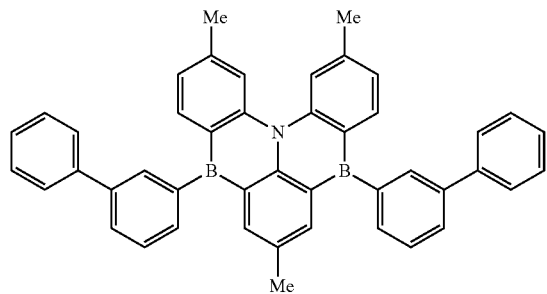
(1-3-58)
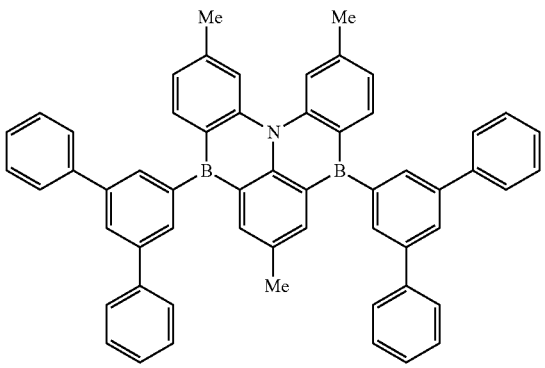
(1-3-65)
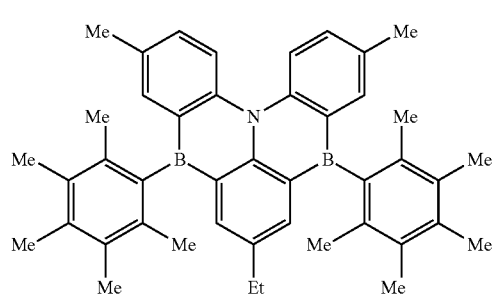
(1-3-66)
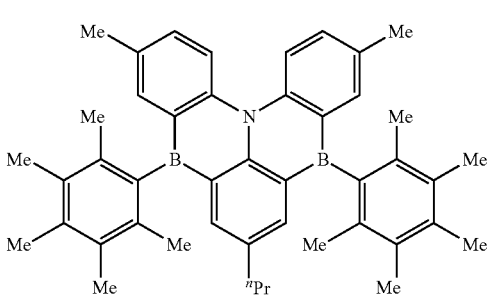
(1-3-67)
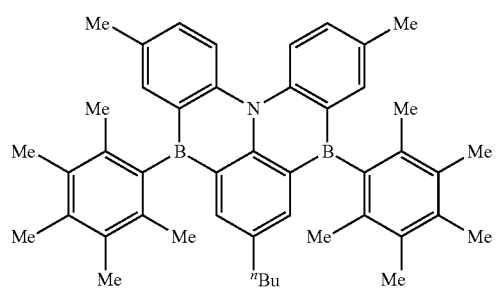
(1-3-68)
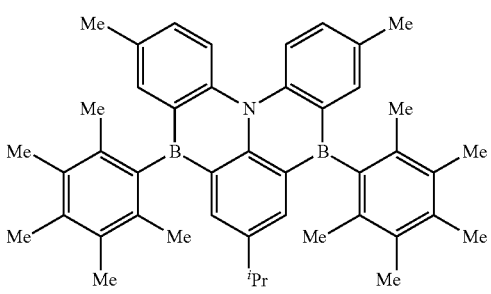
(1-3-69)
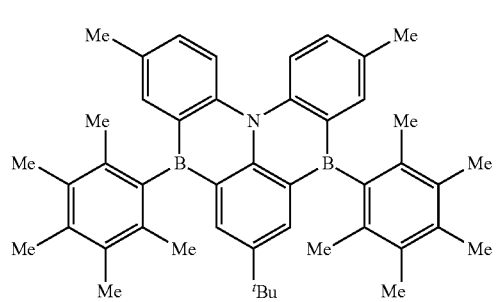
(1-3-70)
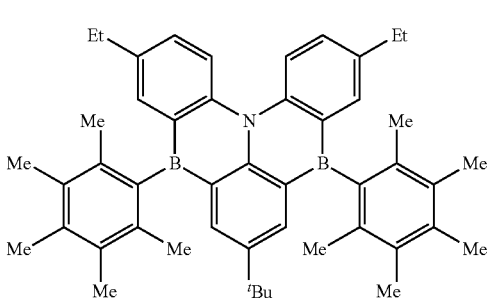
(1-3-71)
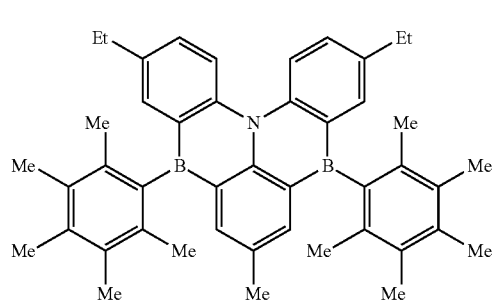
(1-3-72)
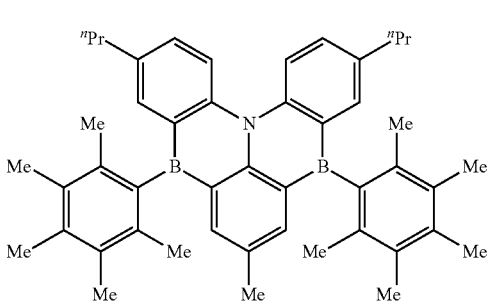

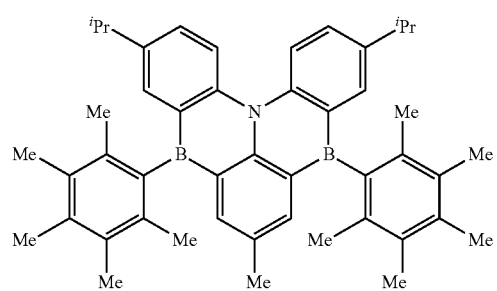 (1-3-73)
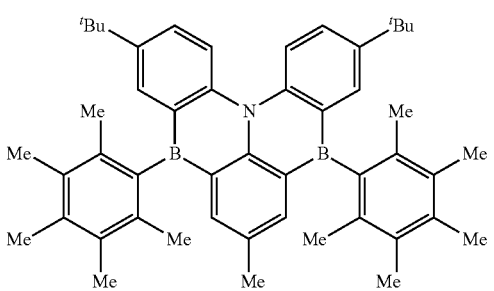 (1-3-74)
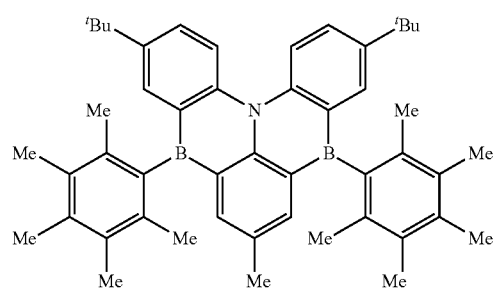 (1-3-75)
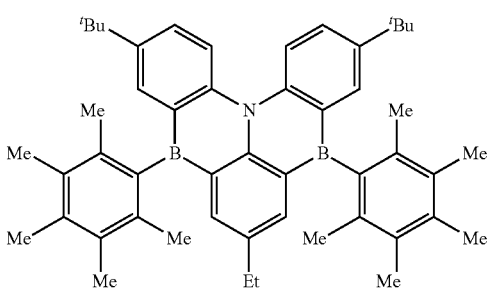 (1-3-76)
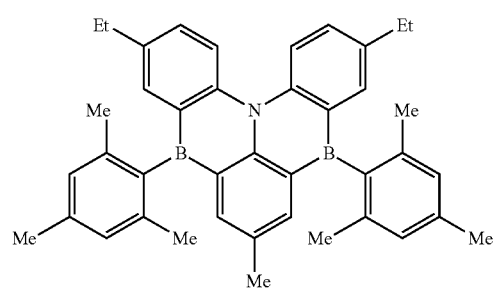 (1-3-77)
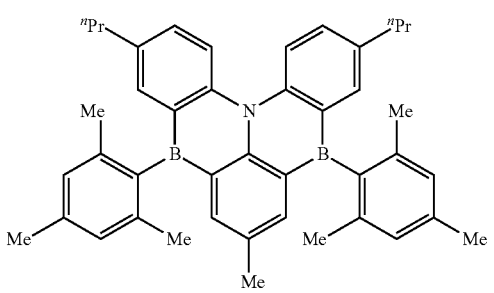 (1-3-78)
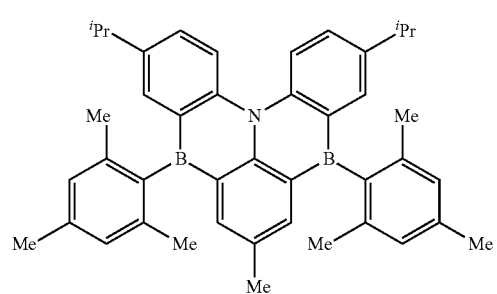 (1-3-79)
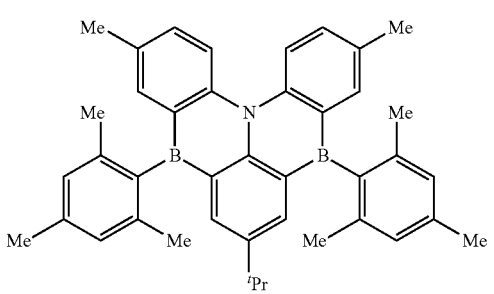 (1-3-80)
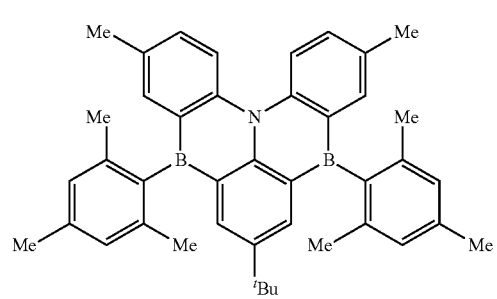 (1-3-81)
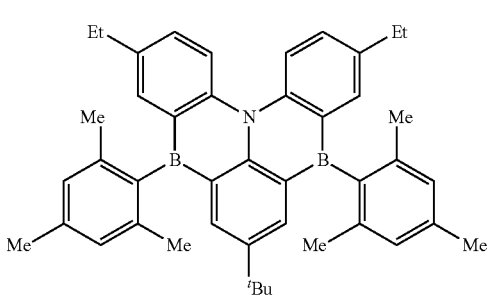 (1-3-82)

-continued
(1-3-90)
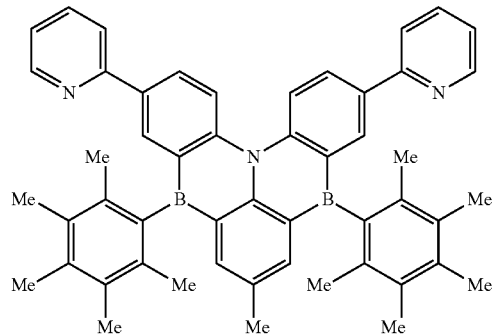
(1-3-91)
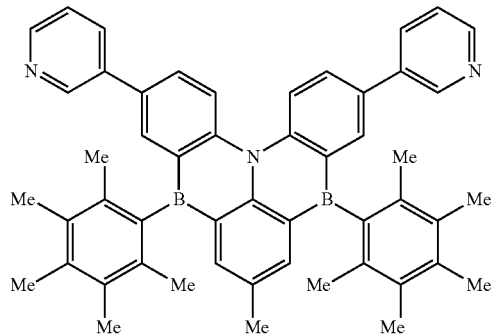
(1-3-92)
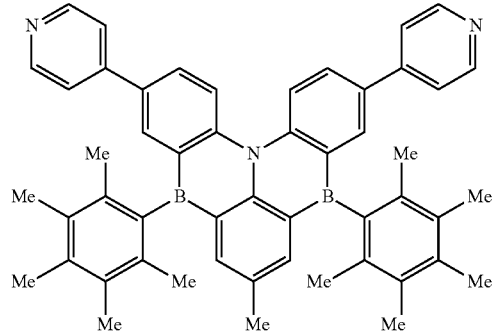
(1-3-93)
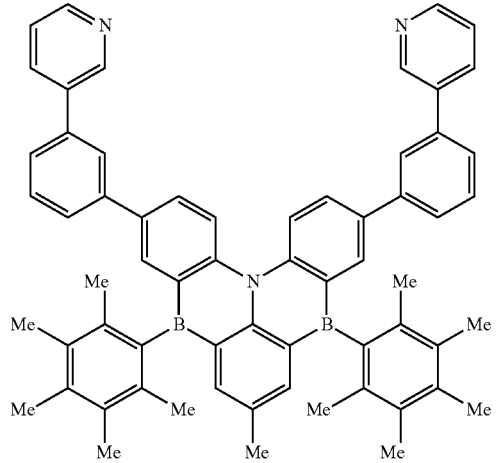
(1-3-94)
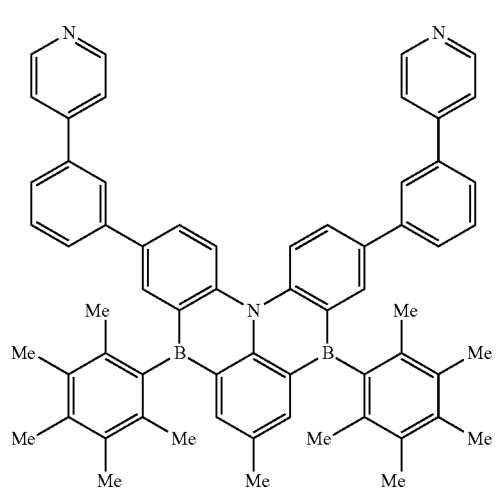
(1-3-95)
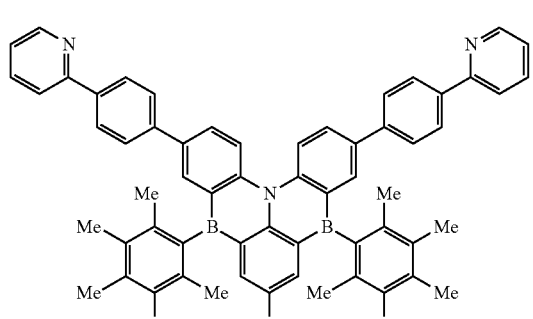

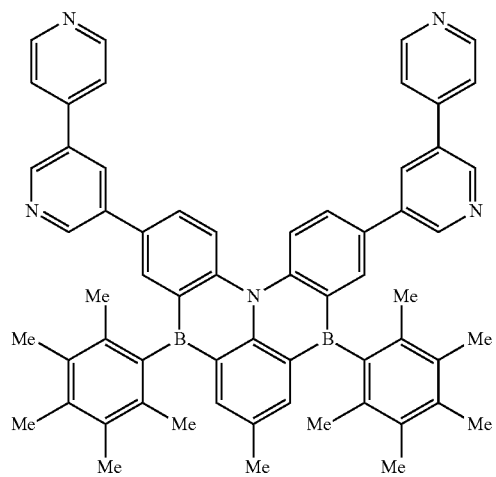
(1-3-96)
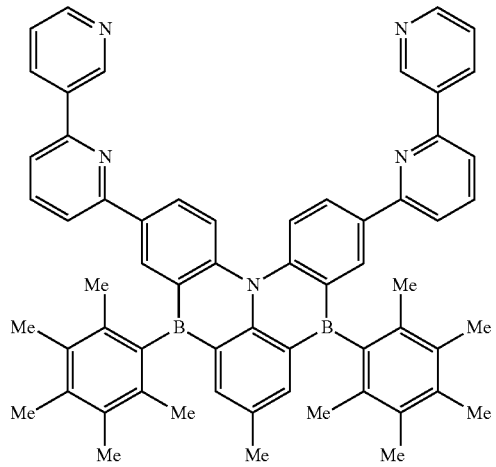
(1-3-97)
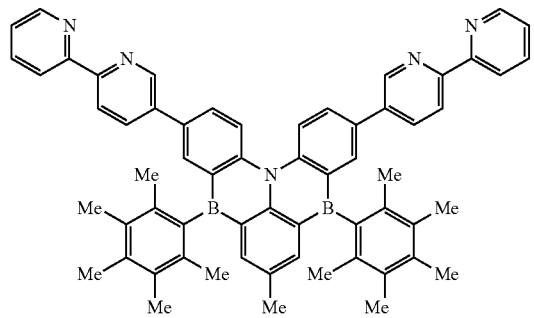
(1-3-98)
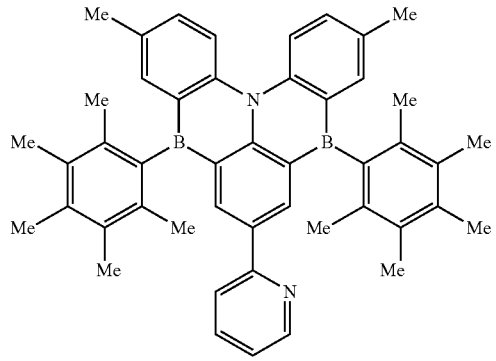
(1-3-99)
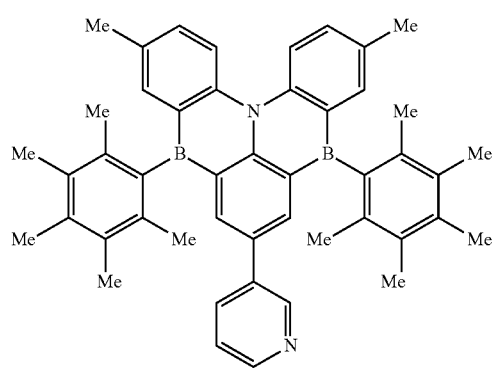
(1-3-100)
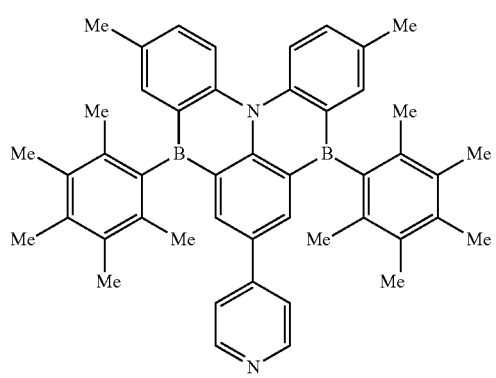
(1-3-101)

-continued
(1-3-102) 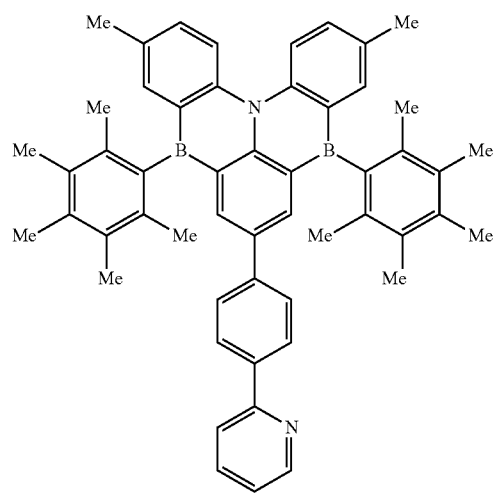
(1-3-103) 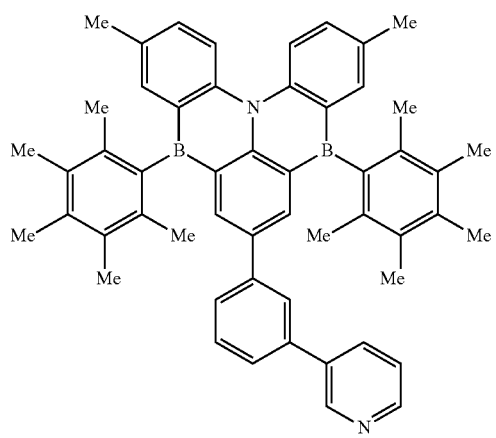
(1-3-104) 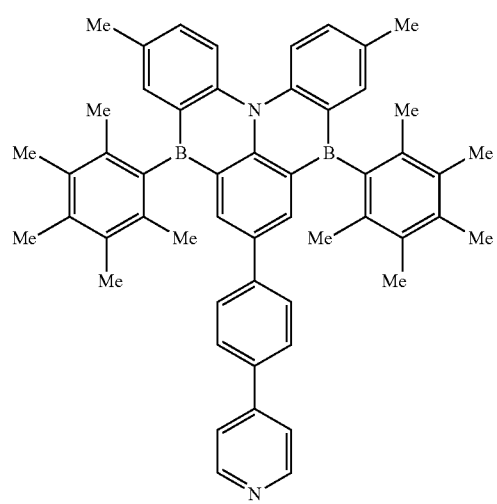
(1-3-110) 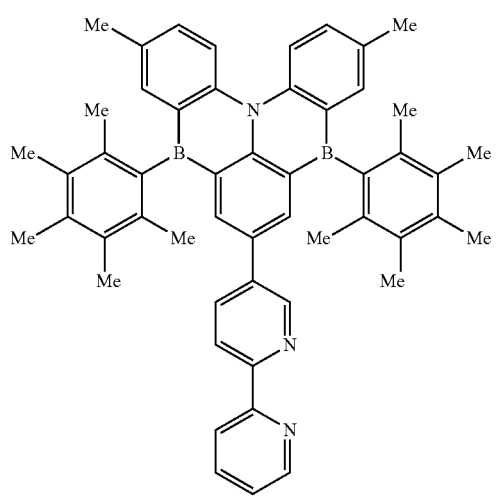
(1-3-111) 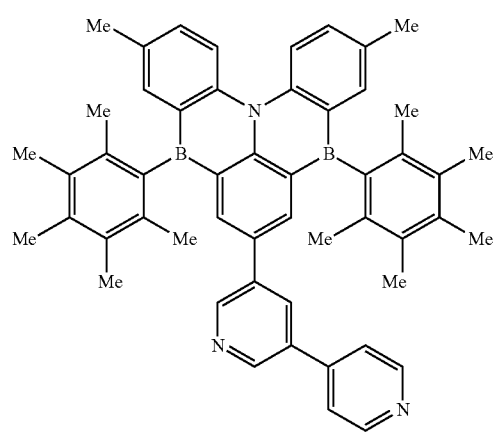
(1-3-112) 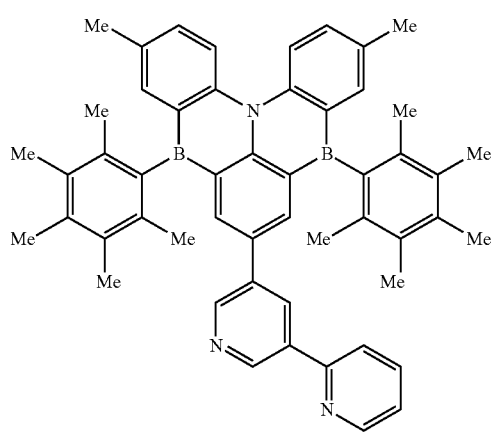

-continued
(1-3-113) 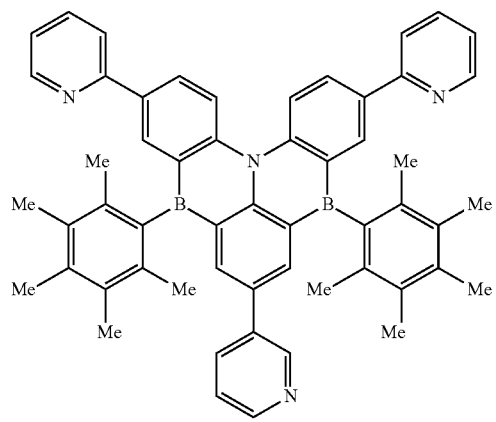
(1-3-114) 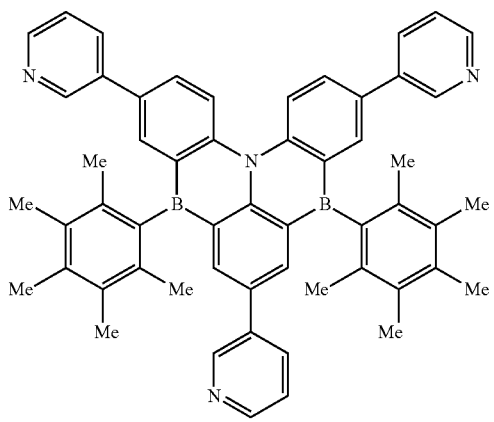
(1-3-115) 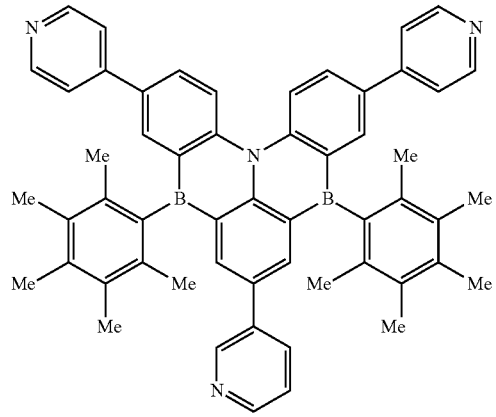
(1-3-116) 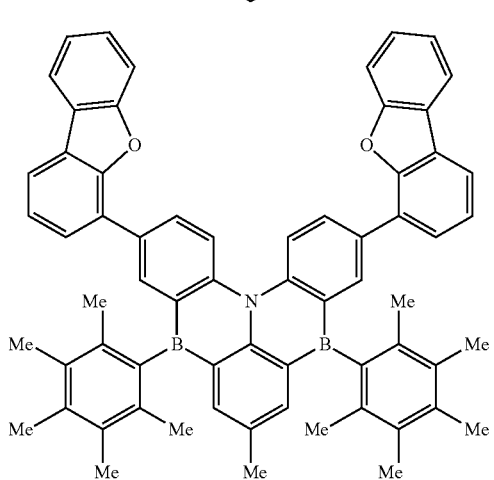
(1-3-118) 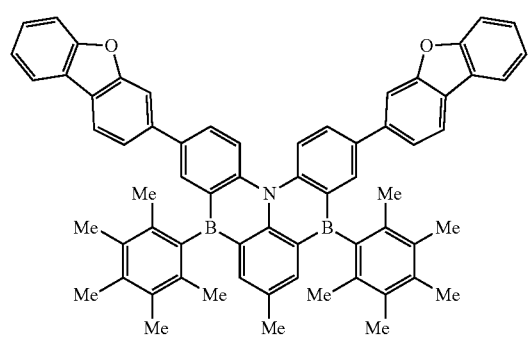
(1-3-117) 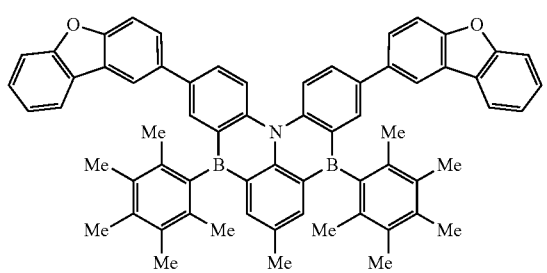
(1-3-119) 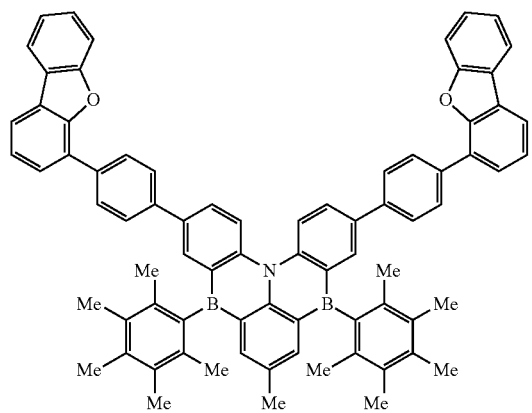
(1-3-120) 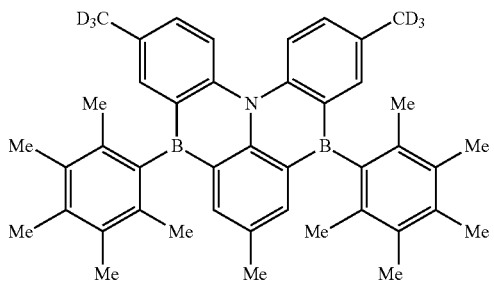

-continued
(1-3-121) 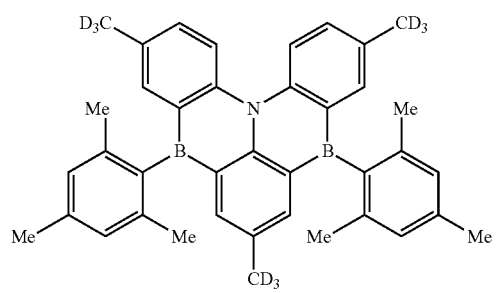
(1-3-122) 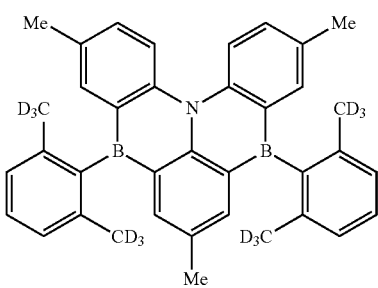
(1-3-130) 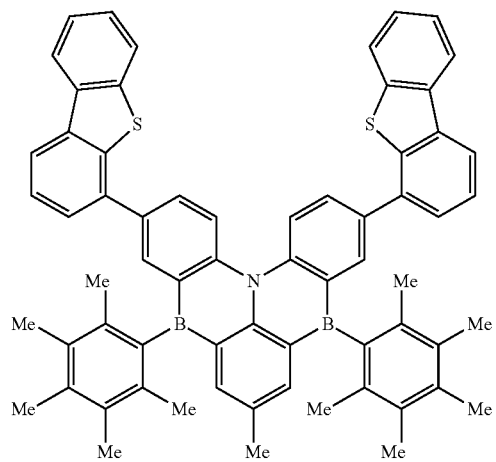
(1-3-131) 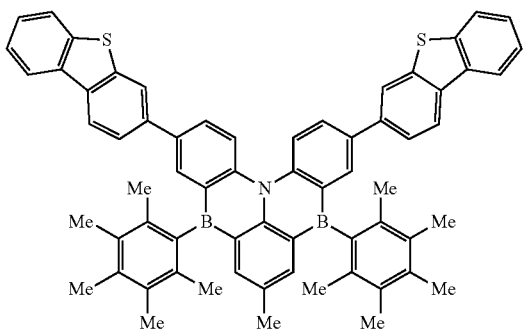
(1-3-132) 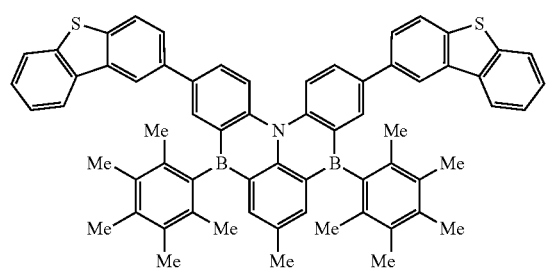
(1-3-133) 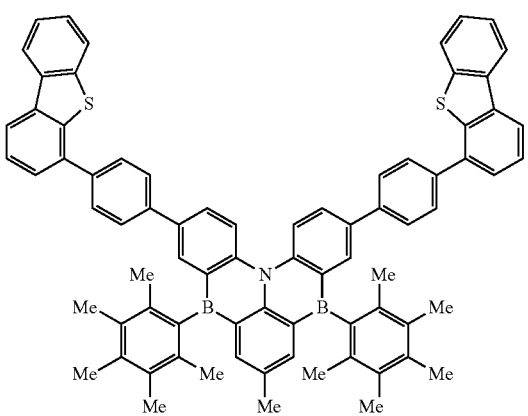
(1-3-134) 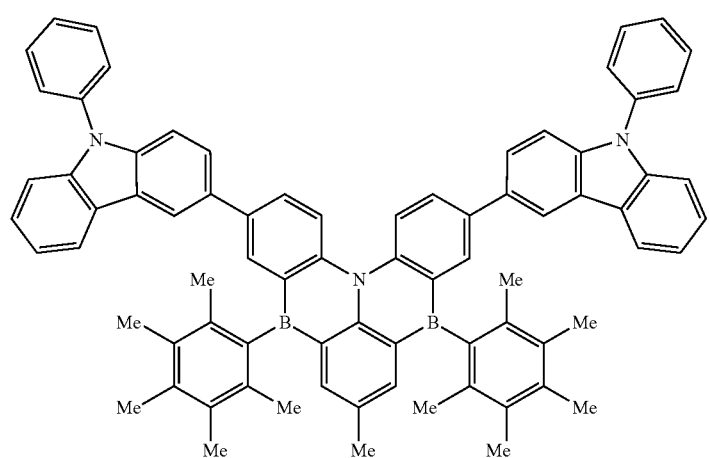

(1-3-135)
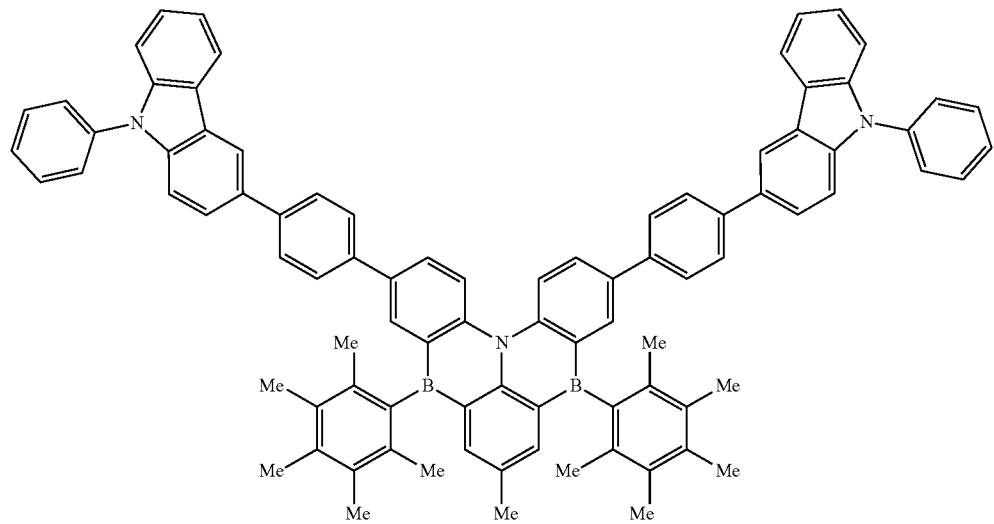
(1-3-136)
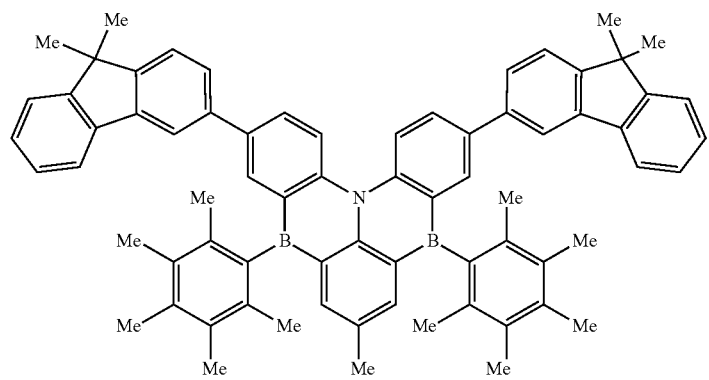
(1-3-137)
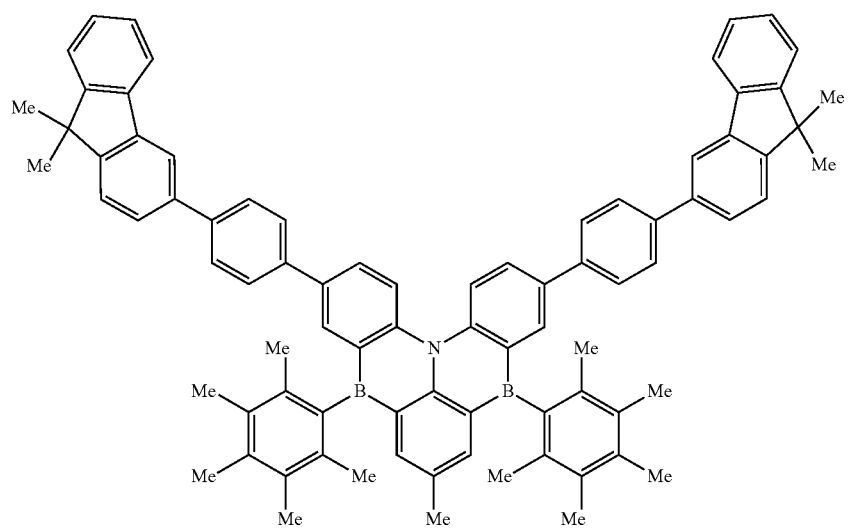

(1-3-145)
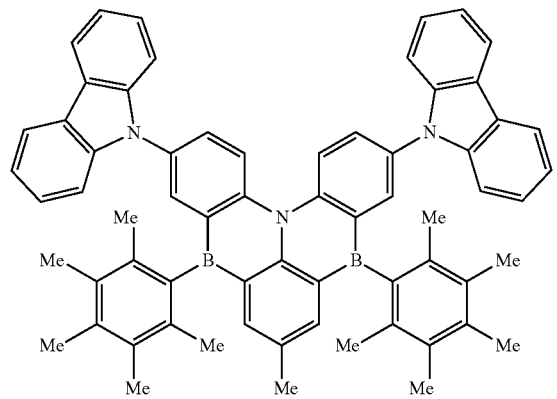
(1-3-146)
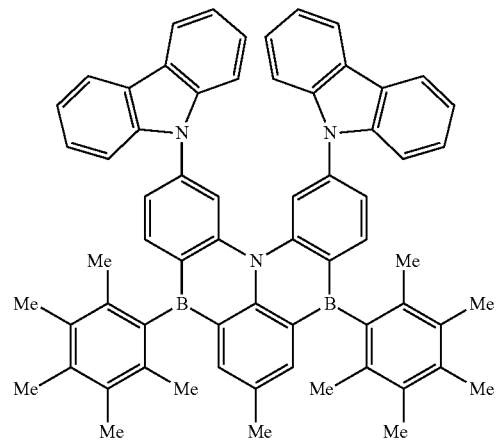
(1-3-147)
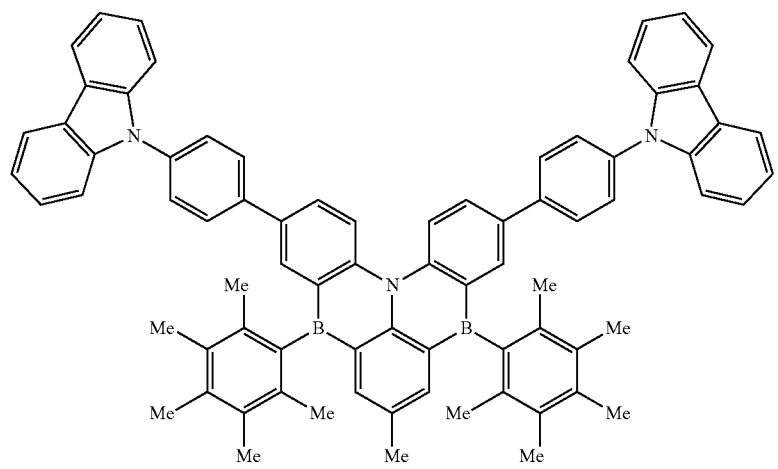
(1-3-148)
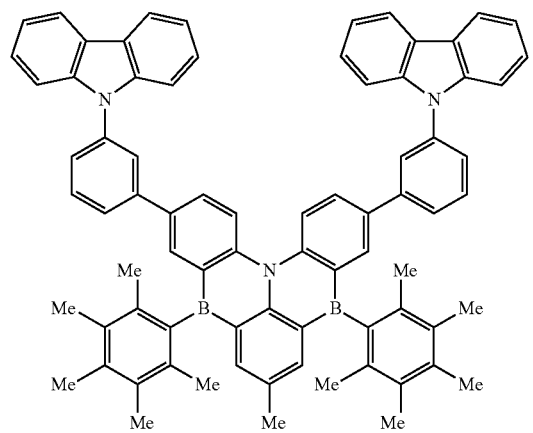
(1-3-149)
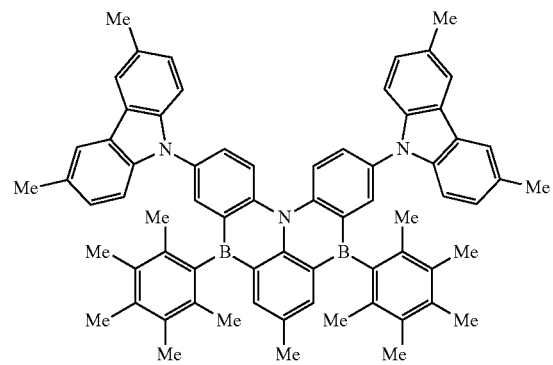

(1-3-150)
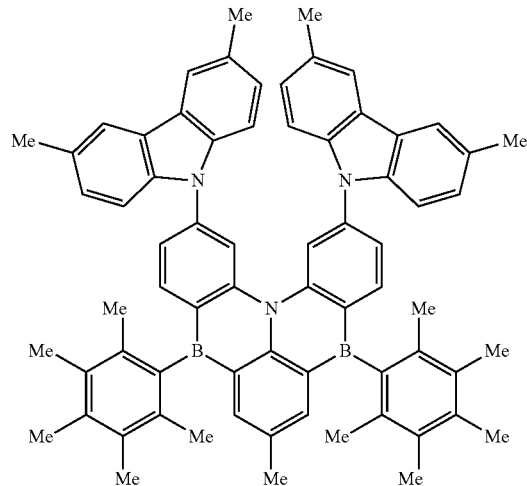
(1-3-151)
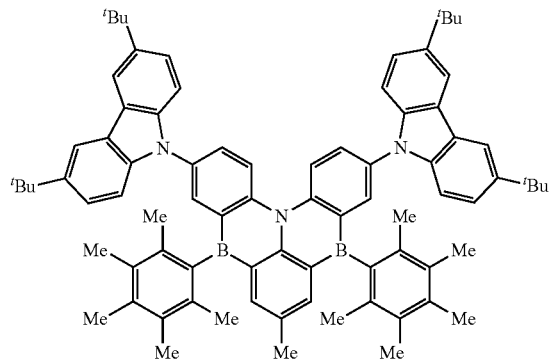
(1-3-152)
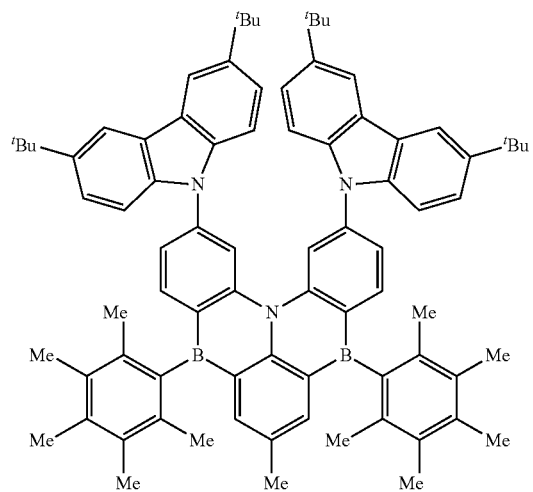
(1-3-153)
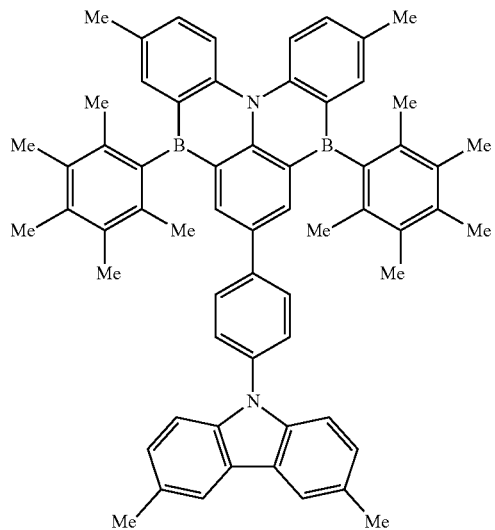
(1-3-154)
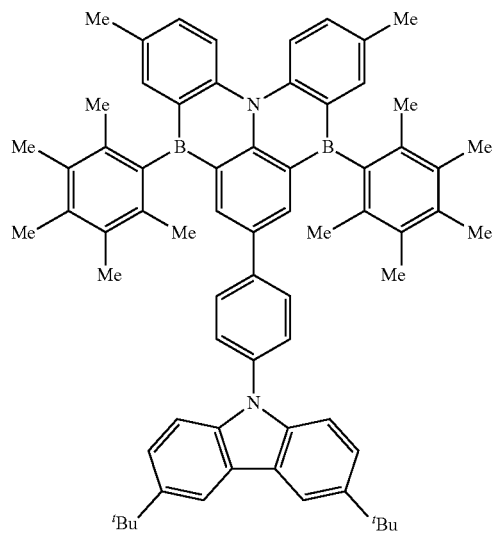
(1-3-160)
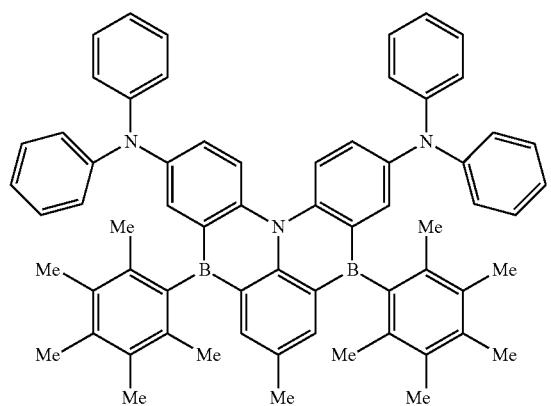

-continued
(1-3-161)
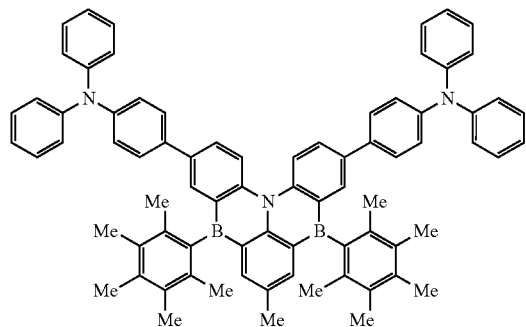
(1-3-162)
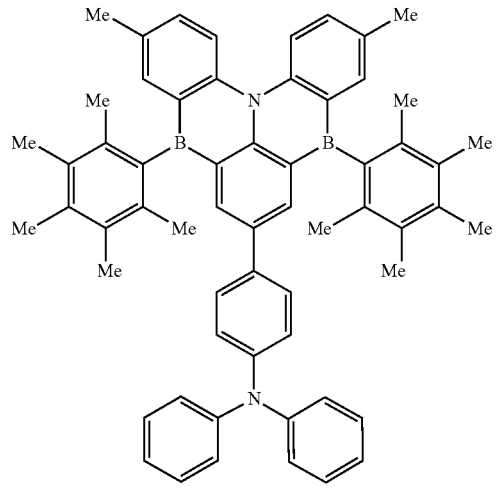
(1-3-163)
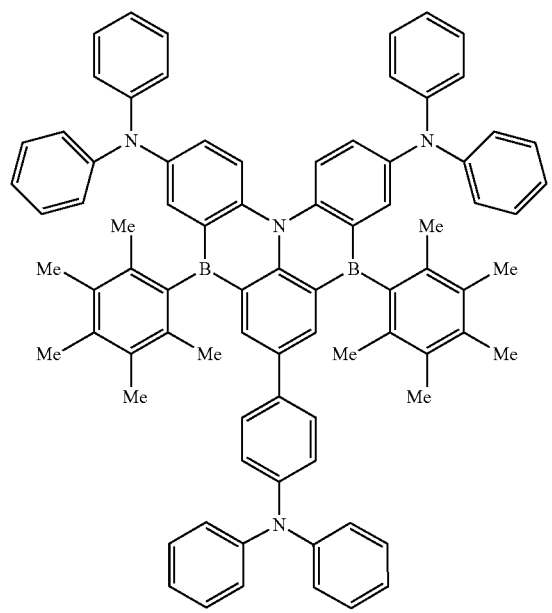
(1-3-164)
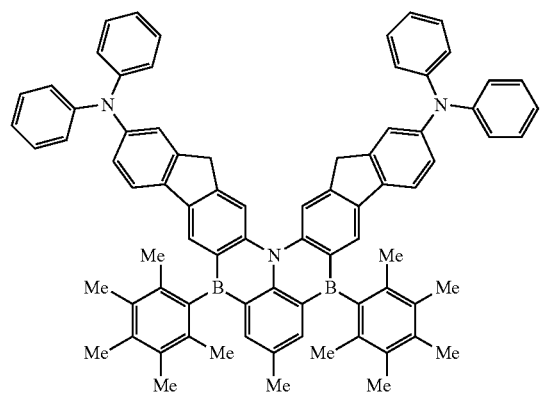
(1-3-166)
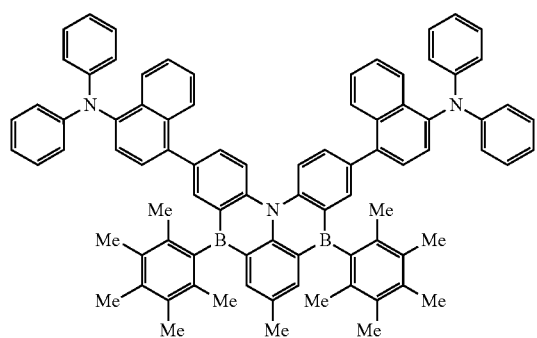
(1-3-165)
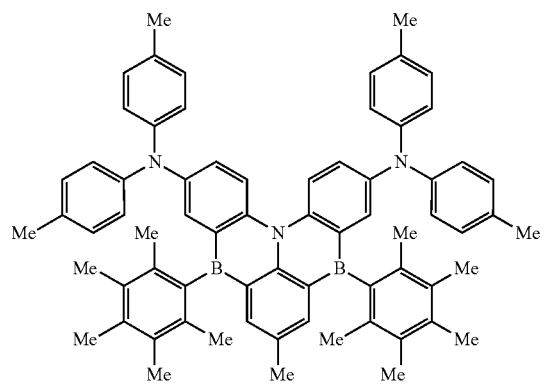

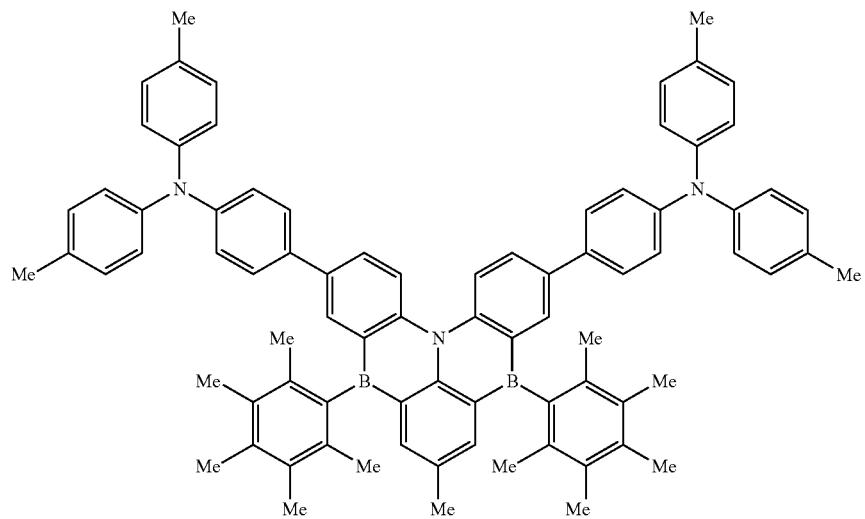
(1-3-167)
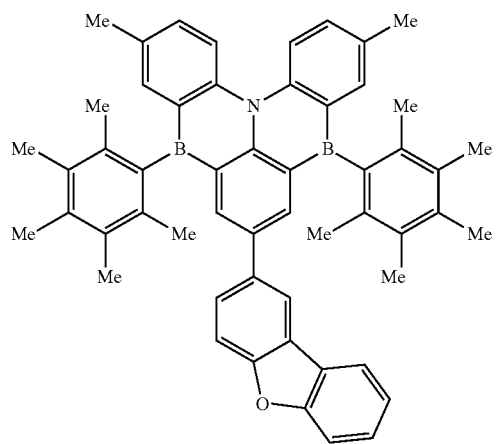
(1-3-175)
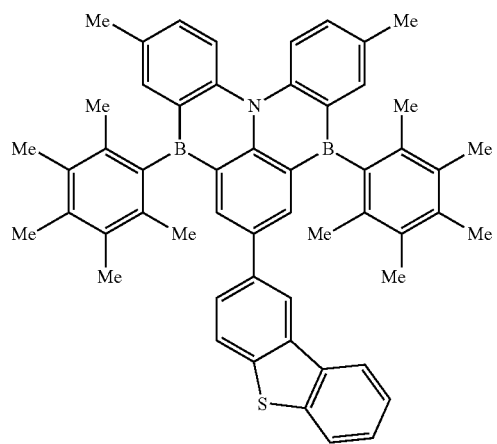
(1-3-176)
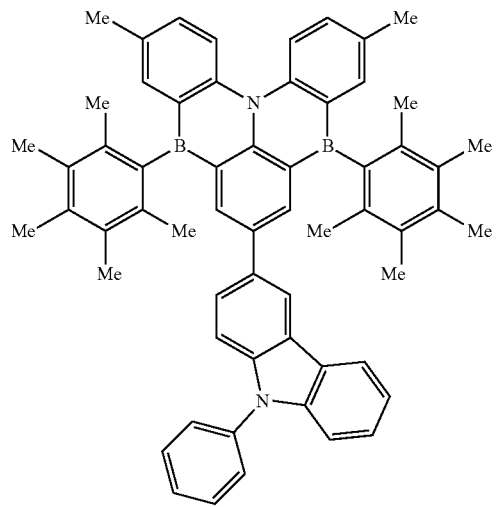
(1-3-177)
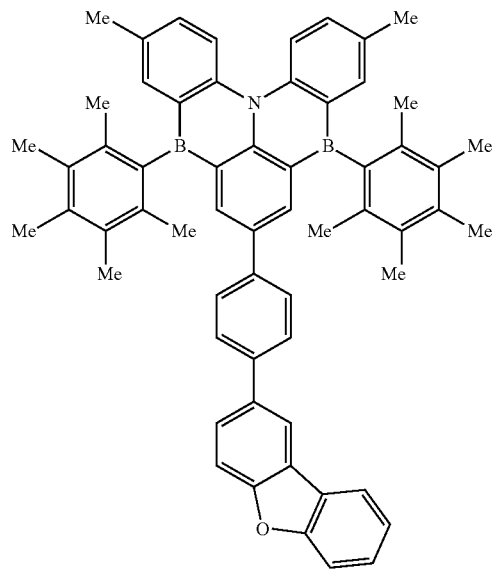
(1-3-178)

(1-3-179)
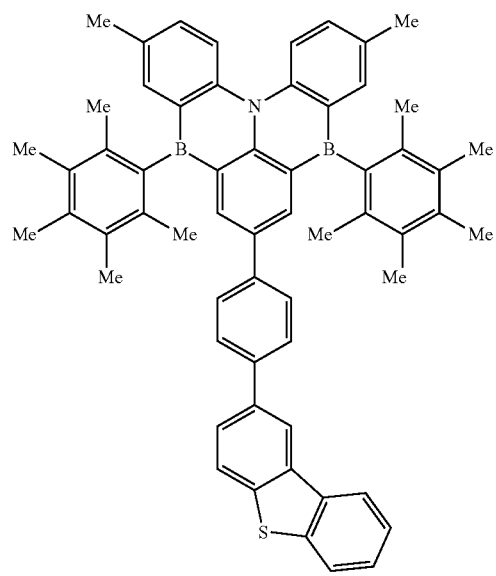
(1-3-180)
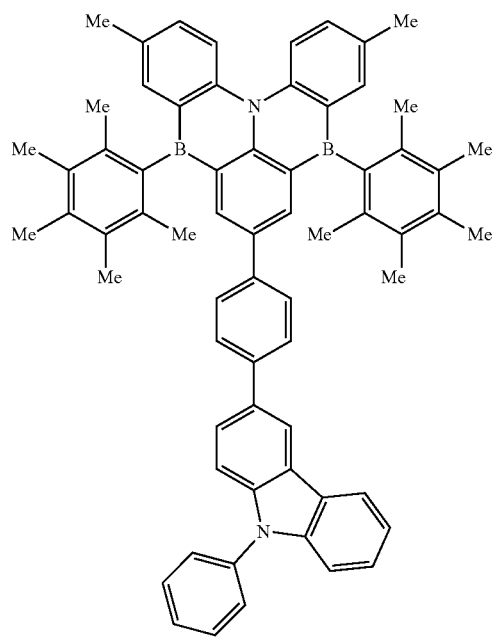
(1-3-181)
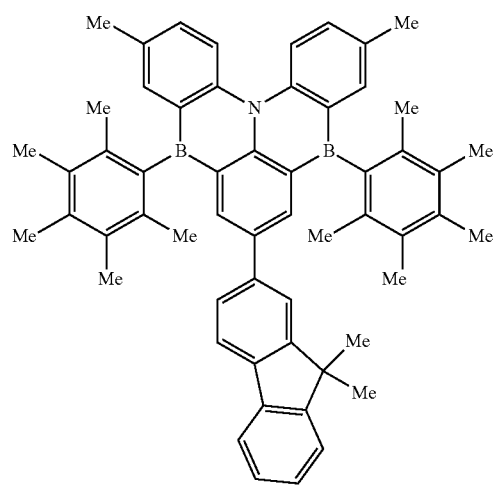
(1-3-182)
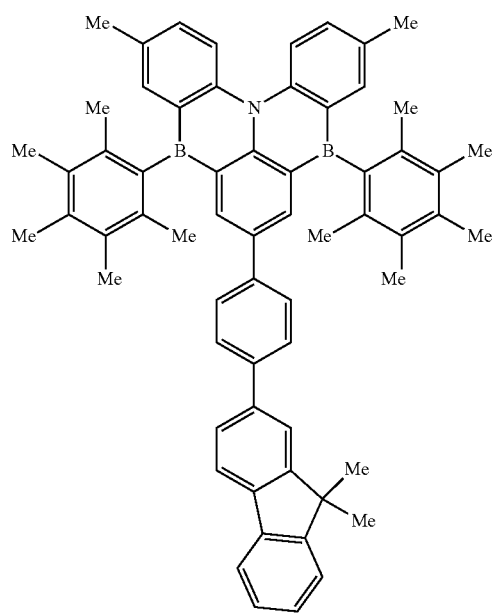

-continued
(1-3-183)
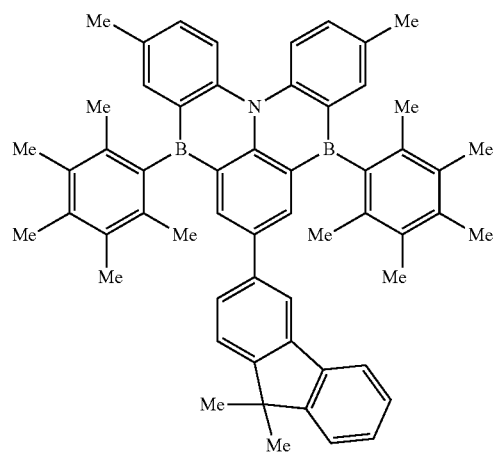
(1-3-184)
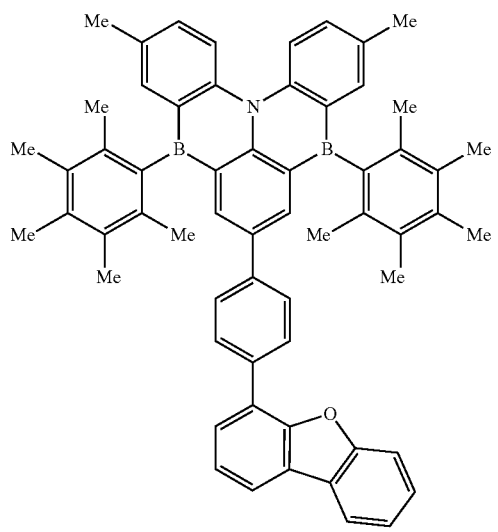
(1-3-185)
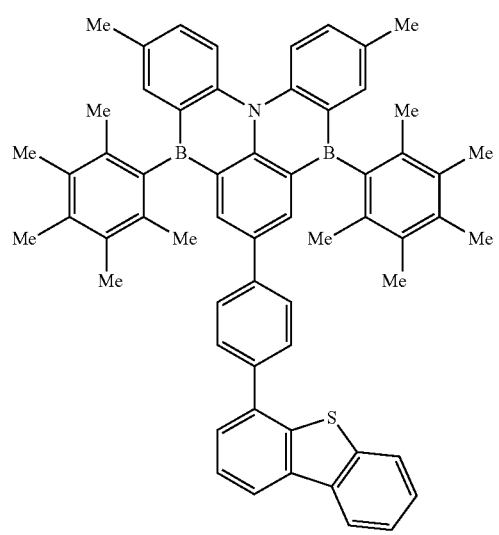
(1-3-186)
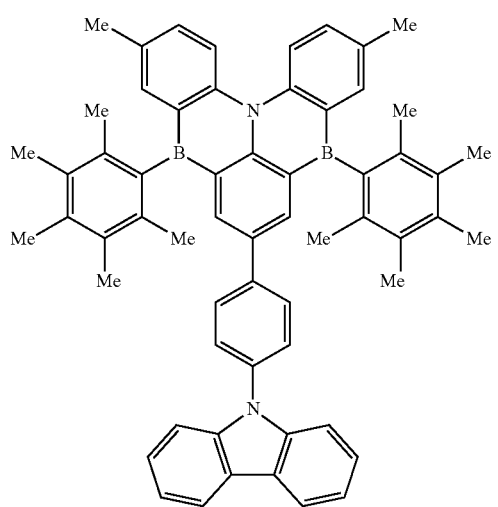
(1-3-190)
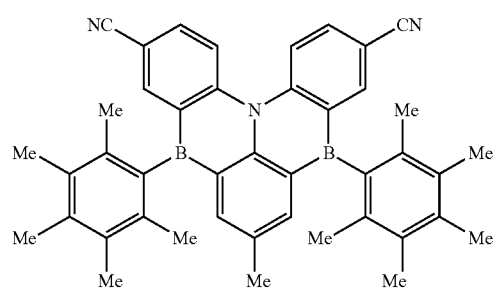
(1-3-191)
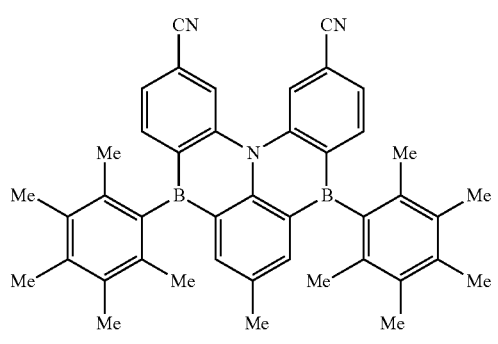
(1-3-192)
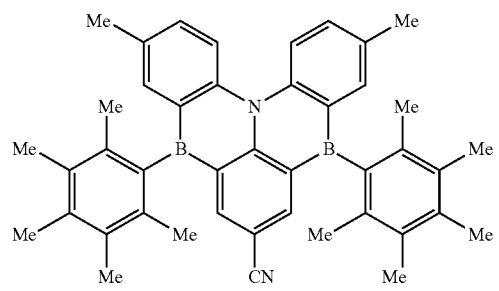
(1-3-193)
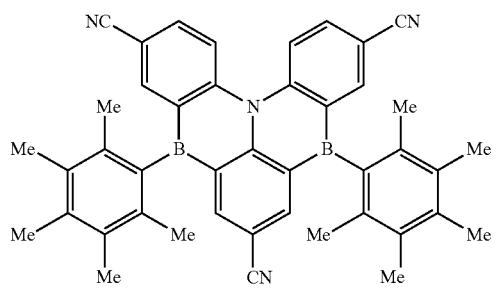

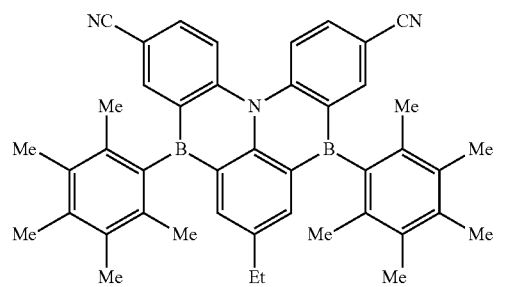
(1-3-194)
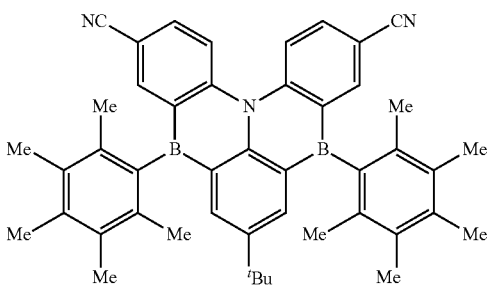
(1-3-195)
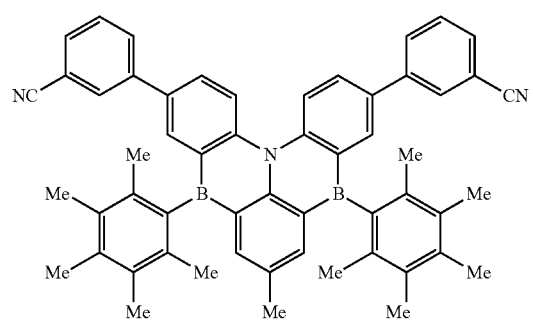
(1-3-196)
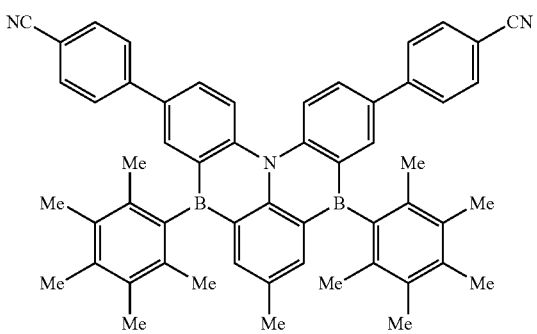
(1-3-197)
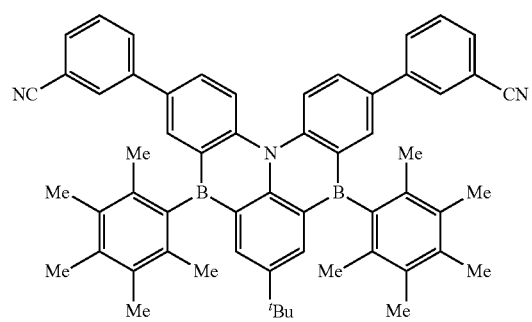
(1-3-198)
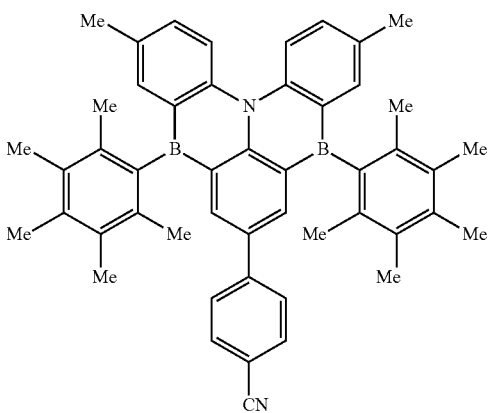
(1-3-199)
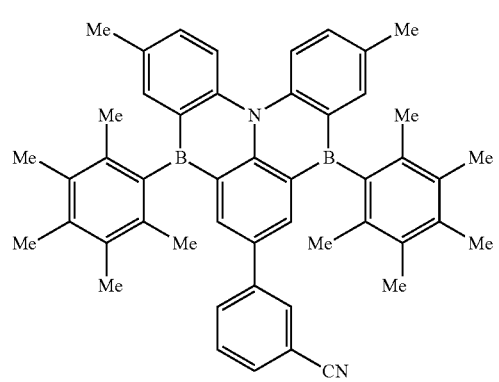
(1-3-200)
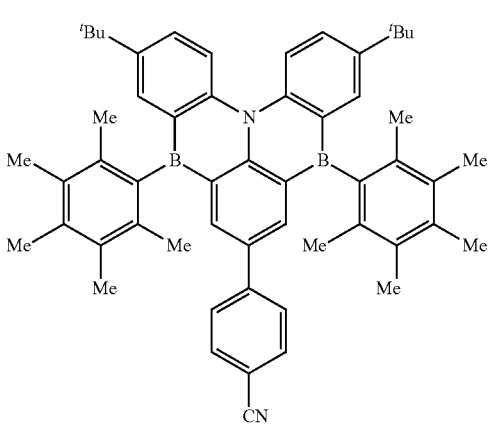
(1-3-201)

-continued
(1-3-202)
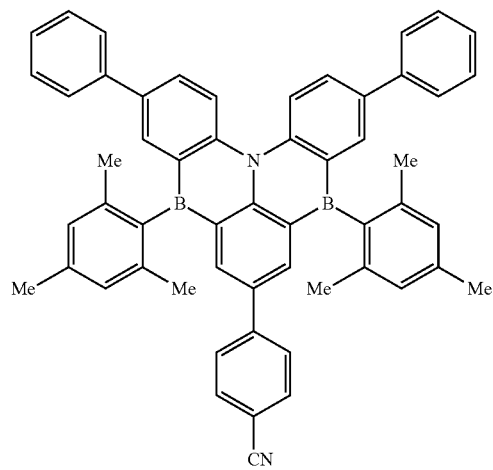
(1-3-203)
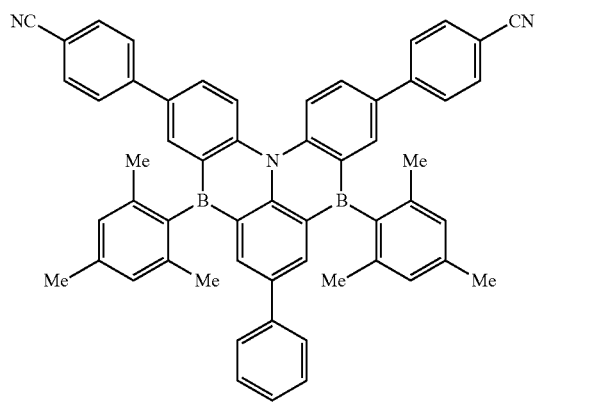
(1-3-204)
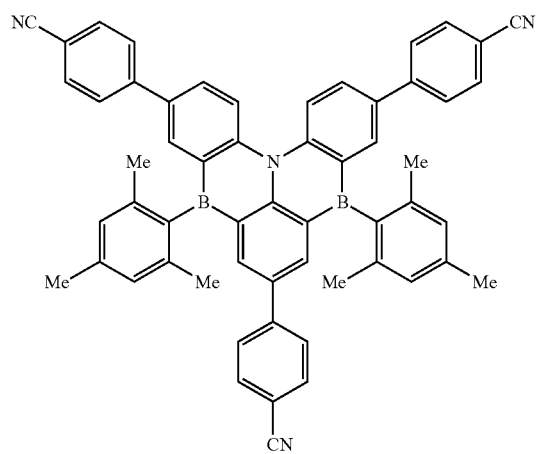
(1-3-210)
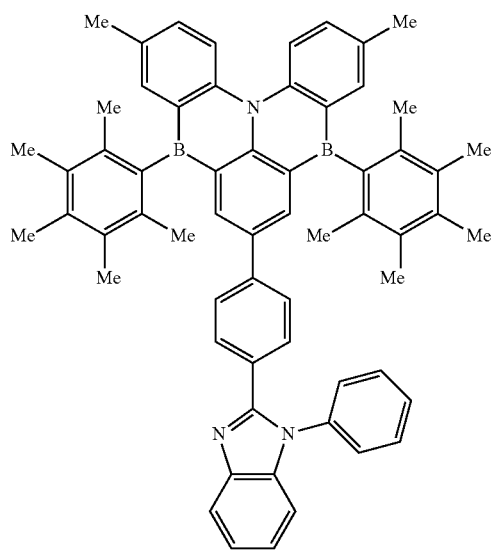
(1-3-211)
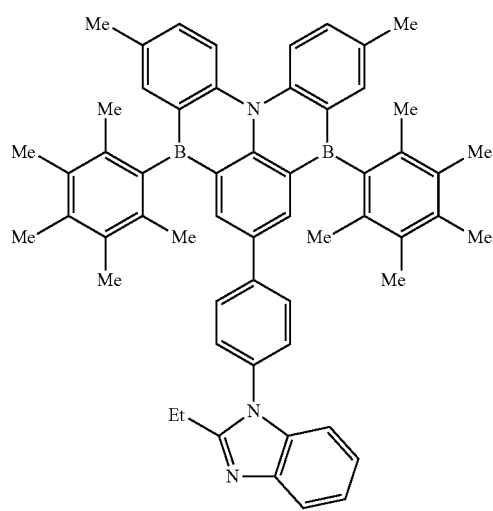
(1-3-212)
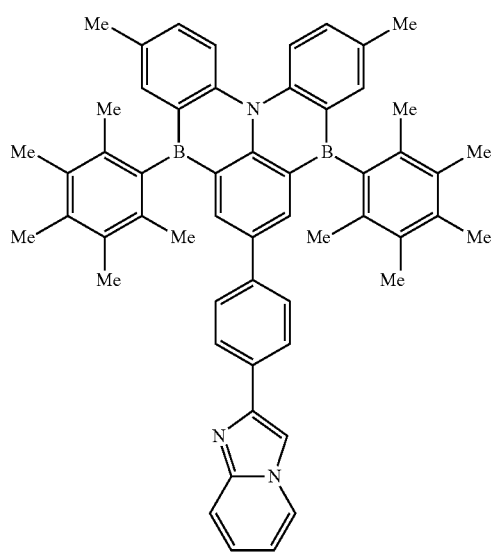

-continued
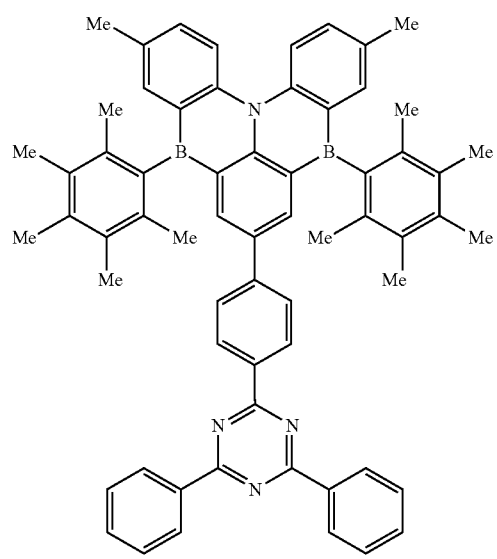
(1-3-213)
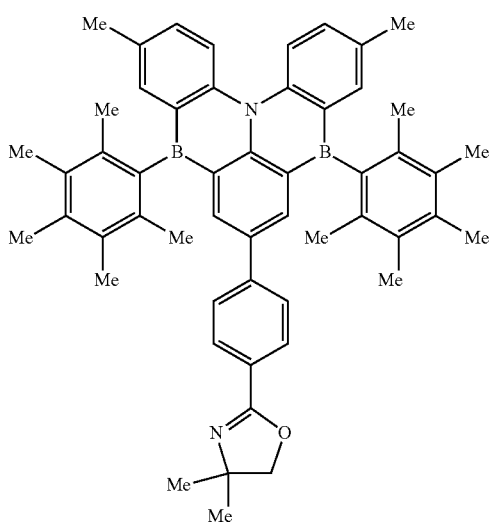
(1-3-214)
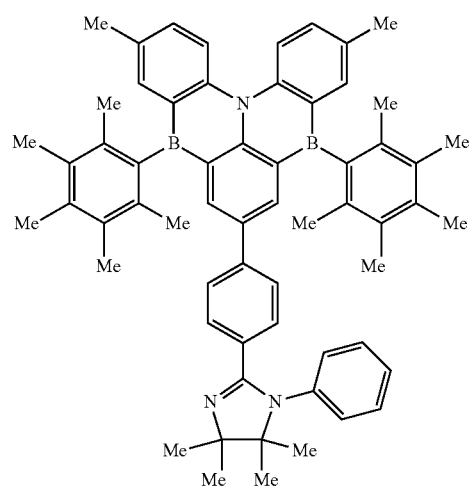
(1-3-215)
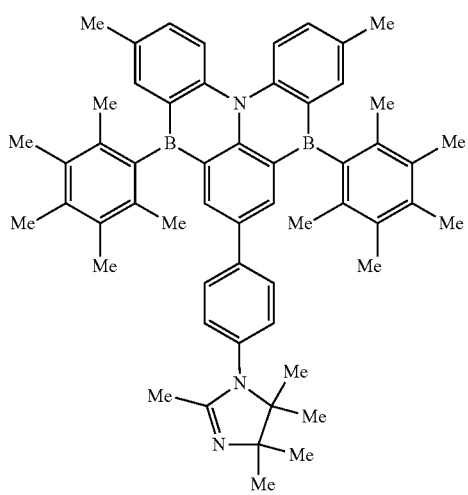
(1-3-216)
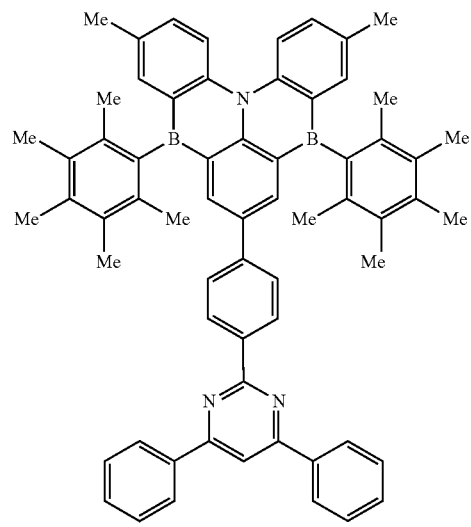
(1-3-217)
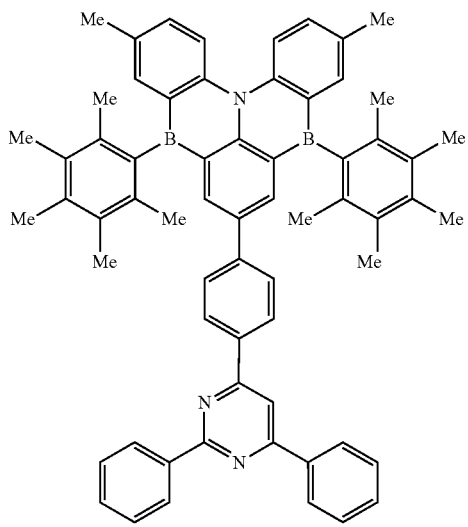
(1-3-218)

-continued
(1-3-219)
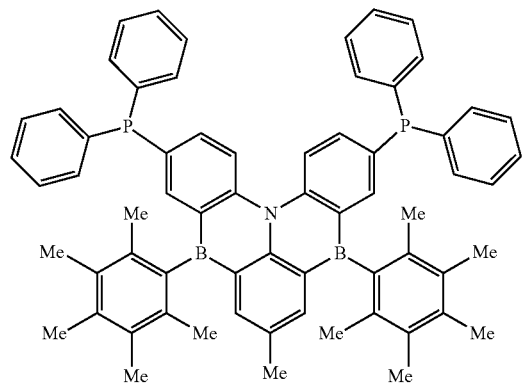
(1-3-220)
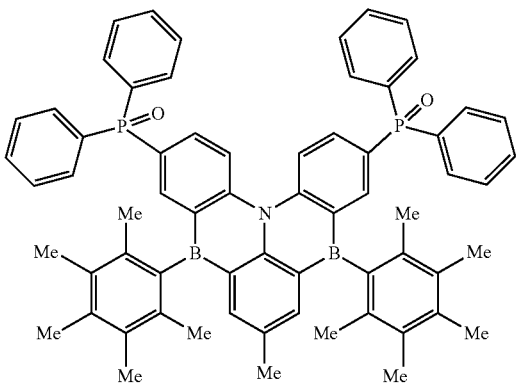
(1-3-221)
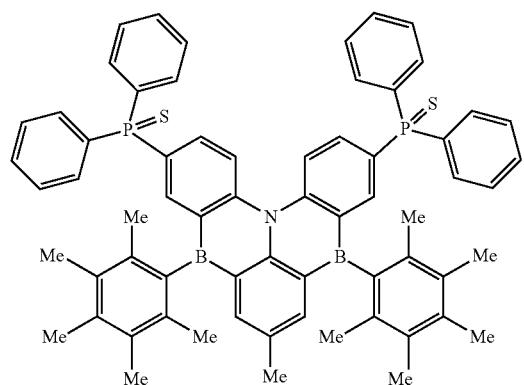
(1-3-222)
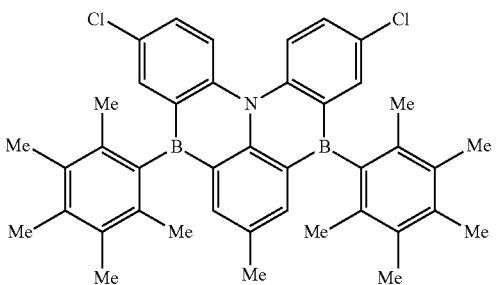
(1-3-223)
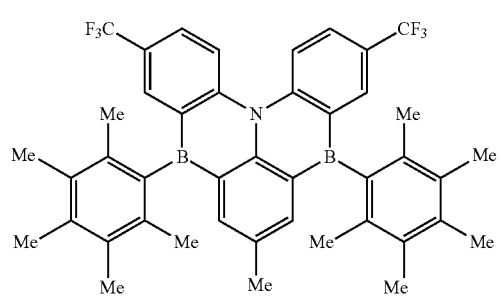
(1-3-224)
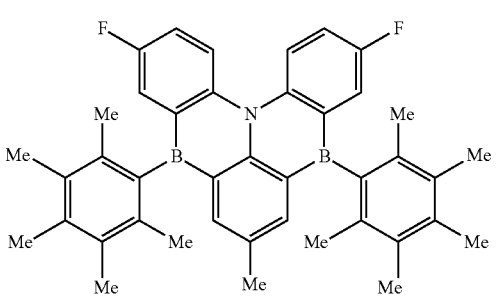
(1-4-1)
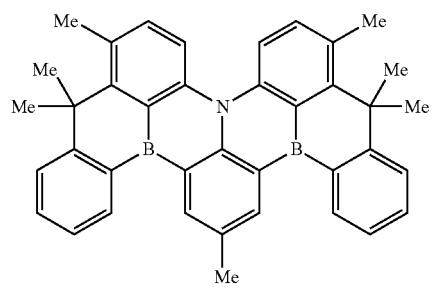
(1-4-2)
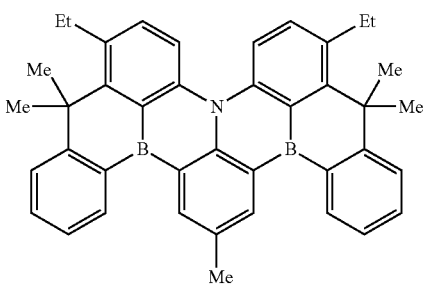

(1-4-3) 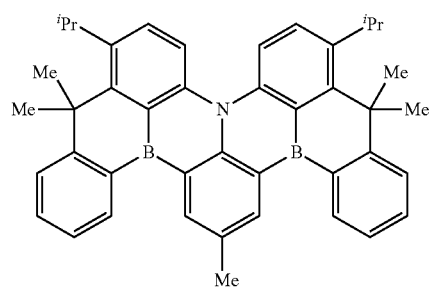
(1-4-4) 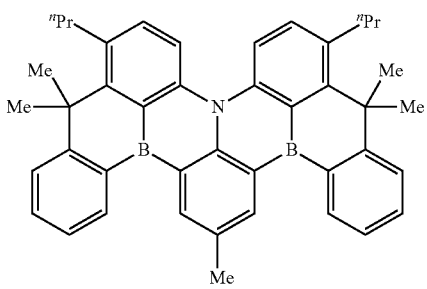
(1-4-5) 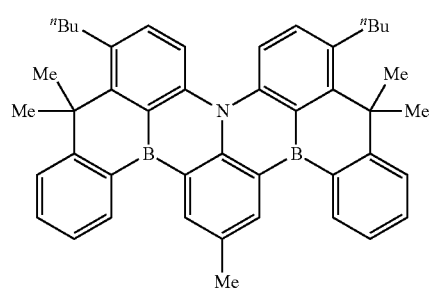
(1-4-6) 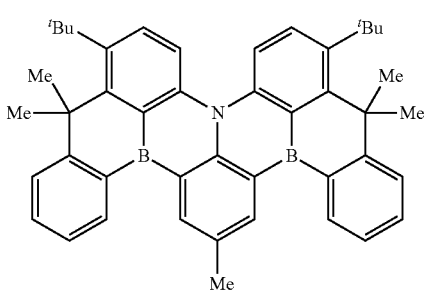
(1-4-7) 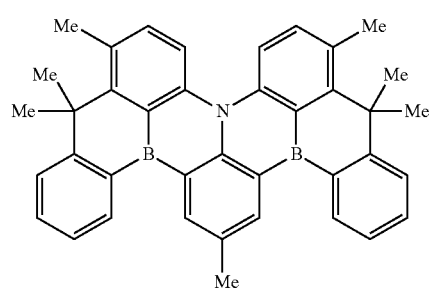
(1-4-8) 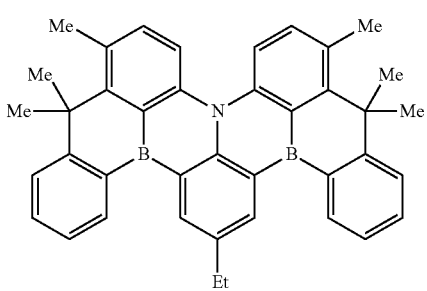
(1-4-9) 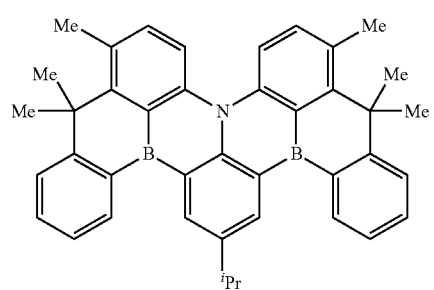
(1-4-10) 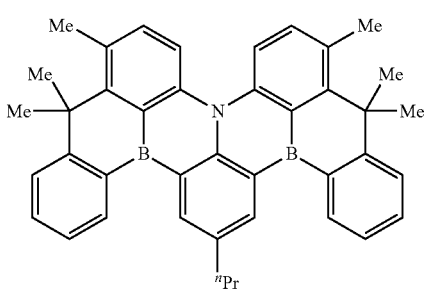
(1-4-11) 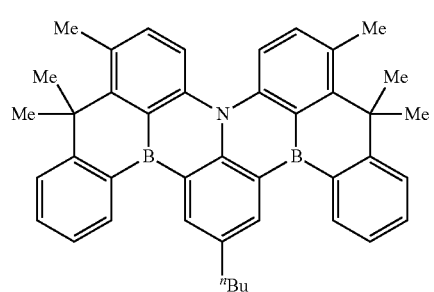
(1-4-12) 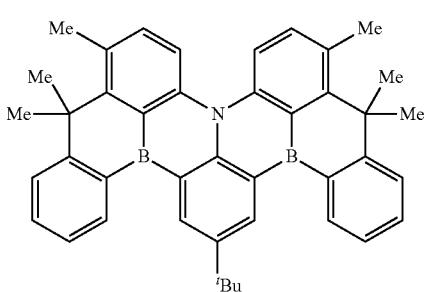

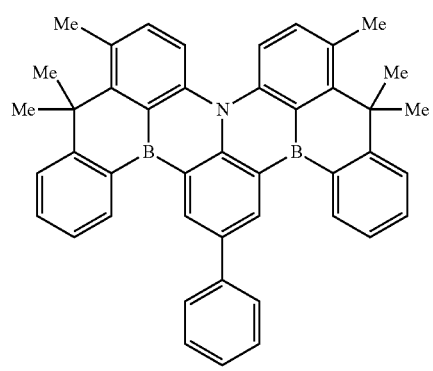 (1-4-13)
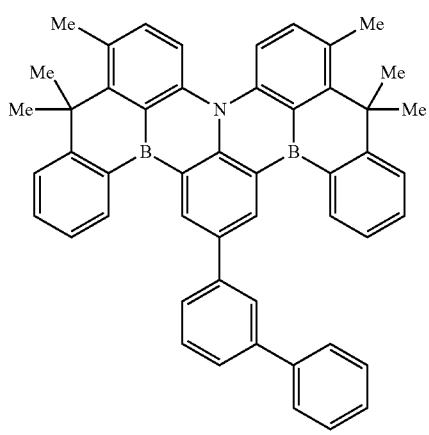 (1-4-14)
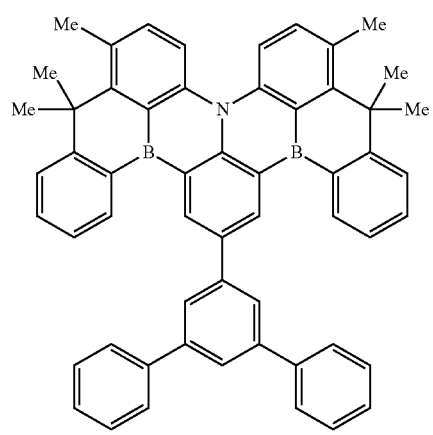 (1-4-15)
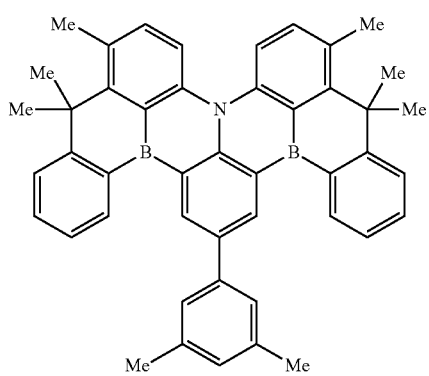 (1-4-16)
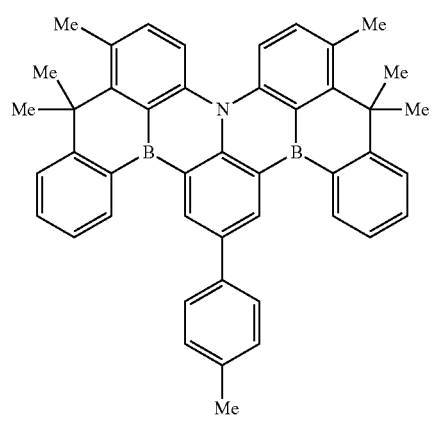 (1-4-17)
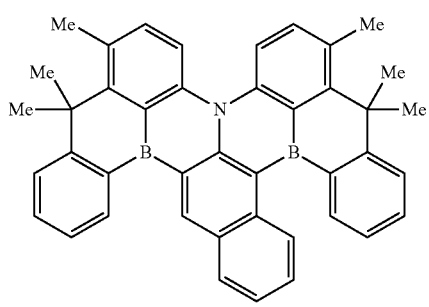 (1-4-18)

-continued
(1-4-25)
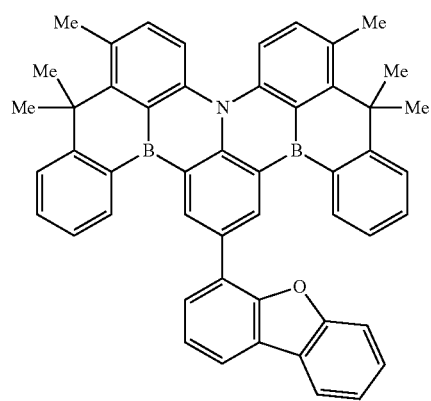
(1-4-26)
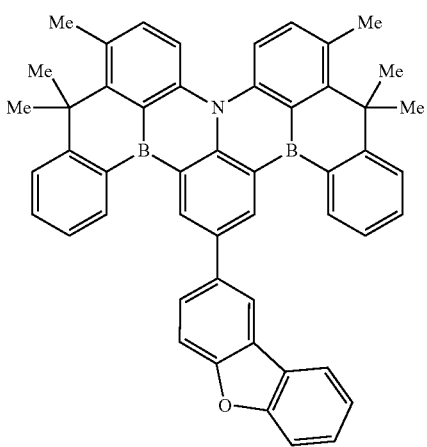
(1-4-27)
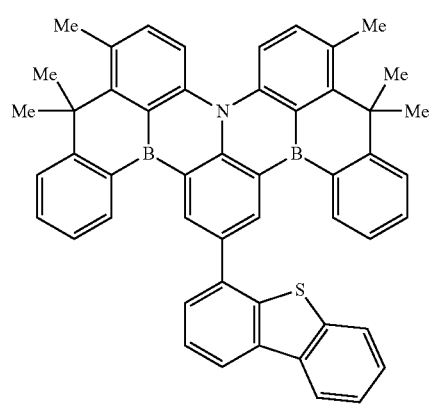
(1-4-28)
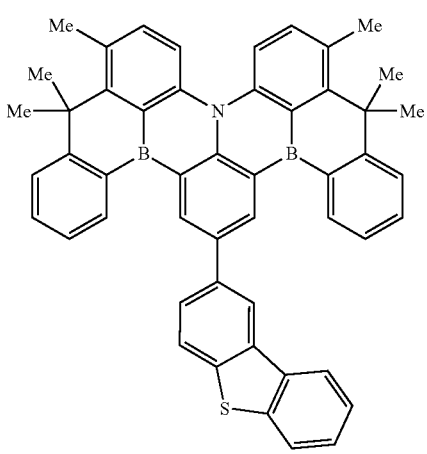
(1-4-29)
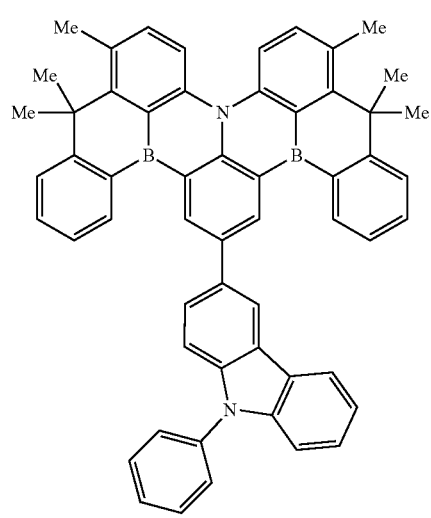
(1-4-30)
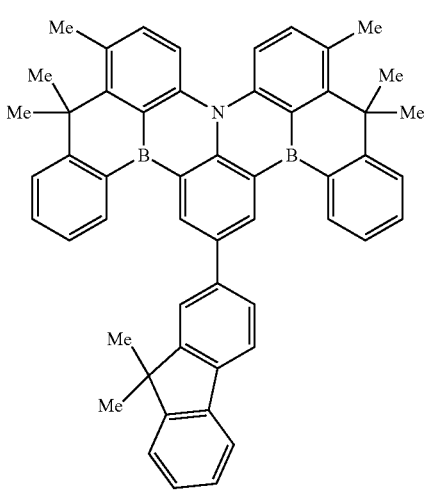

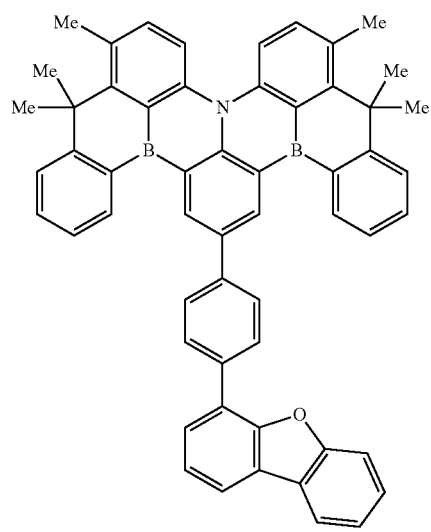
(1-4-31)
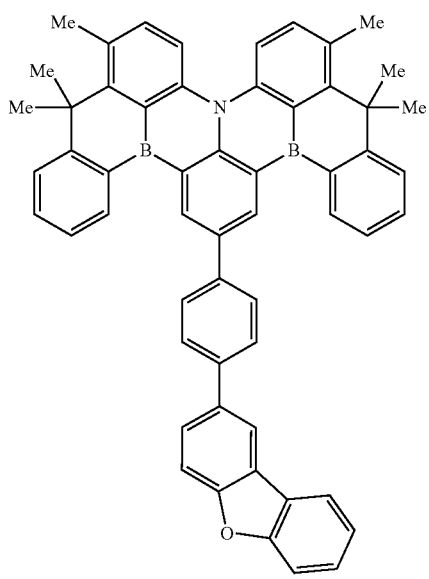
(1-4-32)
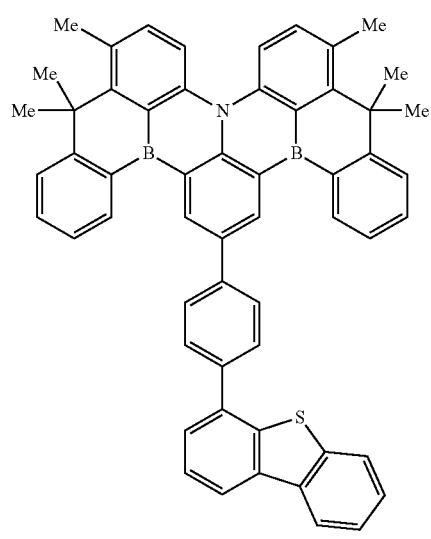
(1-4-33)
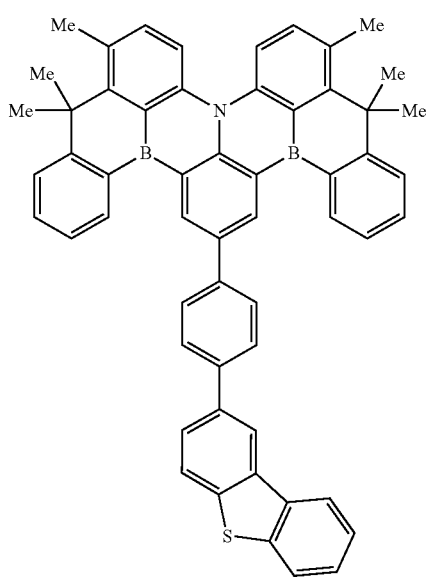
(1-4-34)

-continued
(1-4-35)
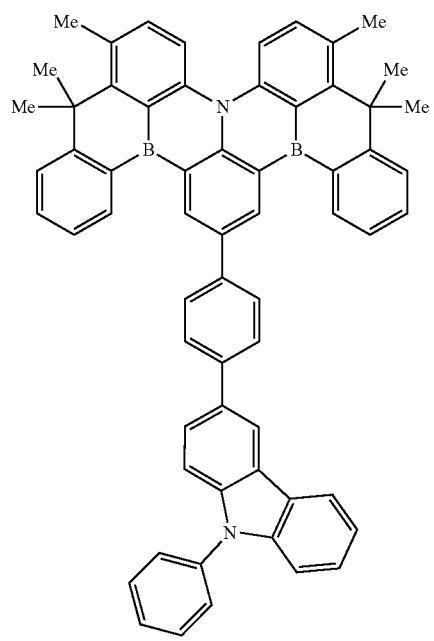
(1-4-36)
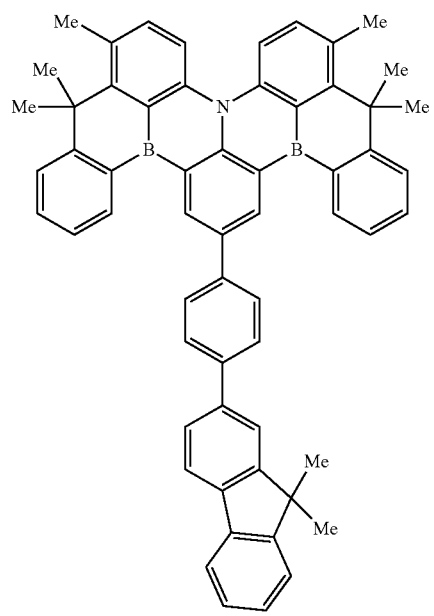
(1-4-45)
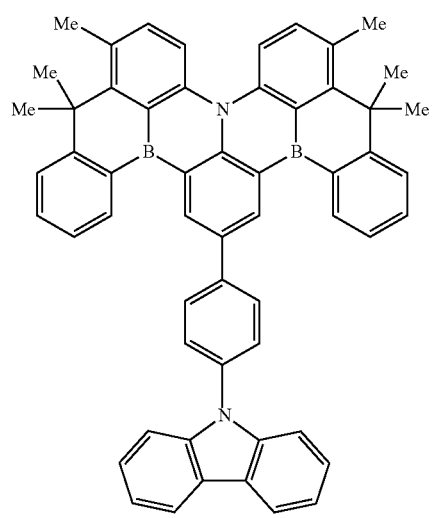
(1-4-46)
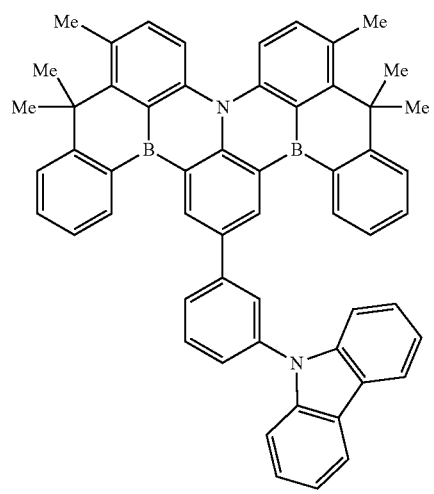
(1-4-47)
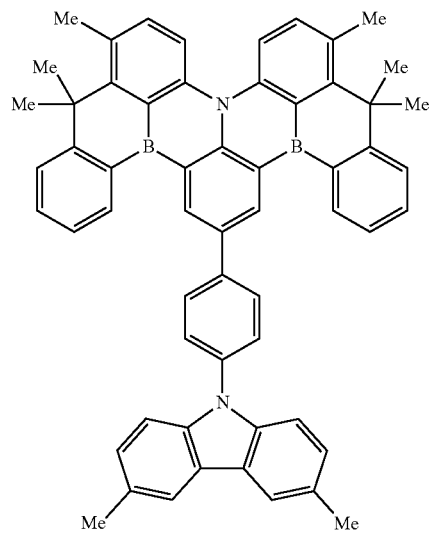
(1-4-48)
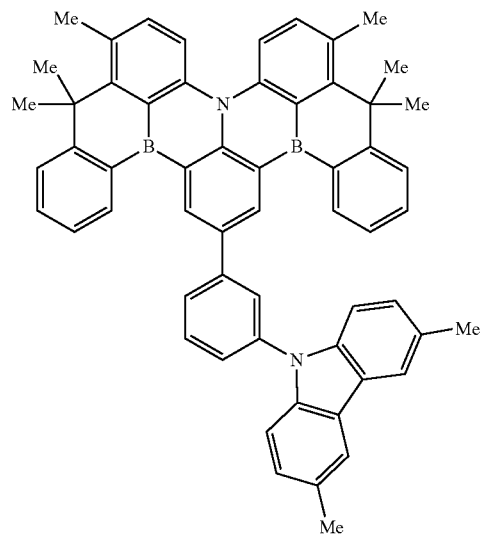

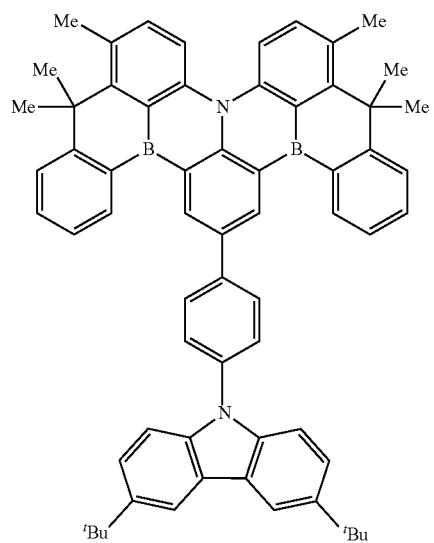
(1-4-49)
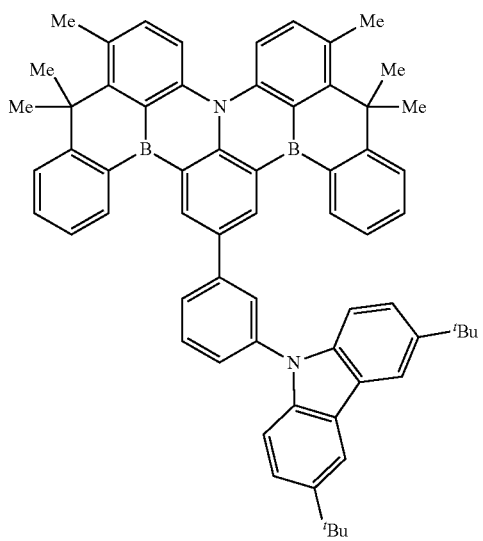
(1-4-50)
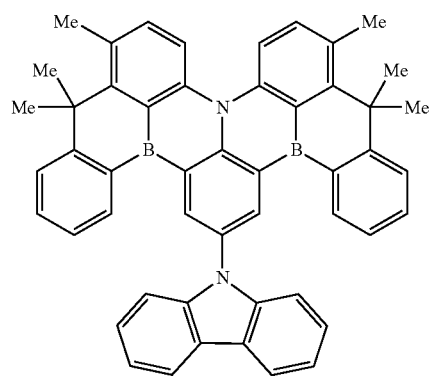
(1-4-51)
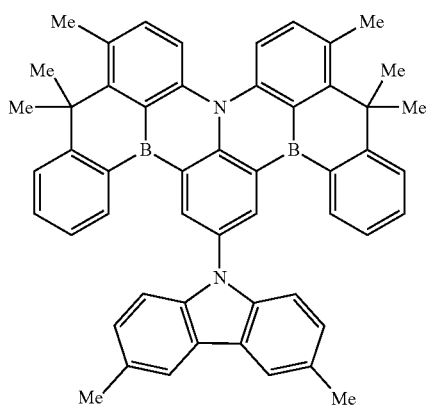
(1-4-52)
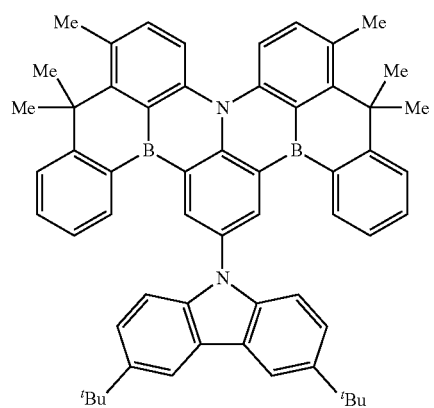
(1-4-53)
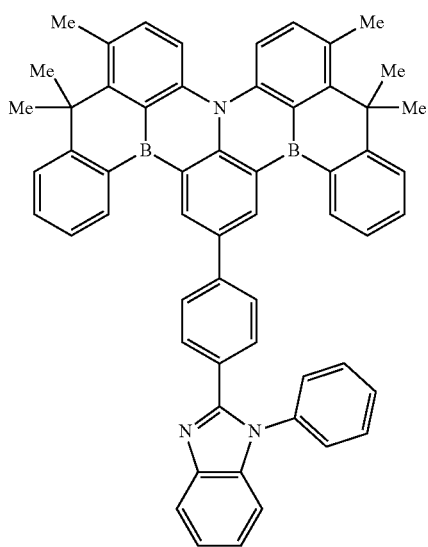
(1-4-54)

-continued
| | |
|---|---|
| (1-4-55) 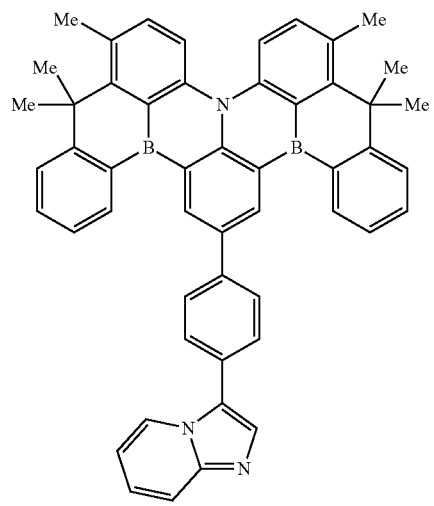 | (1-4-56) 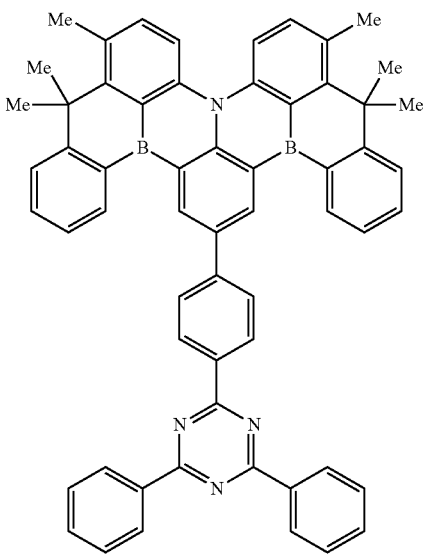 |
| (1-4-65) 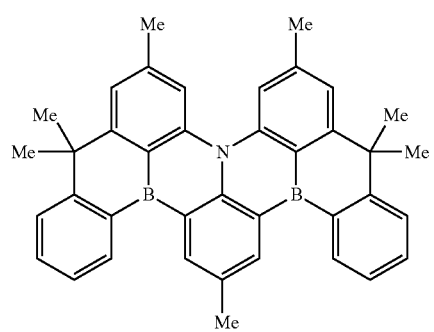 | (1-4-66) 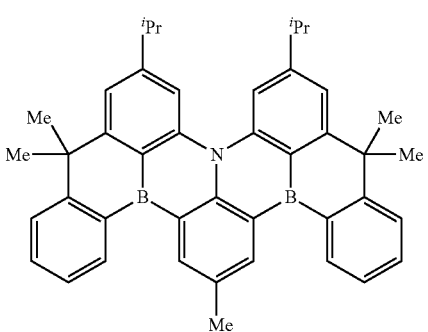 |
| (1-4-67) 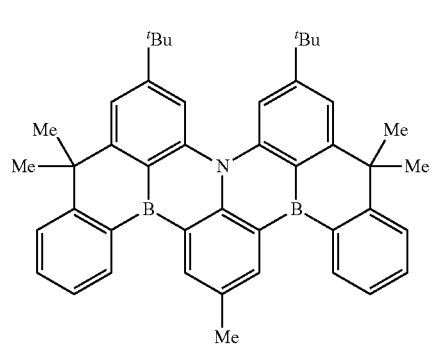 | (1-4-68) 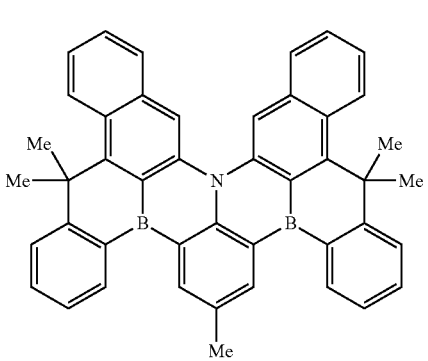 |
| (1-4-69) 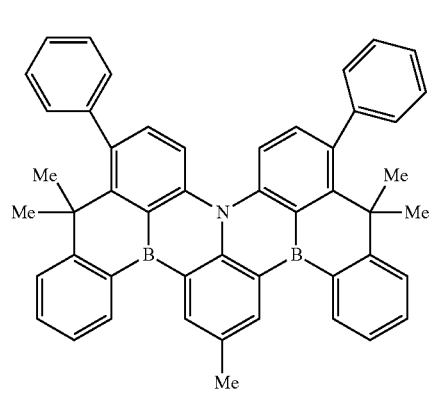 | (1-4-70) 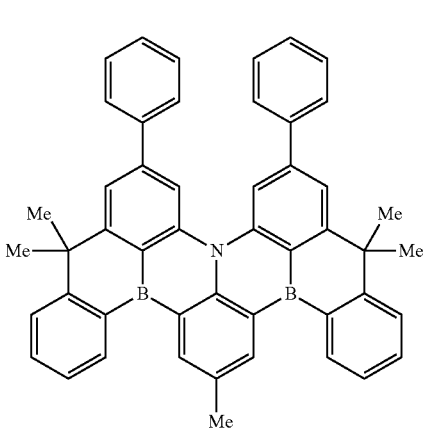 |

-continued
(1-4-71)
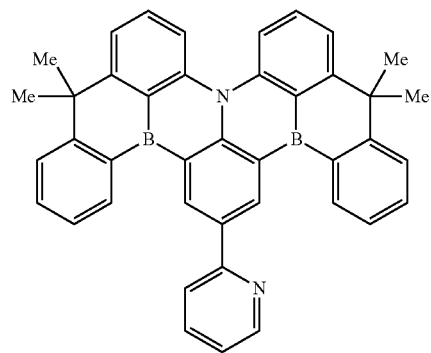
(1-4-72)
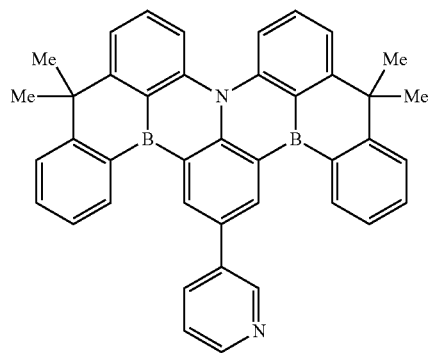
(1-4-73)
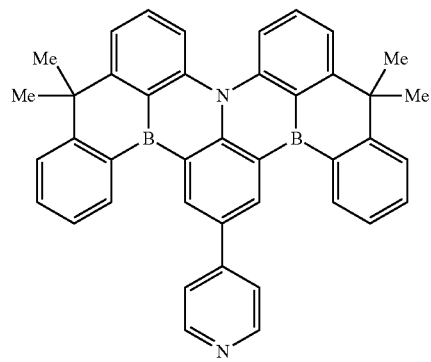
(1-4-74)
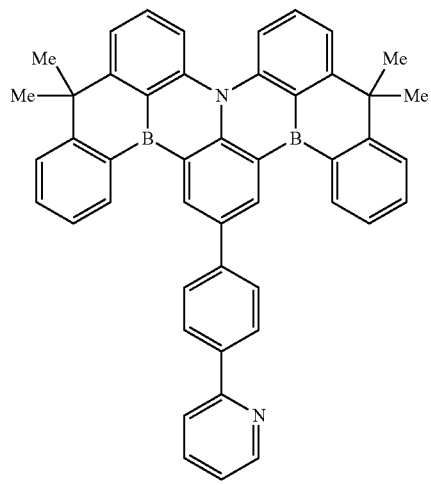
(1-4-75)
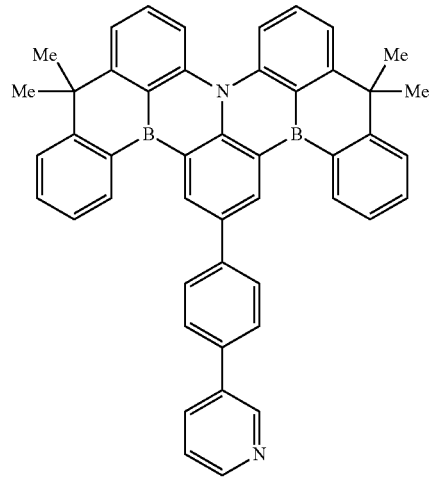
(1-4-76)
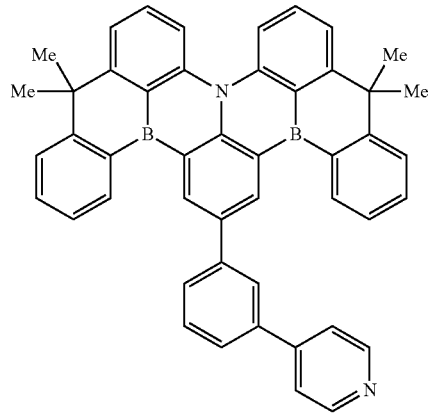

-continued
(1-4-77)
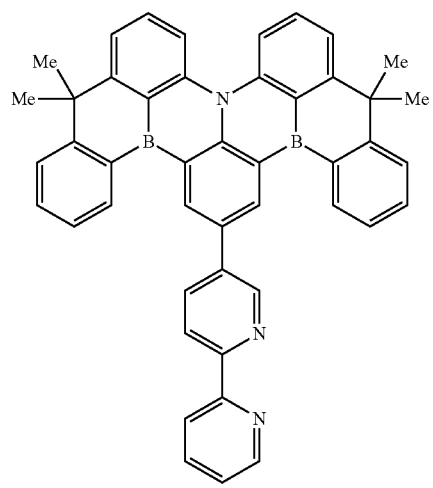
(1-4-78)
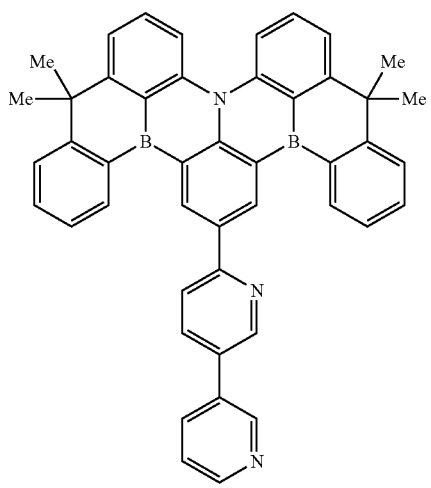
(1-4-79)
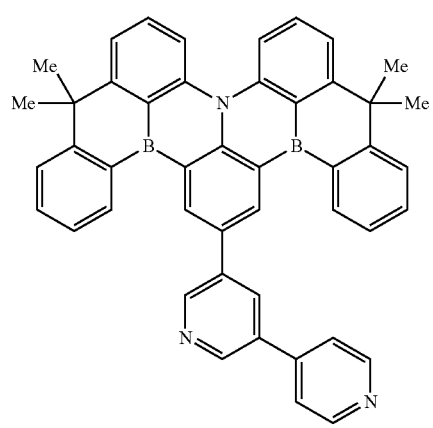
(1-4-85)
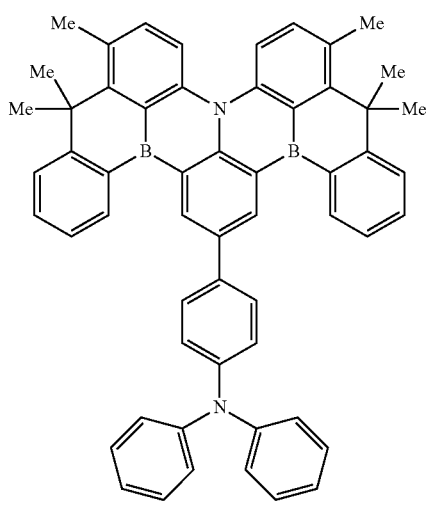
(1-4-86)
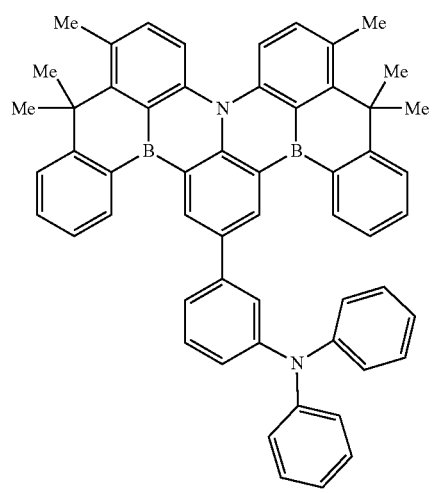
(1-4-87)
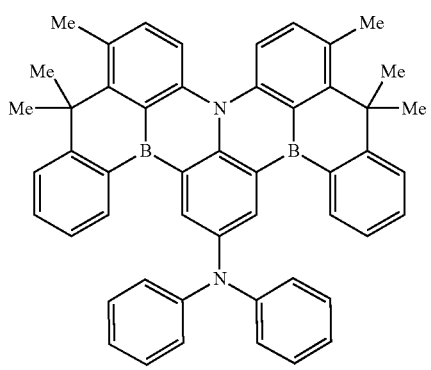

-continued
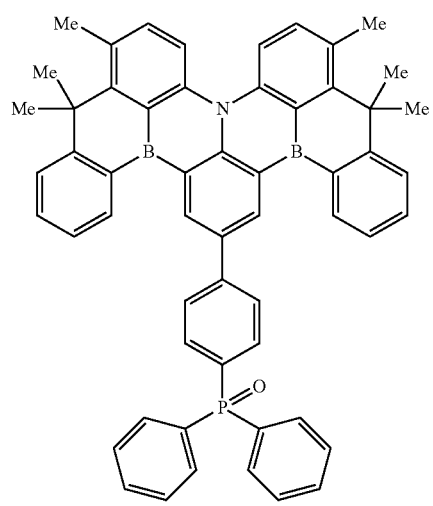
(1-4-88)
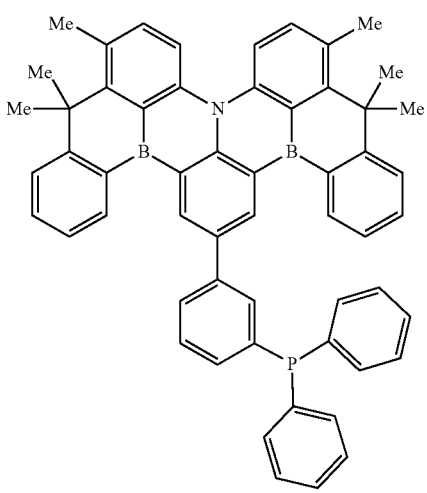
(1-4-89)
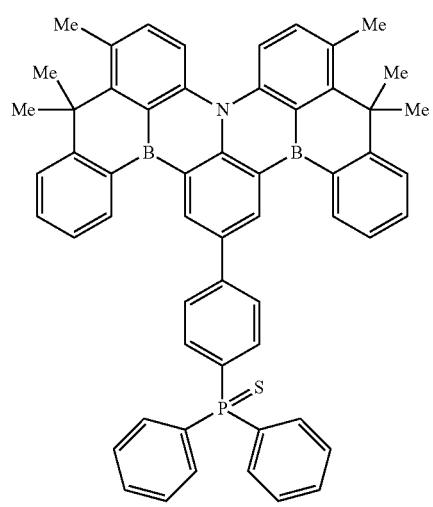
(1-4-90)
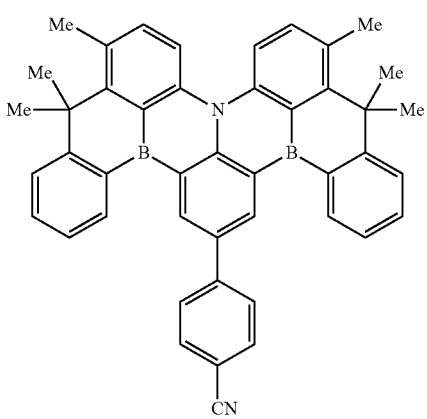
(1-4-91)
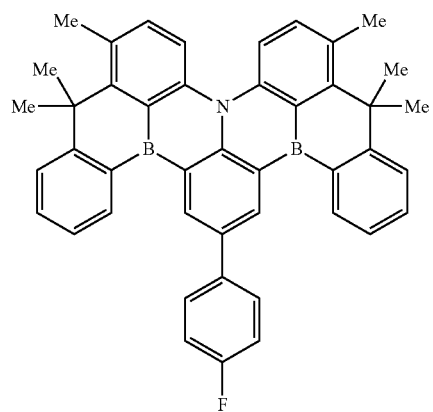
(1-4-92)
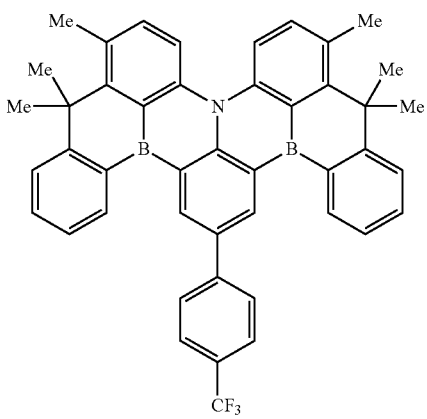
(1-4-93)

-continued
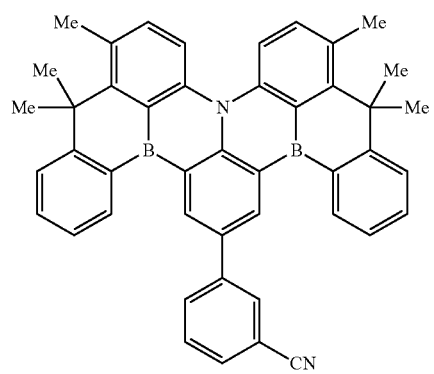
(1-4-94)
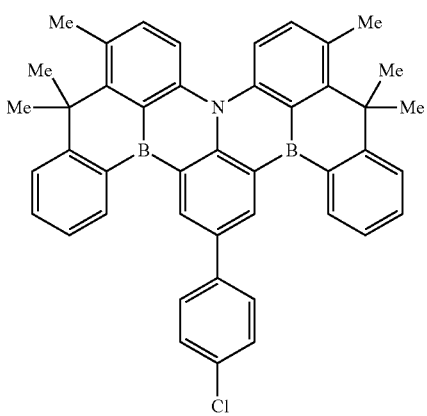
(1-4-95)
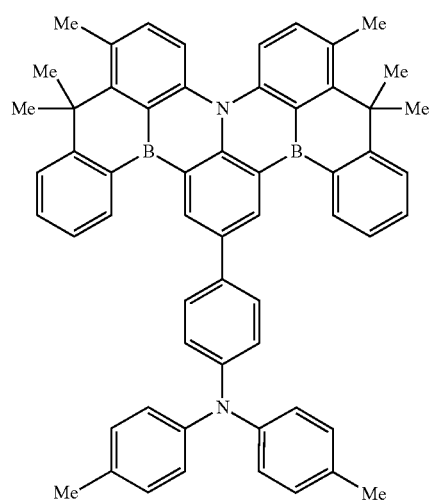
(1-4-96)
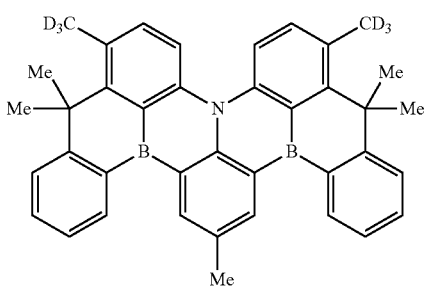
(1-4-97)
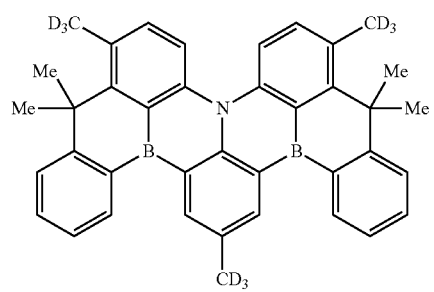
(1-4-98)
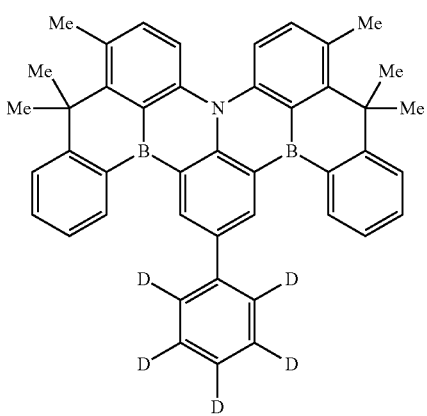
(1-4-99)

-continued
(1-5-1)
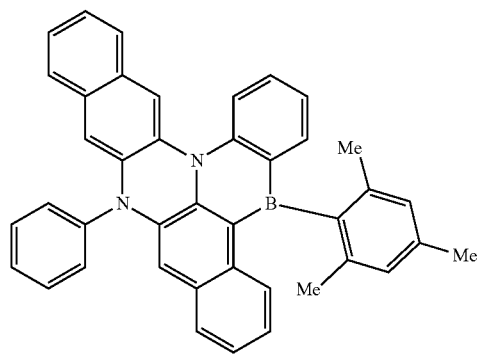
(1-5-2)
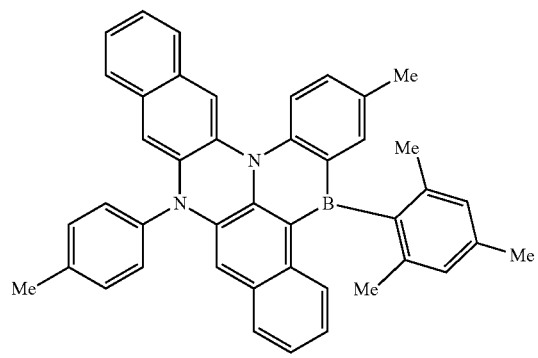
(1-5-3)
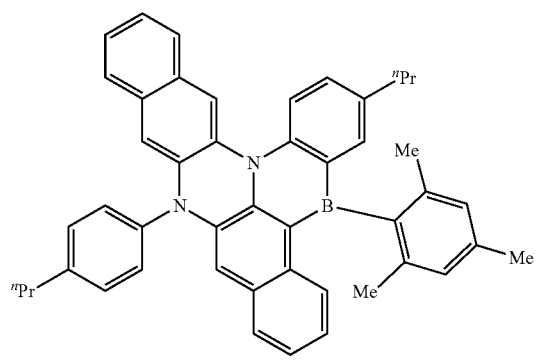
(1-5-4)
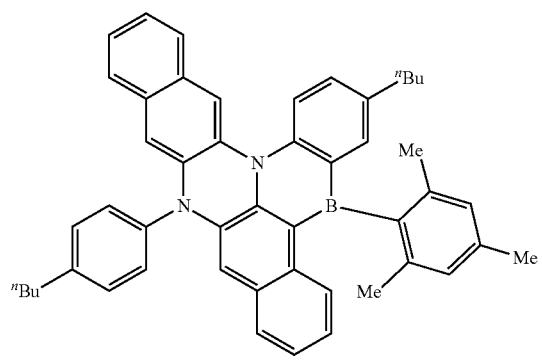
(1-5-5)
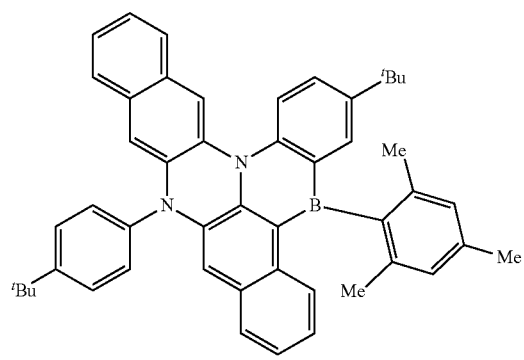
(1-5-6)
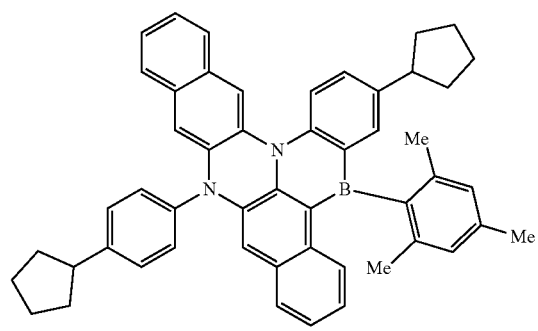
(1-5-7)
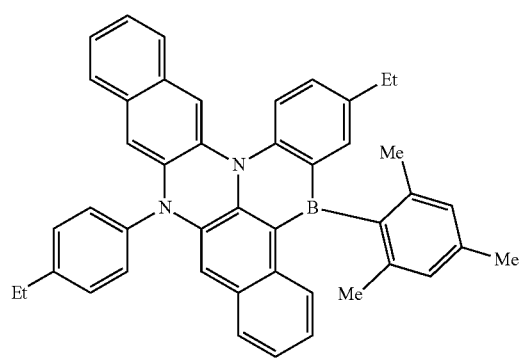
(1-5-8)
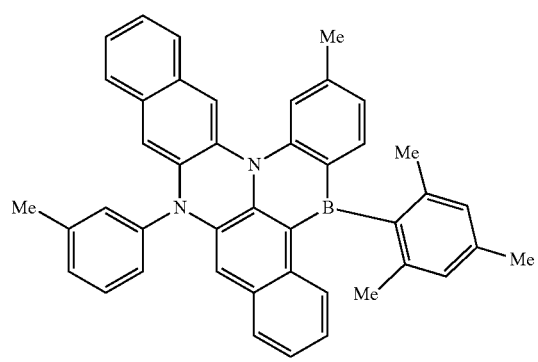

(1-5-9)
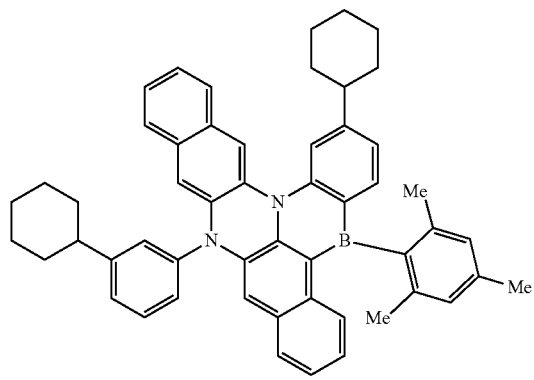
(1-5-10)
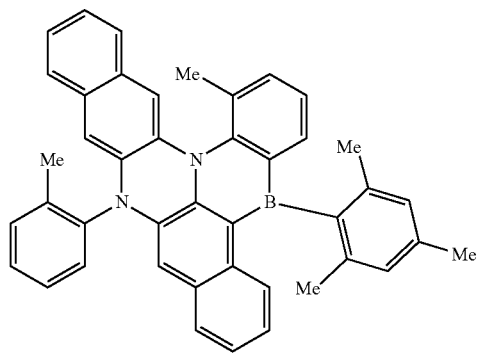
(1-5-11)
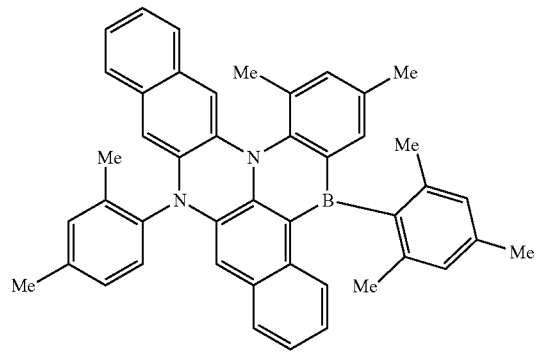
(1-5-12)
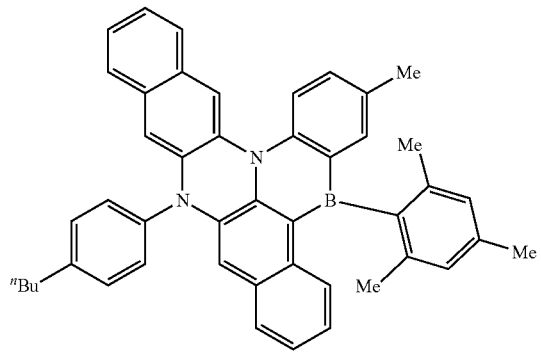
(1-5-13)
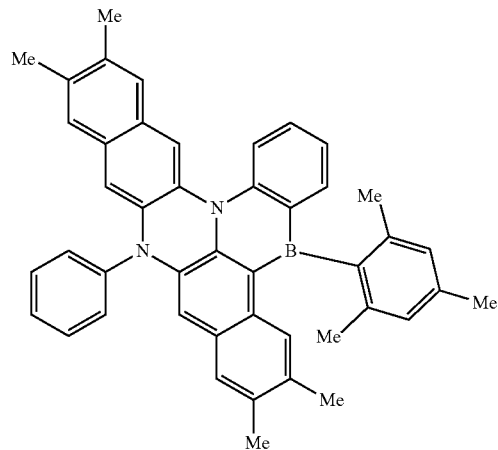
(1-5-14)
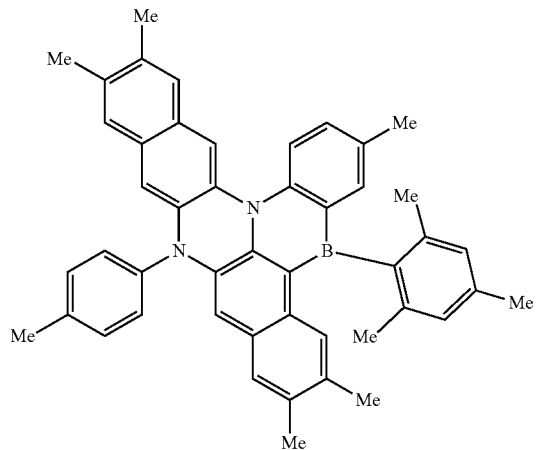
(1-5-15)
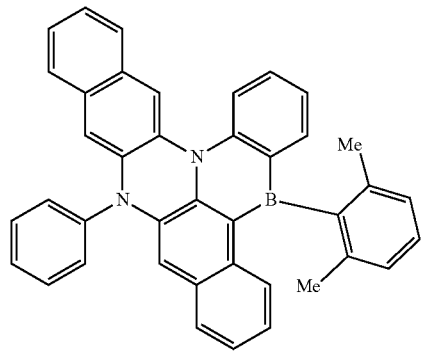
(1-5-25)
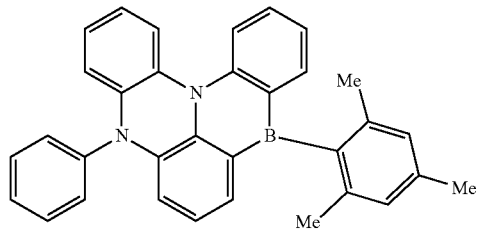

-continued
(1-5-26)
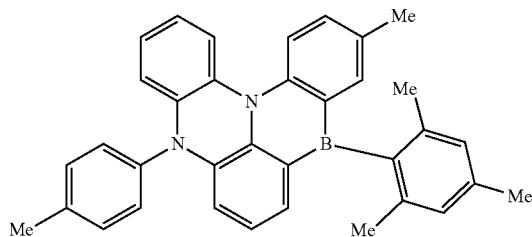
(1-5-27)
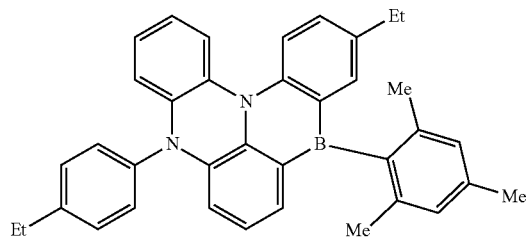
(1-5-28)
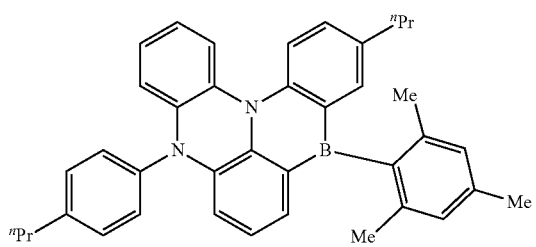
(1-5-29)
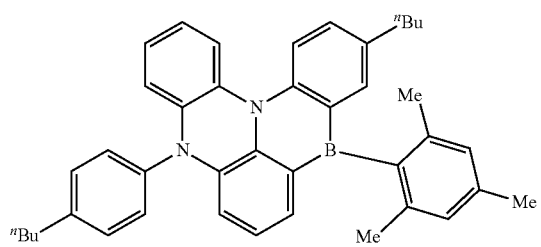
(1-5-30)
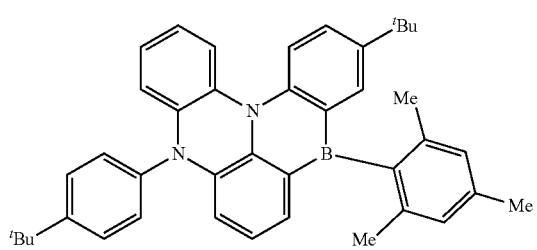
(1-5-31)
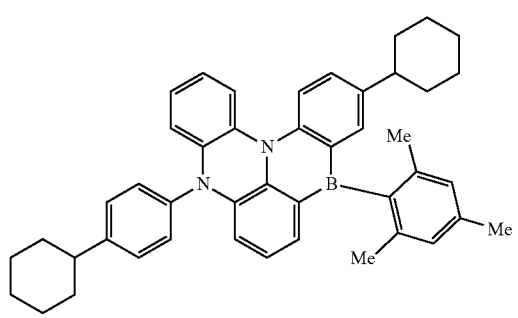
(1-5-32)
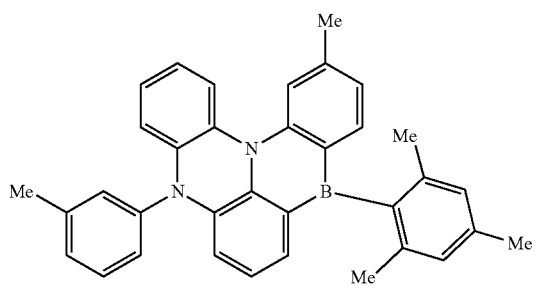
(1-5-33)
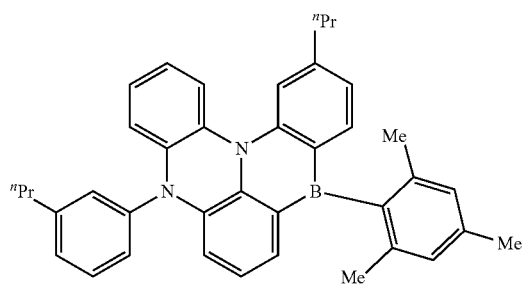
(1-5-34)
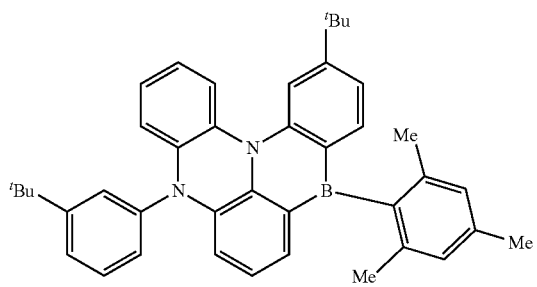
(1-5-35)
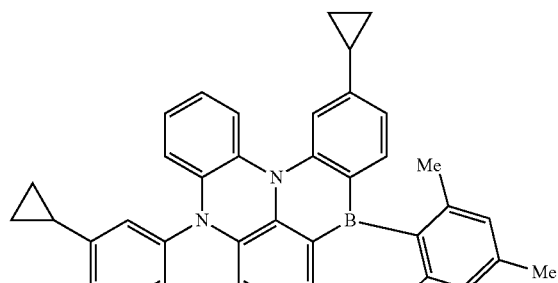

(1-5-36) 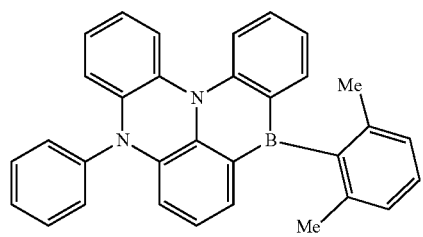
(1-5-37) 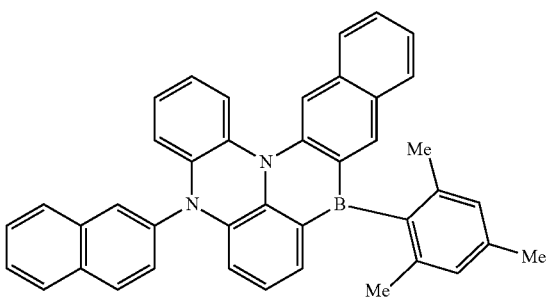
(1-5-38) 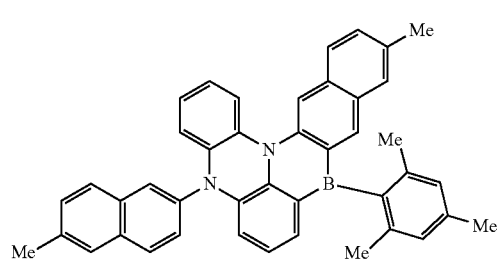
(1-5-39) 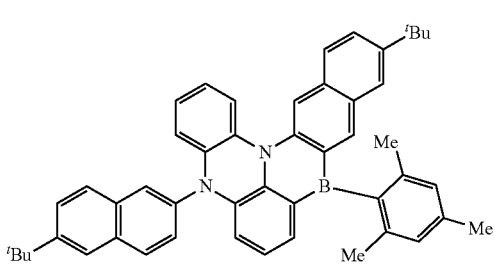
(1-5-40) 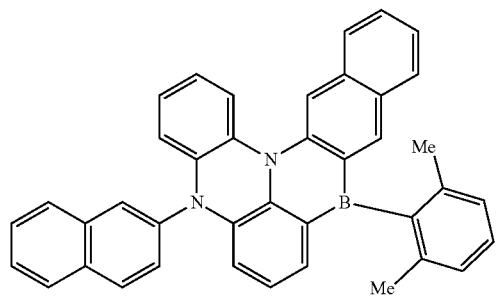
(1-5-41) 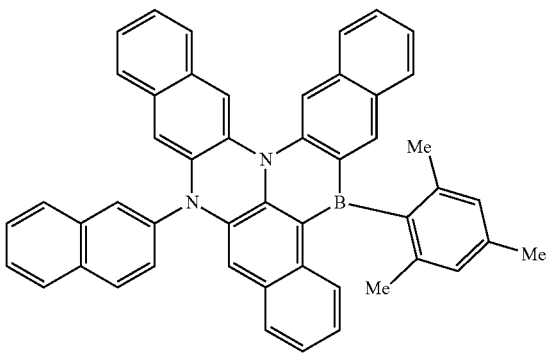
(1-5-42) 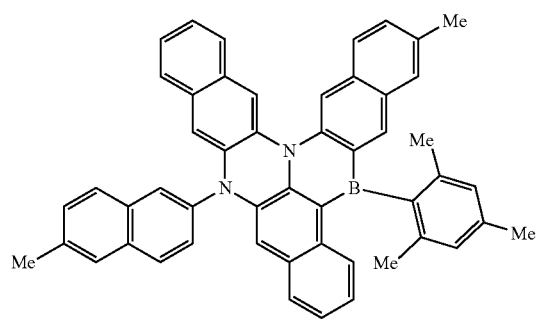
(1-5-43) 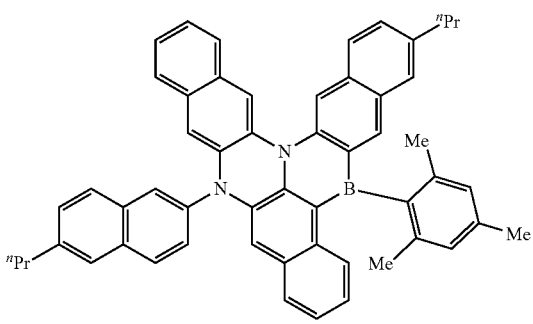

-continued
(1-5-44)
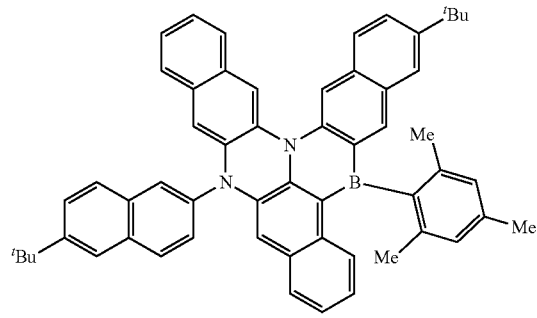
(1-5-45)
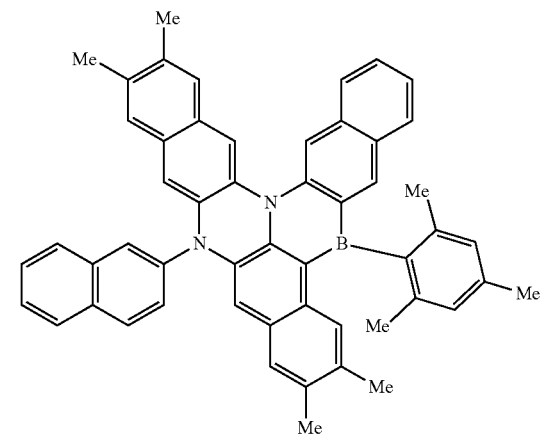
(1-5-55)
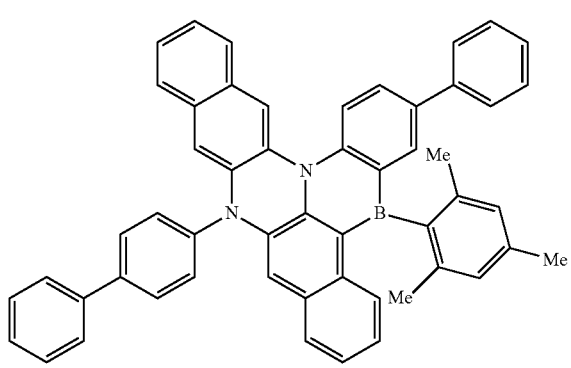
-continued
(1-5-57)
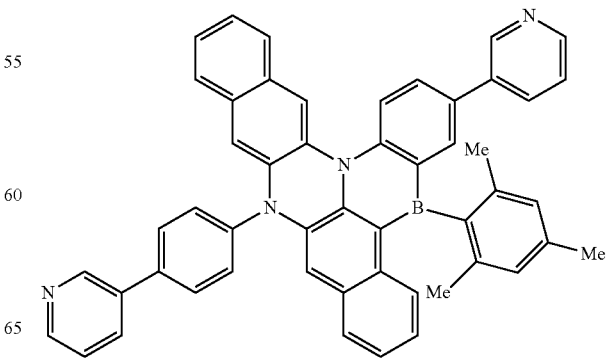
(1-5-56)
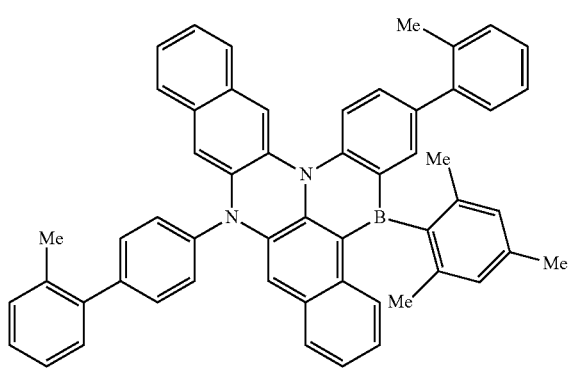
(1-5-58)

(1-5-59)
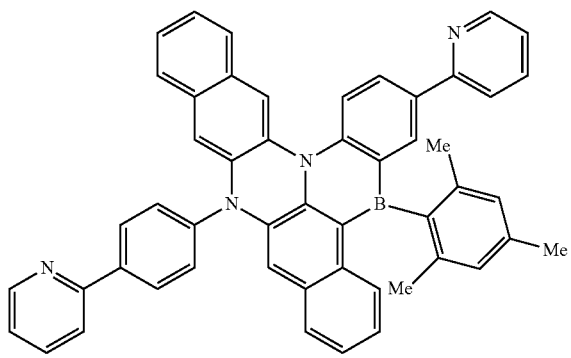
(1-5-60)
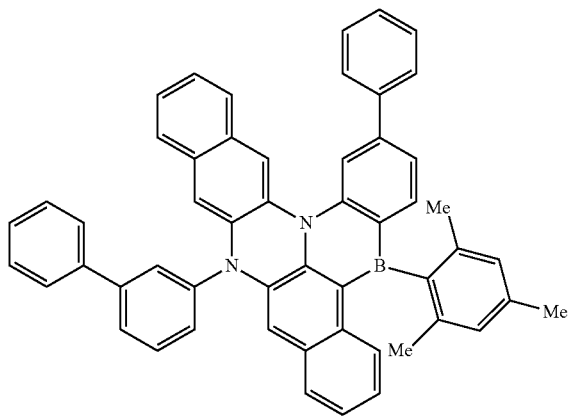
(1-5-61)
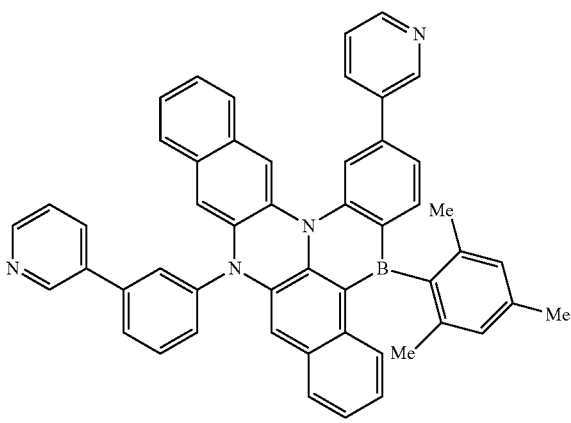
(1-5-62)
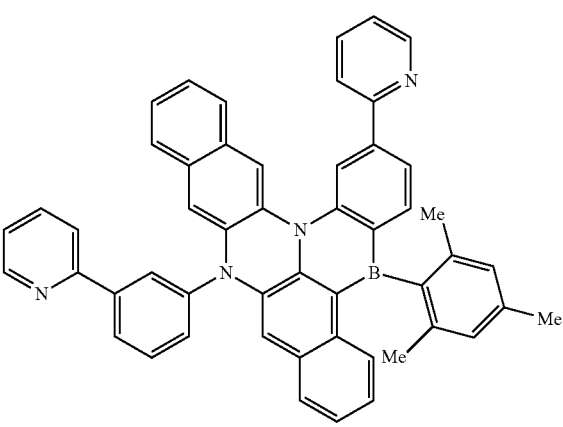
(1-5-63)
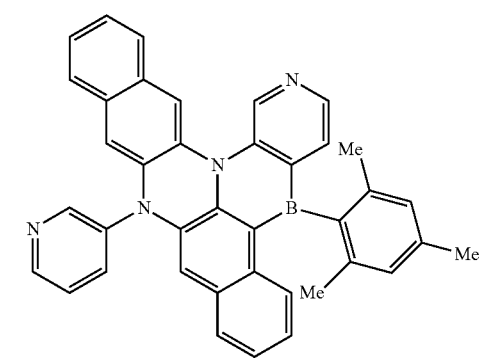
(1-5-64)
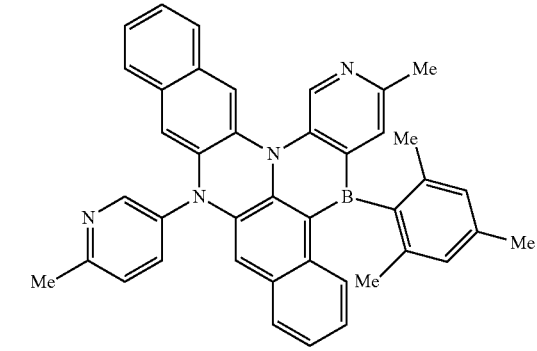
(1-5-65)
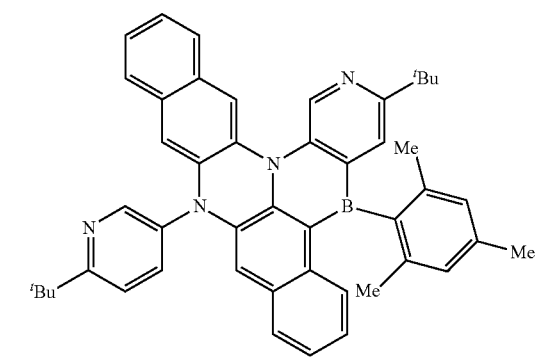

-continued
(1-5-66)
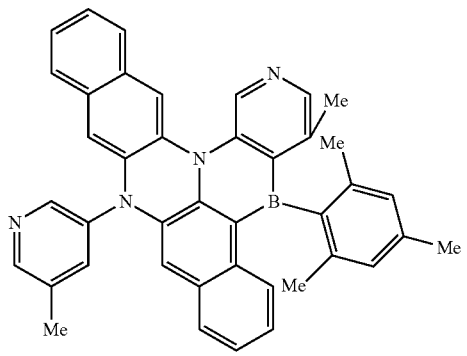
(1-5-57)
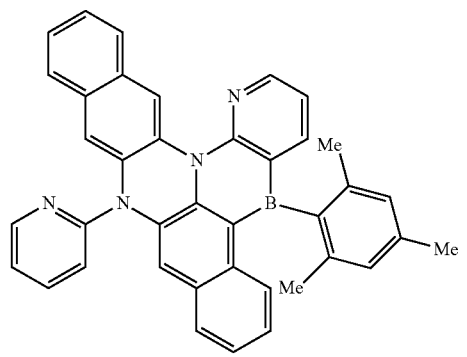
(1-5-58)
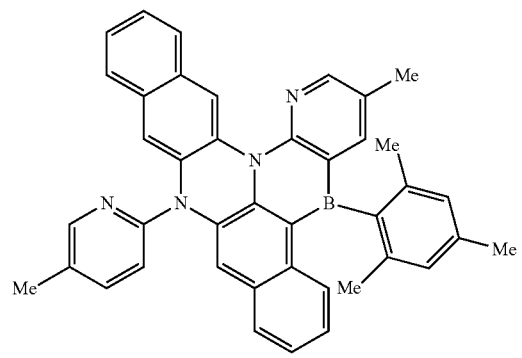
(1-5-59)
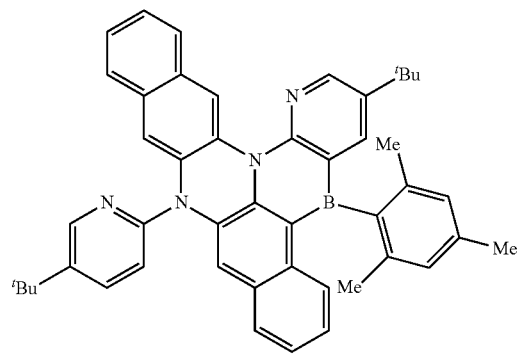
-continued
(1-5-70)
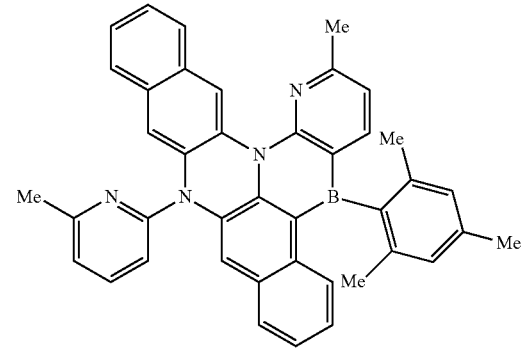
(1-5-71)
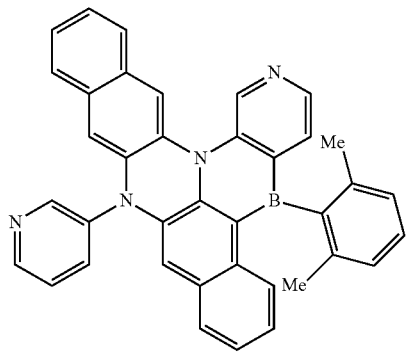
(1-5-72)
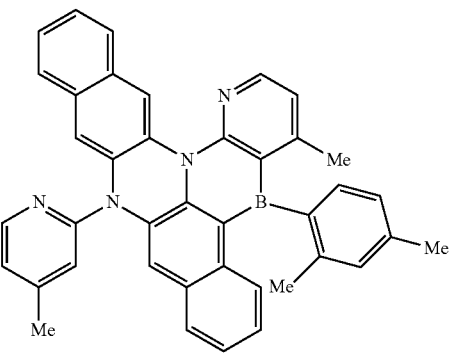
(1-5-80)
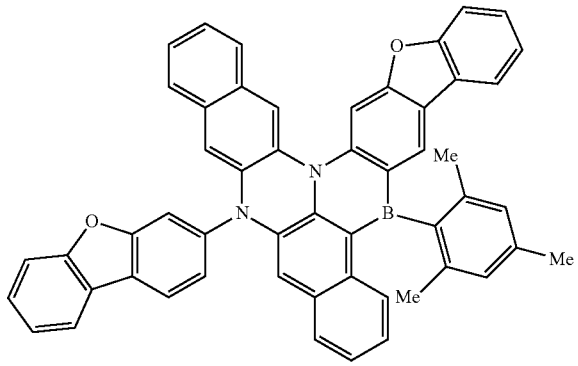

(1-5-81)
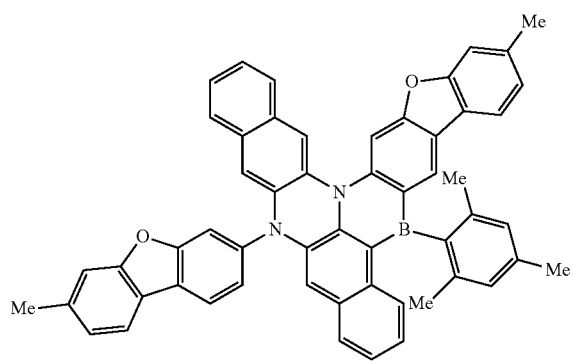
(1-5-82)
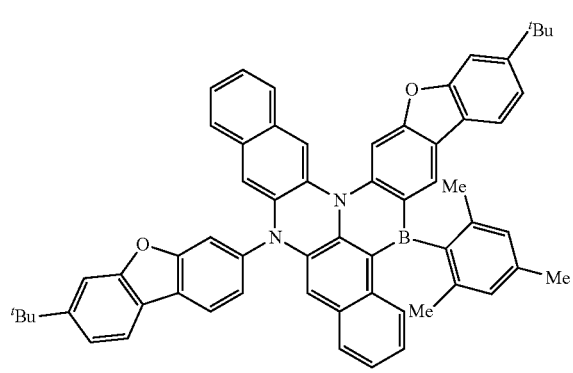
(1-5-83)
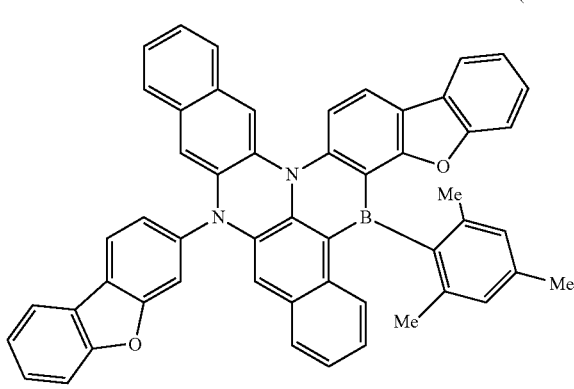
(1-5-84)
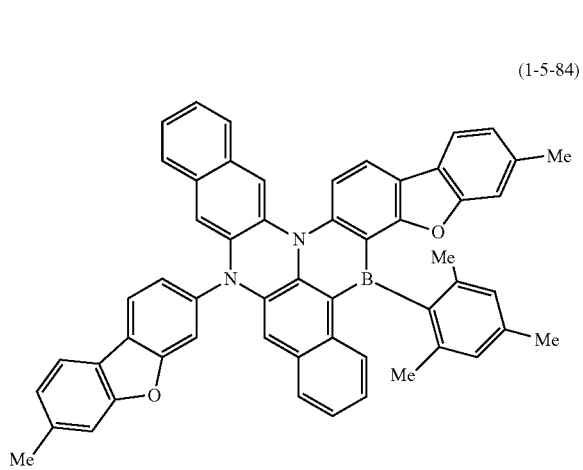
(1-5-85)
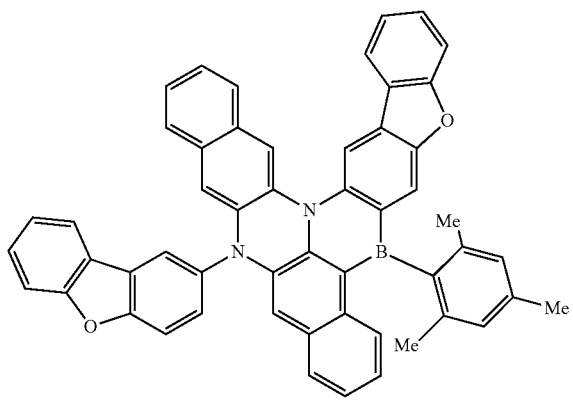
(1-5-86)
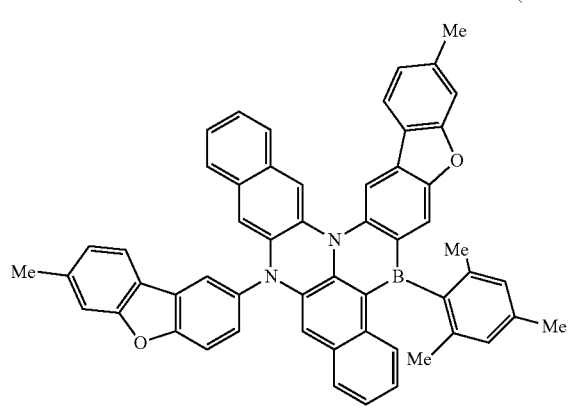
(1-5-87)
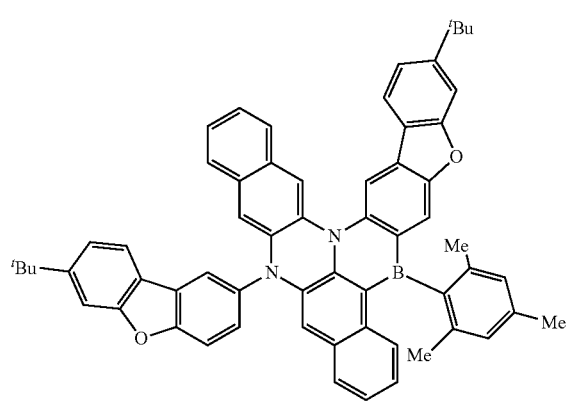

(1-5-88)
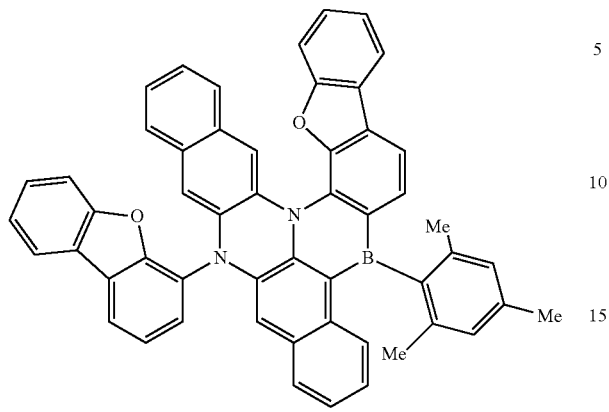
(1-5-91)
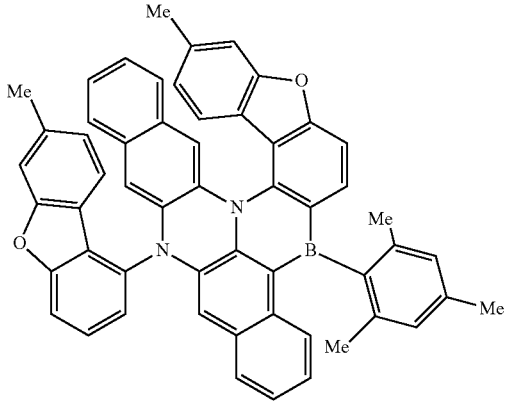
(1-5-89)
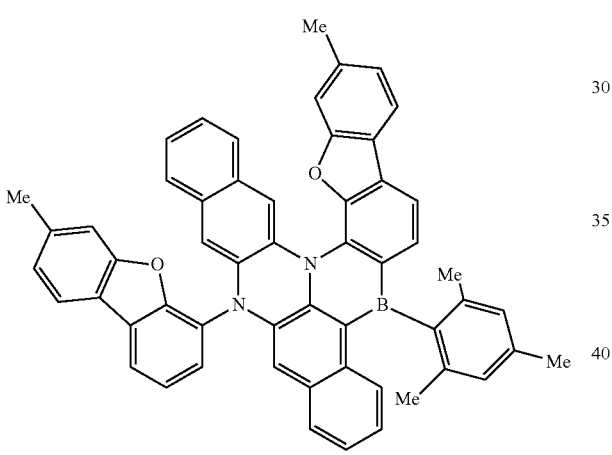
(1-5-95)
(1-5-96)
(1-5-90)
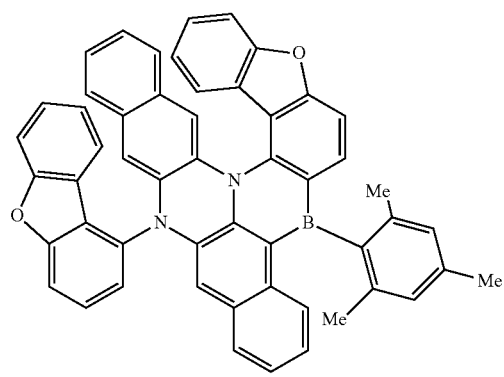
(1-5-97)
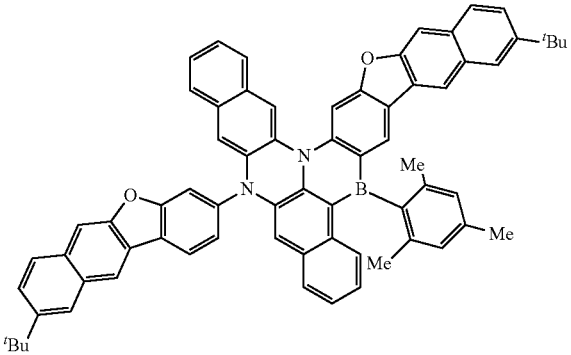

-continued
(1-5-98)
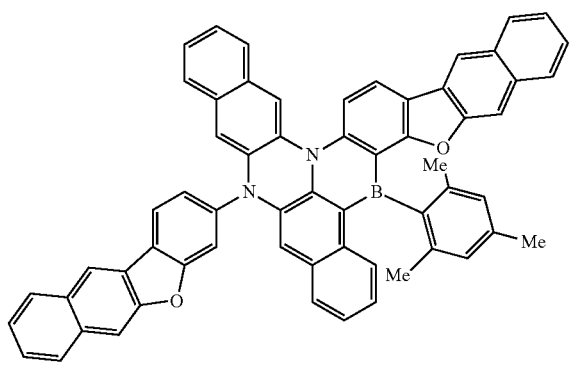
(1-5-101)
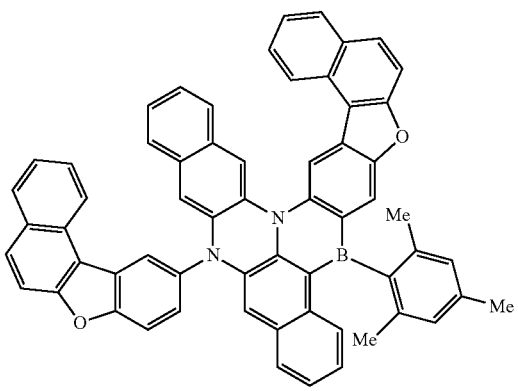
(1-5-99)
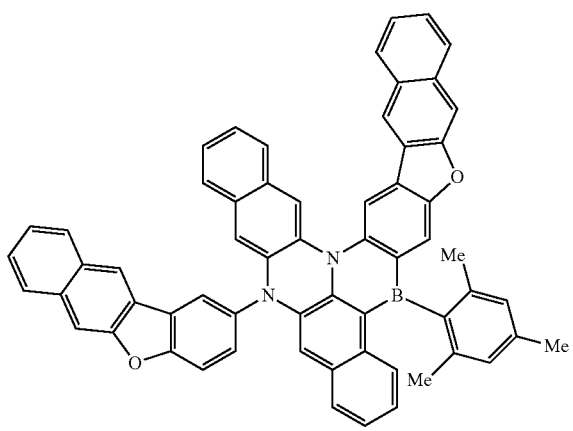
(1-5-102)
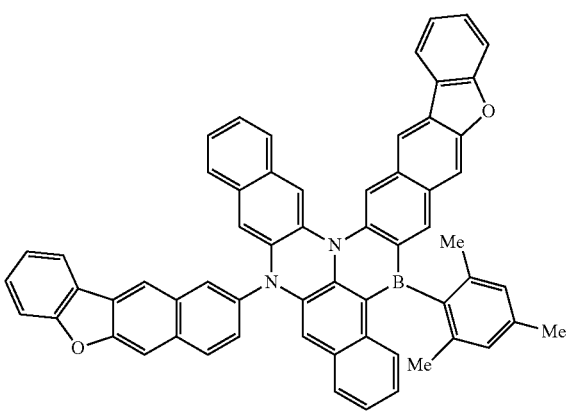
(1-5-100)
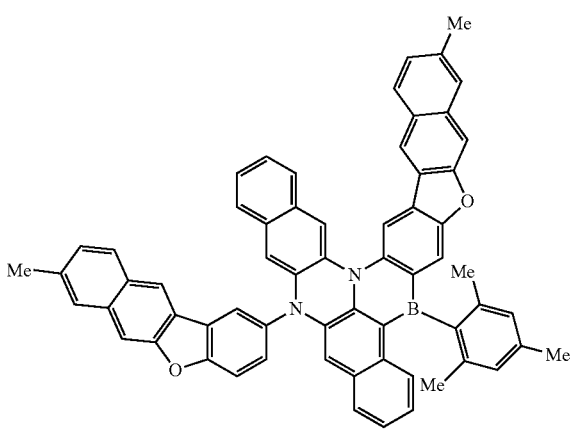
(1-5-103)
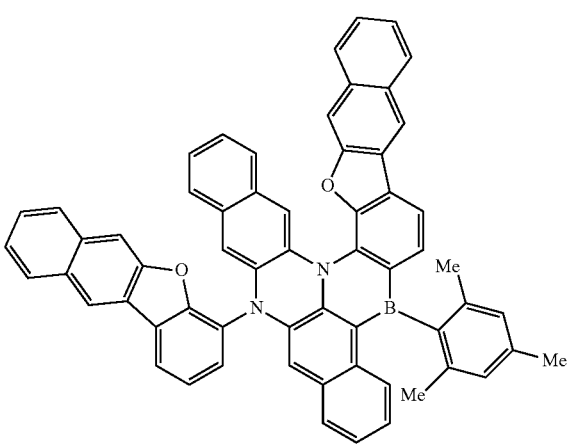

-continued
(1-5-104)
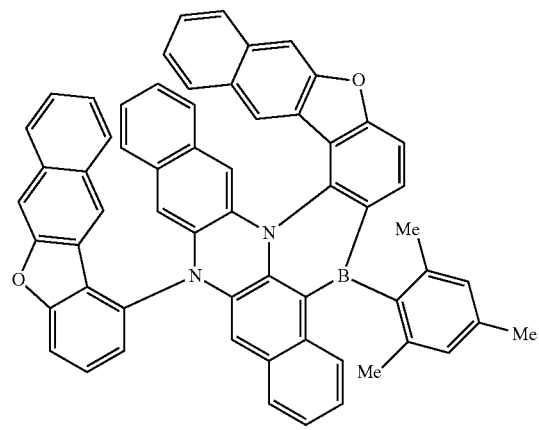
(1-5-110)
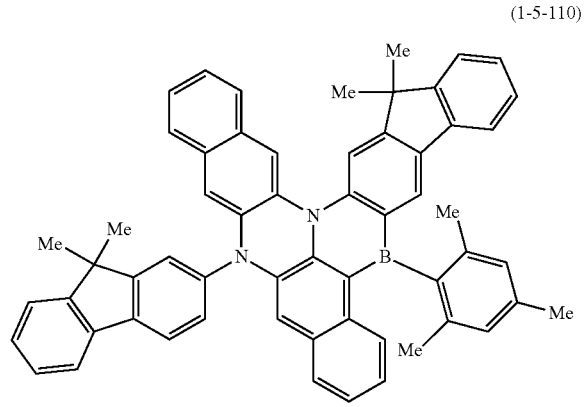
(1-5-111)
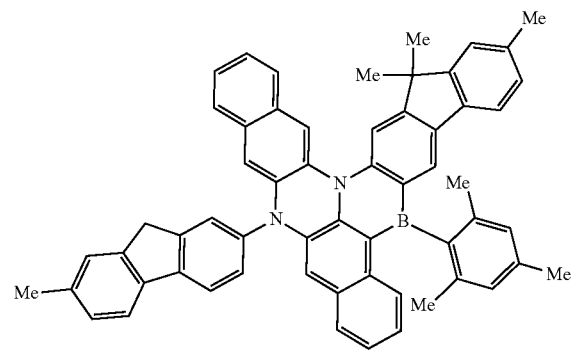
(1-5-112)
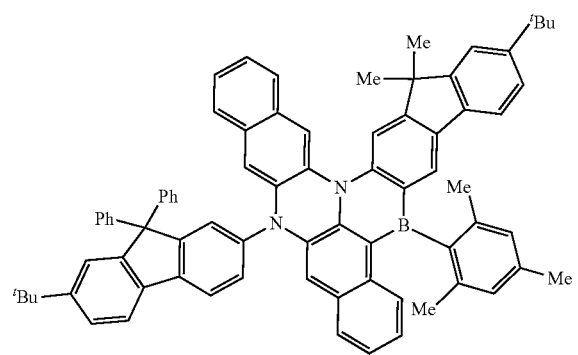
-continued
(1-5-113)
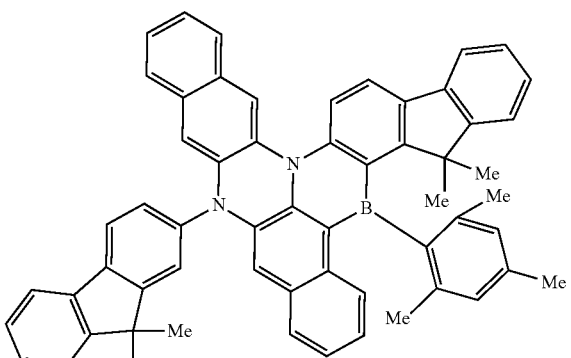
(1-5-114)
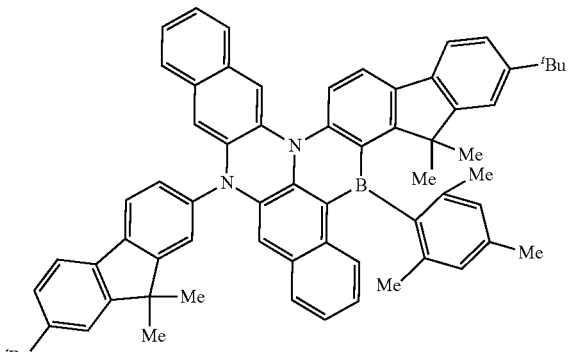
(1-5-115)
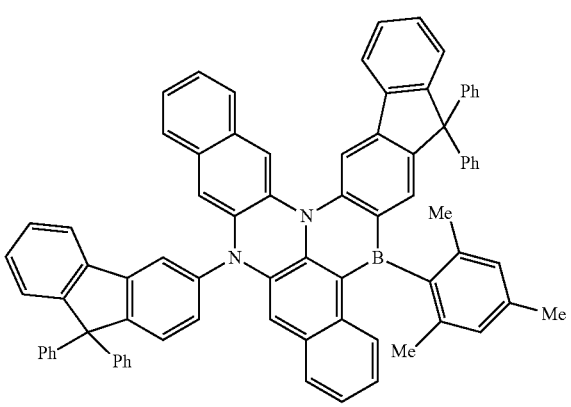
(1-5-116)
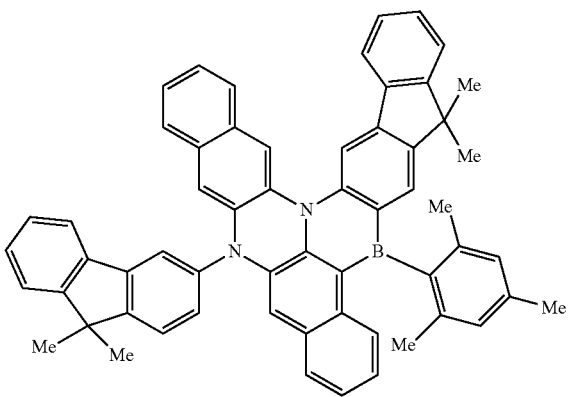

(1-5-117)
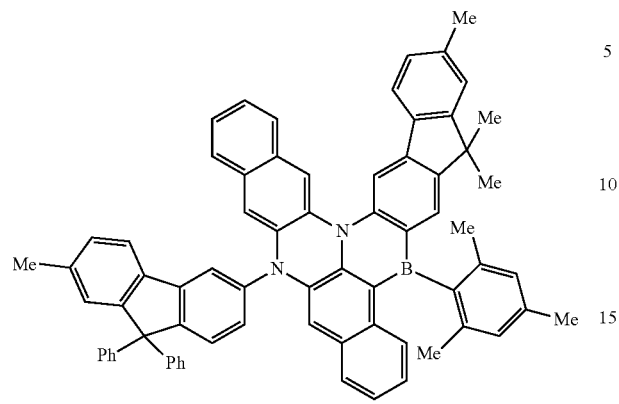
(1-5-118)
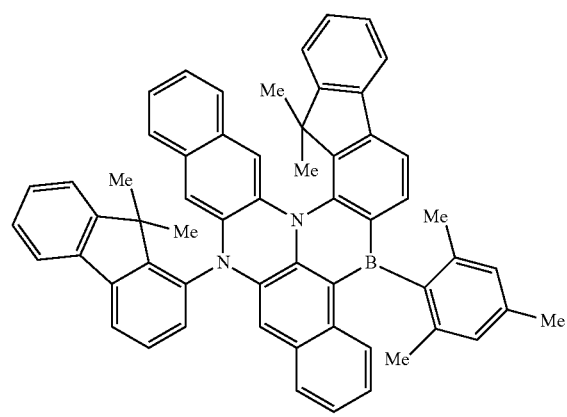
(1-5-119)
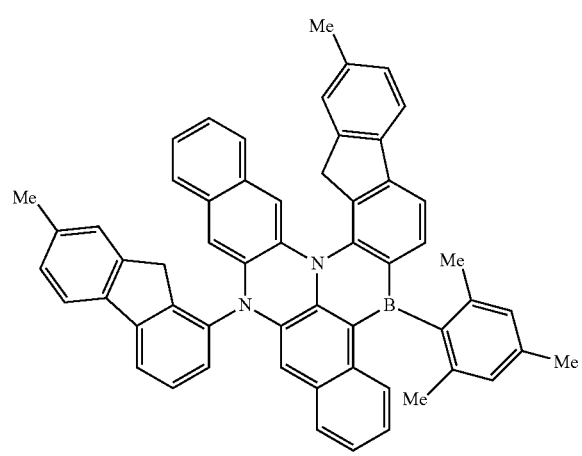
(1-5-120)
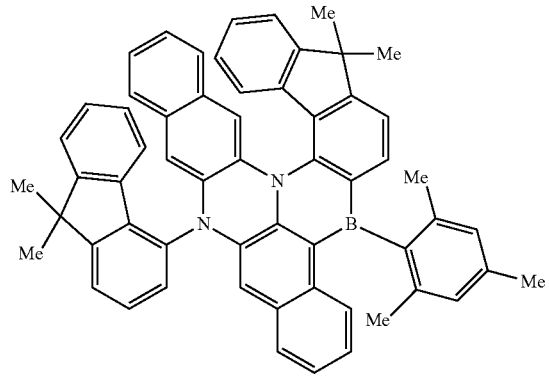
(1-5-121)
(1-5-125)
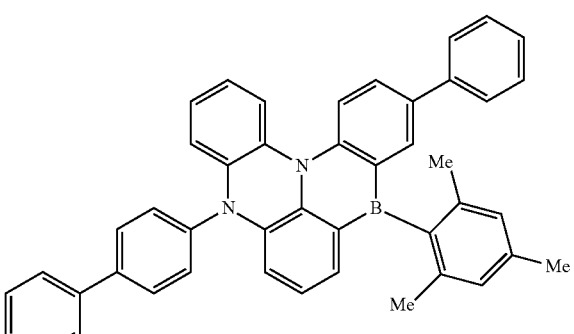
(1-5-126)
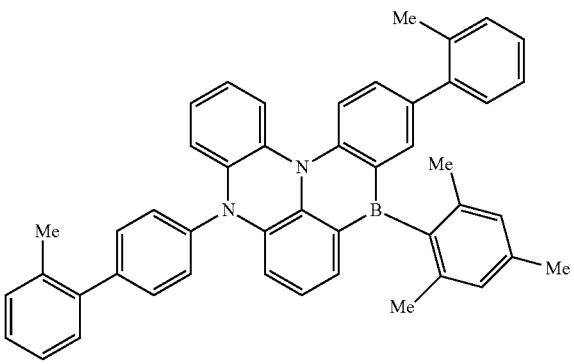

(1-5-127)
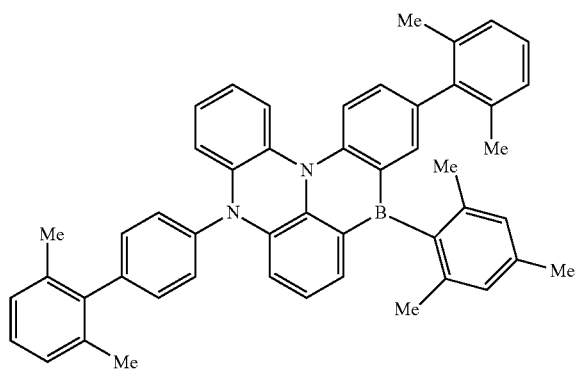
(1-5-128)
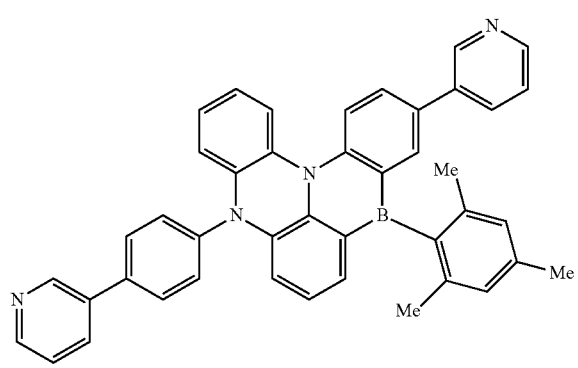
(1-5-129)
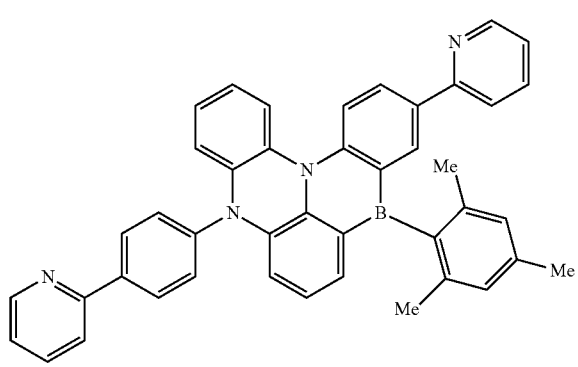
(1-5-130)
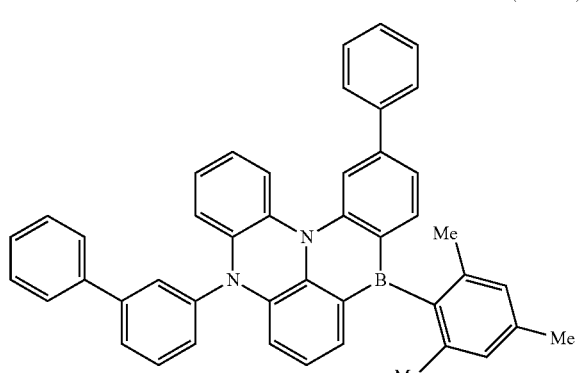
(1-5-131)
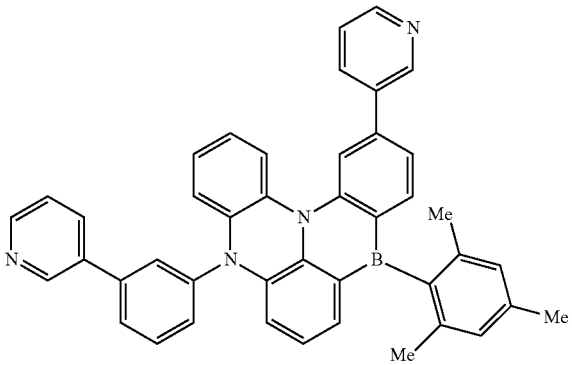
(1-5-132)
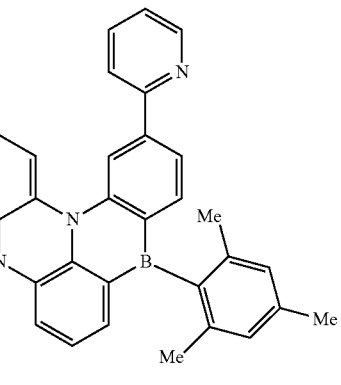
(1-5-133)
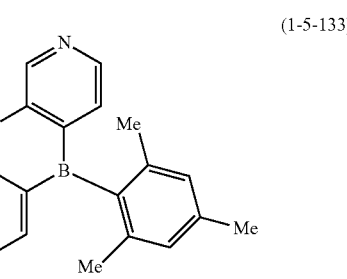
(1-5-134)
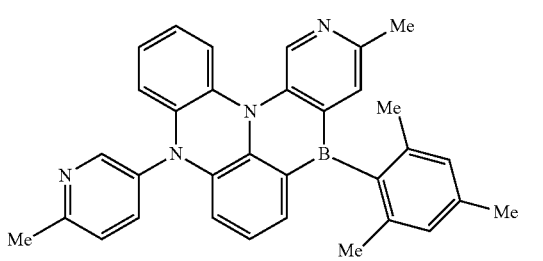
(1-5-135)
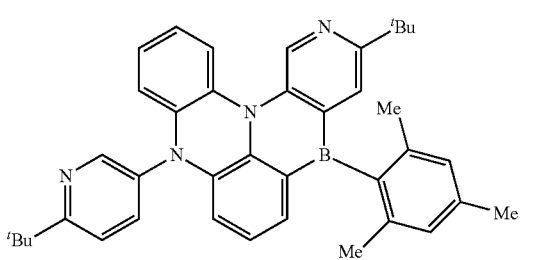

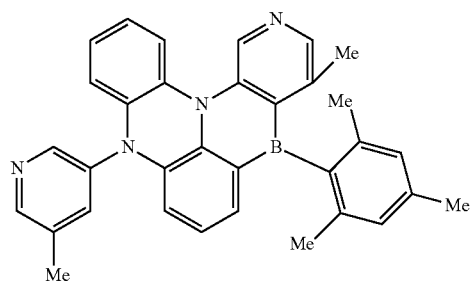
(1-5-136)
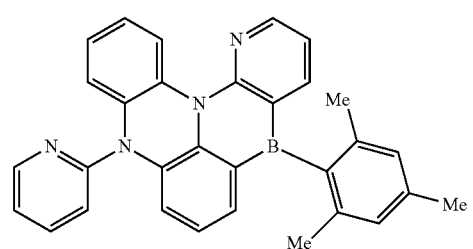
(1-5-137)
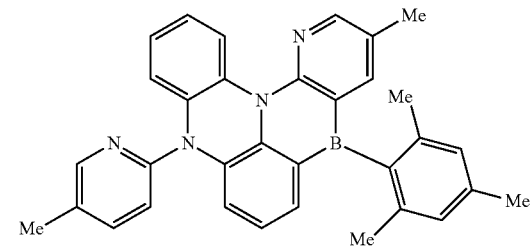
(1-5-138)
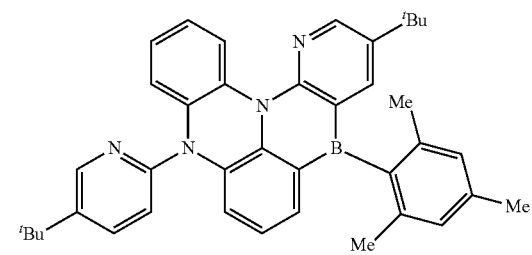
(1-5-139)
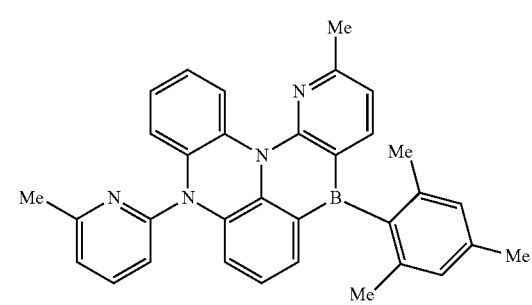
(1-5-140)
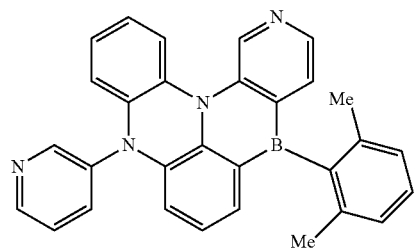
(1-5-141)
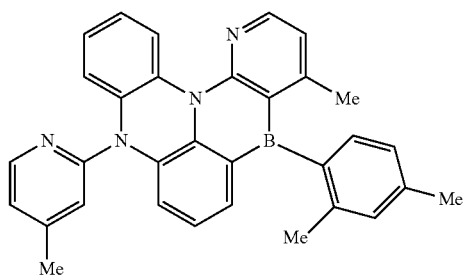
(1-5-142)
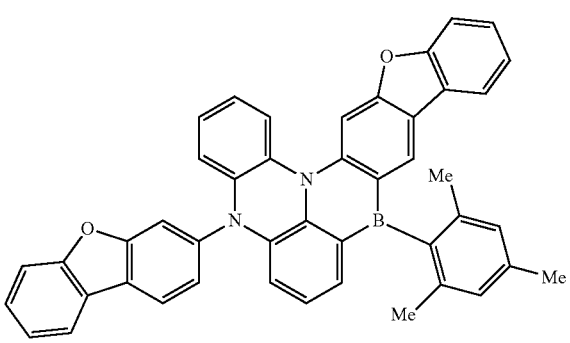
(1-5-150)
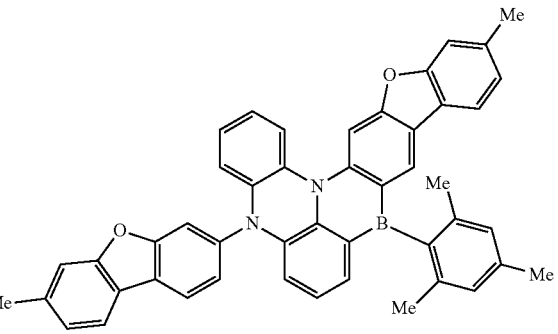
(1-5-151)
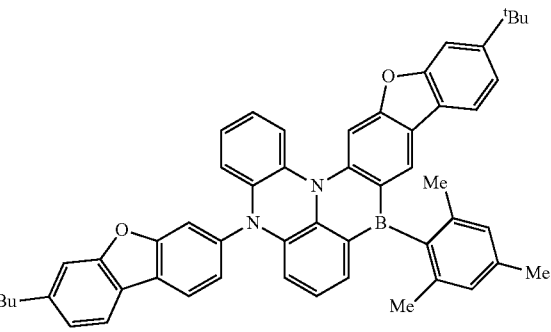
(1-5-152)

(1-5-153)
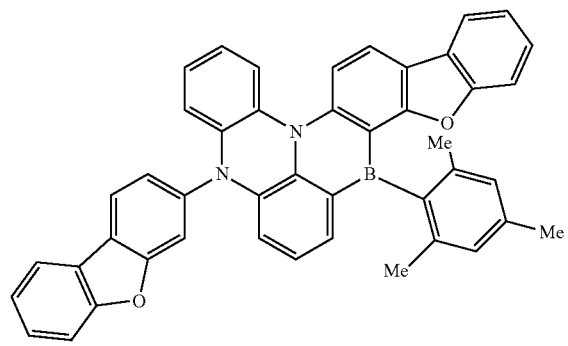
(1-5-154)
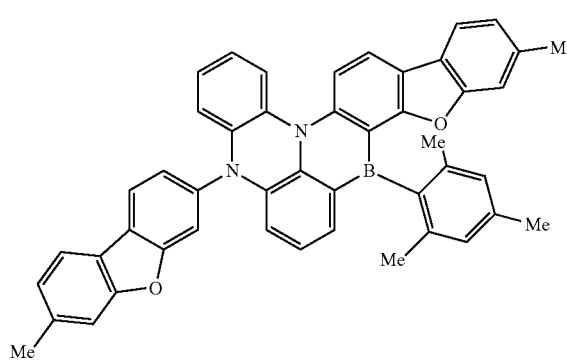
(1-5-55)
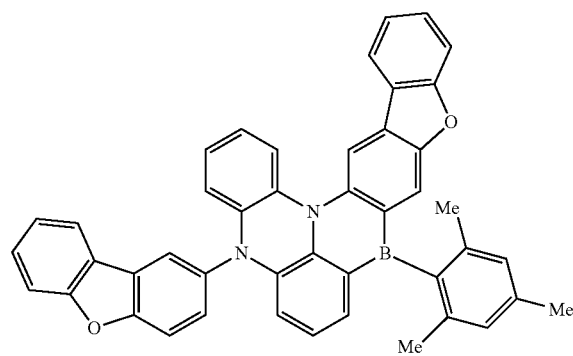
(1-5-156)
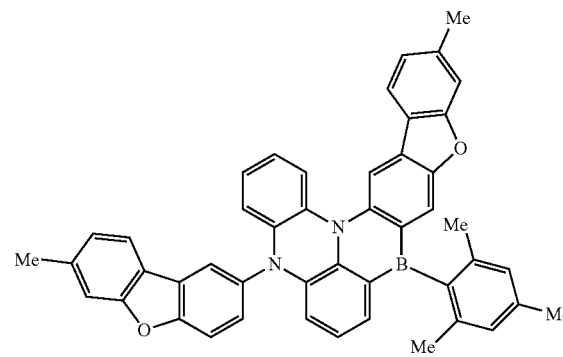
(1-5-157)
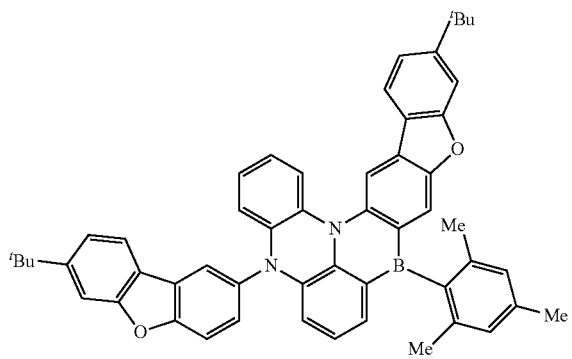
(1-5-158)
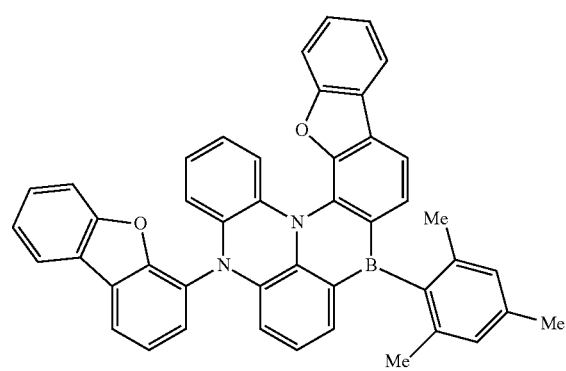
(1-5-159)
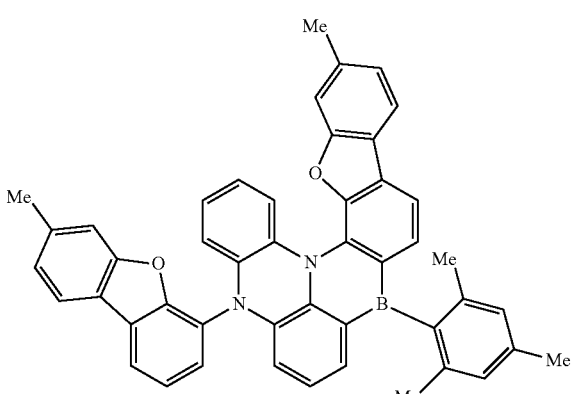
(1-5-160)
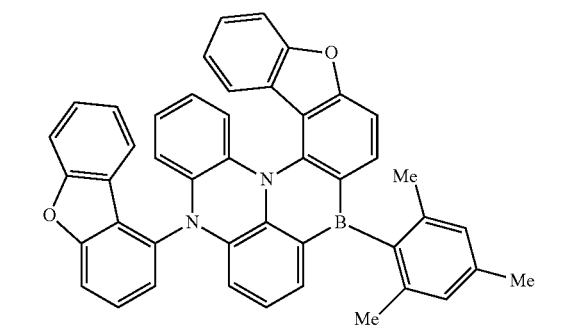

(1-5-161)
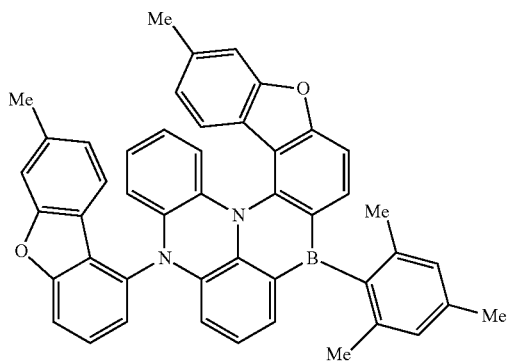
(1-5-163)
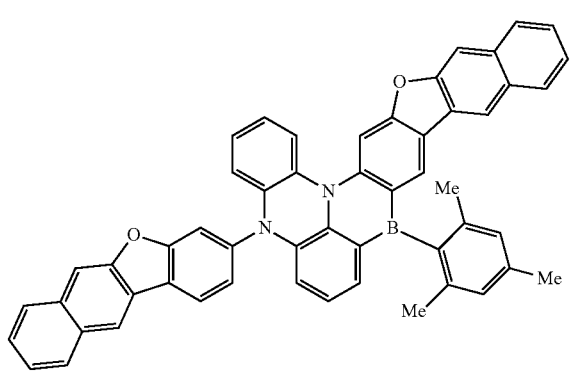
(1-5-164)
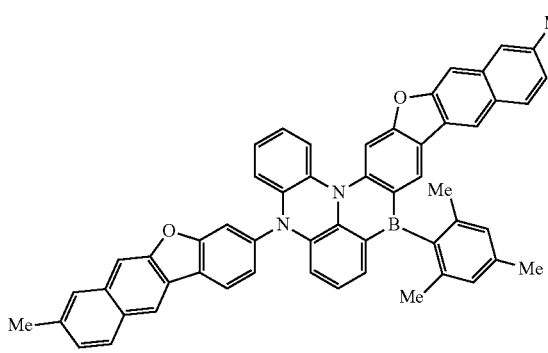
(1-5-165)
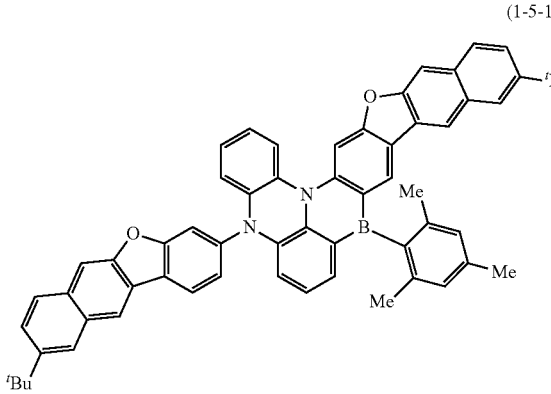
(1-5-166)
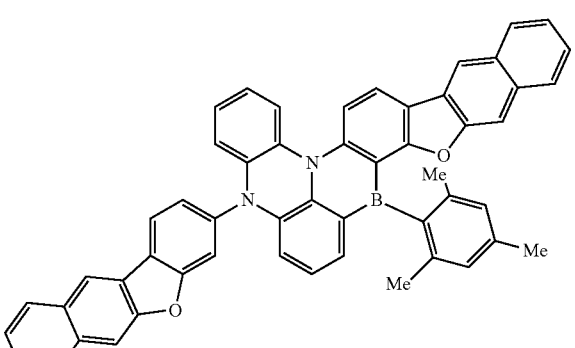
(1-5-167)
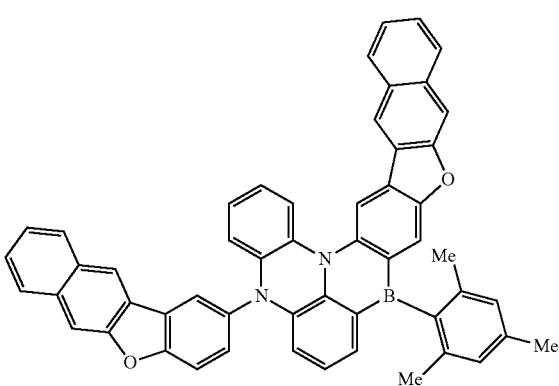
(1-5-168)
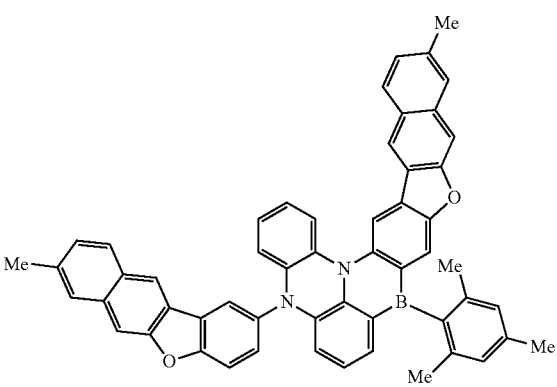
(1-5-169)
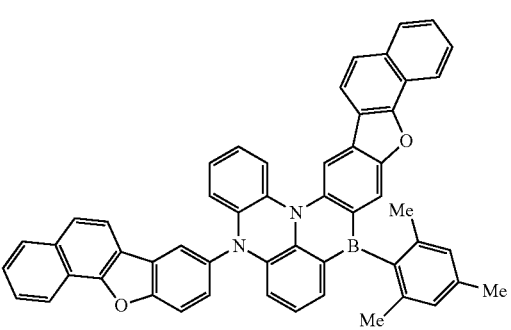

(1-5-170)
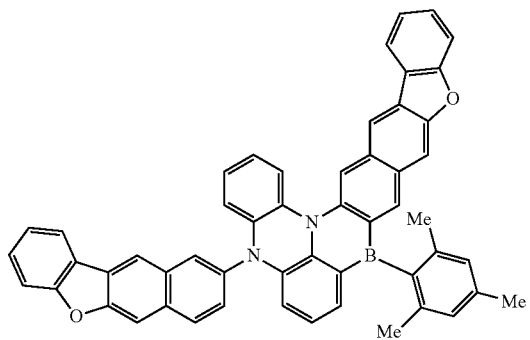
(1-5-176)
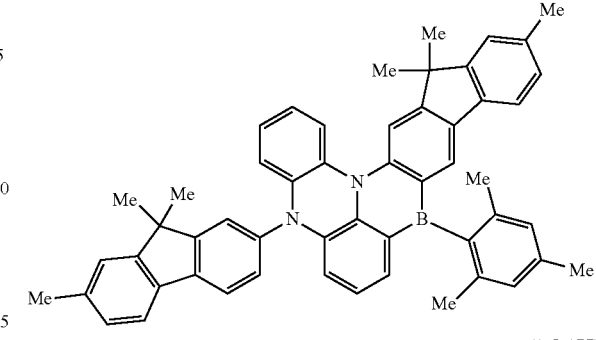
(1-5-171)
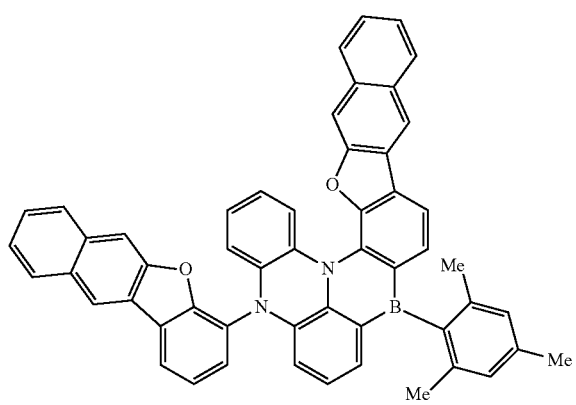
(1-5-177)
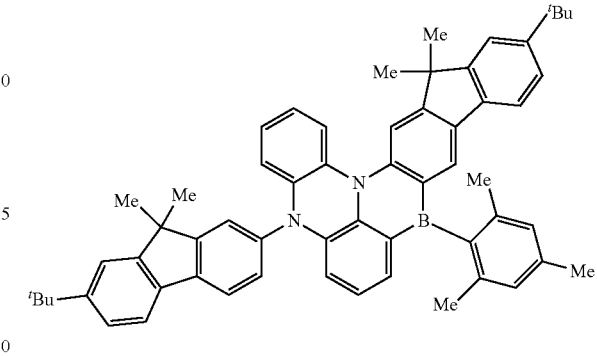
(1-5-172)
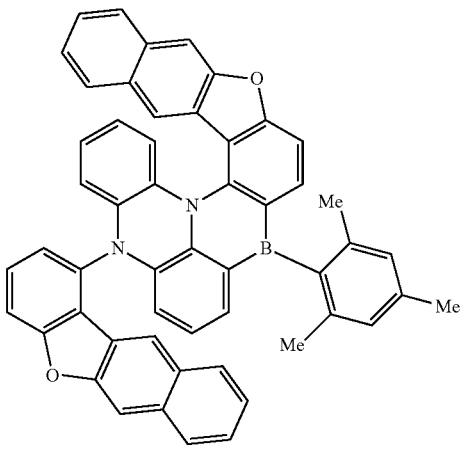
(1-5-178)
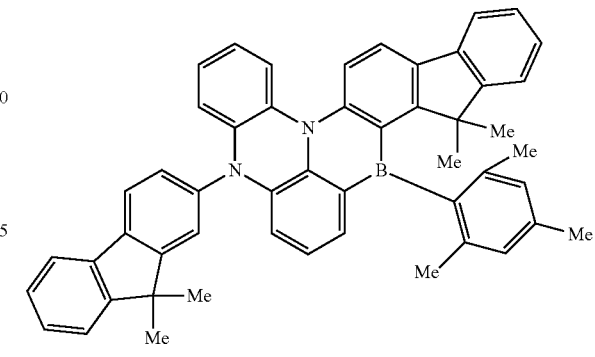
(1-5-175)
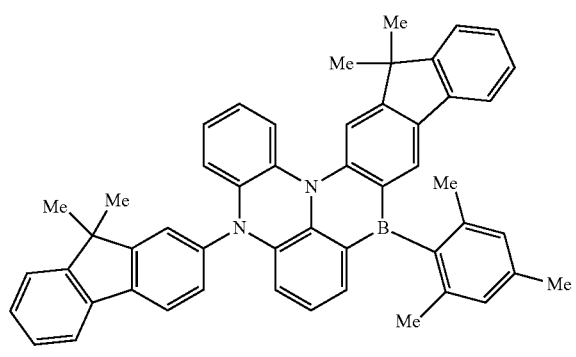
(1-5-179)

(1-5-180)
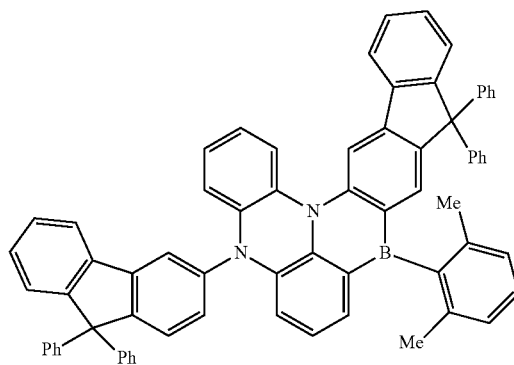
(1-5-181)
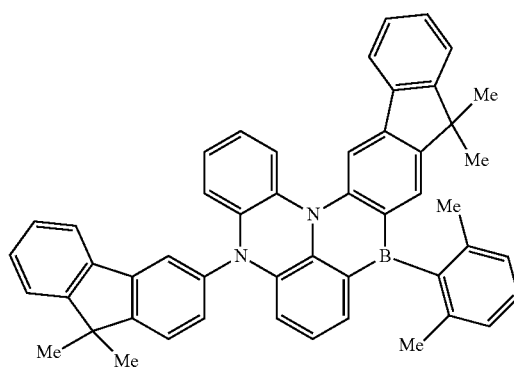
(1-5-182)
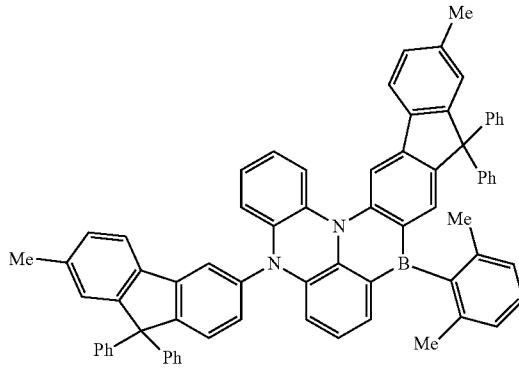
(1-5-183)
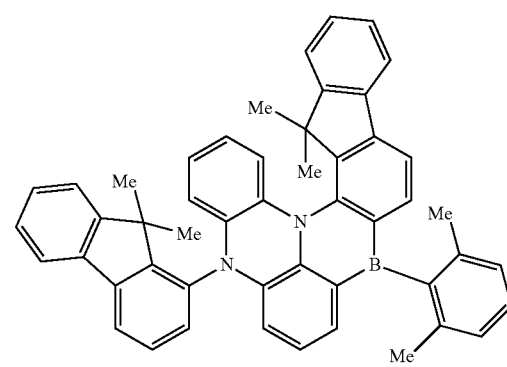
(1-5-184)
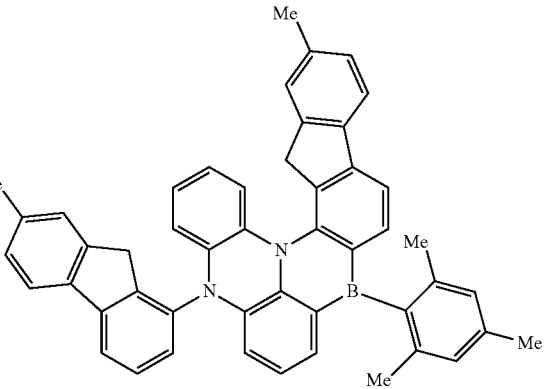
(1-5-185)
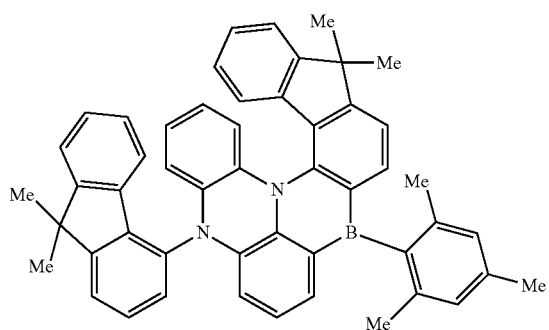
(1-5-186)
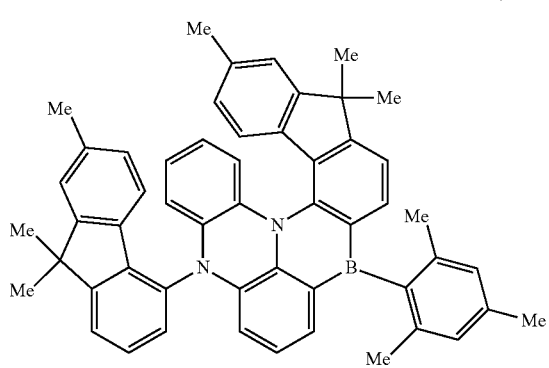
(1-5-190)
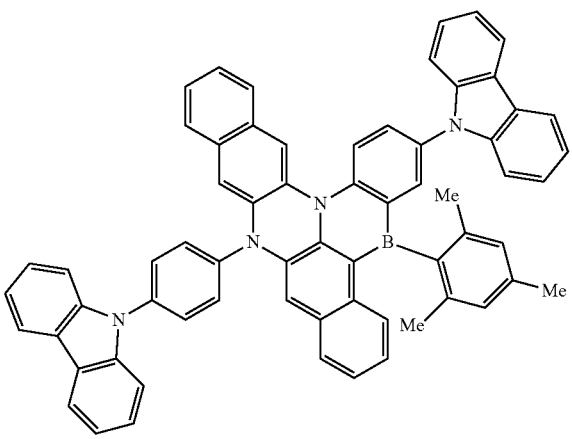

(1-5-191)
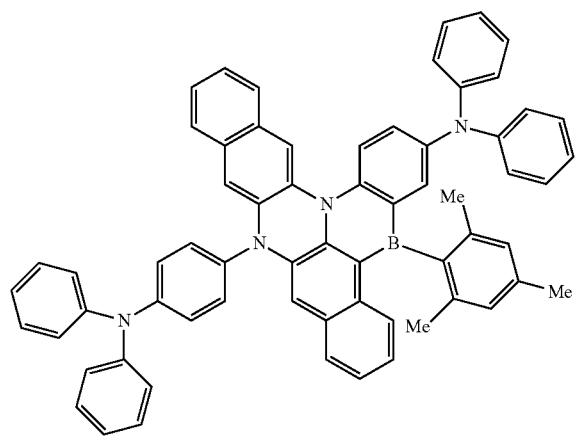
(1-5-194)
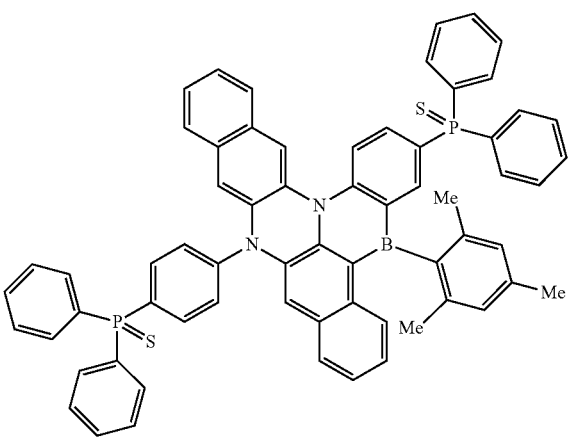
(1-5-192)
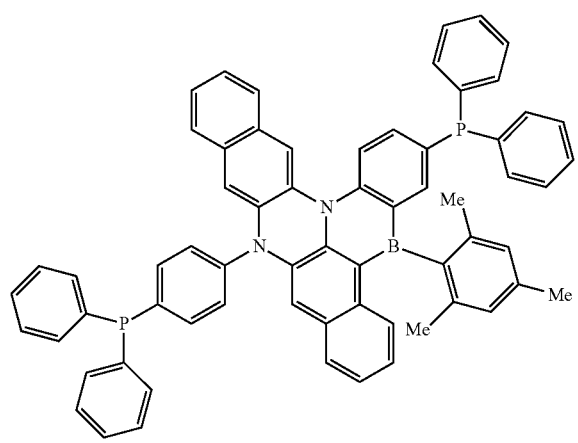
(1-5-195)
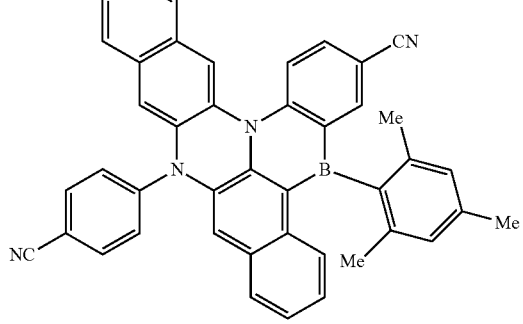
(1-5-193)
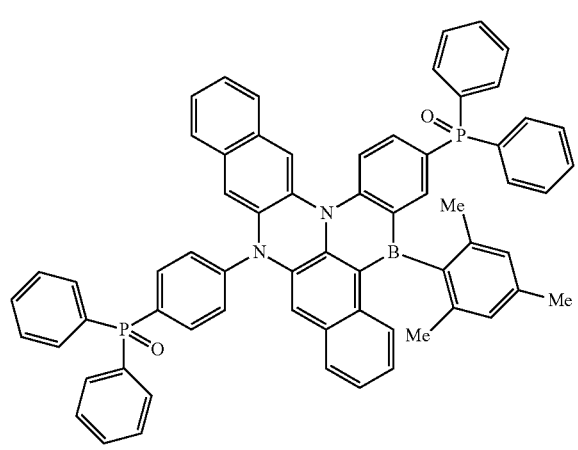
(1-5-196)
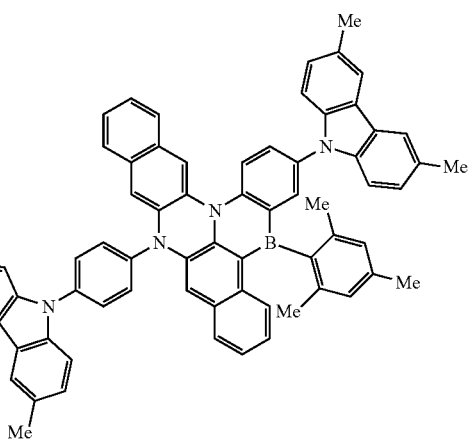

(1-5-197)
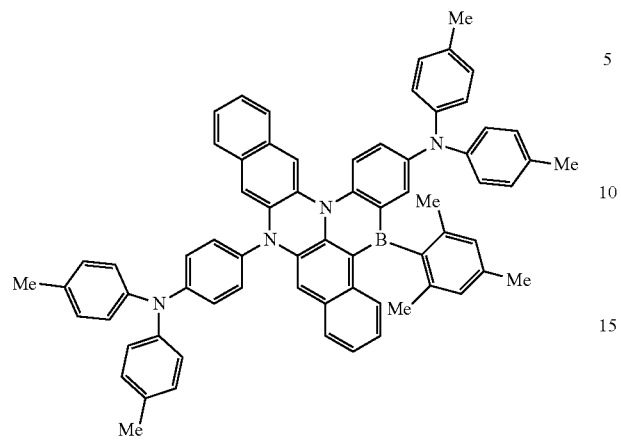
(1-5-198)
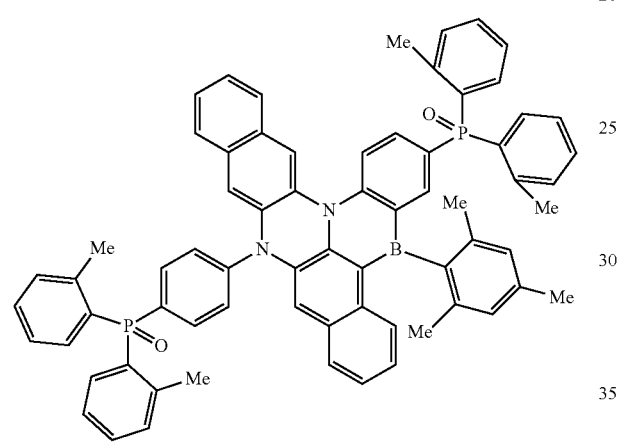
(1-5-199)
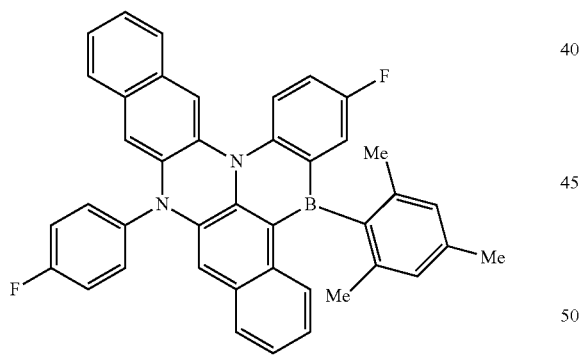
(1-5-200)
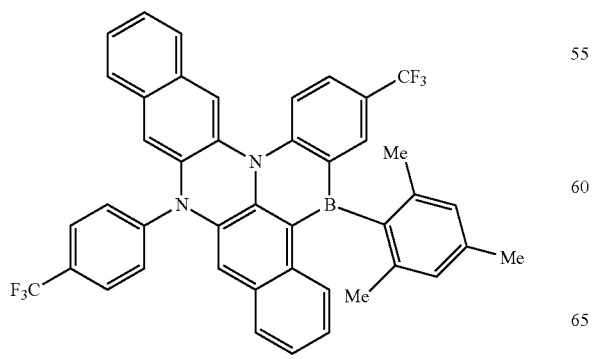
(1-5-201)
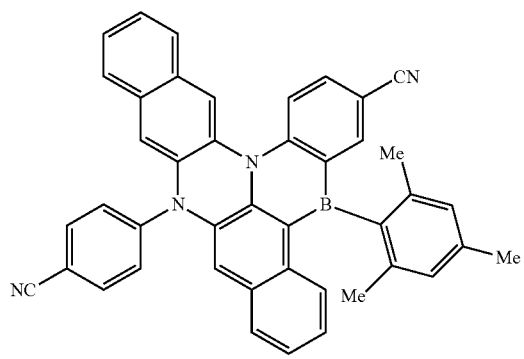
(1-5-202)
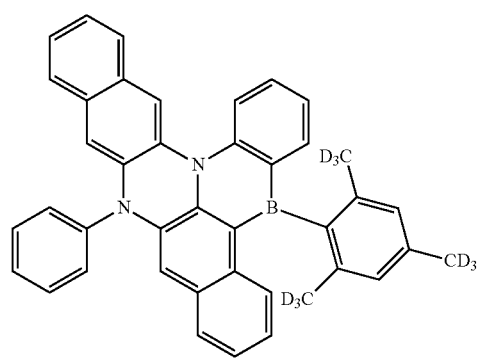
(1-5-203)
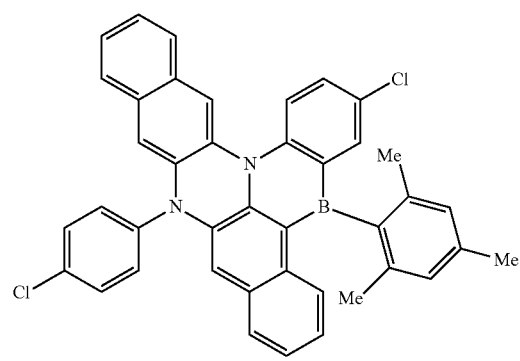
(1-5-204)
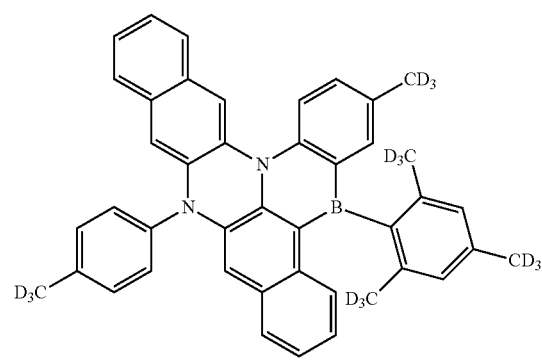

-continued
(1-6-1)
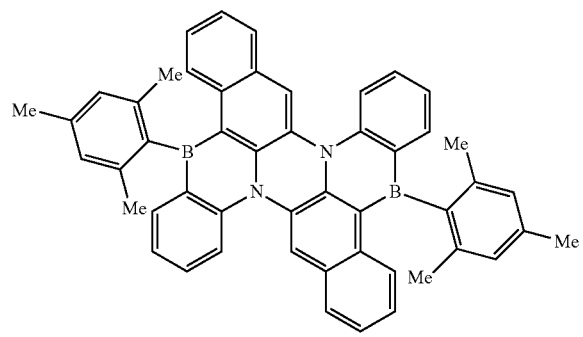
(1-6-2)
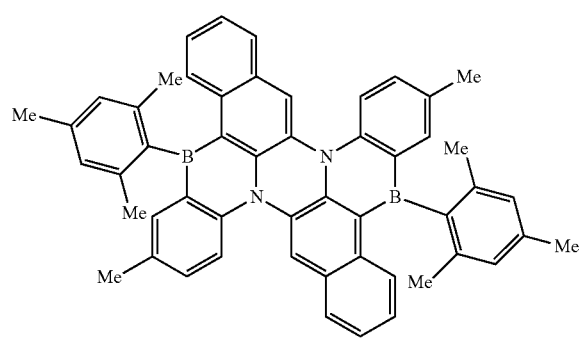
(1-6-3)
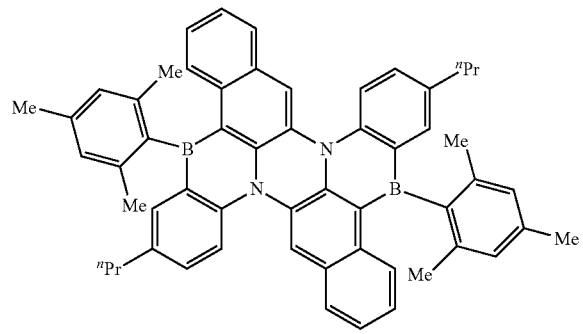
(1-6-4)
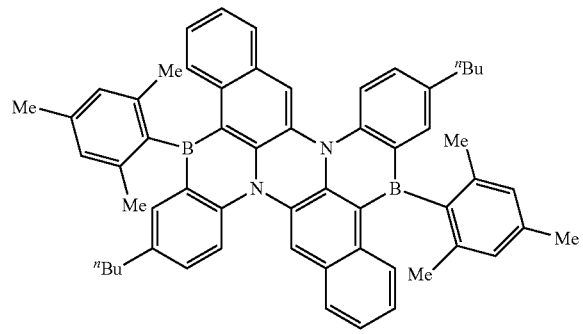
(1-6-5)
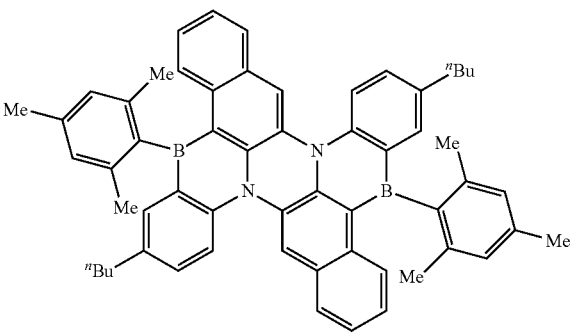
(1-6-6)
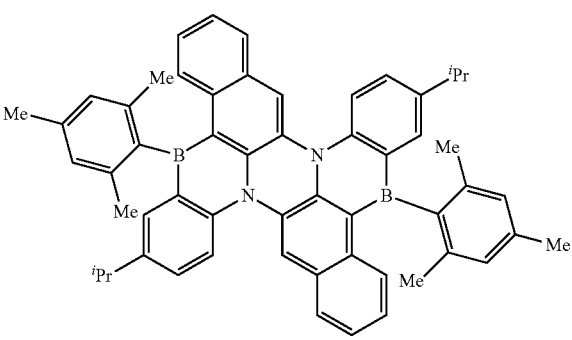
(1-6-7)
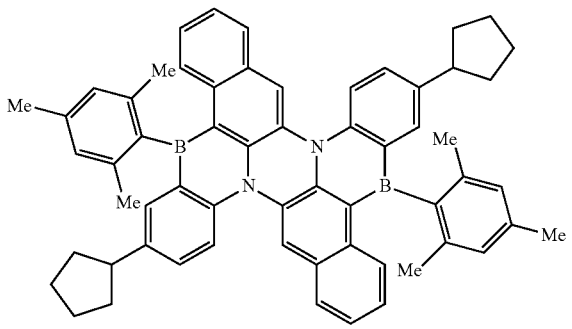
(1-6-8)
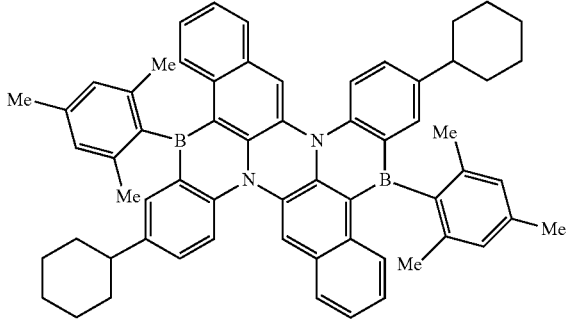

(1-6-9)
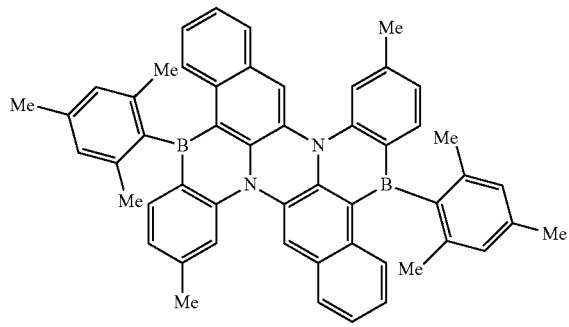
(1-6-10)
(1-6-11)
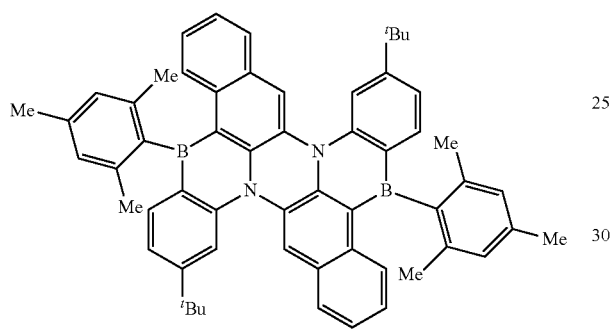
(1-6-20)
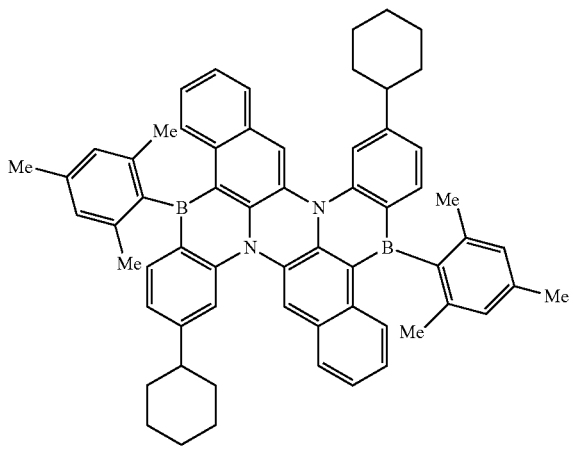
(1-6-21)
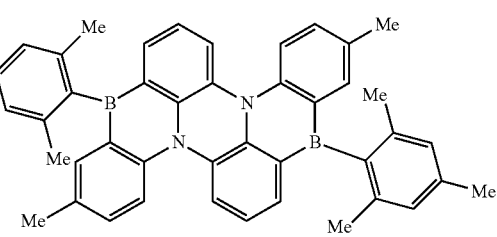
(1-6-22)
(1-6-23)
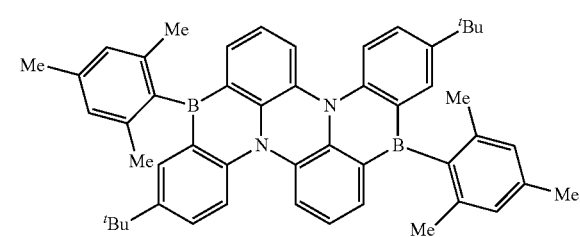
(1-6-24)
(1-6-25)
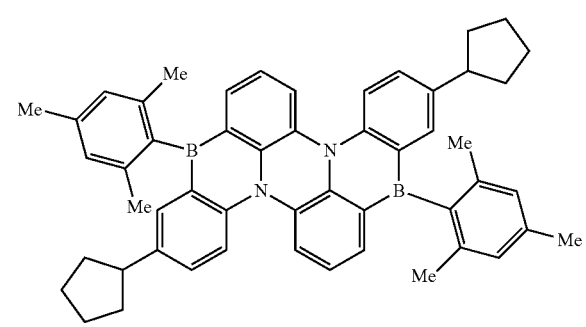

-continued
(1-6-26)
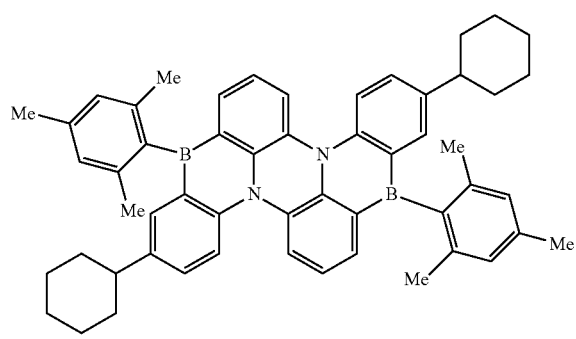
(1-6-27)
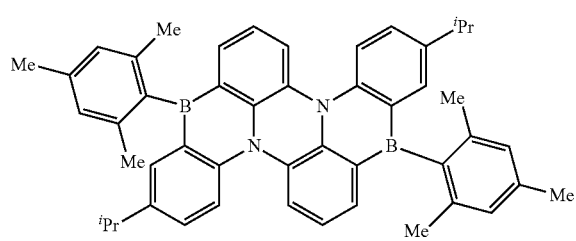
(1-6-28)
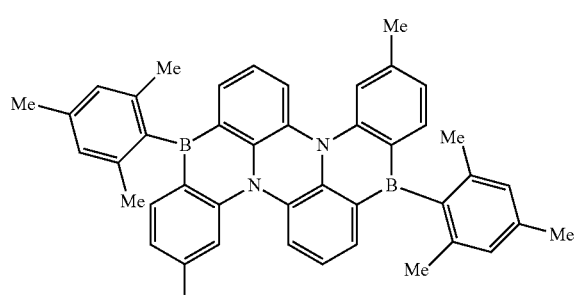
(1-6-29)
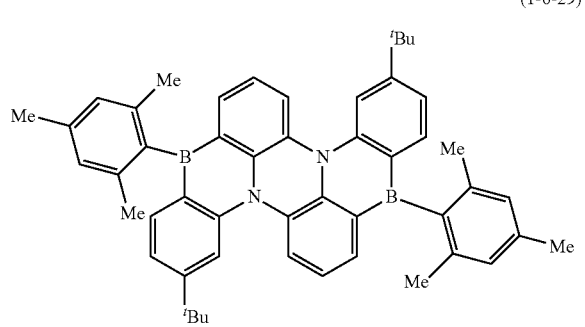
-continued
(1-6-30)
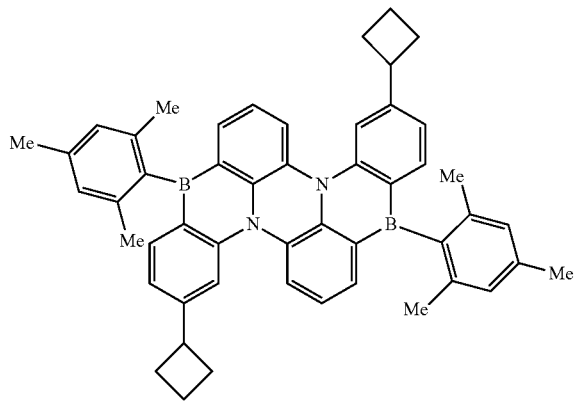
(1-6-35)
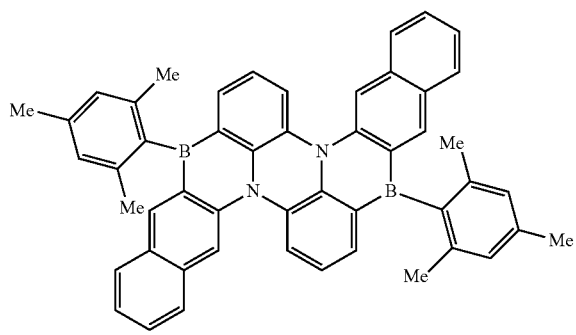
(1-6-36)
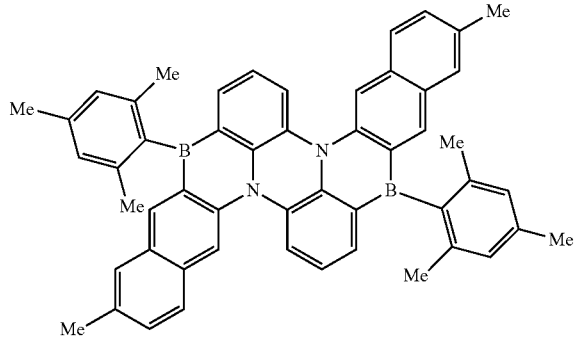
(1-6-37)

(1-6-38)
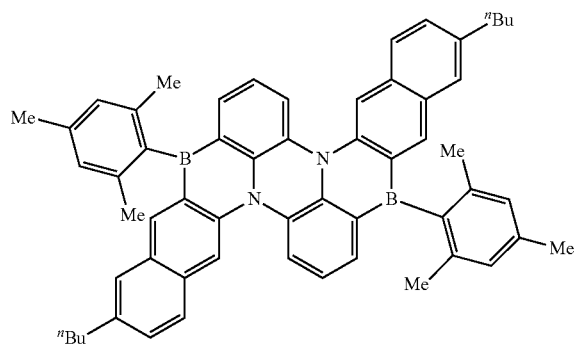
(1-6-39)
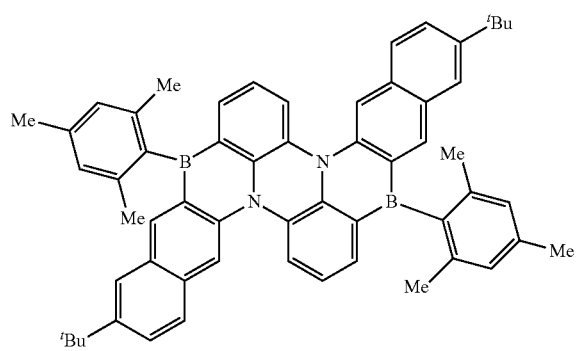
(1-6-40)
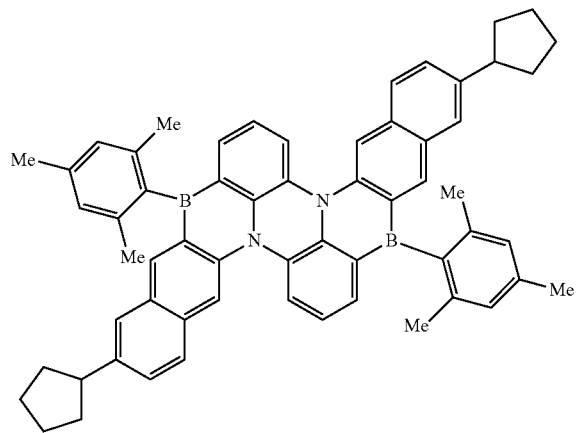
(1-6-41)
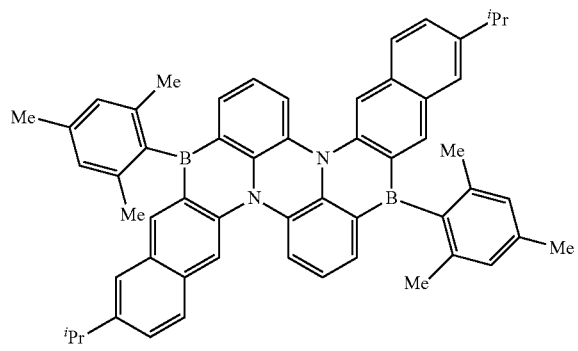
(1-6-42)
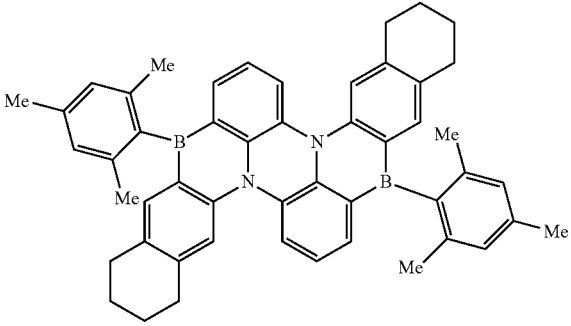
(1-6-43)
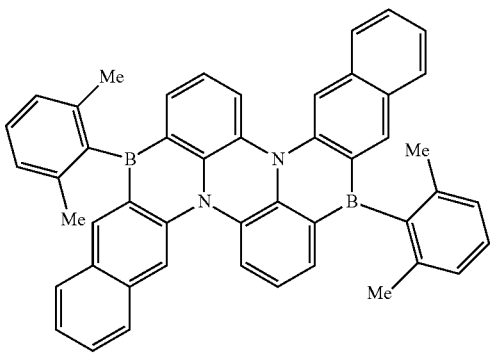
(1-6-50)
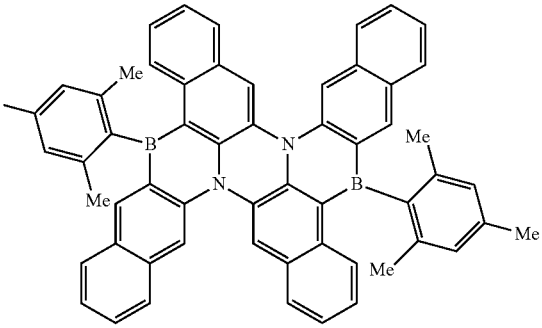
(1-6-51)
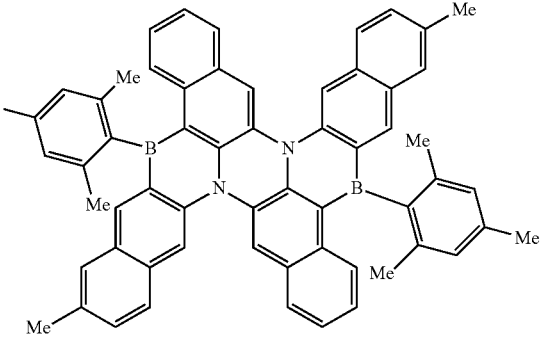

-continued
(1-6-52)
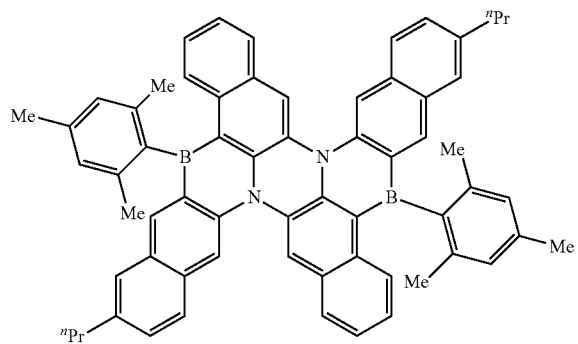
(1-6-53)
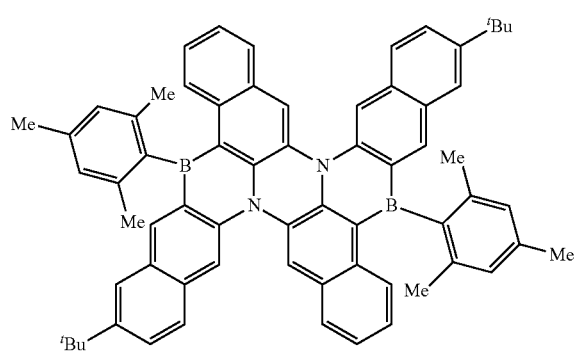
(1-6-54)
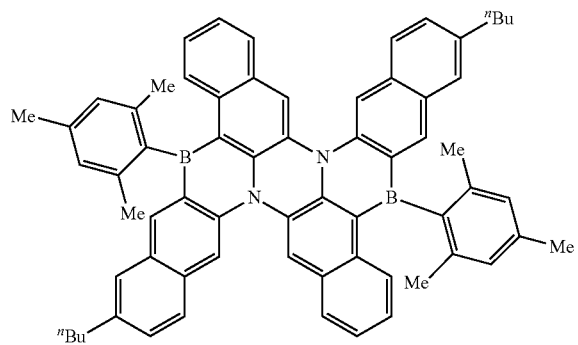
(1-6-55)
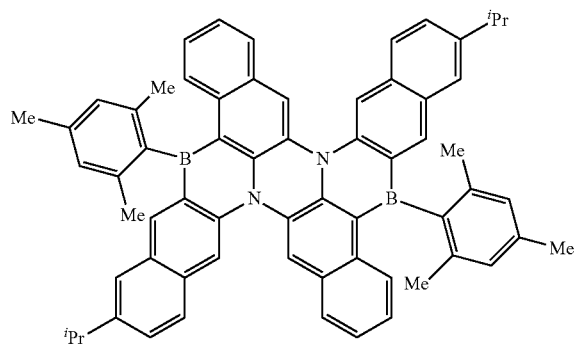
-continued
(1-6-56)
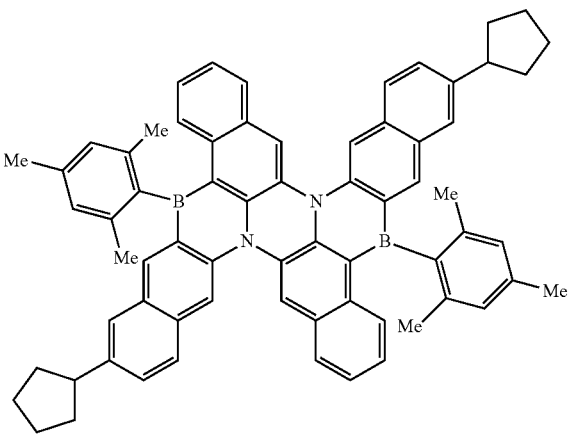
(1-6-57)
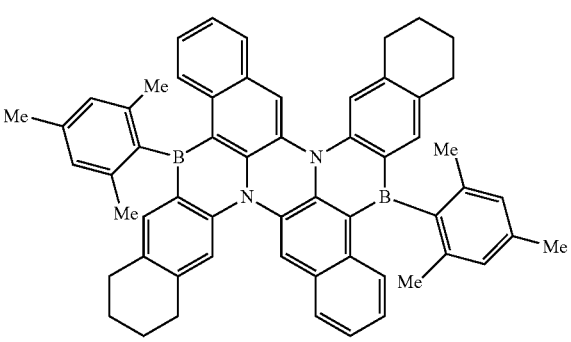
(1-6-58)
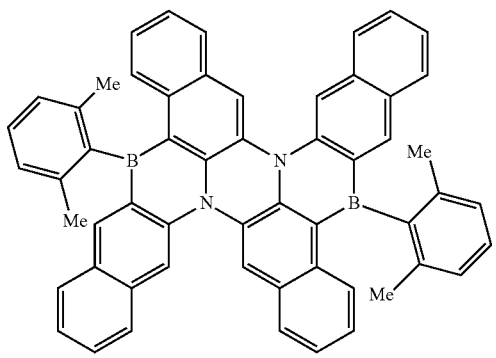
(1-6-65)
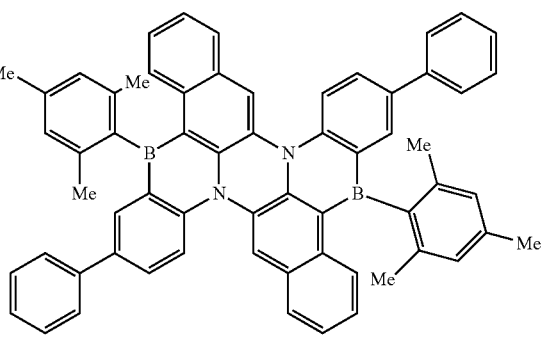

(1-6-66)
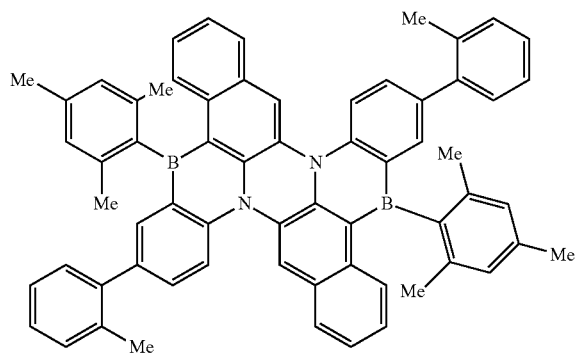
(1-6-67)
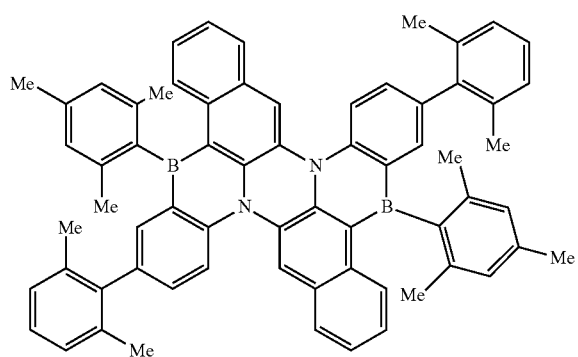
(1-6-68)
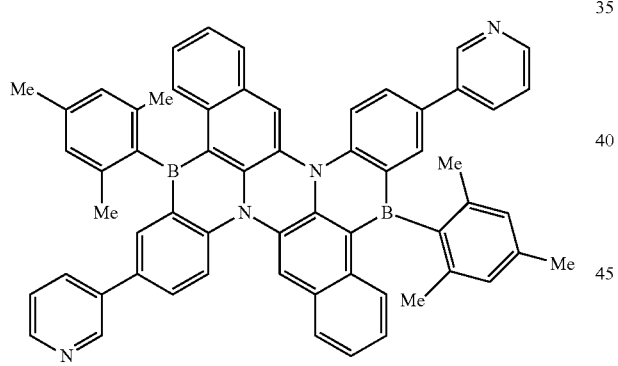
(1-6-69)
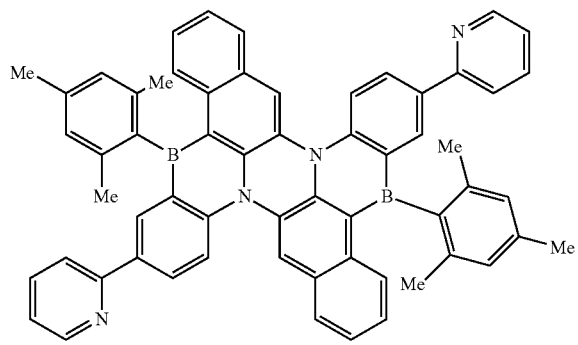
(1-6-70)
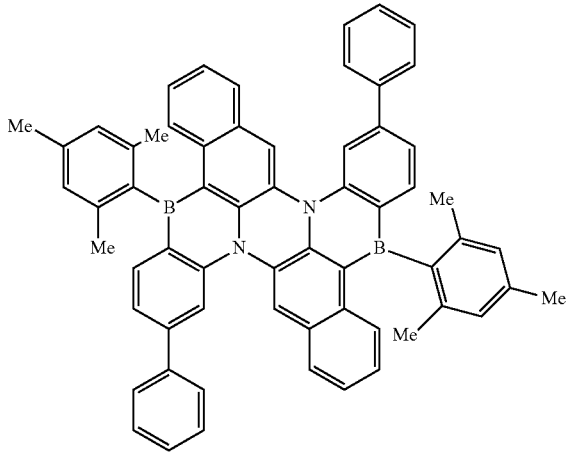
(1-6-71)
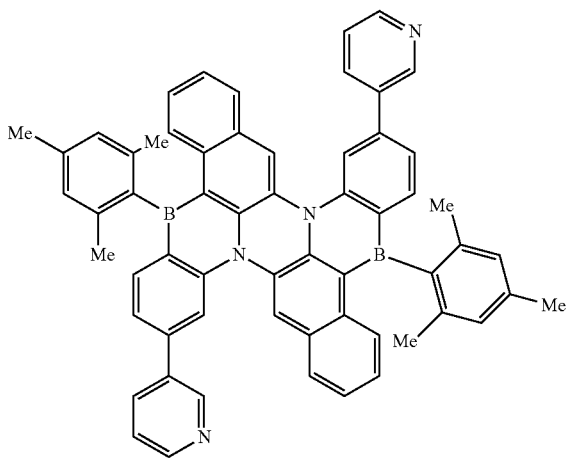
(1-6-72)
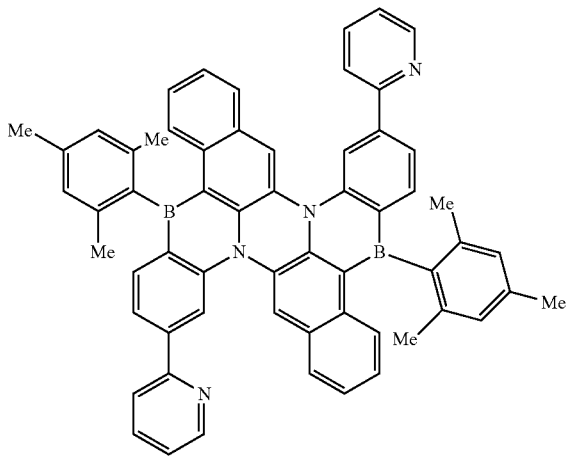

-continued
(1-6-73)
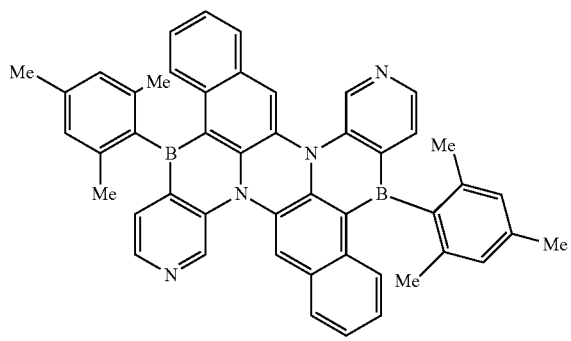
(1-6-74)
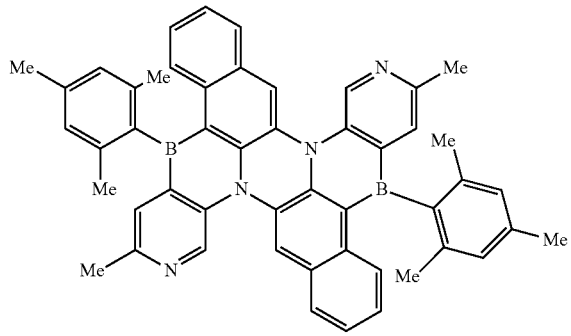
(1-6-75)
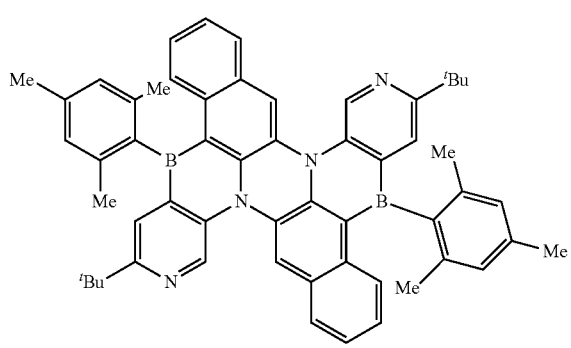
(1-6-76)
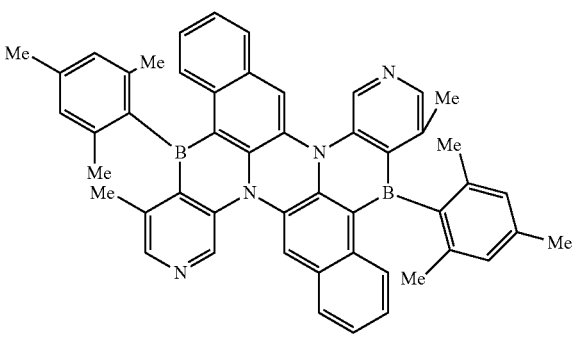
-continued
(1-6-77)
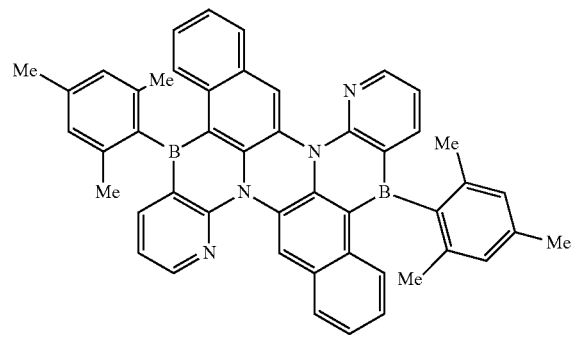
(1-6-78)
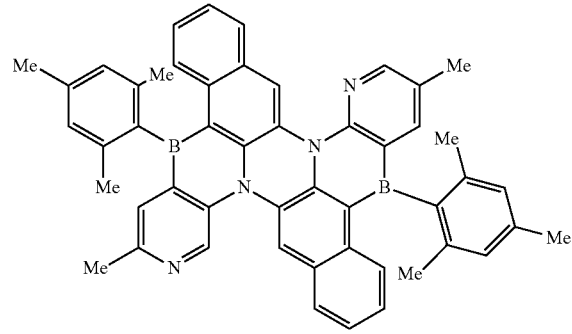
(1-6-79)
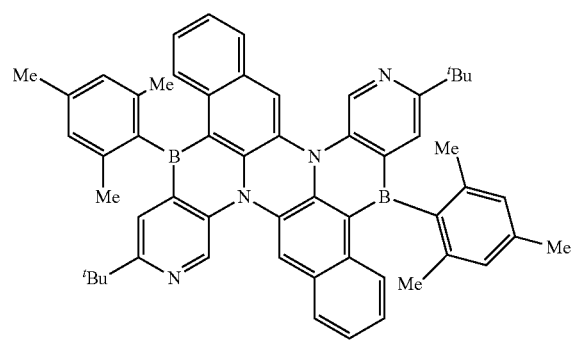
(1-6-80)
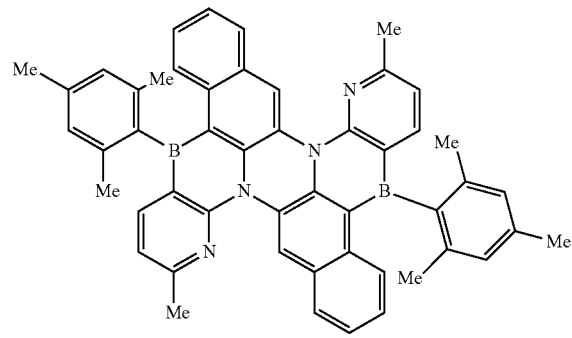

(1-6-81)
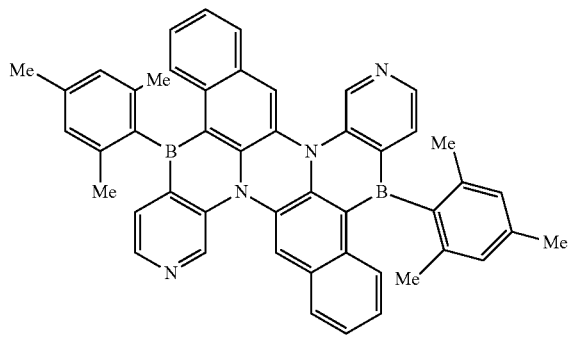
(1-6-82)
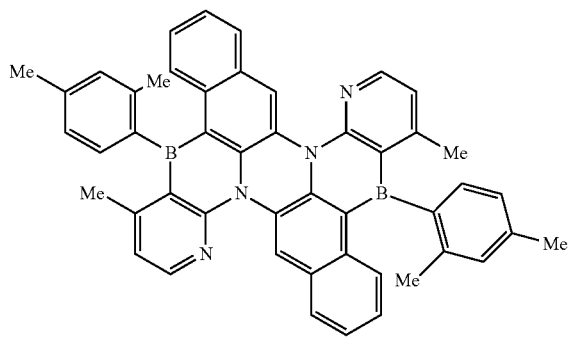
(1-6-90)
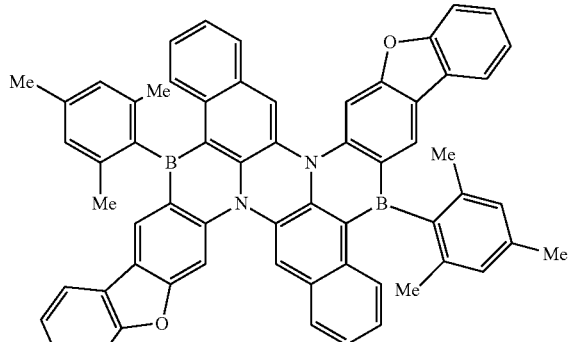
(1-6-91)
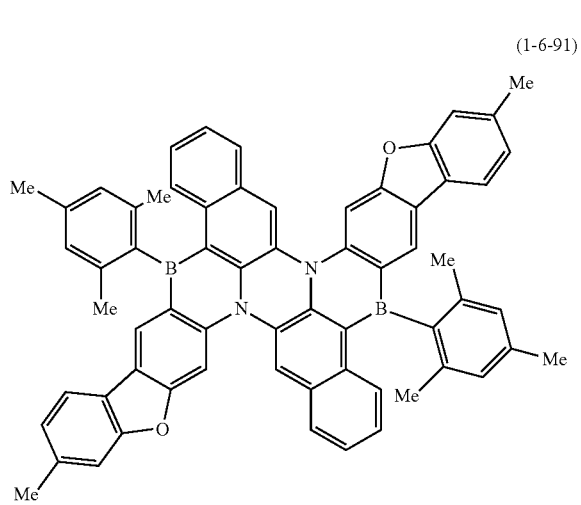
(1-6-92)
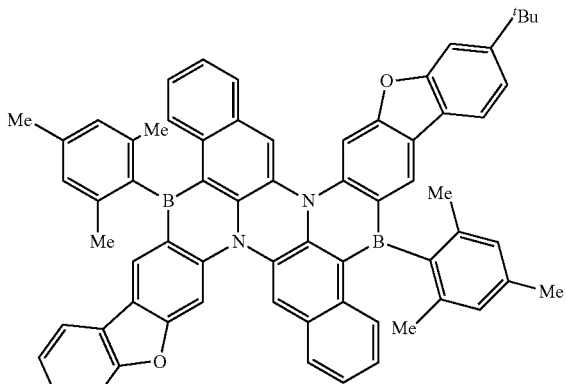
(1-6-93)
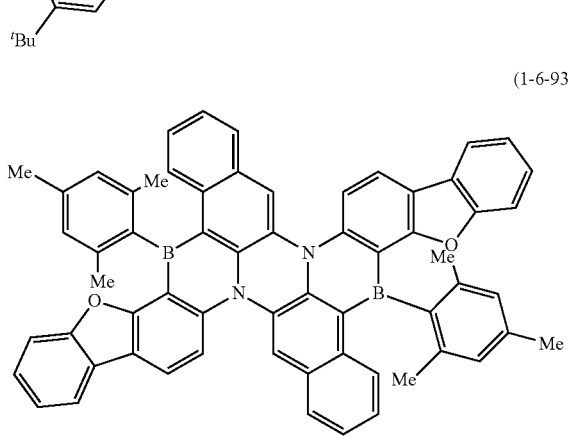
(1-6-94)
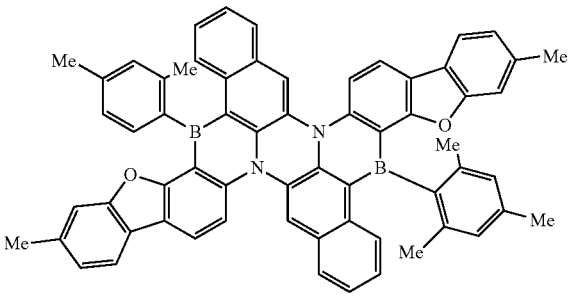
(1-6-95)
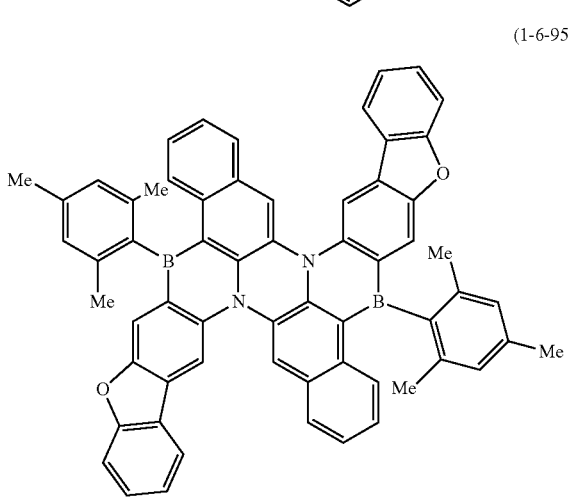

(1-6-96)
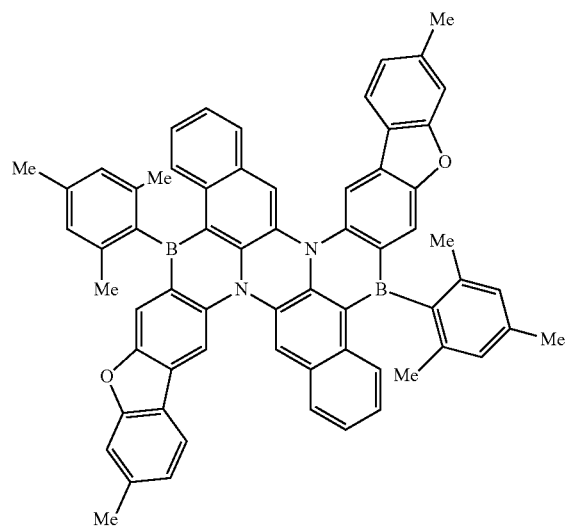
(1-6-99)
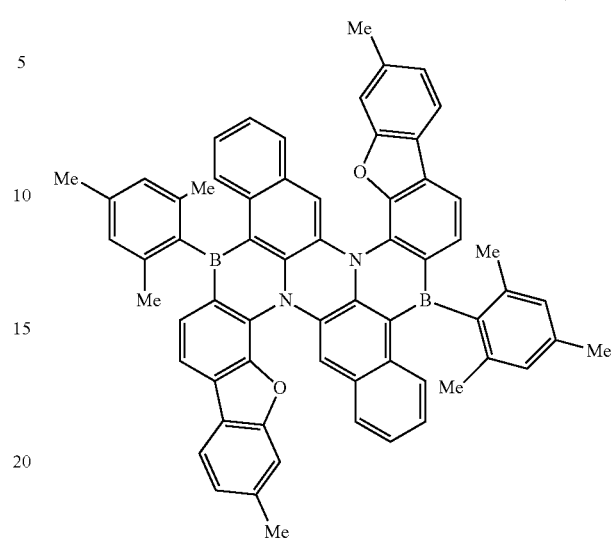
(1-6-97)
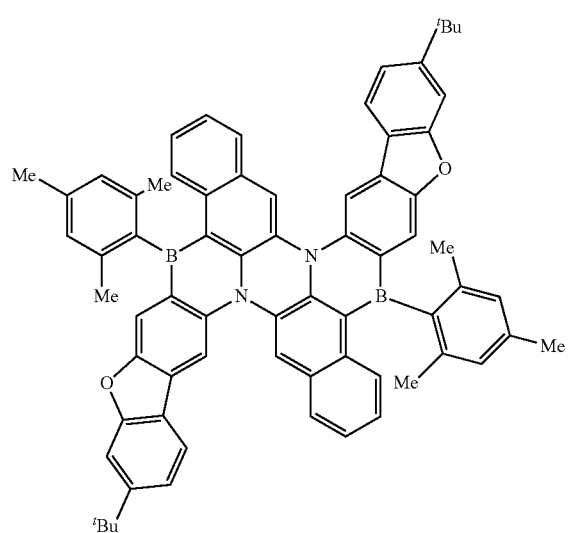
(1-6-100)
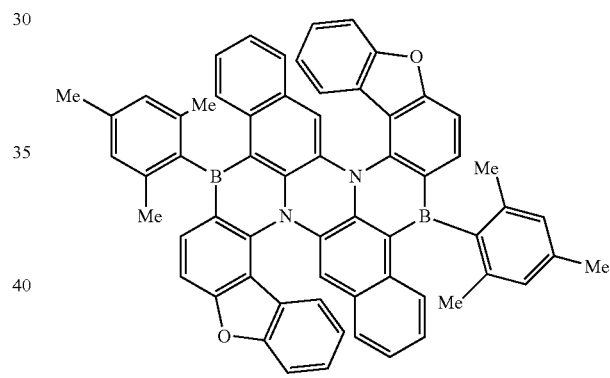
(1-6-98)
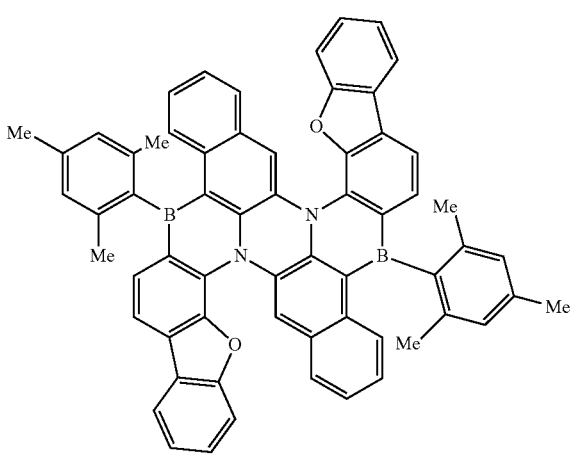
(1-6-101)
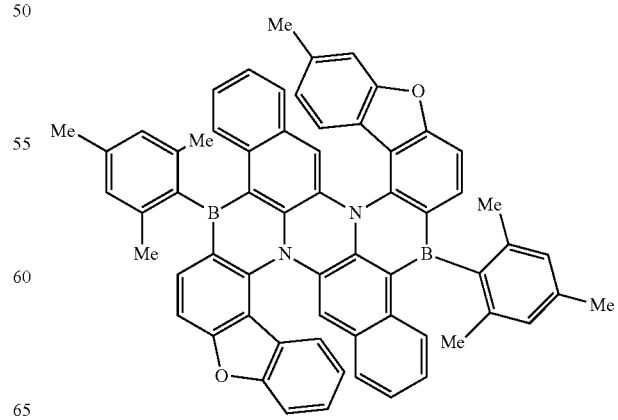

(1-6-105)
(1-6-106)
(1-6-107)
(1-6-108)
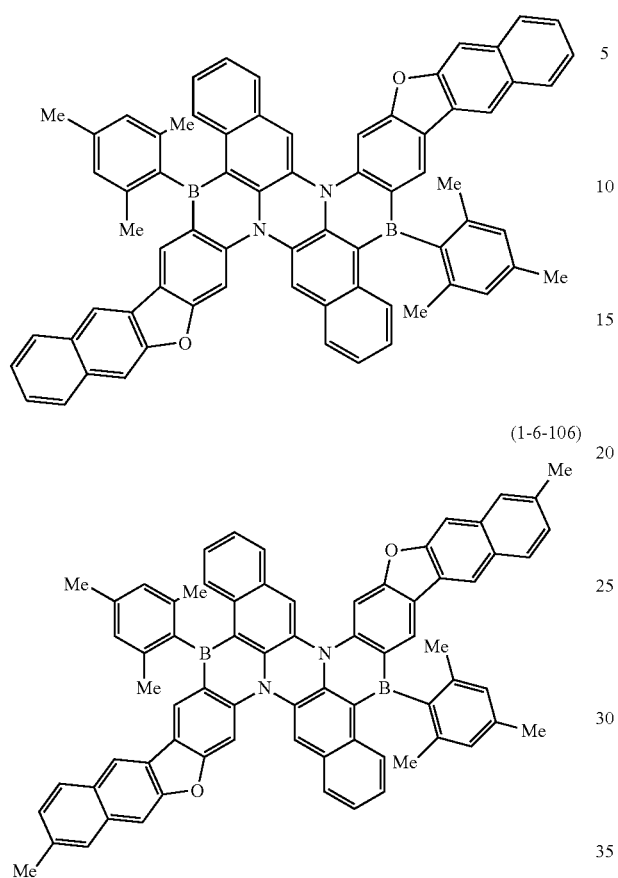
(1-6-109)
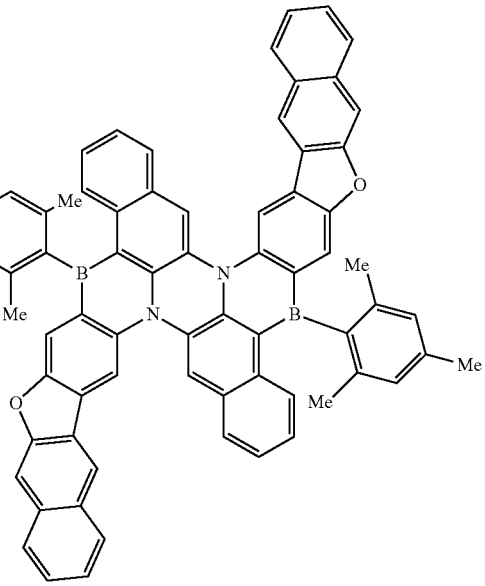
(1-6-110)
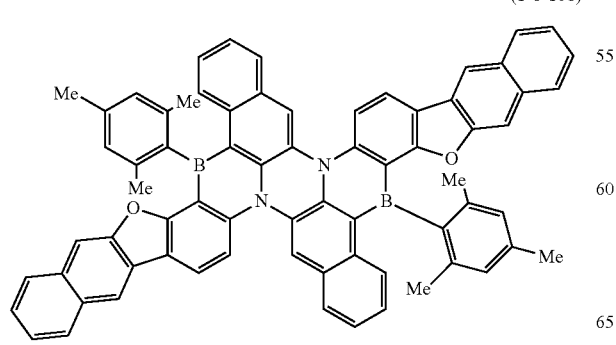

(1-6-111)
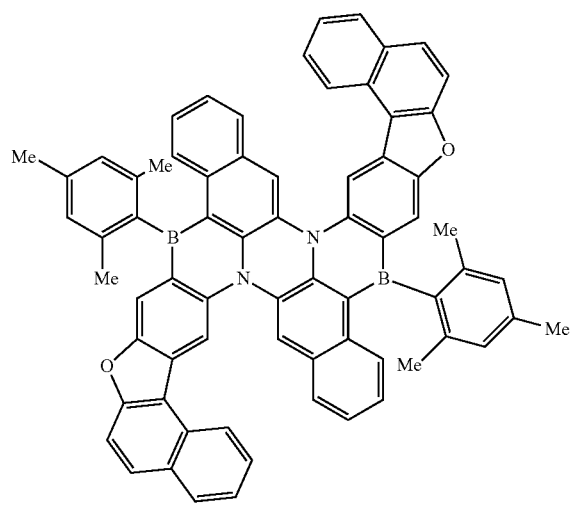
(1-6-113)
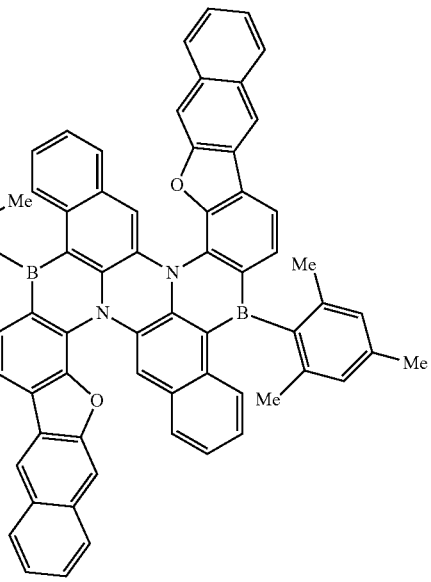
(1-6-112)
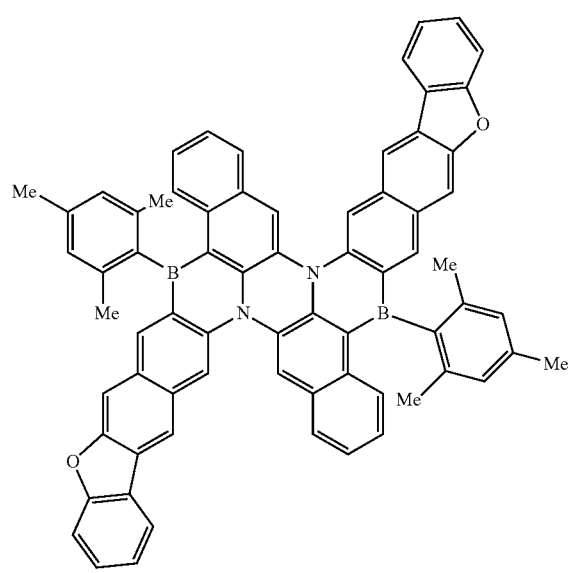
(1-6-114)
(1-6-121)
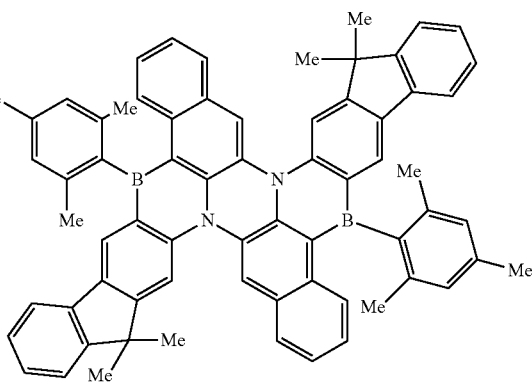

(1-6-122)
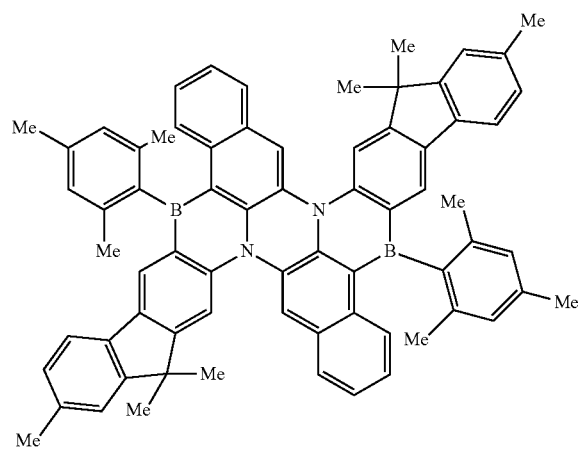
(1-6-123)
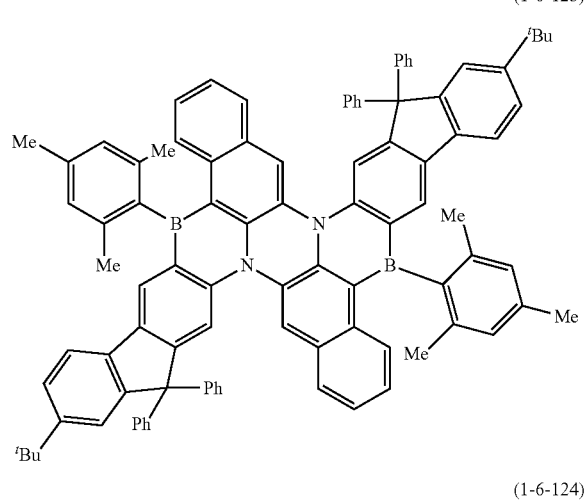
(1-6-124)
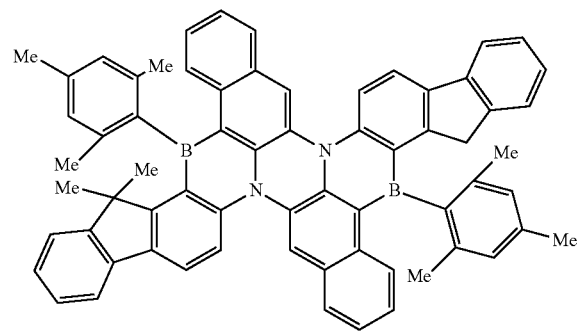
(1-6-125)
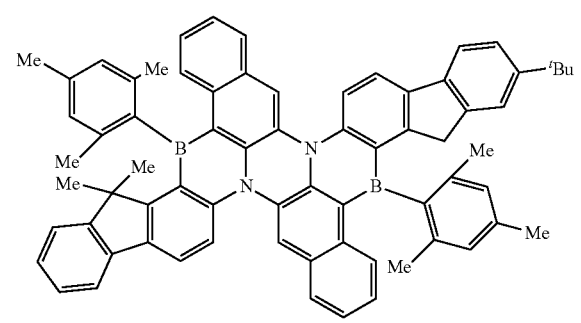
(1-6-126)
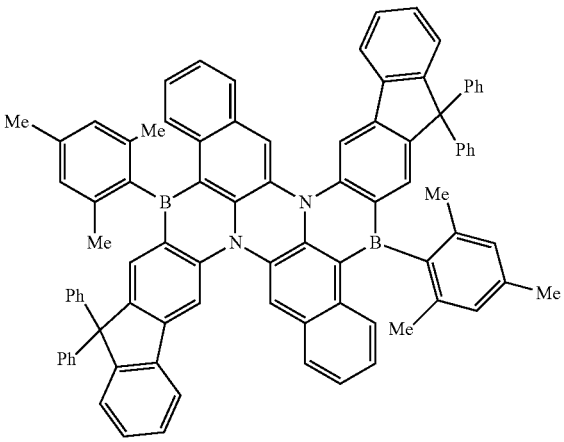
(1-6-127)
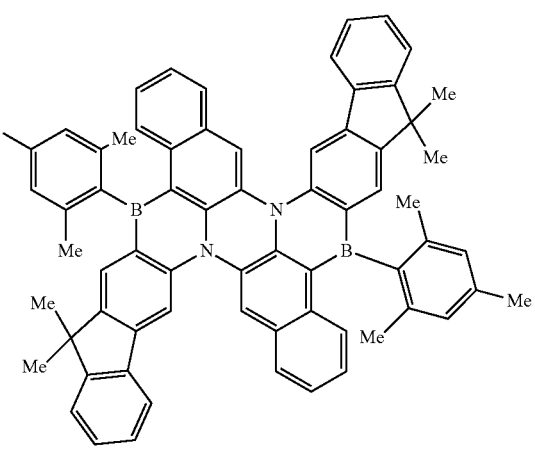
(1-6-128)
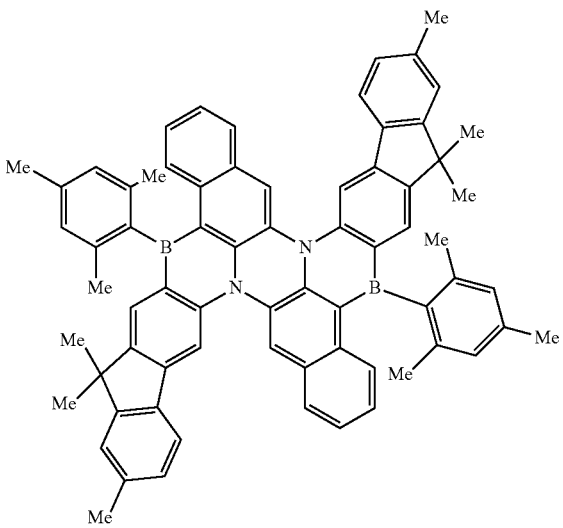

(1-6-129)
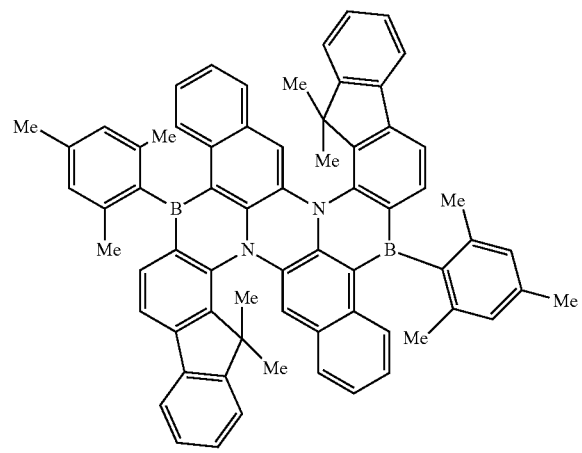
(1-6-130)
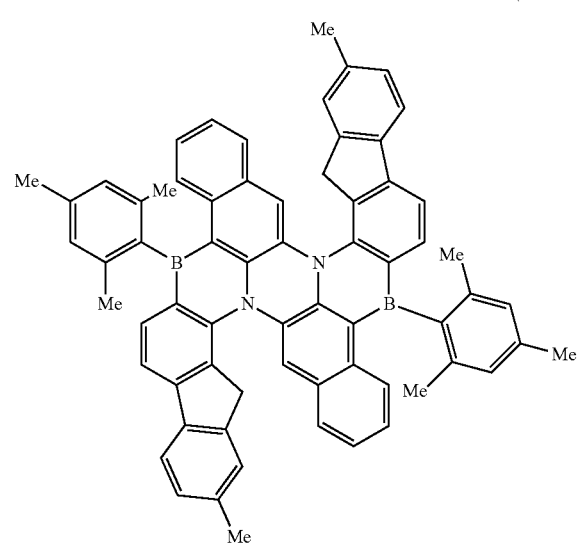
(1-6-131)
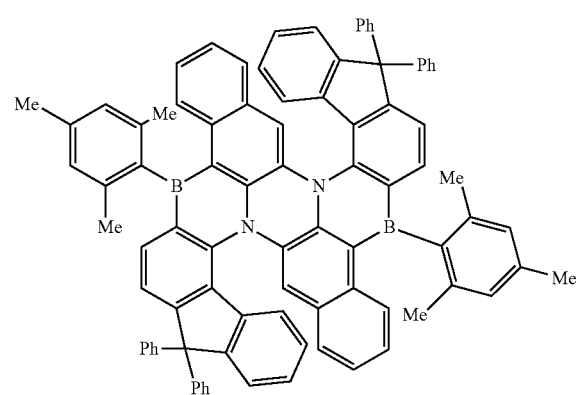
(1-6-132)
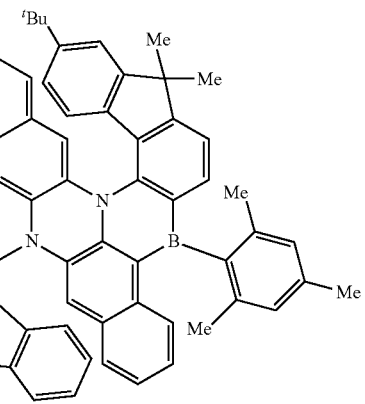
(1-6-138)
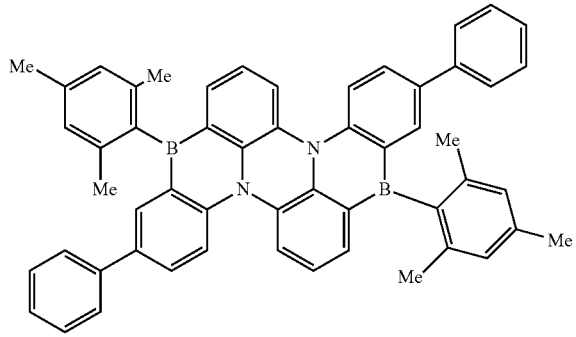
(1-6-139)
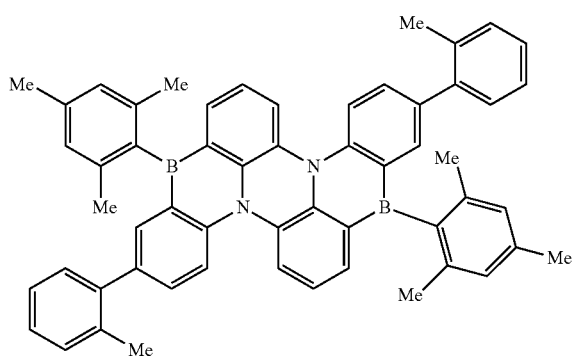
(1-6-140)

159
-continued
(1-6-141)
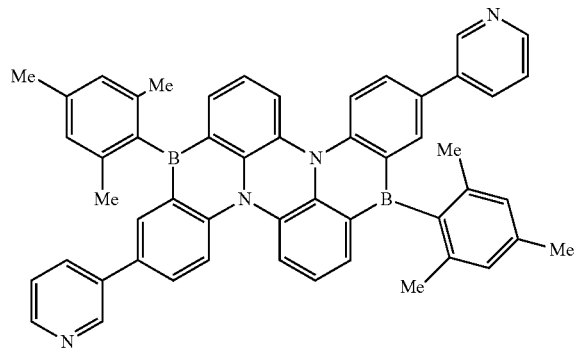
(1-6-142)
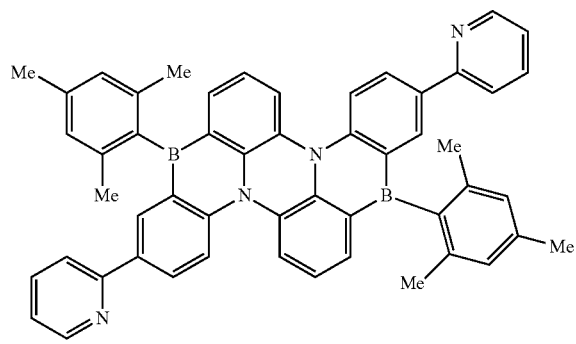
(1-6-143)
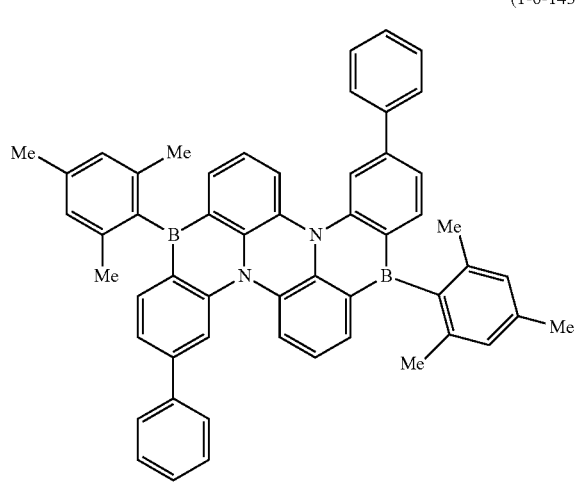
160
-continued
(1-6-144)
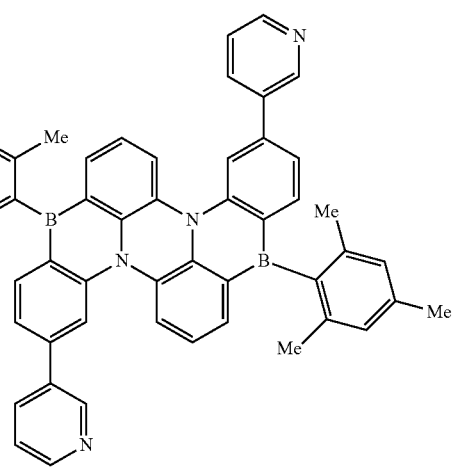
(1-6-145)
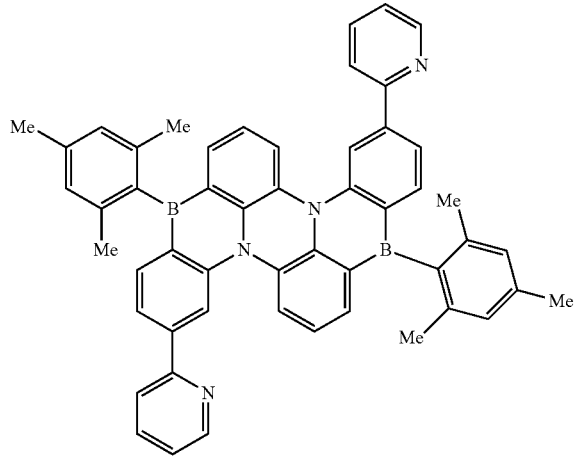
(1-6-146)
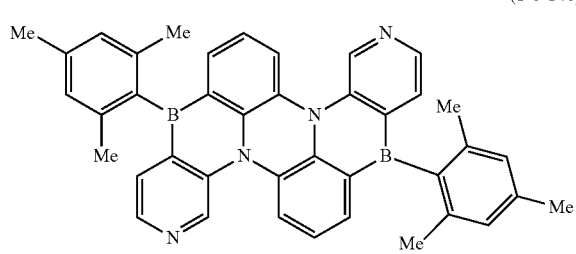
(1-6-147)
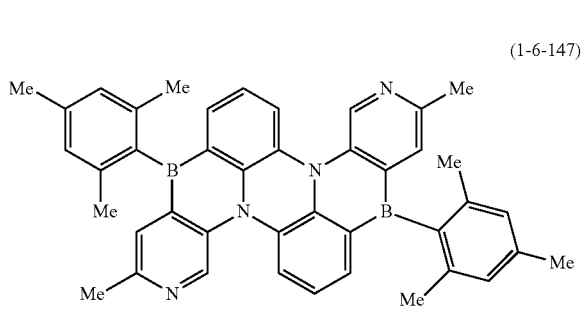

(1-6-148)
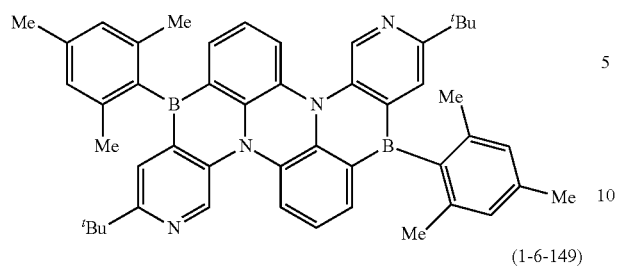
(1-6-149)
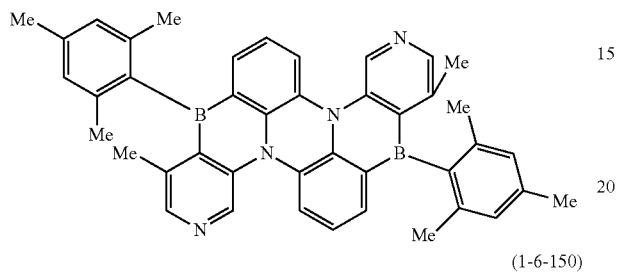
(1-6-150)
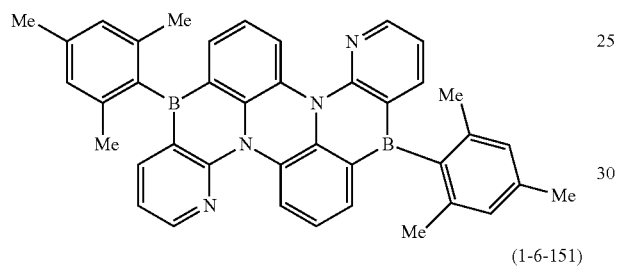
(1-6-151)
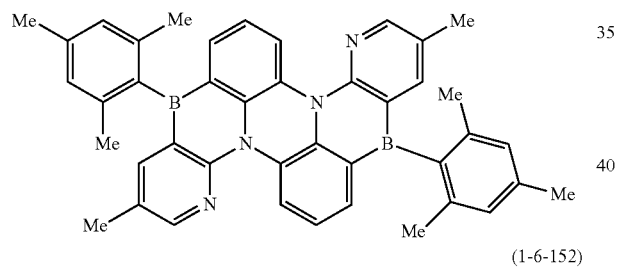
(1-6-152)
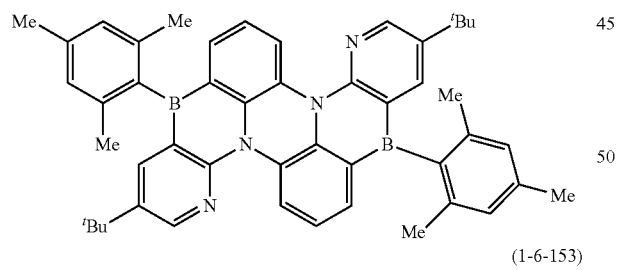
(1-6-153)
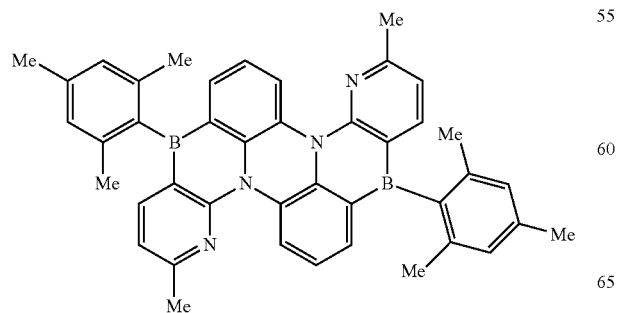
(1-6-154)
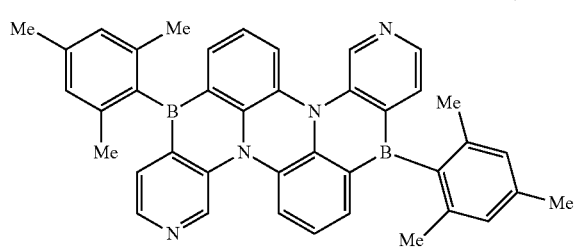
(1-6-155)
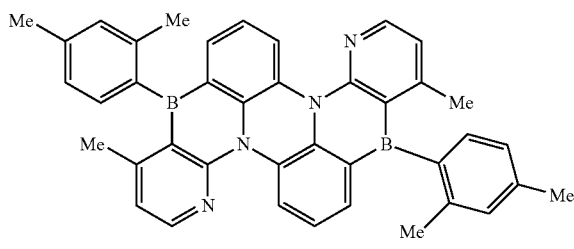
(1-6-161)
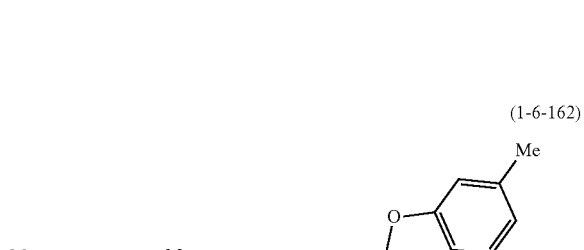
(1-6-162)
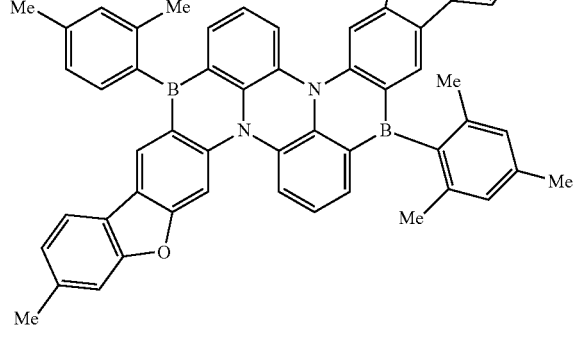

-continued
(1-6-163)
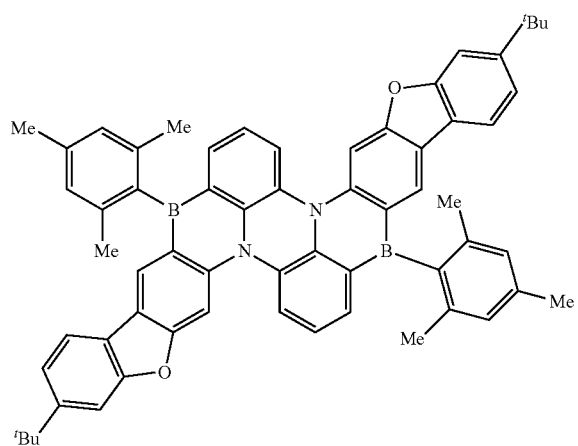
(1-6-164)
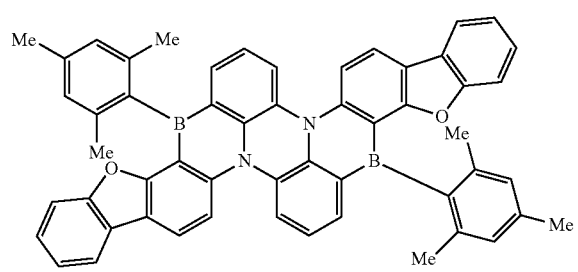
(1-6-165)
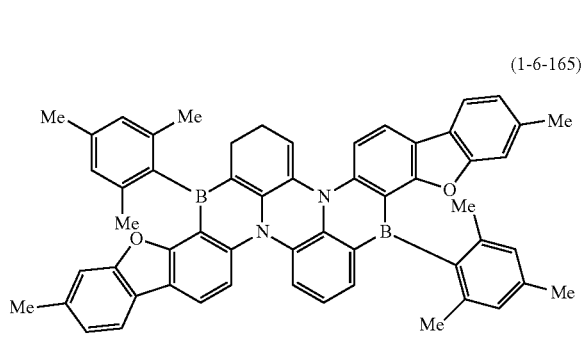
(1-6-166)
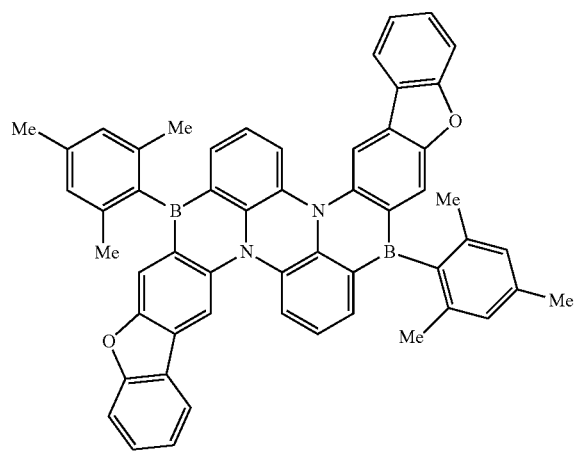
-continued
(1-6-167)
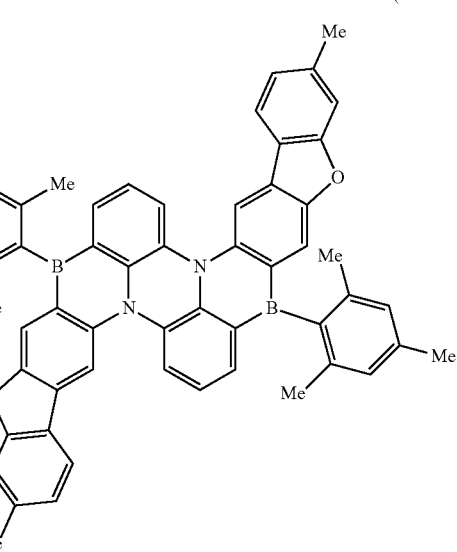
(1-6-168)
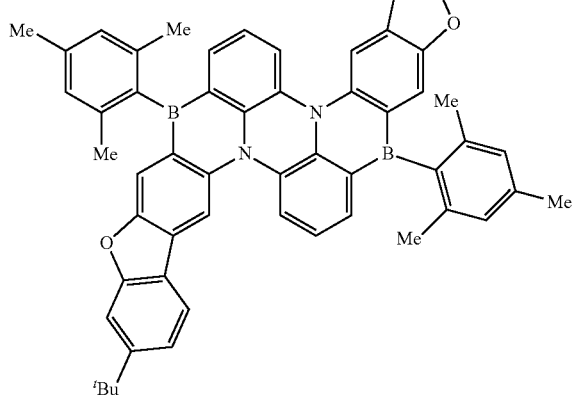
(1-6-169)
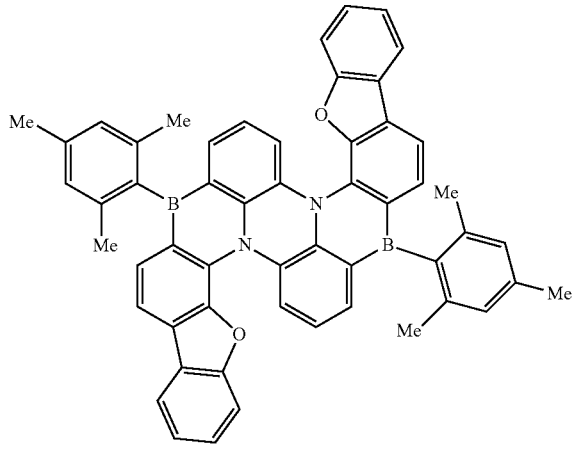

(1-6-170)
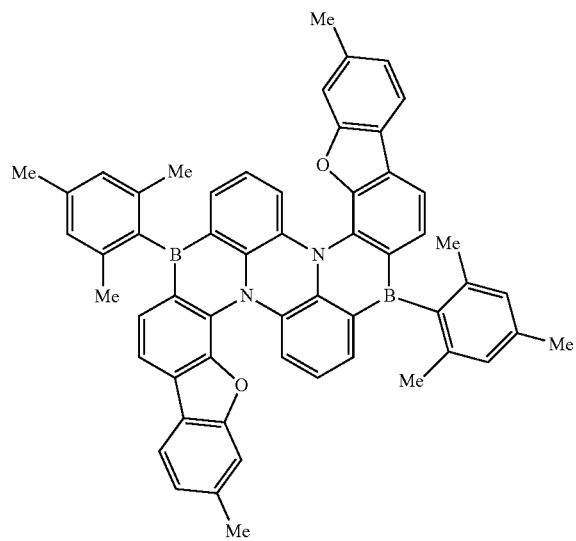
(1-6-177)
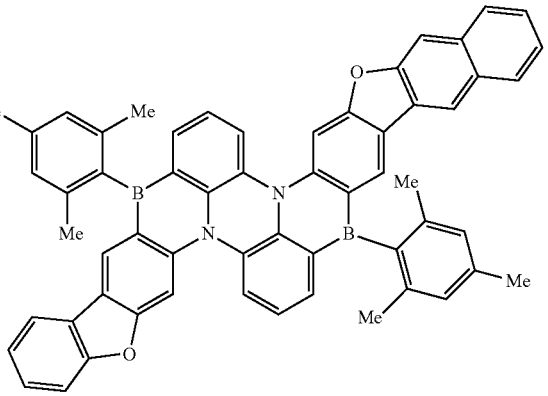
(1-6-171)
(1-6-178)
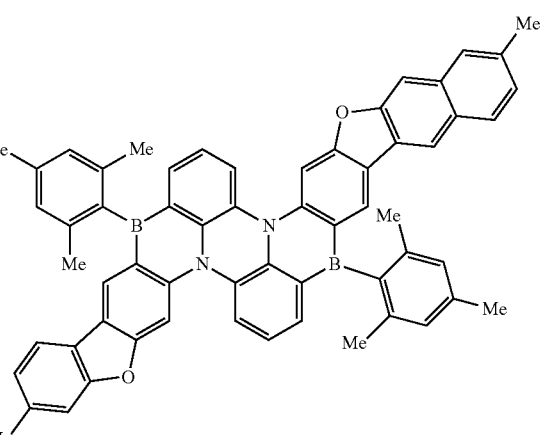
(1-6-179)
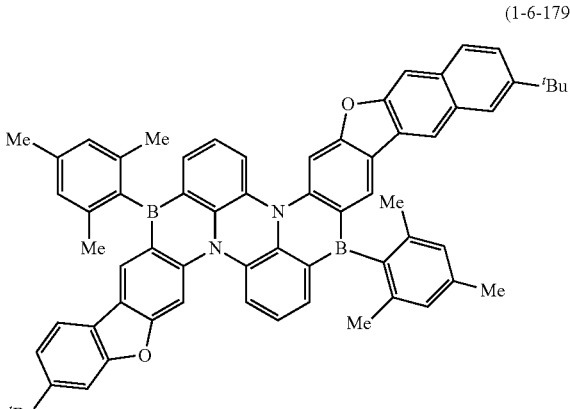
(1-6-172)
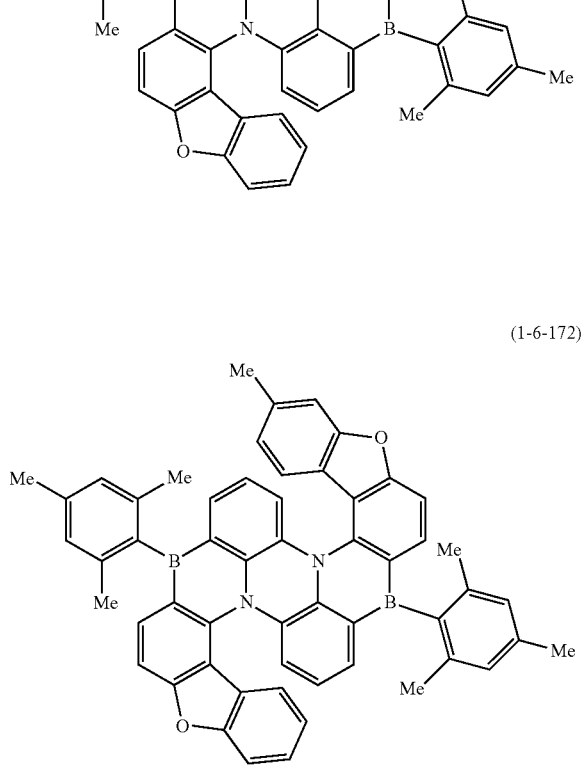
(1-6-180)
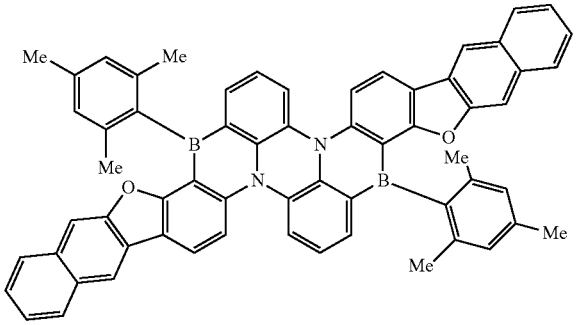

167
-continued
(1-6-181)
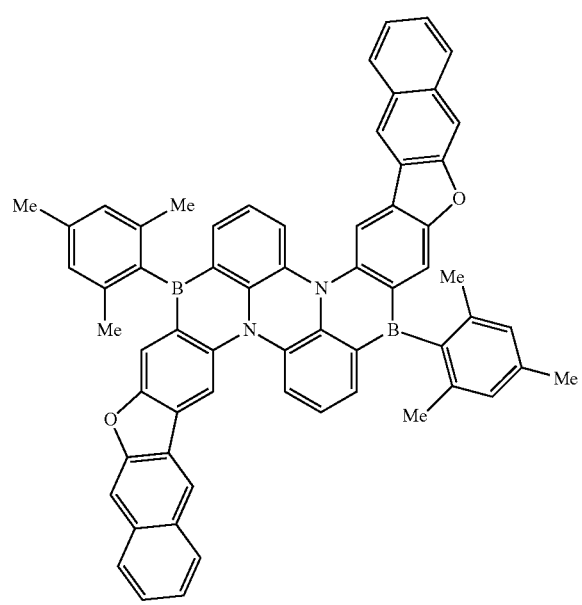
(1-6-182)
(1-6-183)
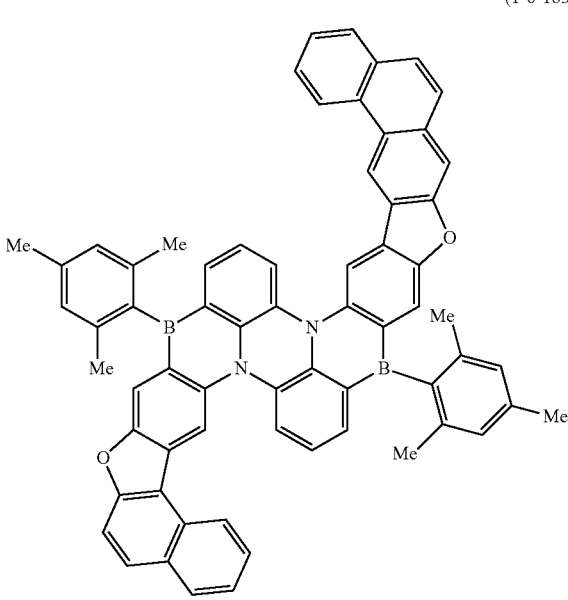
(1-6-184)
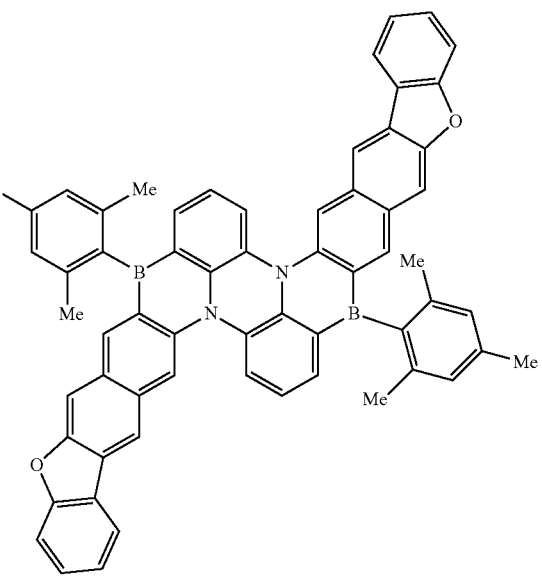

(1-6-185)
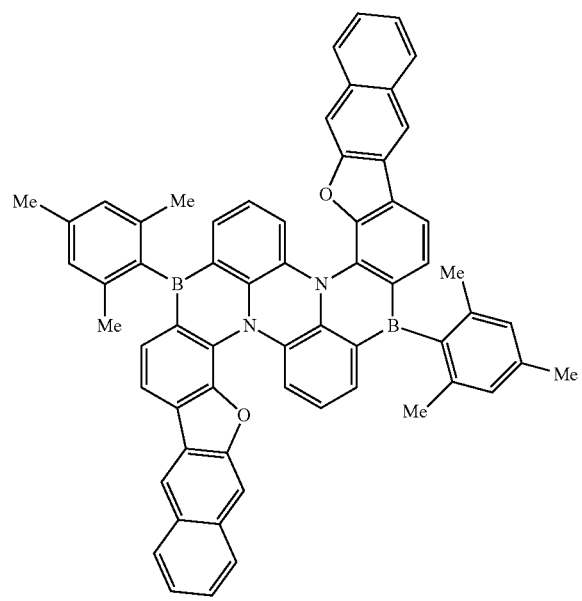
(1-6-192)
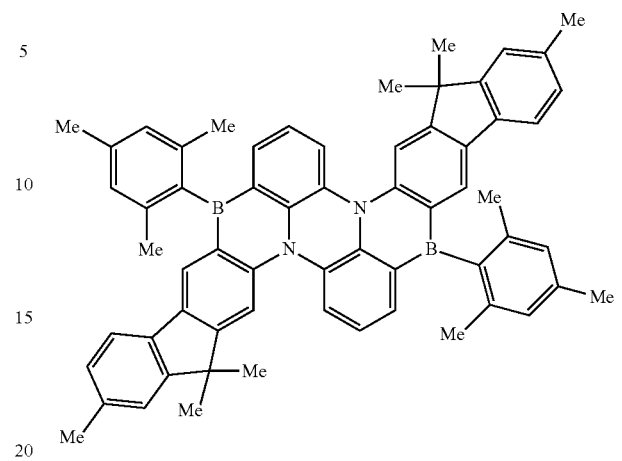
(1-6-186)
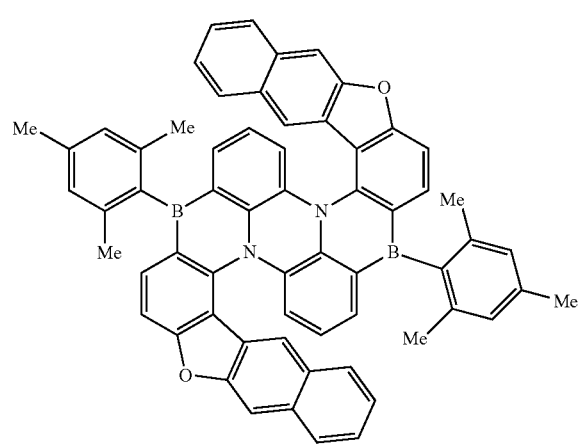
(1-6-193)
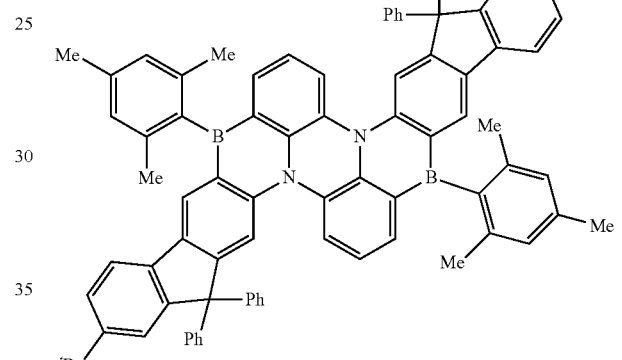
(1-6-194)
(1-6-191)
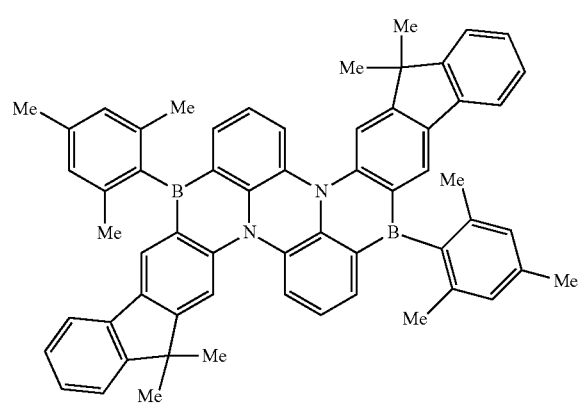
(1-6-195)
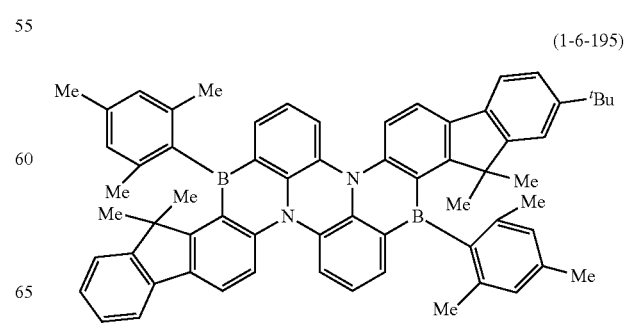

-continued
(1-6-196)
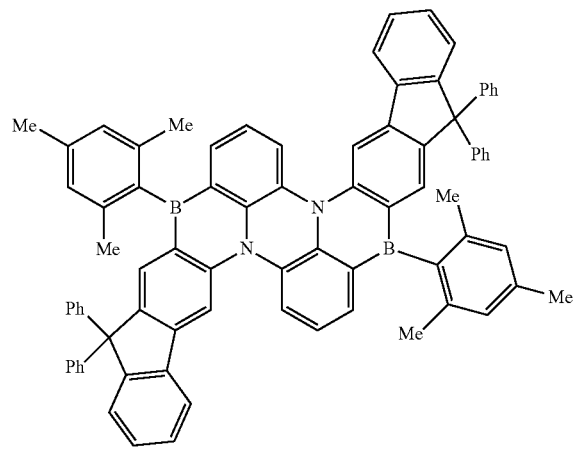
(1-6-199)
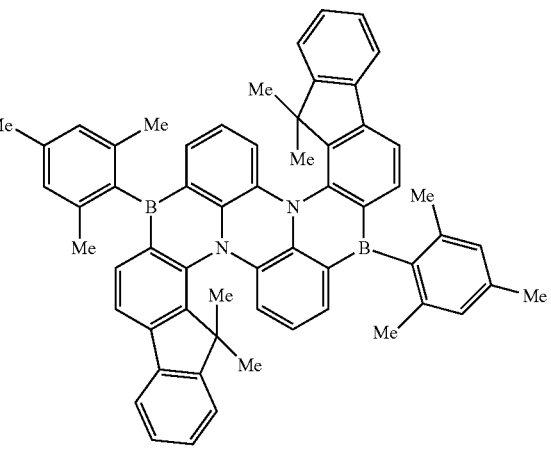
(1-6-197)
(1-6-200)
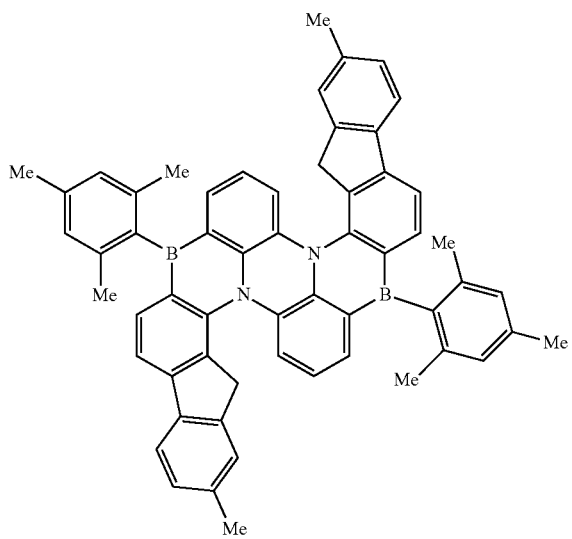
(1-6-198)
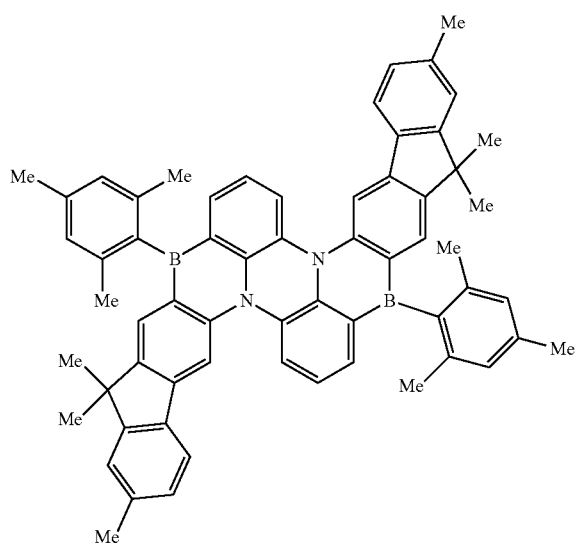
(1-6-201)
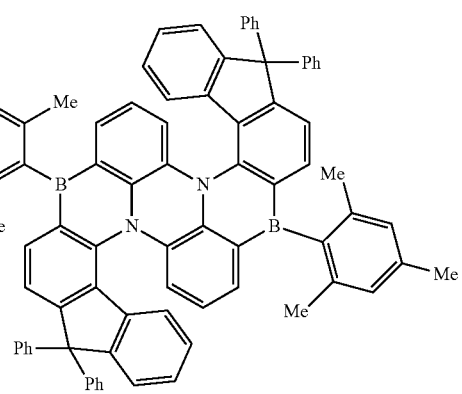

-continued
(1-6-202)
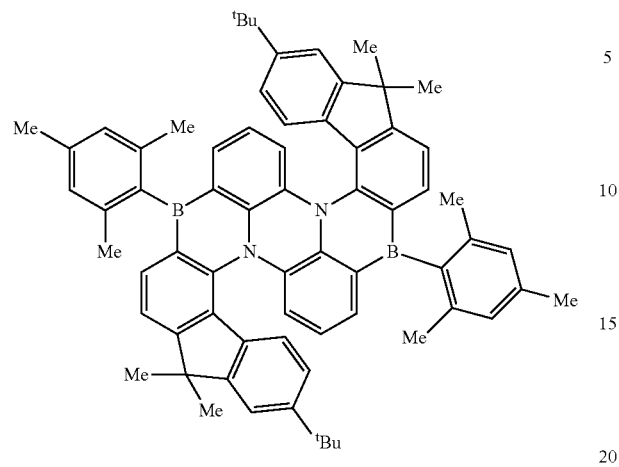
(1-6-208)
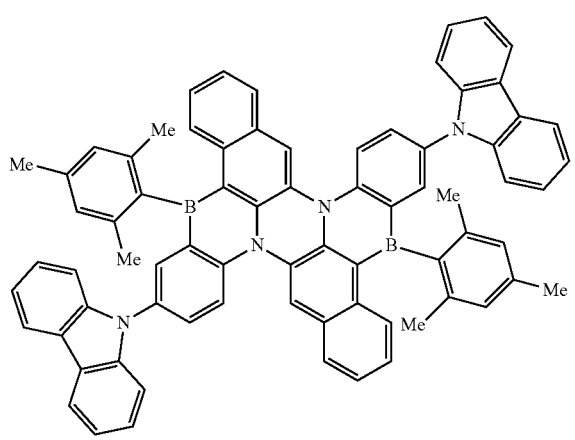
(1-6-209)
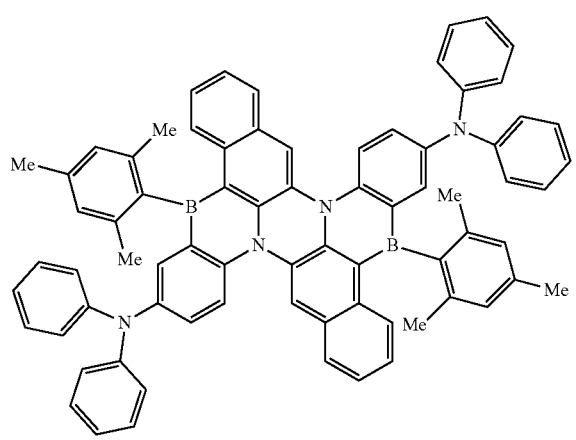
(1-6-210)
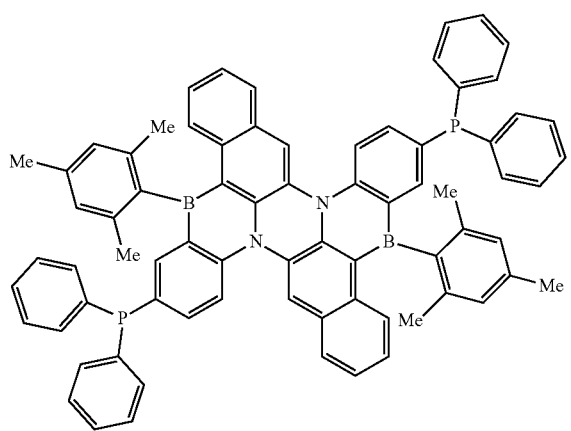
(1-6-211)
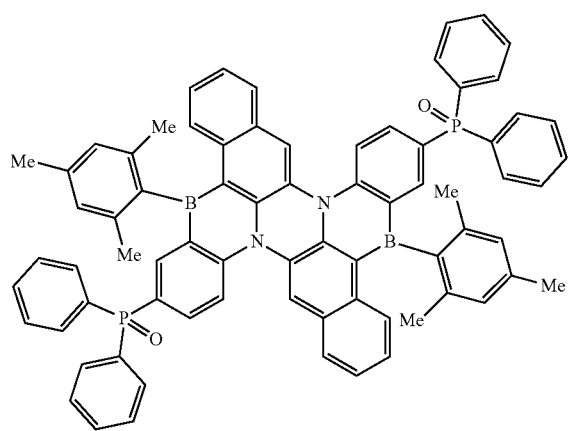

(1-6-212)
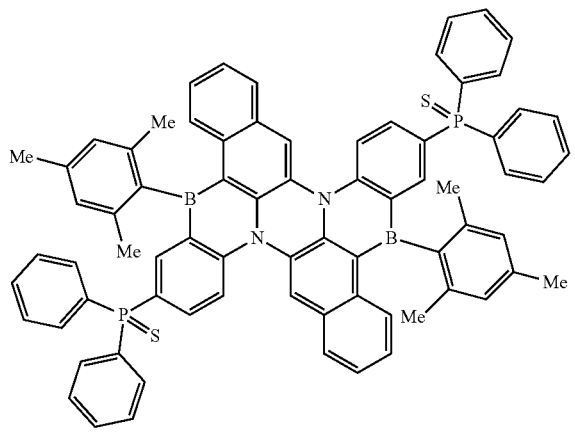
(1-6-213)
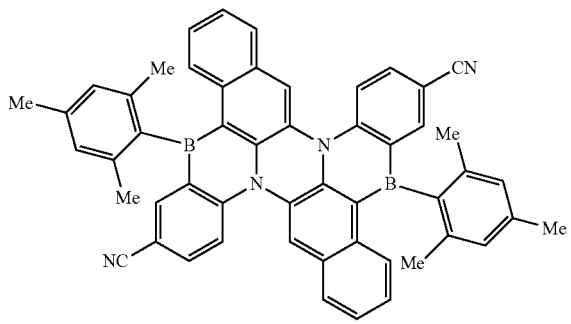
(1-6-214)
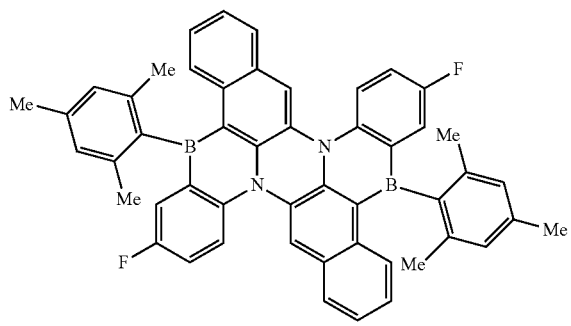
(1-6-215)
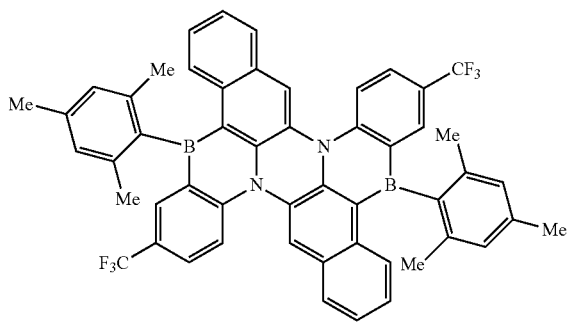
(1-6-216)
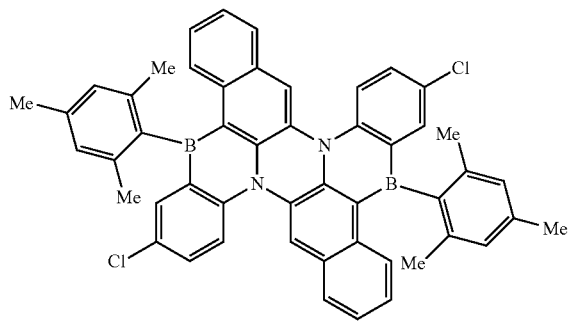
(1-7-1)
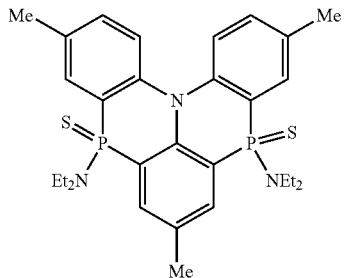
(1-7-2)
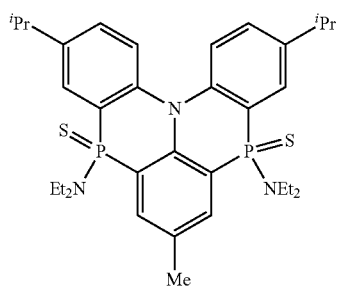
(1-7-3)
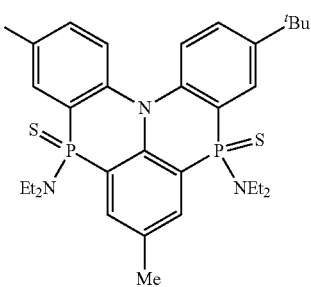

-continued
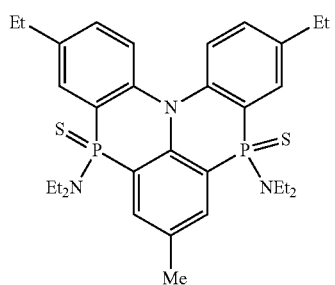
(1-7-4)
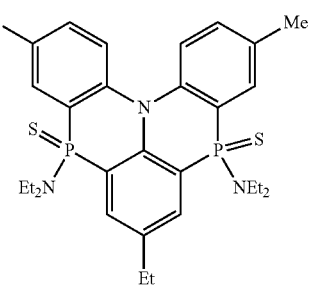
(1-7-5)
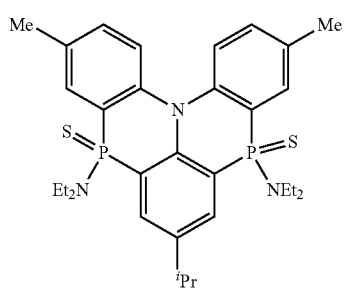
(1-7-6)
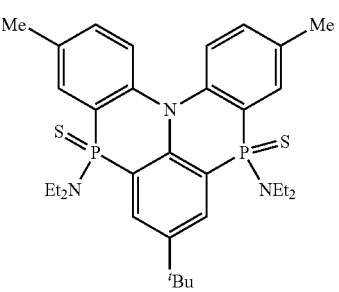
(1-7-7)
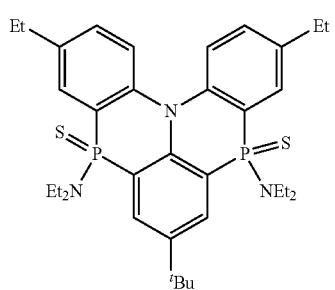
(1-7-8)
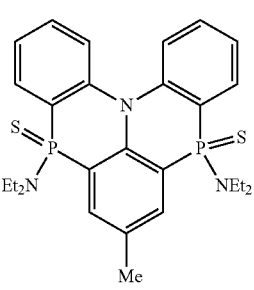
(1-7-9)
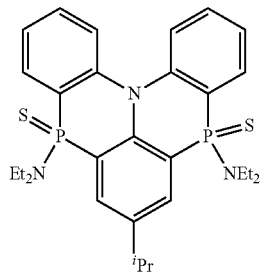
(1-7-10)
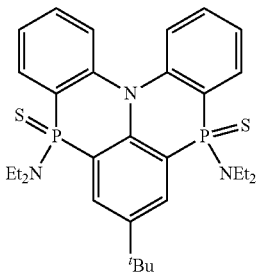
(1-7-11)
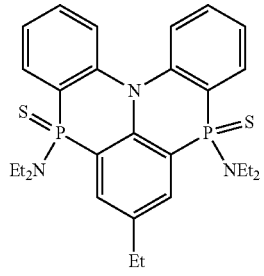
(1-7-12)
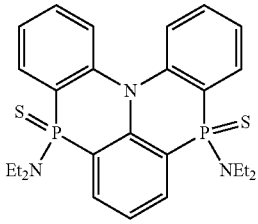
(1-7-13)

-continued
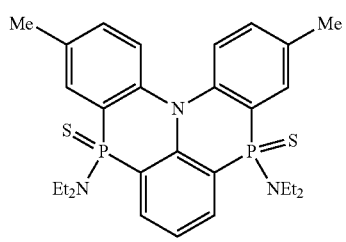
(1-7-14)
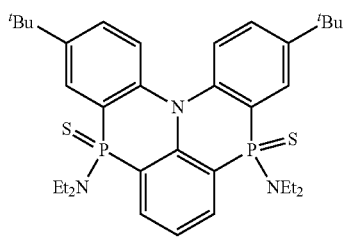
(1-7-15)
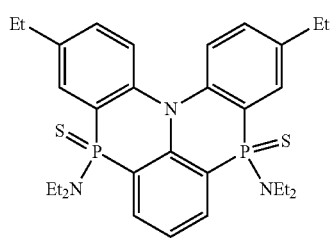
(1-7-16)
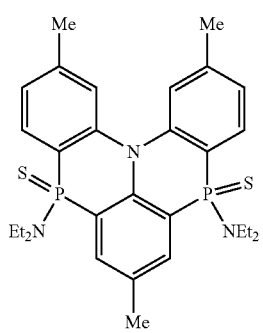
(1-7-17)
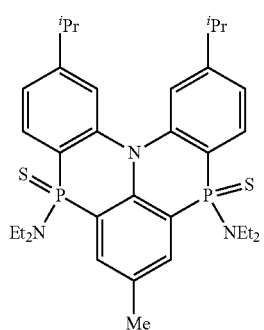
(1-7-18)
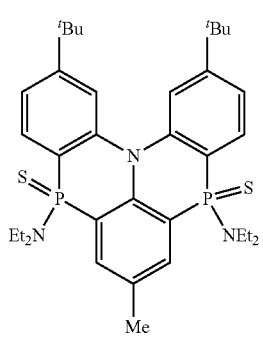
(1-7-19)
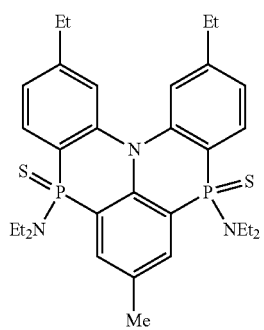
(1-7-20)
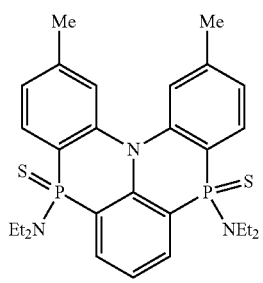
(1-7-21)
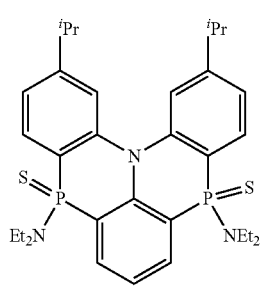
(1-7-22)
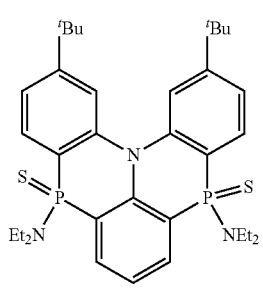
(1-7-23)

-continued
(1-7-24)
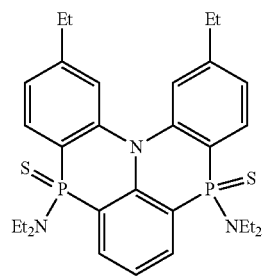
(1-7-30)
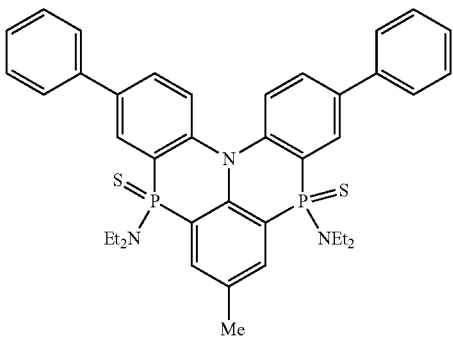
(1-7-31)
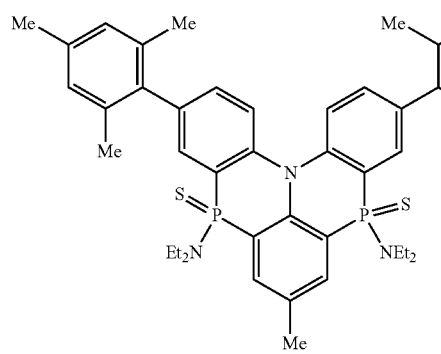
(1-7-32)
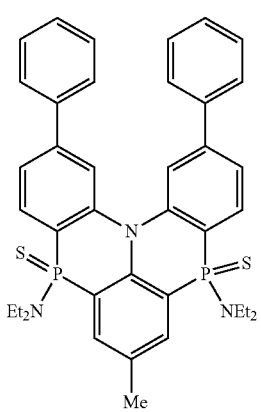
(1-7-33)
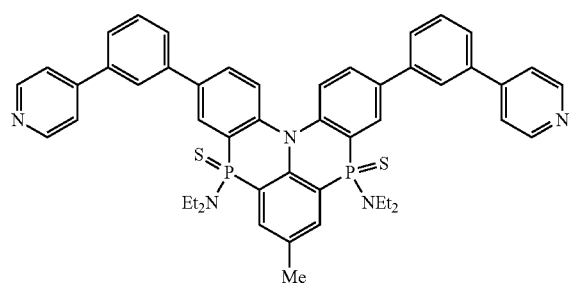
(1-7-34)
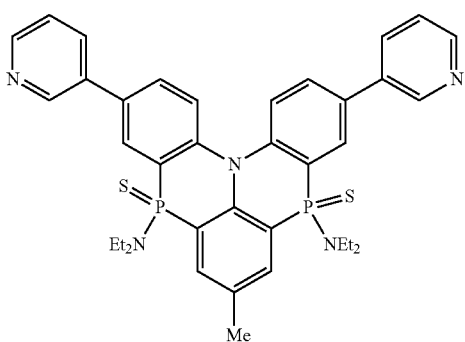
(1-7-35)
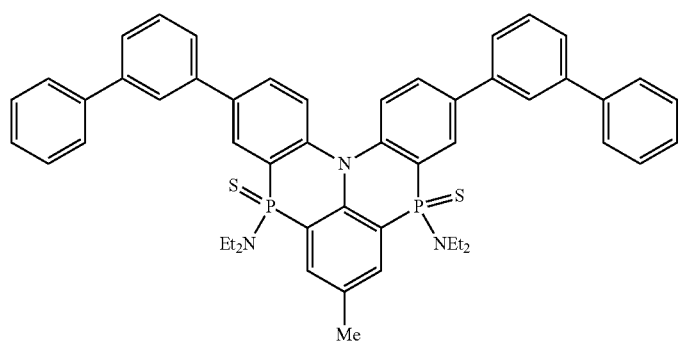

(1-7-36)
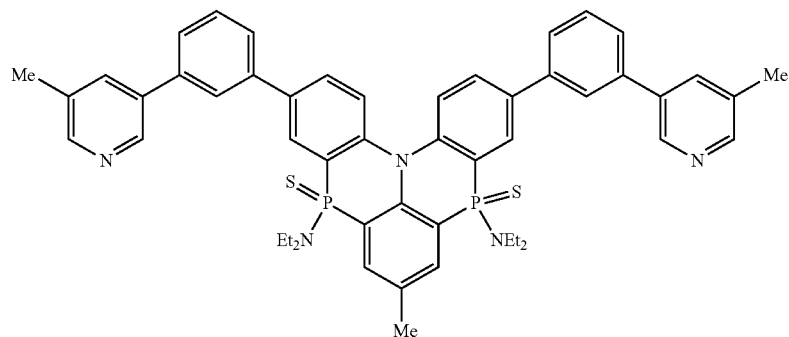
(1-7-37)
(1-7-38)
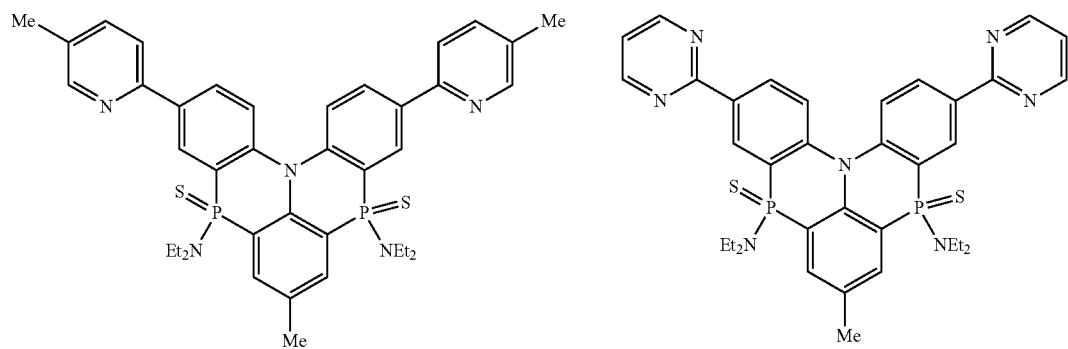
(1-7-39)
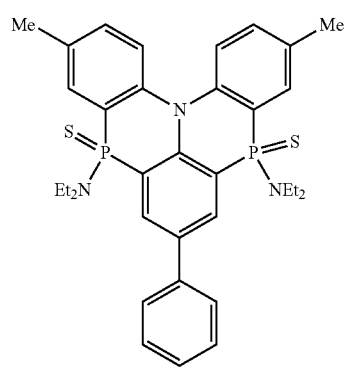
(1-7-40)
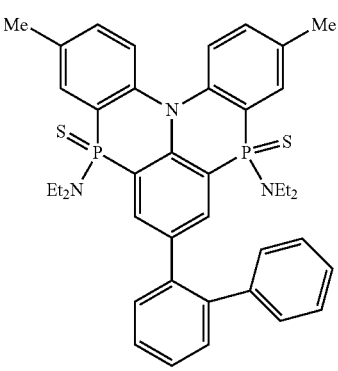
(1-7-41)
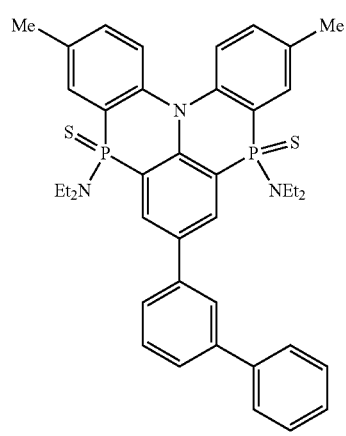
(1-7-42)
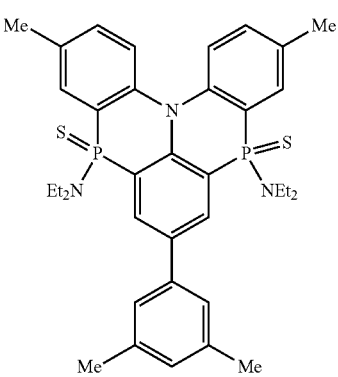

-continued
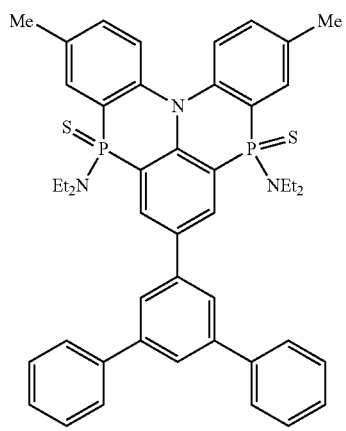 (1-7-43)
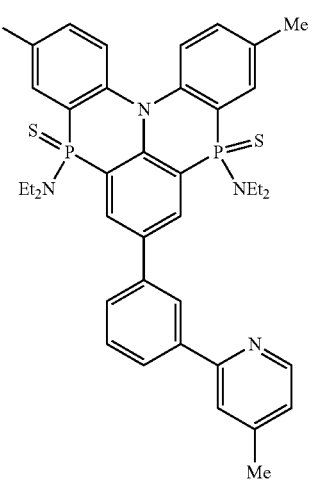 (1-7-44)
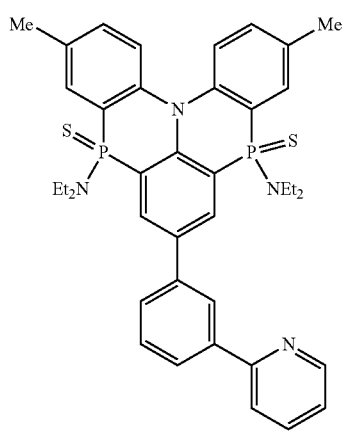 (1-7-45)
(1-7-46)
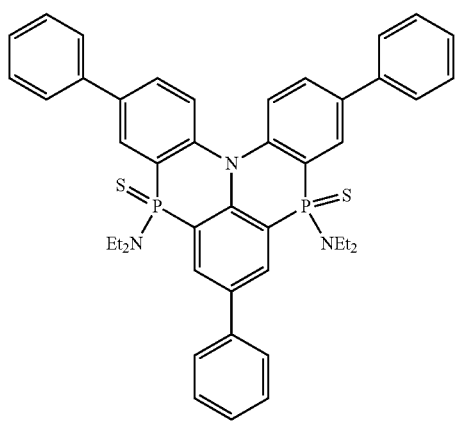 (1-7-47)
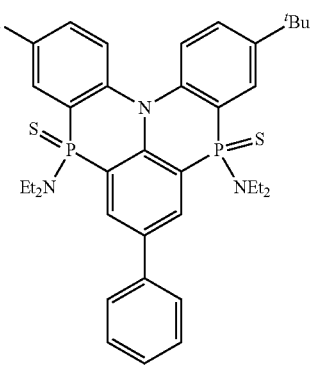 (1-7-48)
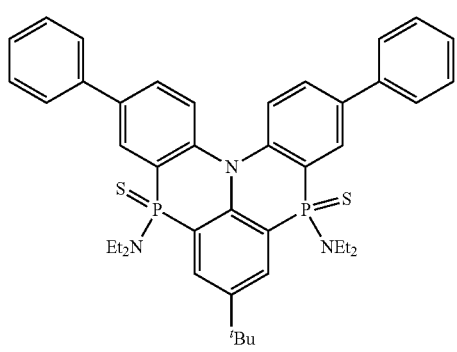 (1-7-49)
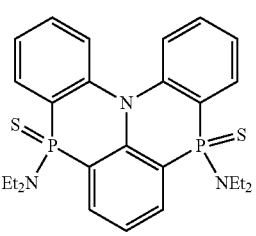 (1-7-55)

(1-7-56)
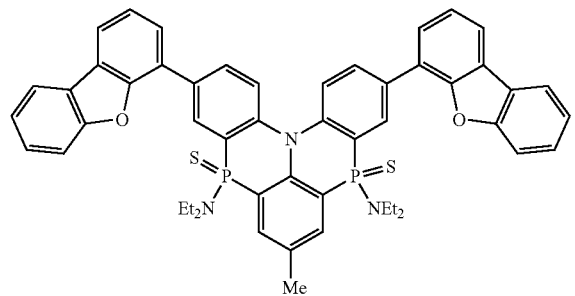
(1-7-57)
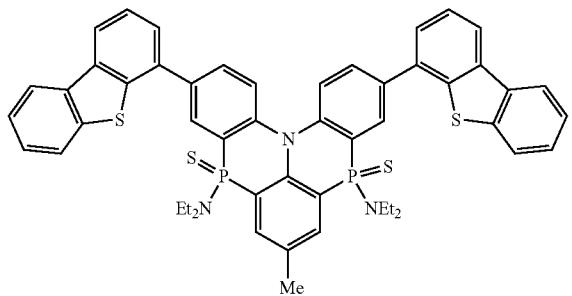
(1-7-58)
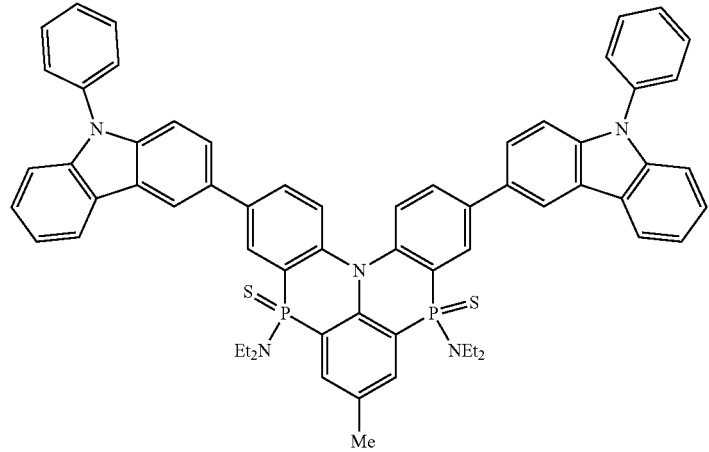
(1-7-59)
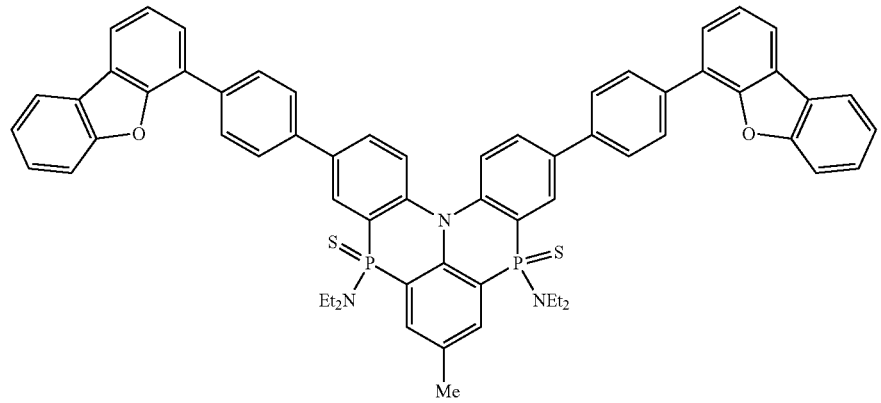
(1-7-60)
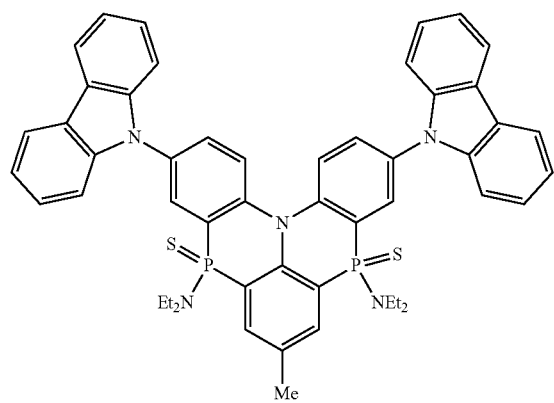
(1-7-61)
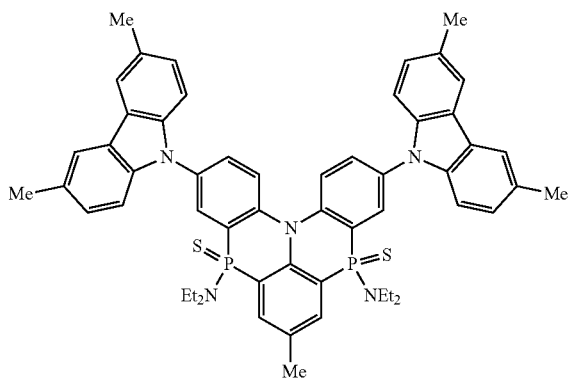

-continued
(1-7-62)
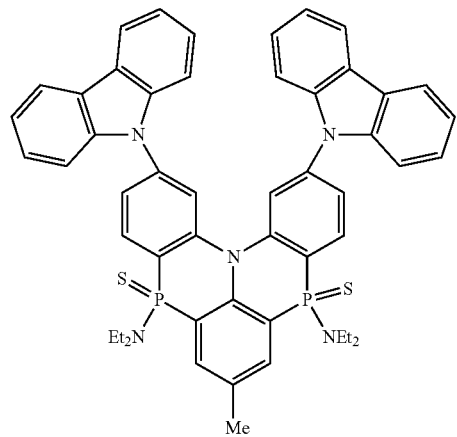
(1-7-63)
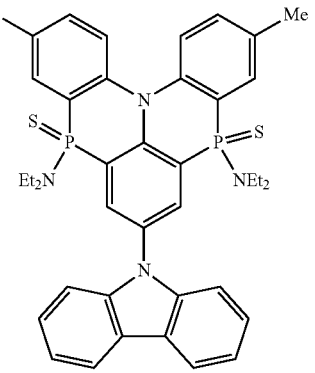
(1-7-64)
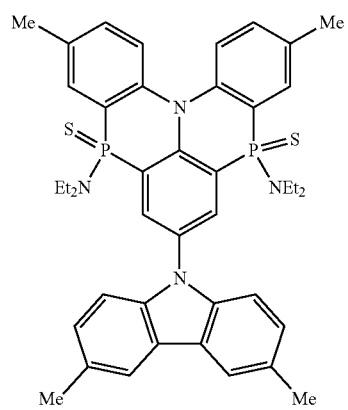
(1-7-65)
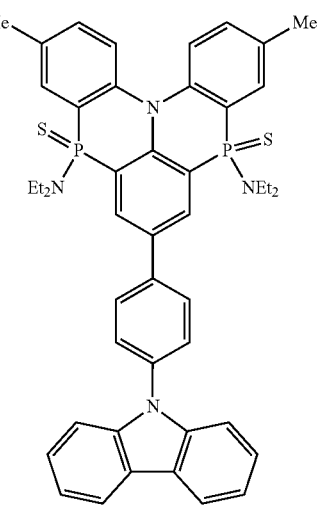
(1-7-66)
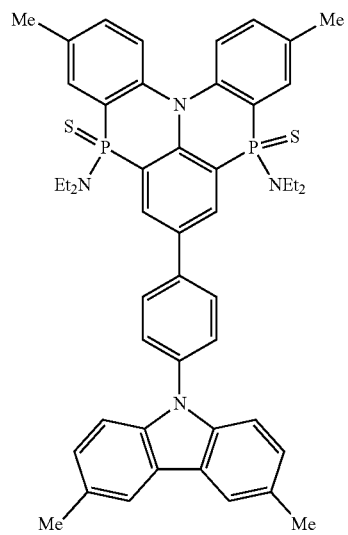
(1-7-67)
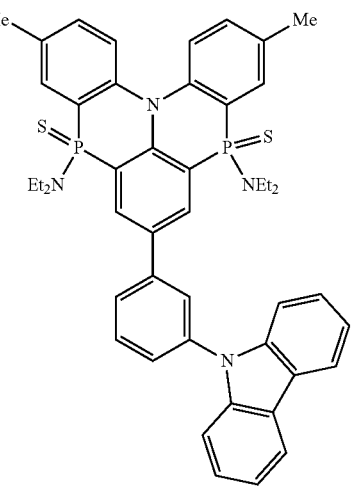

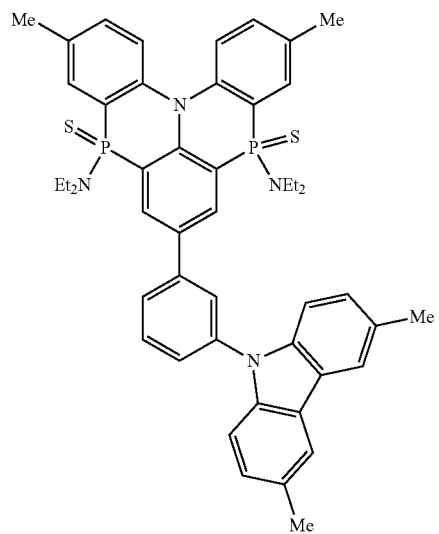
(1-7-68)
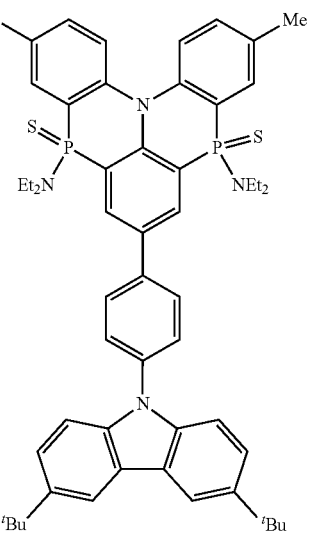
(1-7-69)
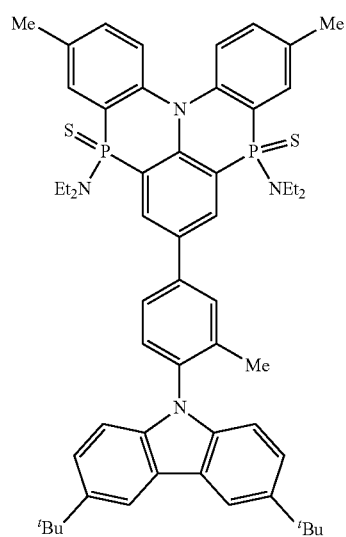
(1-7-70)
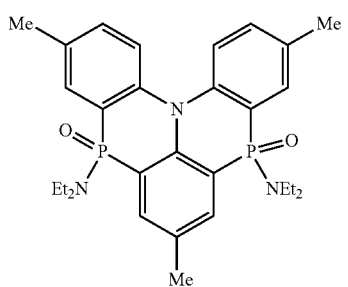
(1-7-75)
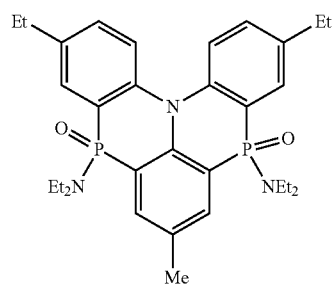
(1-7-76)
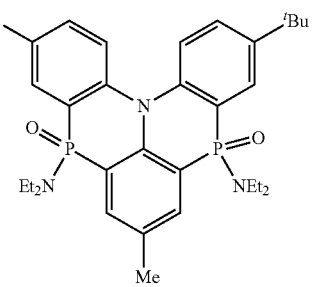
(1-7-77)
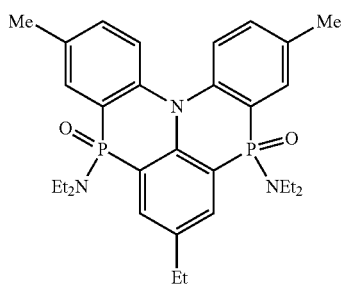
(1-7-78)
(1-7-79)

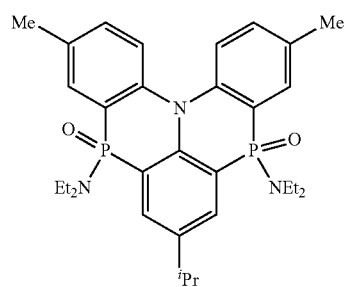
(1-7-80)
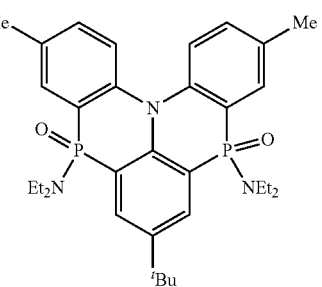
(1-7-81)
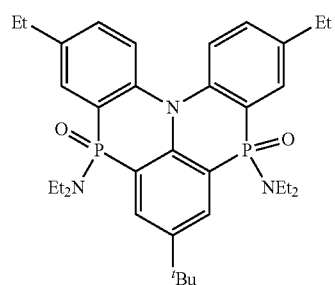
(1-7-82)
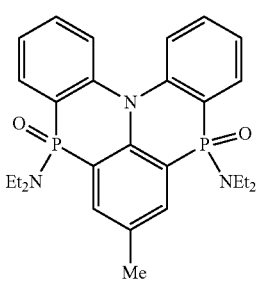
(1-7-83)
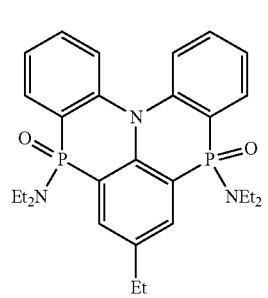
(1-7-84)
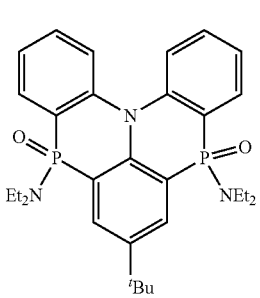
(1-7-85)
(1-7-86)
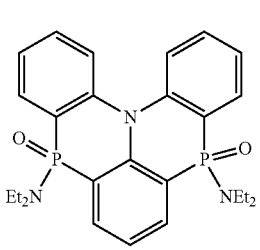
(1-7-87)
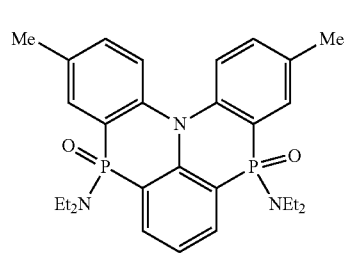
(1-7-88)

-continued
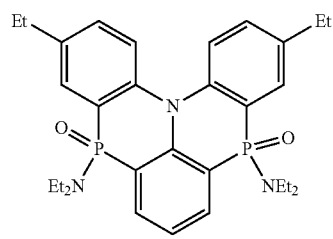
(1-7-90)
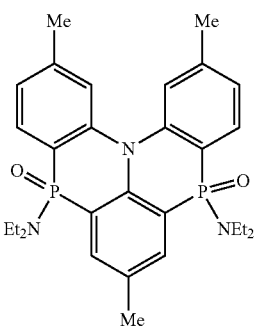
(1-7-91)
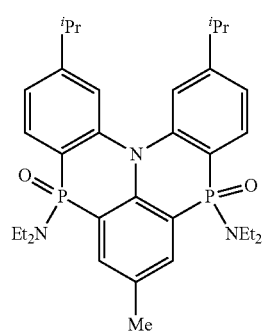
(1-7-92)
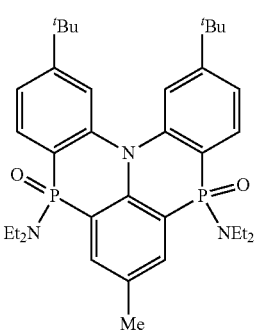
(1-7-93)
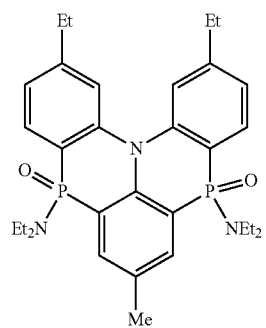
(1-7-94)
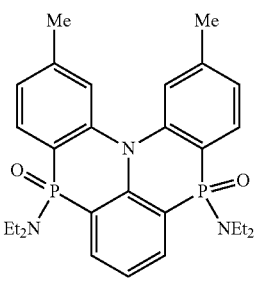
(1-7-95)
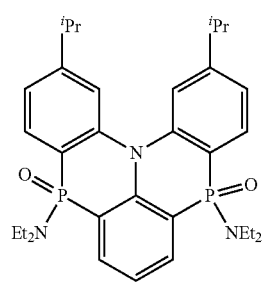
(1-7-96)
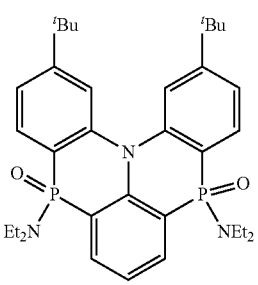
(1-7-97)
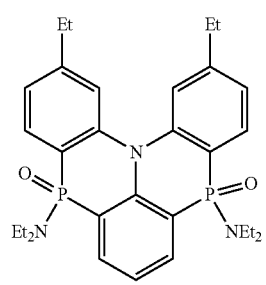
(1-7-98)
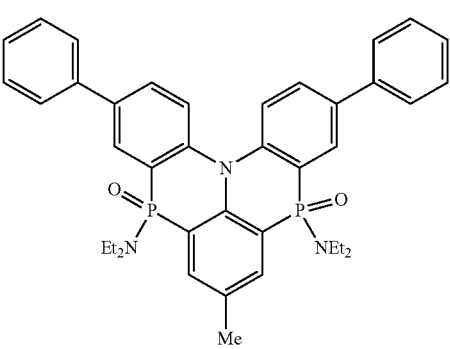
(1-7-105)

-continued
(1-7-106)
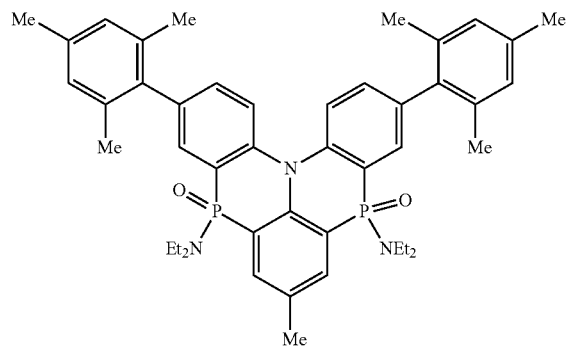
(1-7-107)
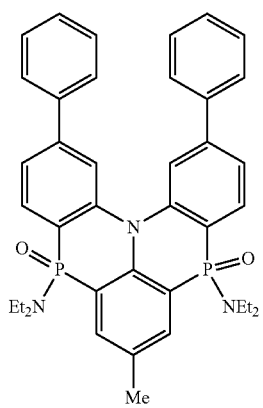
(1-7-108)
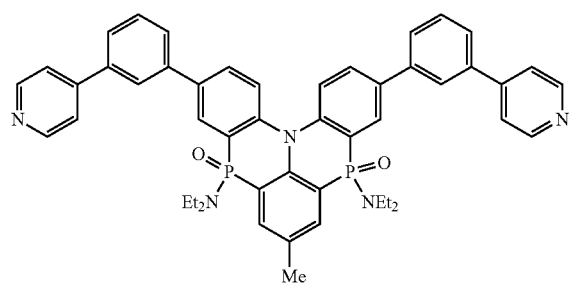
(1-7-109)
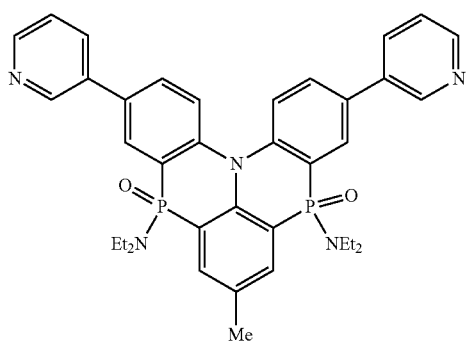
(1-7-110)
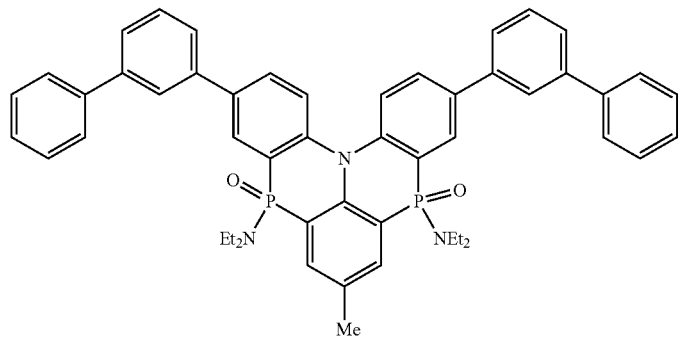
(1-7-111)
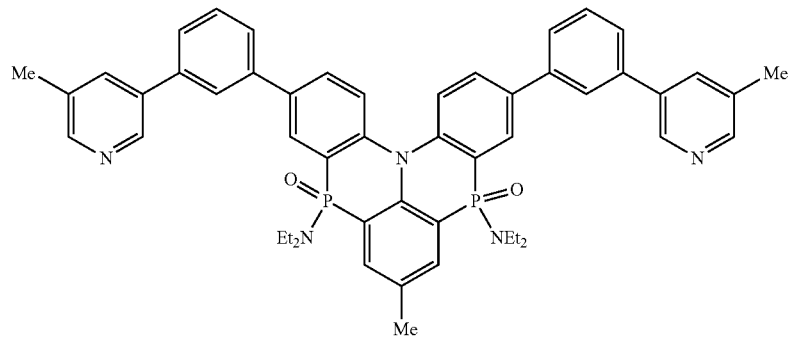

-continued
(1-7-112)
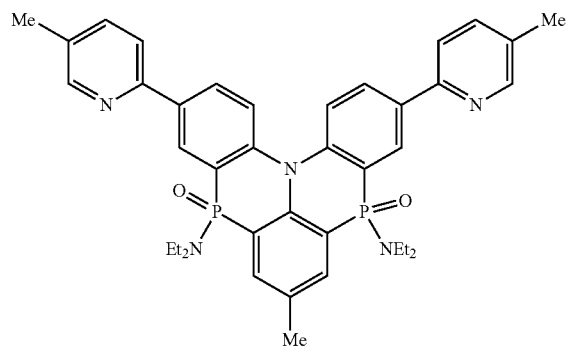
(1-7-113)
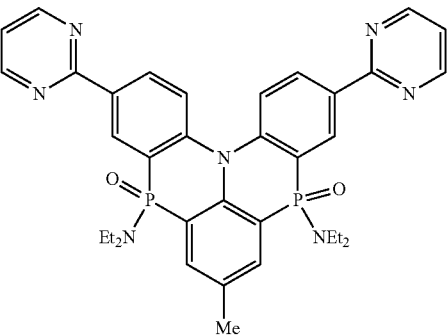
(1-7-114)
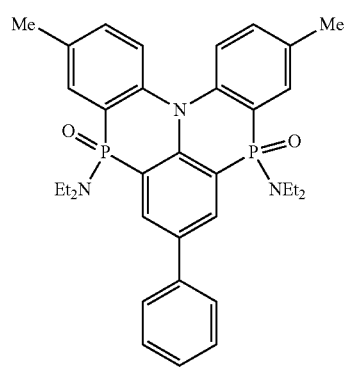
(1-7-115)
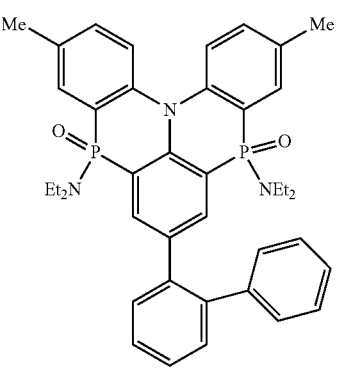
(1-7-116)
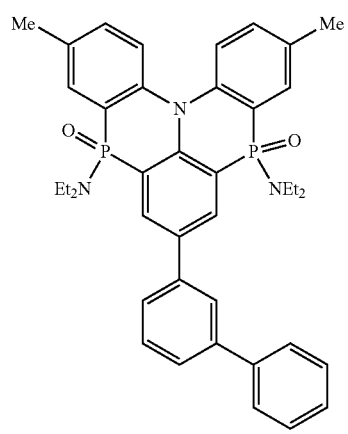
(1-7-117)
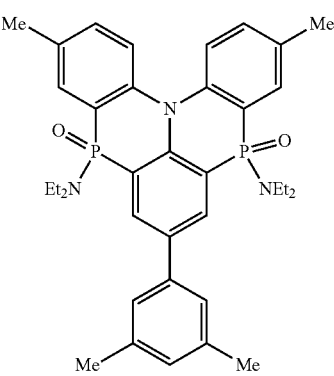
(1-7-118)
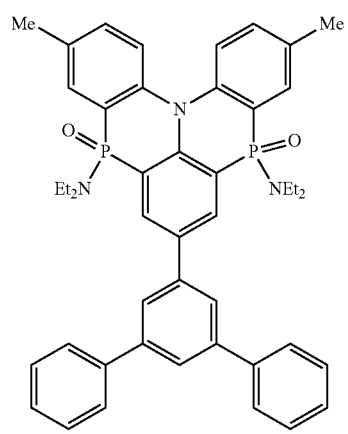
(1-7-119)
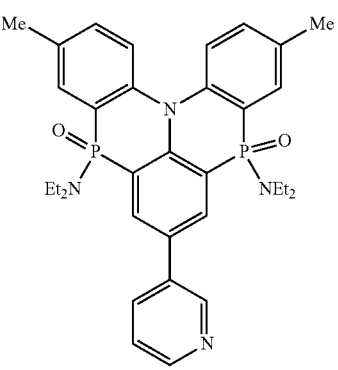

-continued
(1-7-120) 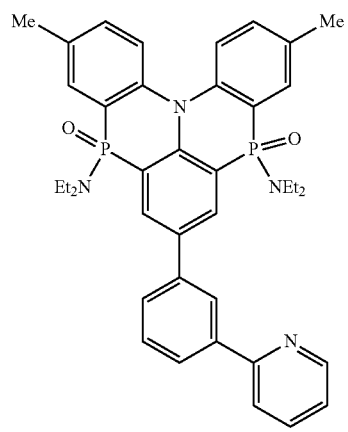
(1-7-121) 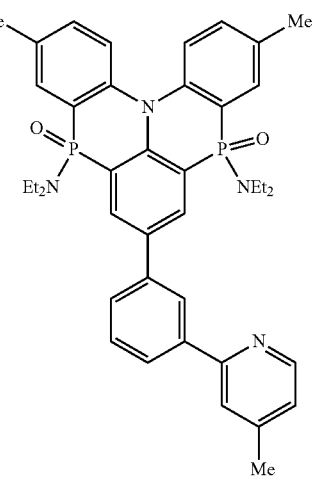
(1-7-122) 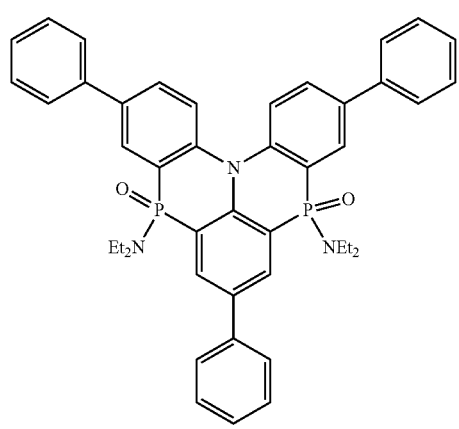
(1-7-123) 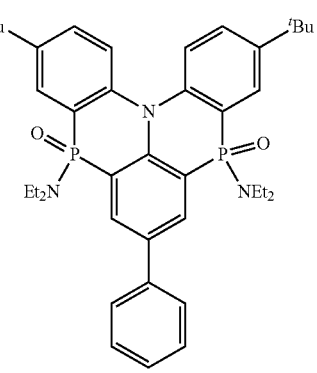
(1-7-124) 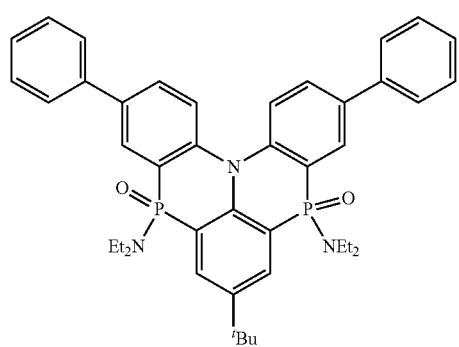
(1-7-130) 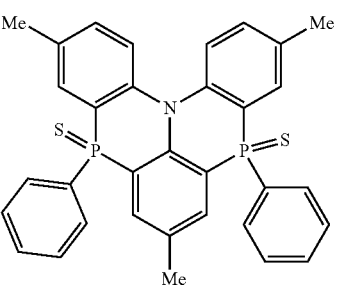
(1-7-131) 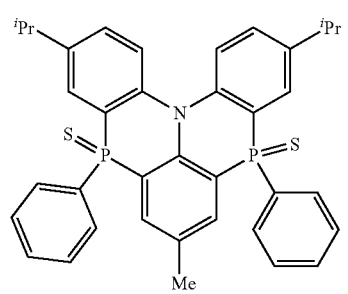
(1-7-132) 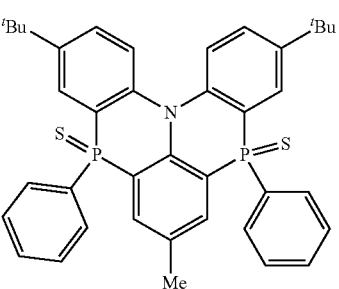

-continued
(1-7-133) 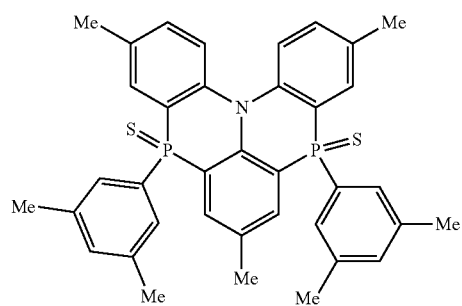
(1-7-134) 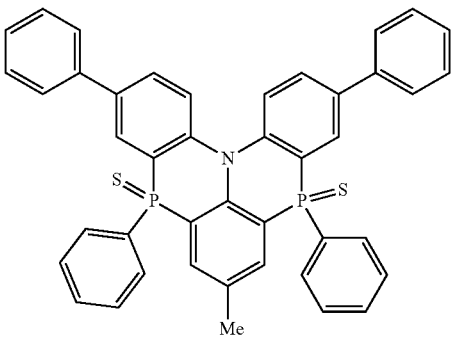
(1-7-135) 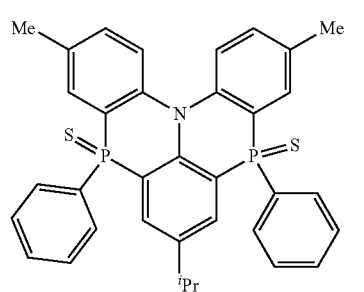
(1-7-136) 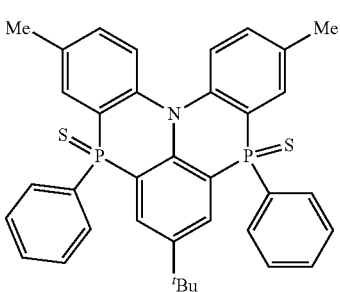
(1-7-137) 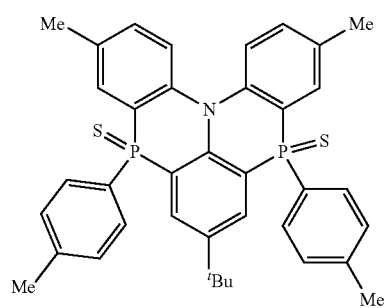
(1-7-138) 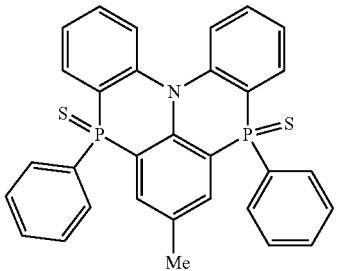
(1-7-139) 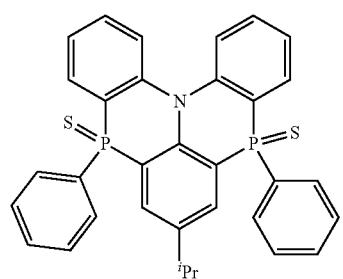
(1-7-140) 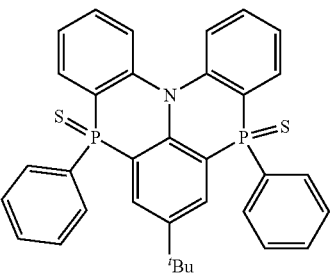
(1-7-141) 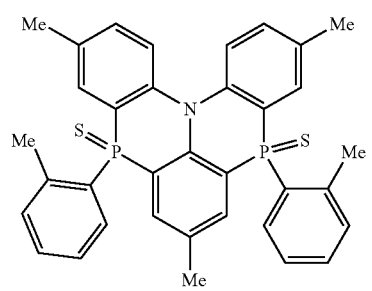
(1-7-142) 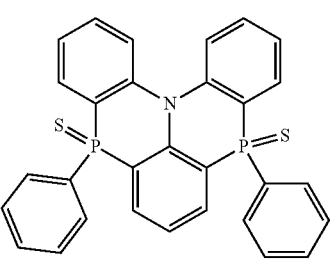

-continued
(1-7-143)
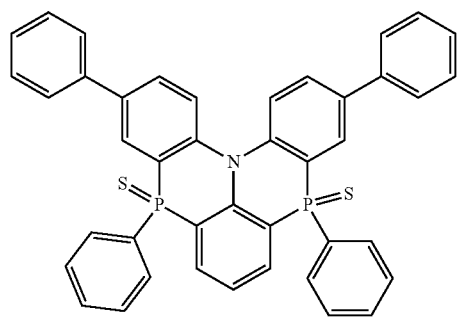
(1-7-144)
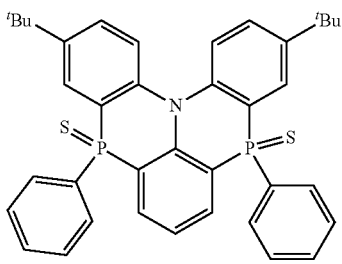
(1-7-145)
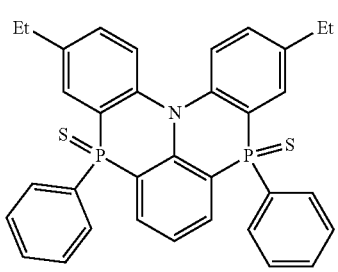
(1-7-146)
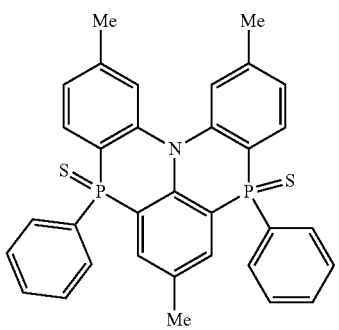
(1-7-147)
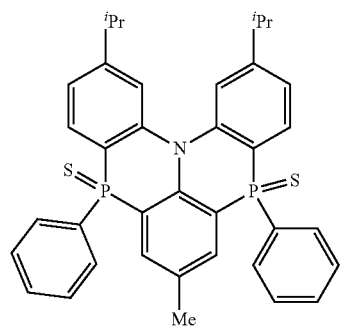
(1-7-148)
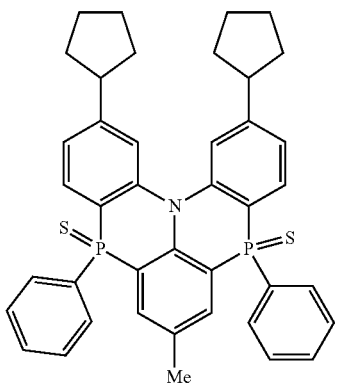
(1-7-149)
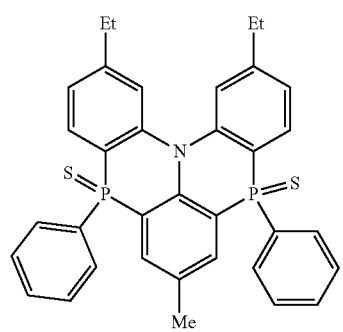
(1-7-150)
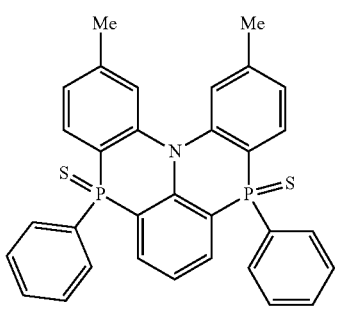

-continued
(1-7-151)
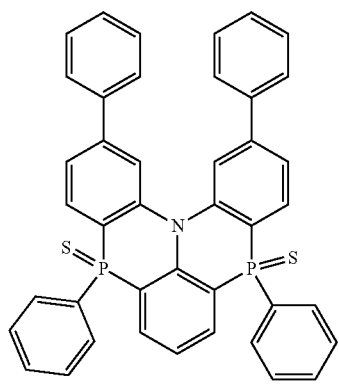
(1-7-152)
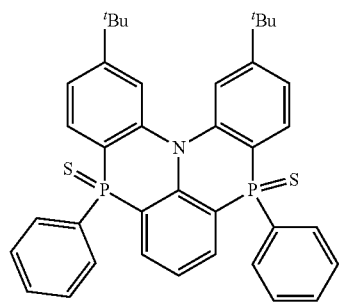
(1-7-153)
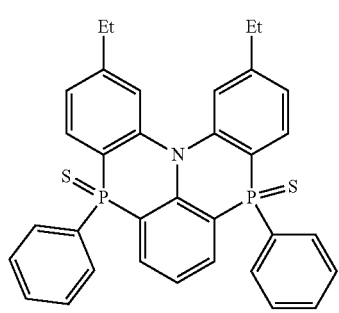
(1-7-158)
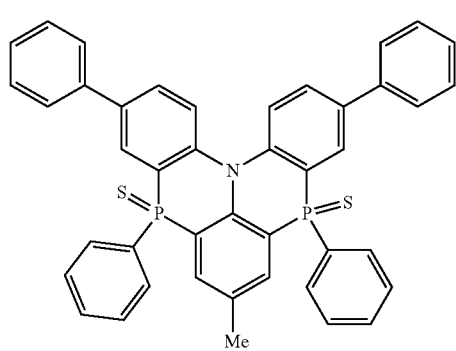
(1-7-159)
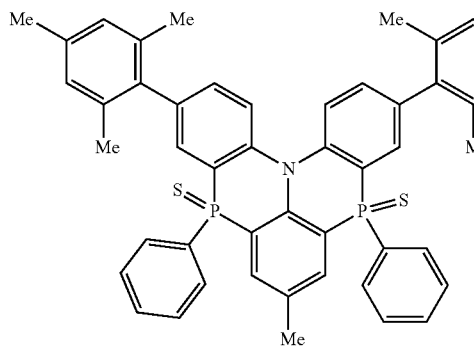
(1-7-160)
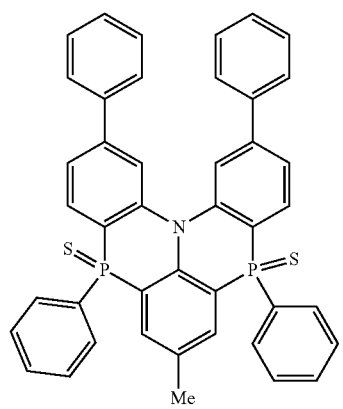
(1-7-161)
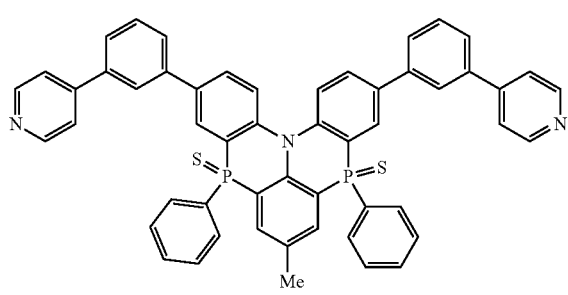
(1-7-162)
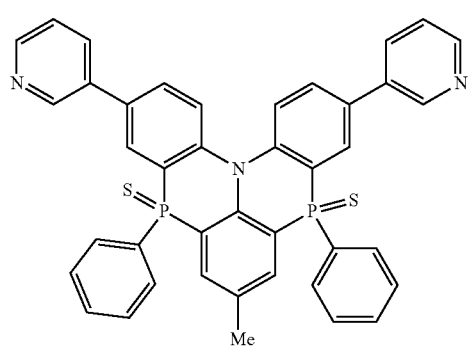

-continued
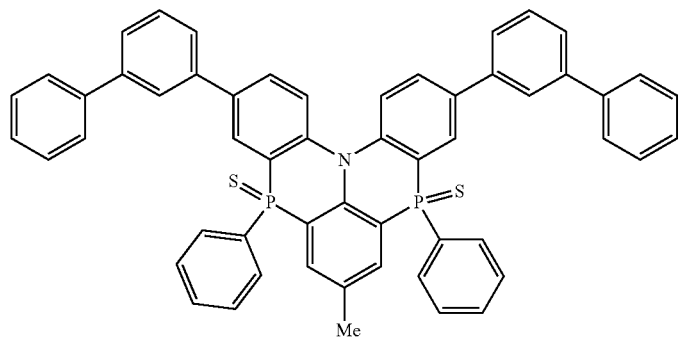
(1-7-163)
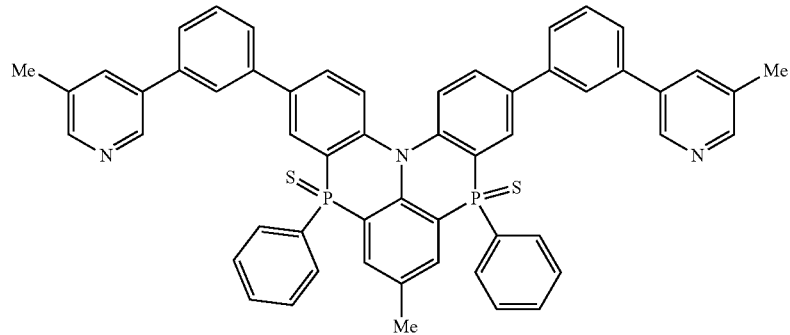
(1-7-164)
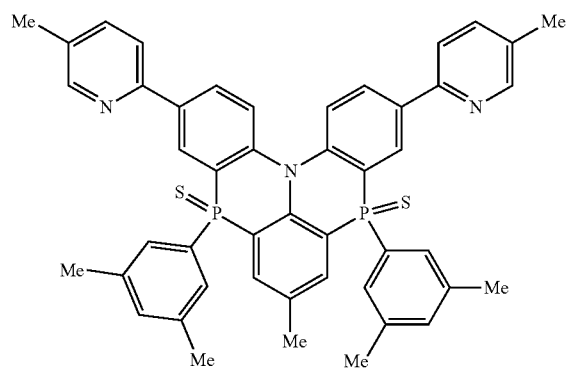
(1-7-165)
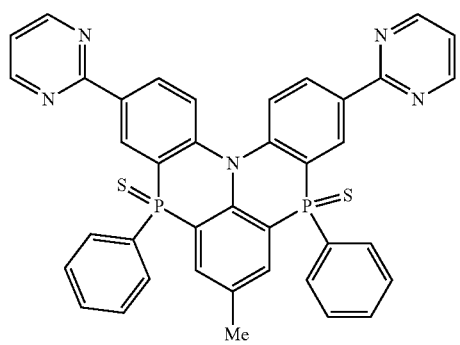
(1-7-166)
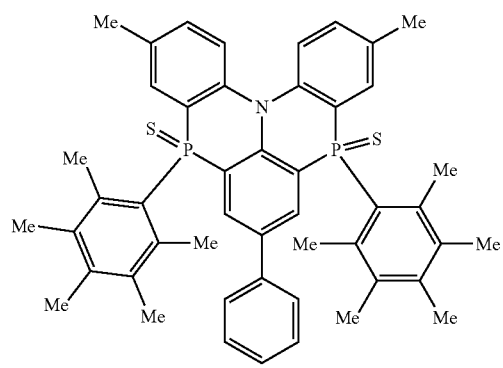
(1-7-167)
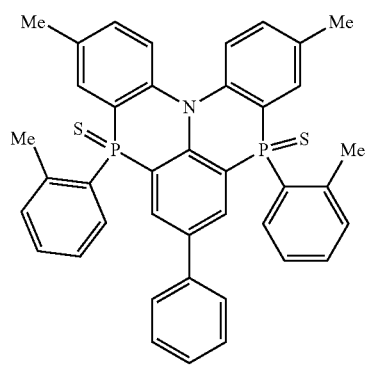
(1-7-168)

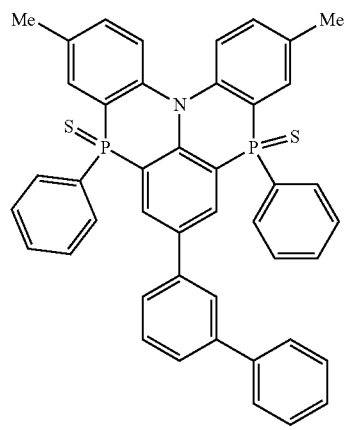
(1-7-169)
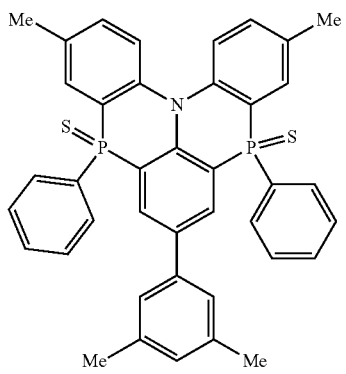
(1-7-170)
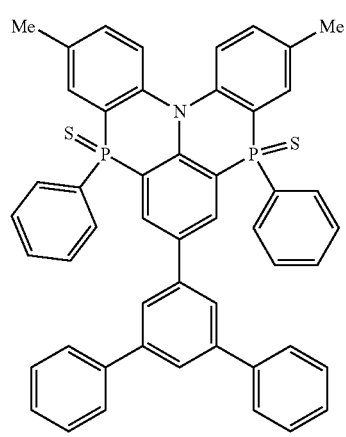
(1-7-171)
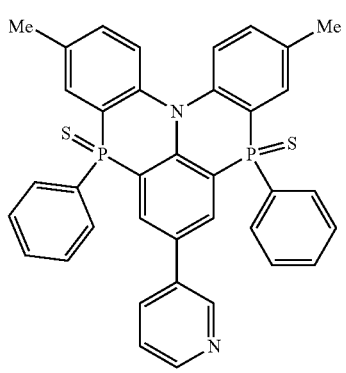
(1-7-172)
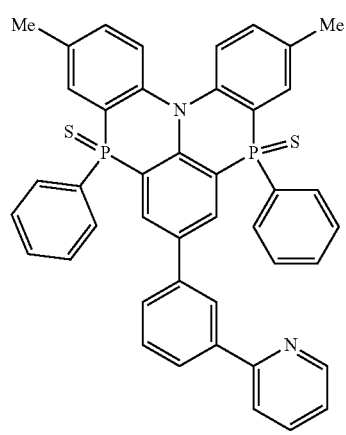
(1-7-173)
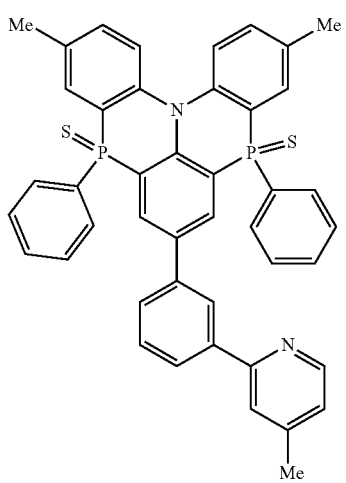
(1-7-174)

-continued
(1-7-175)
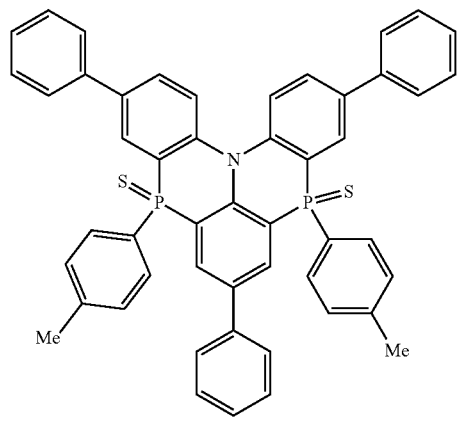
(1-7-176)
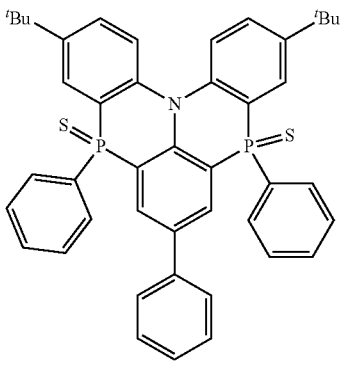
(1-7-177)
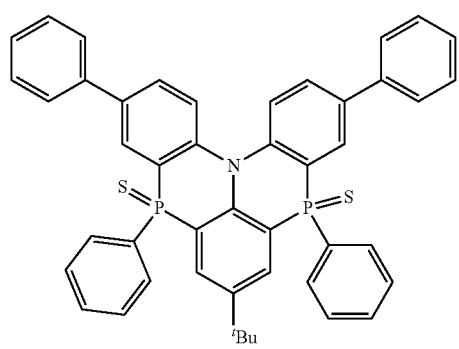
(1-7-185)
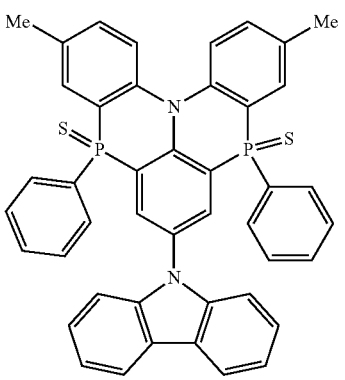
(1-7-186)
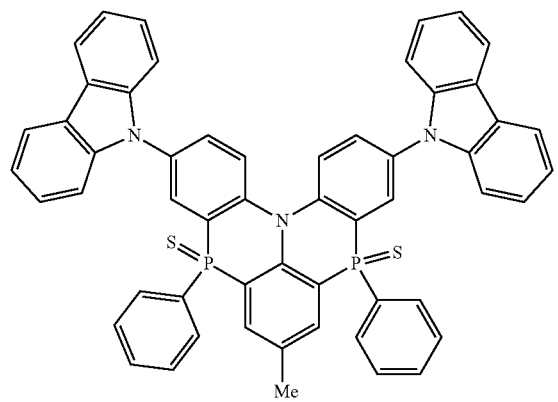
(1-7-187)
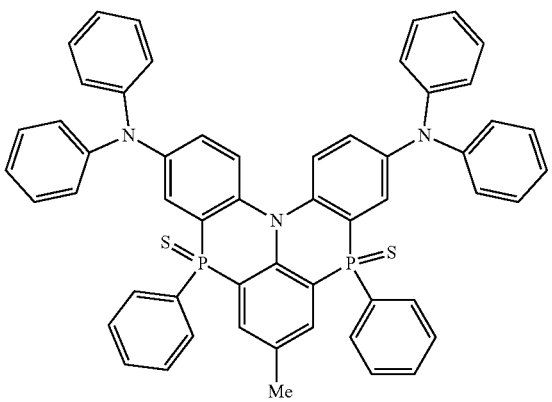
(1-7-188)
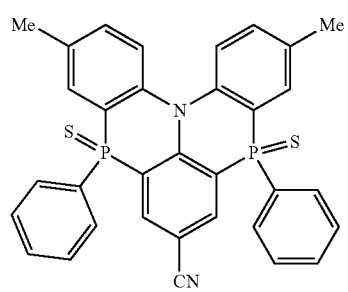
(1-7-189)
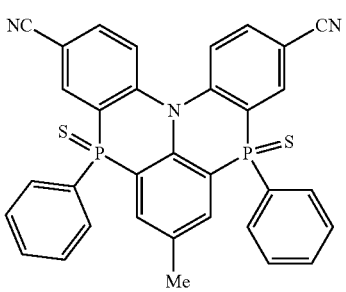

(1-7-190)
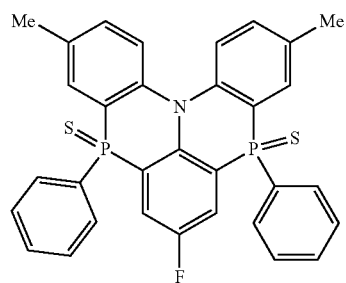
(1-7-191)
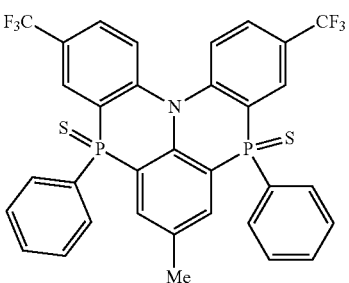
(1-7-192)
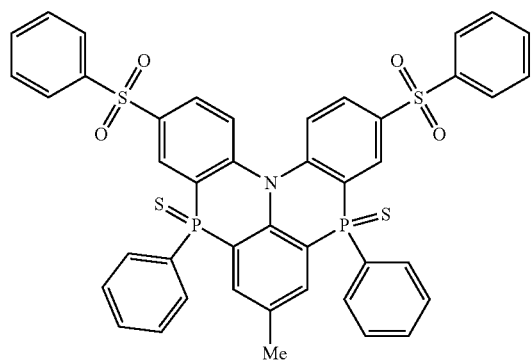
(1-7-193)
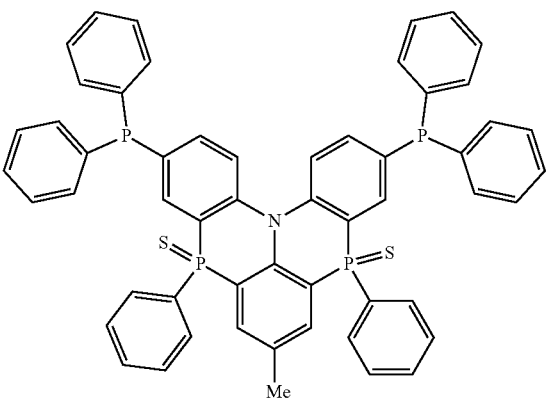
(1-7-194)
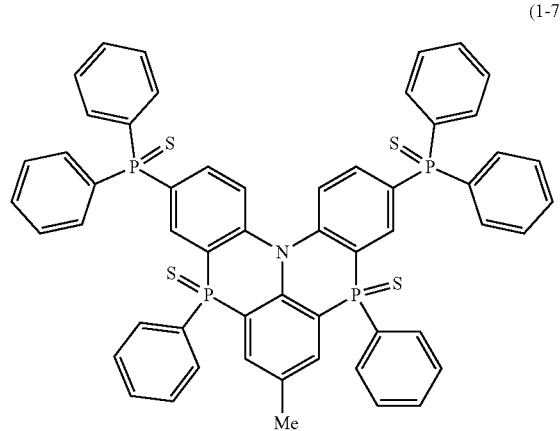
(1-7-195)
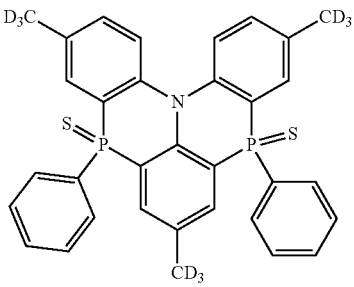
(1-7-196)
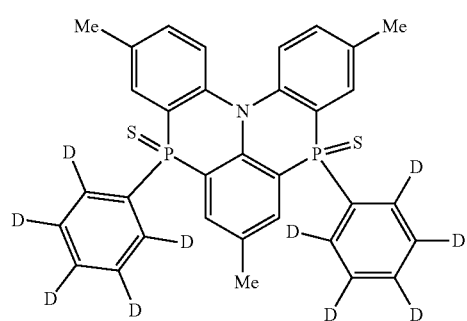
(1-7-197)
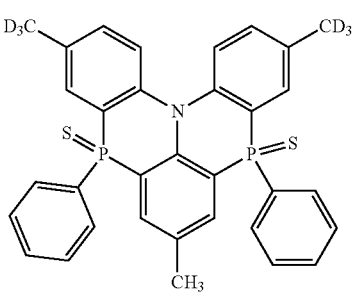

-continued
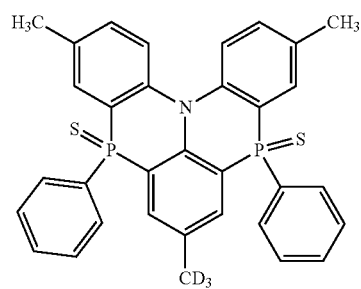
(1-7-198)
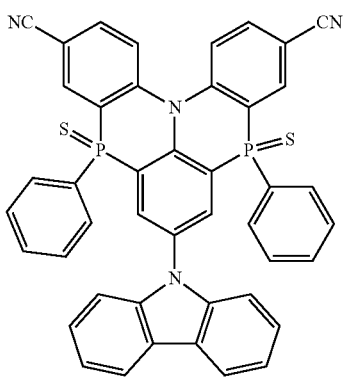
(1-7-199)
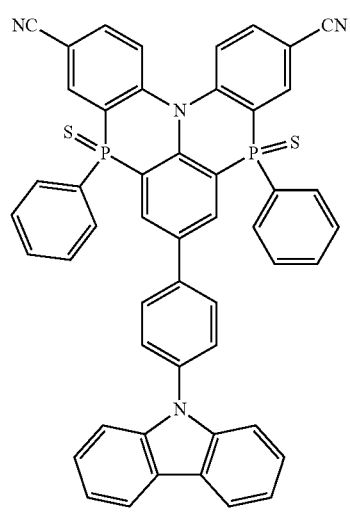
(1-7-200)
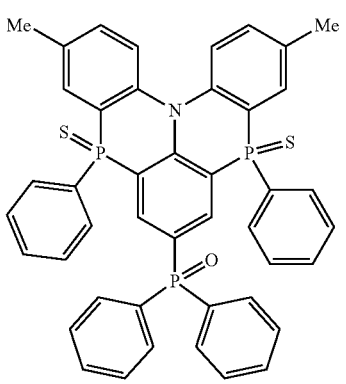
(1-7-201)
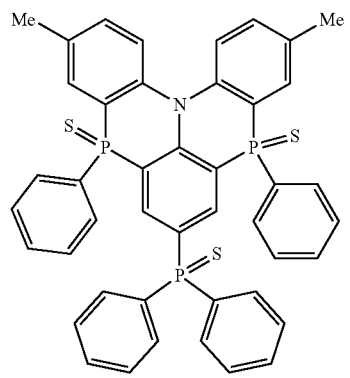
(1-7-202)
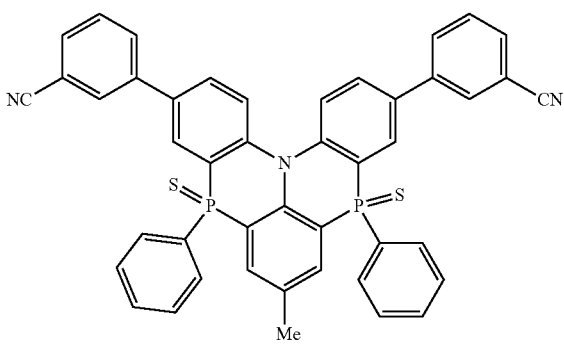
(1-7-208)
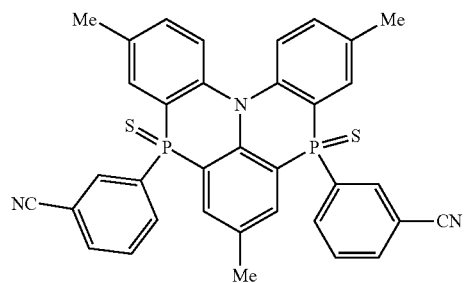
(1-7-209)
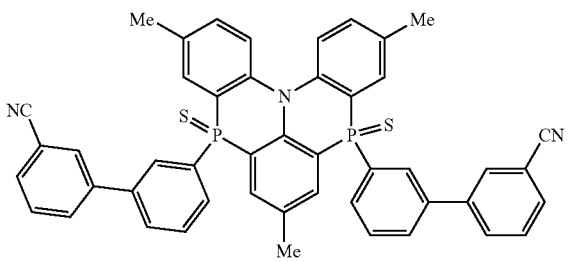
(1-7-210)

-continued
(1-7-211)
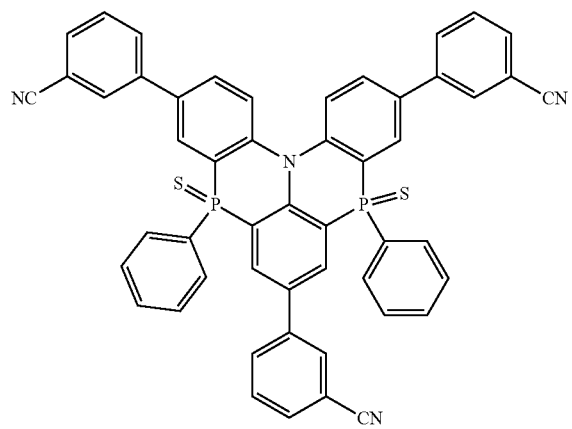
(1-7-212)
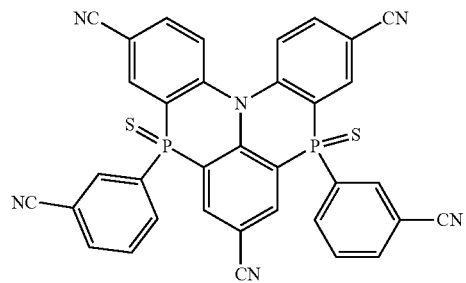
(1-7-213)
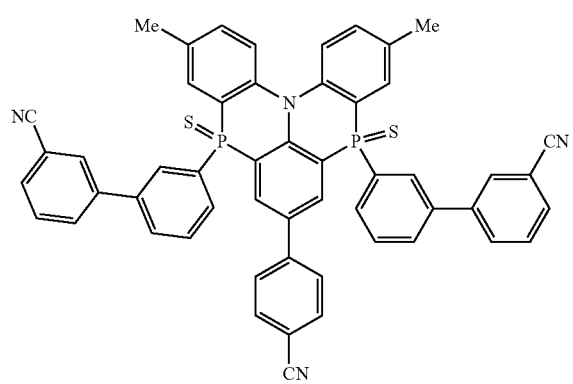
(1-7-214)
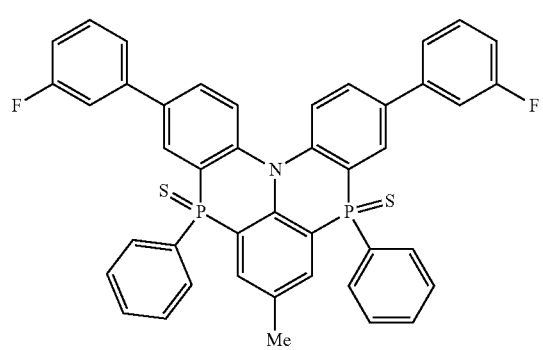
(1-7-215)
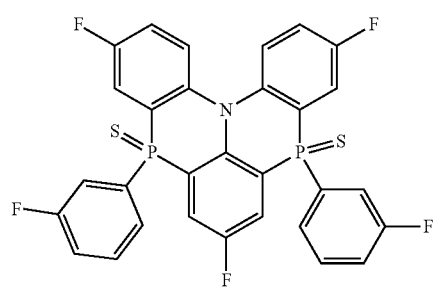
(1-7-216)
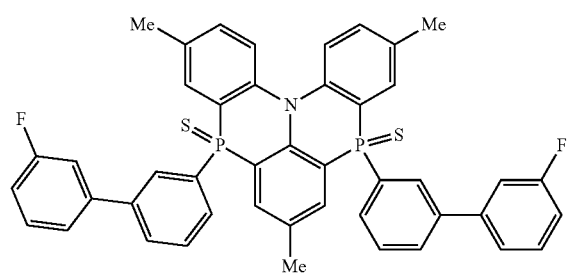
(1-7-217)
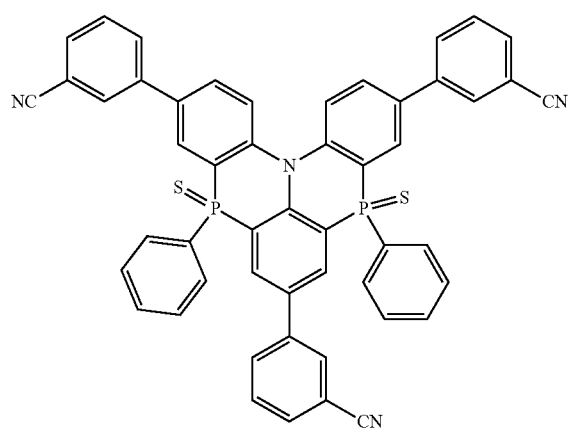
(1-7-218)
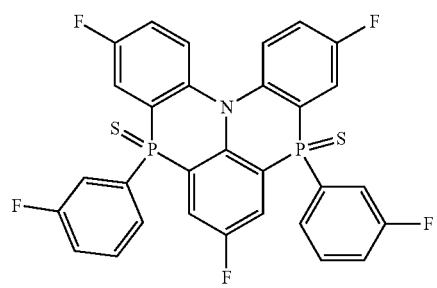

-continued
(1-7-219)
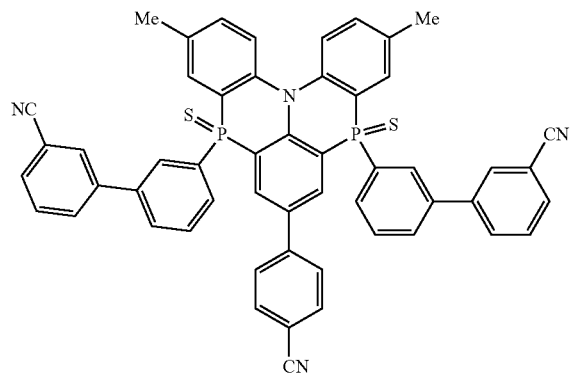
(1-7-225)
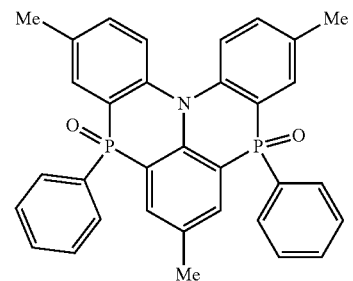
(1-7-226)
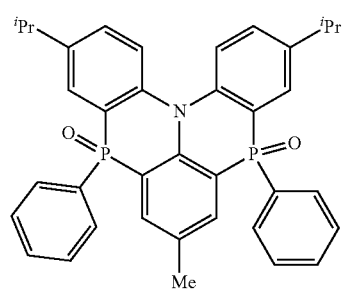
(1-7-227)
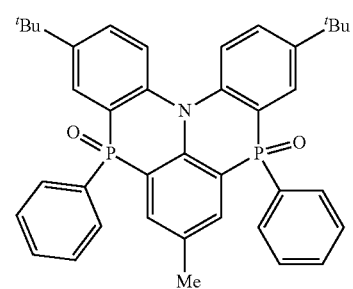
(1-7-228)
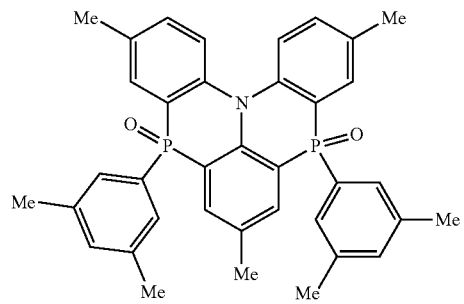
(1-7-229)
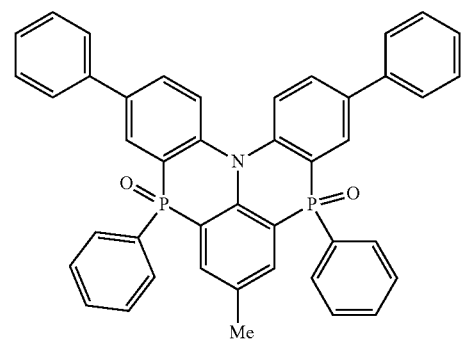
(1-7-230)
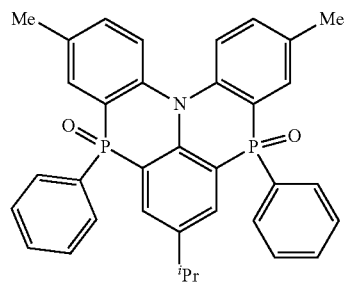
(1-7-331)
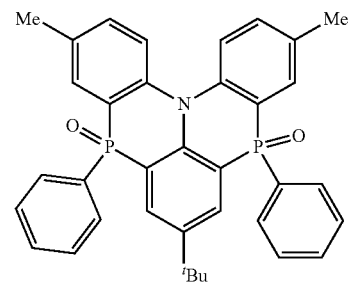
(1-7-332)
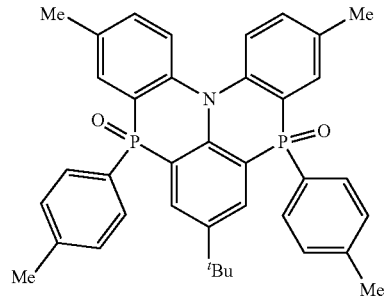
(1-7-333)
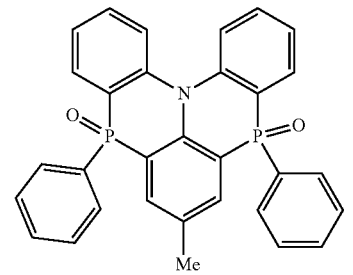

-continued
| | |
|---|---|
| (1-7-234) 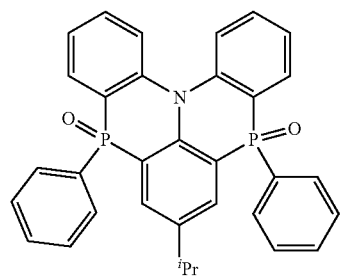 | (1-7-235) 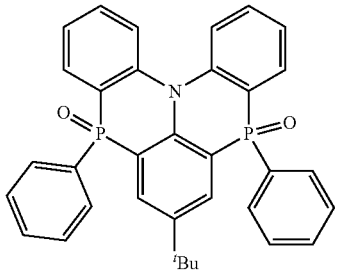 |
| (1-7-236) 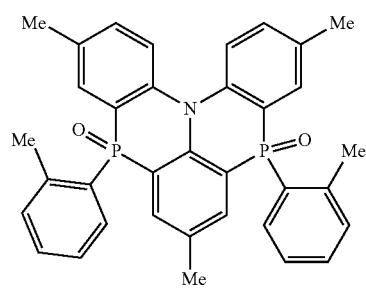 | (1-7-237) 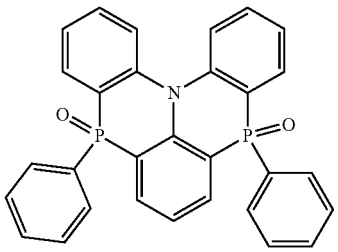 |
| (1-7-238) 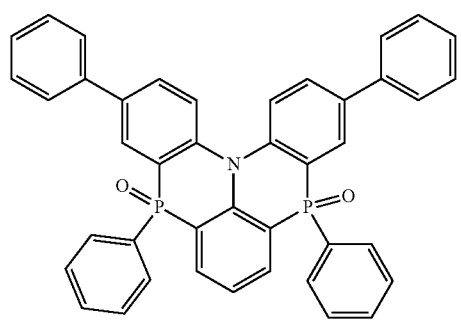 | (1-7-239) 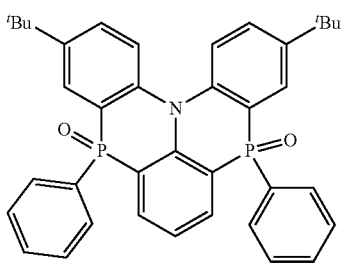 |
| (1-7-240) 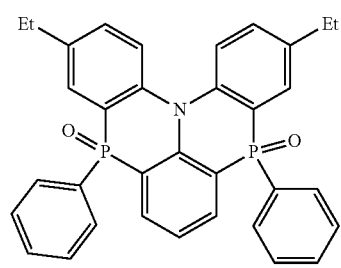 | (1-7-241) 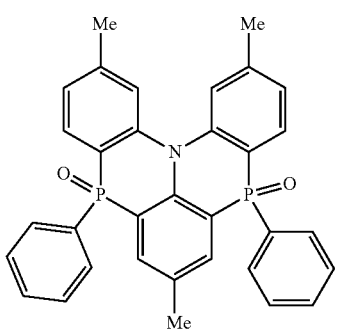 |
| (1-7-242) 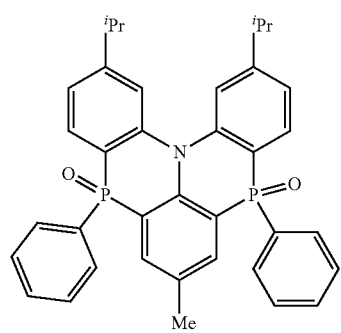 | (1-7-243) 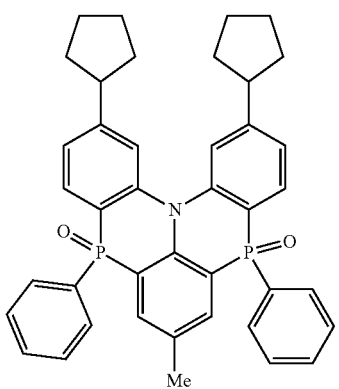 |

-continued
(1-7-244)
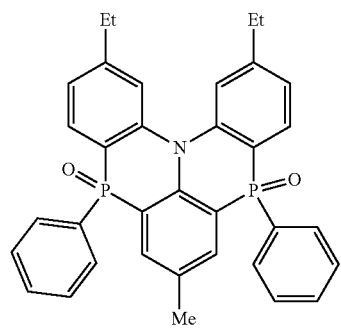
(1-7-245)
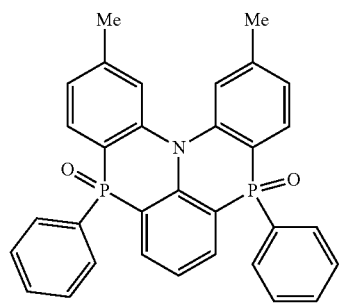
(1-7-246)
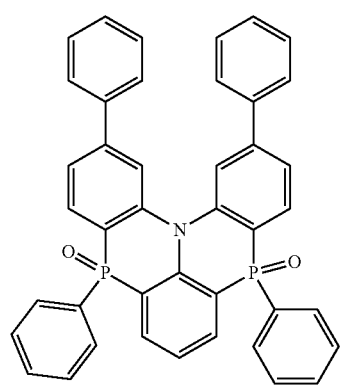
(1-7-247)
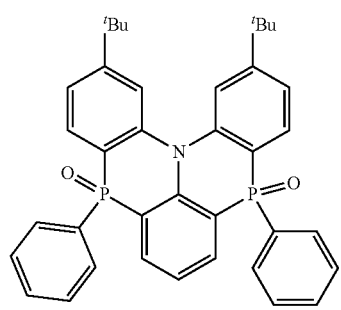
(1-7-248)
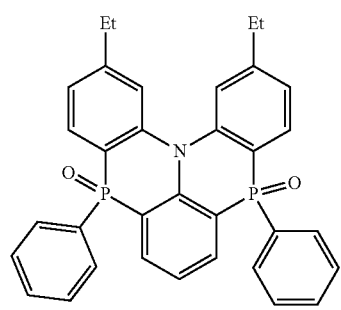
(1-7-255)
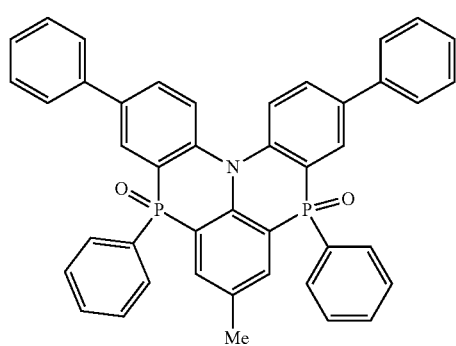
(1-7-256)
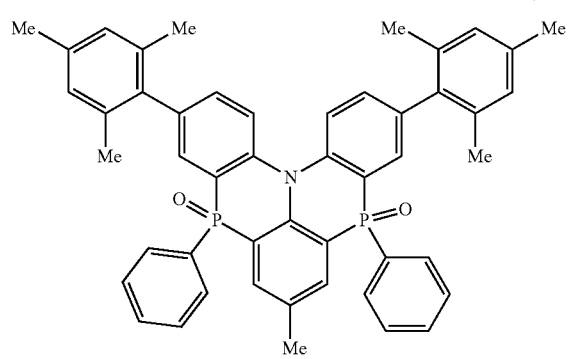
(1-7-257)
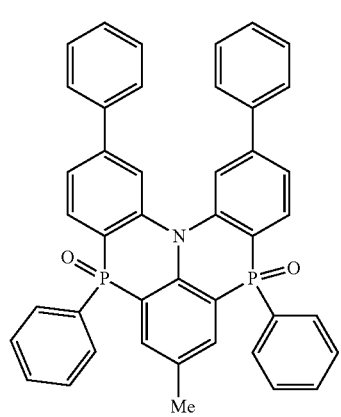

-continued
(1-7-258)
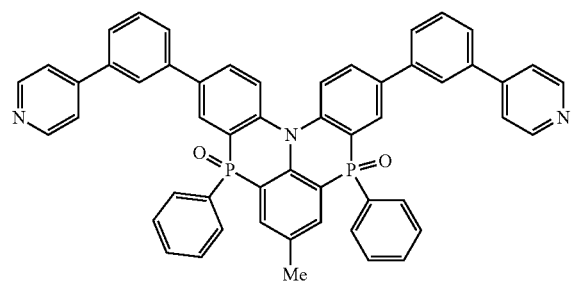
(1-7-259)
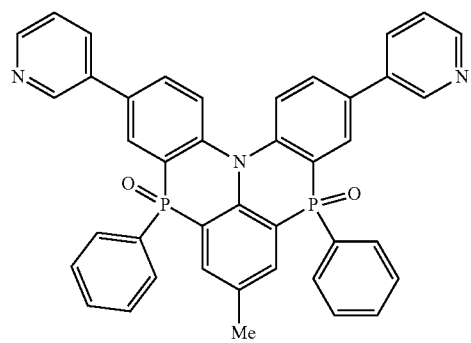
(1-7-260)
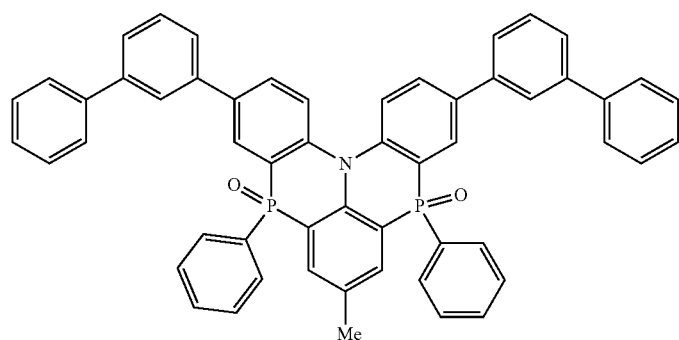
(1-7-261)
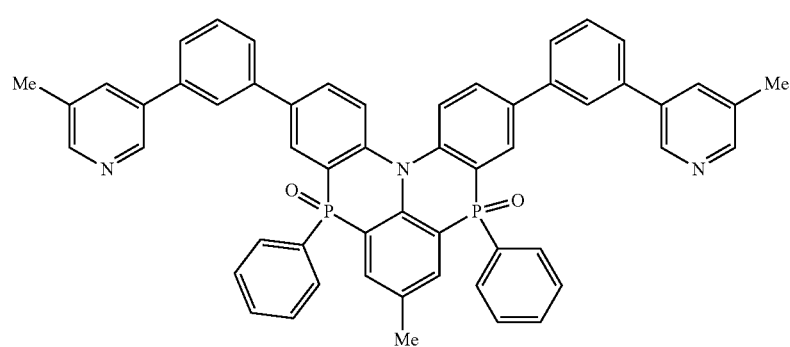
(1-7-262)
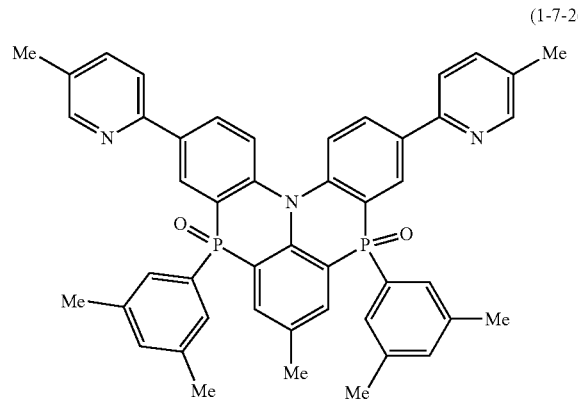
(1-7-263)
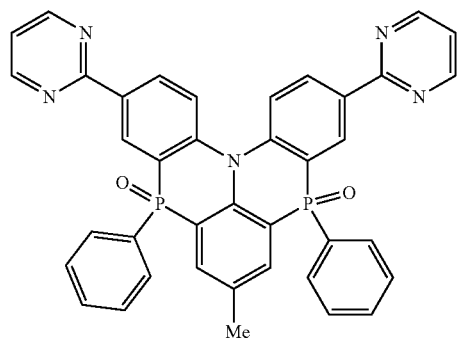

-continued
(1-7-264)
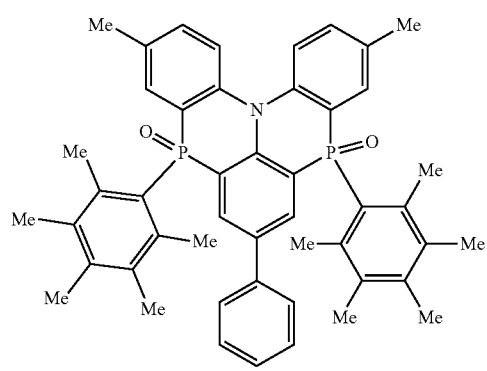
(1-7-265)
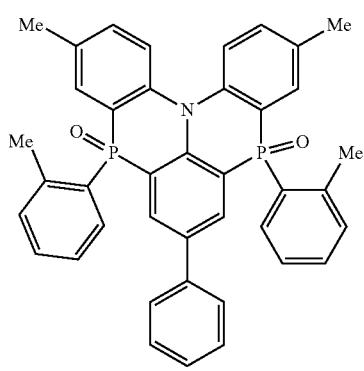
(1-7-266)
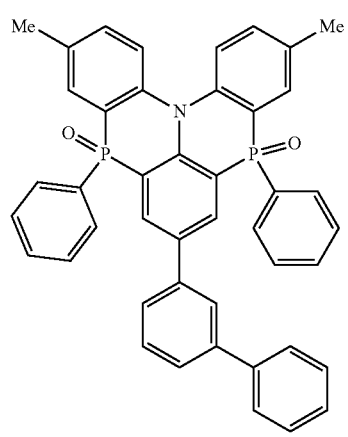
(1-7-267)
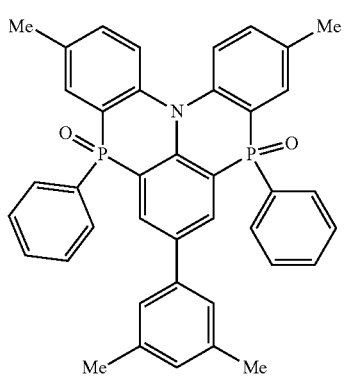
(1-7-268)
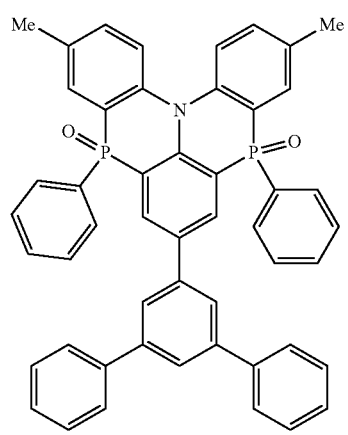
(1-7-269)
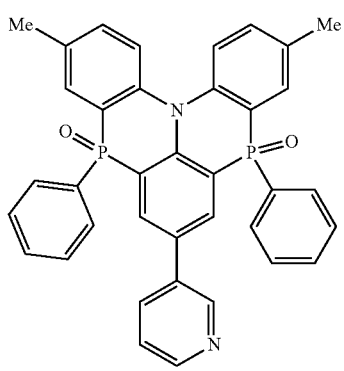

-continued
(1-7-270)
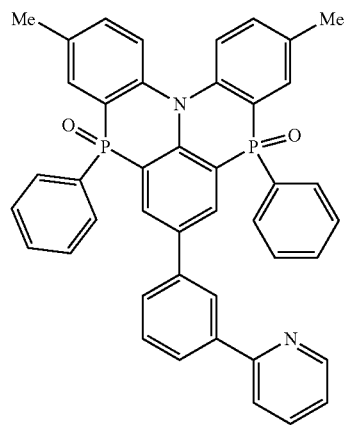
(1-7-271)
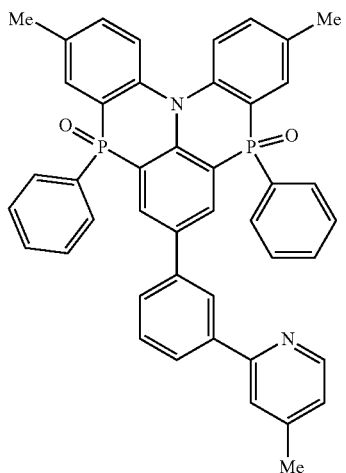
(1-7-272)
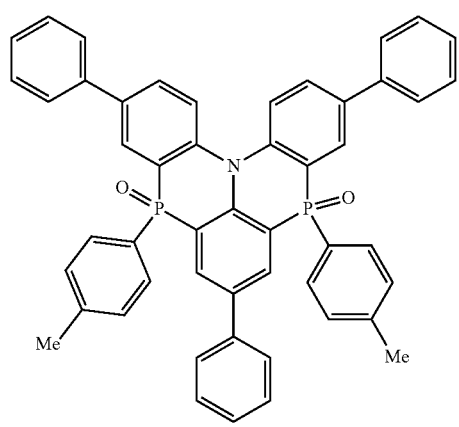
(1-7-273)
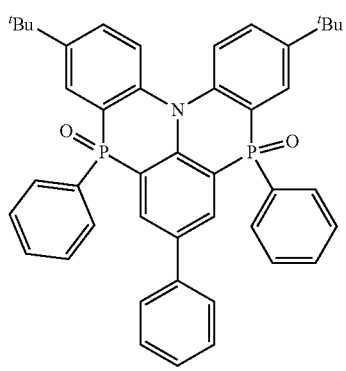
(1-7-274)
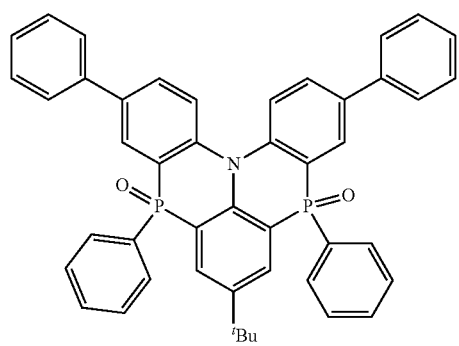

(1-7-277)
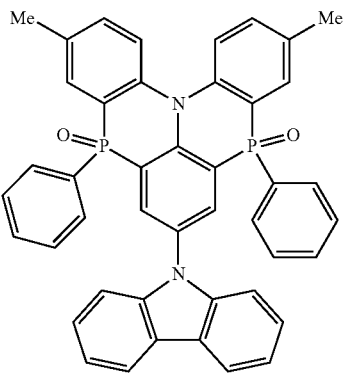
(1-7-278)
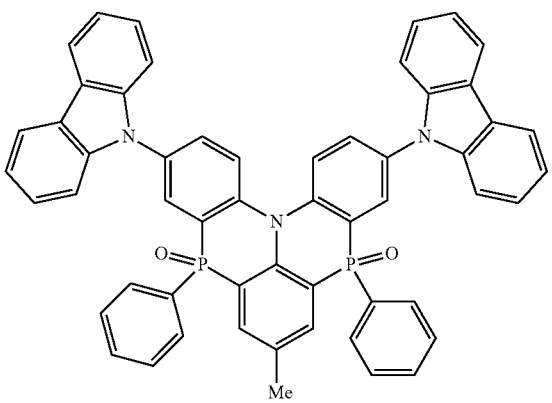
(1-7-279)
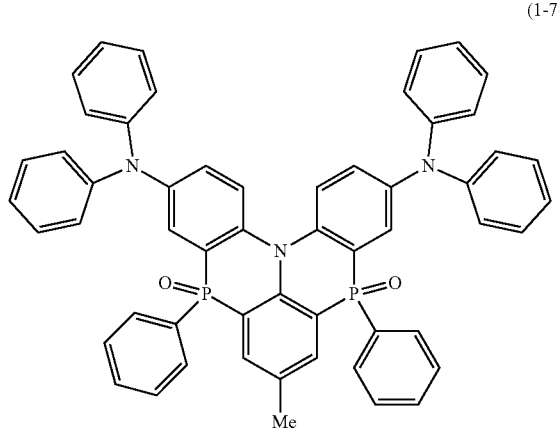
(1-7-280)
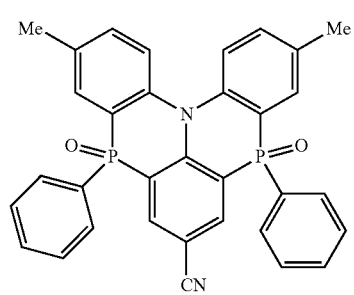
(1-7-281)
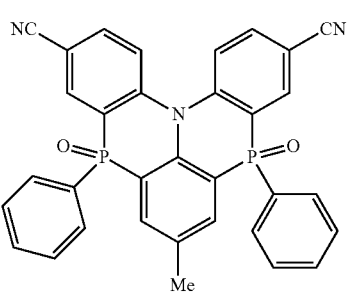
(1-7-282)
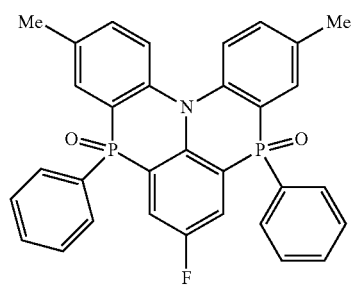
(1-7-283)
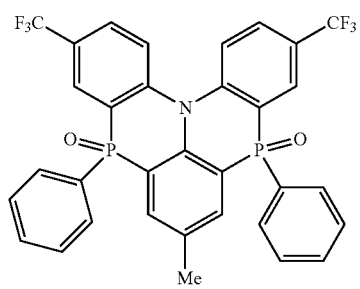
(1-7-284)
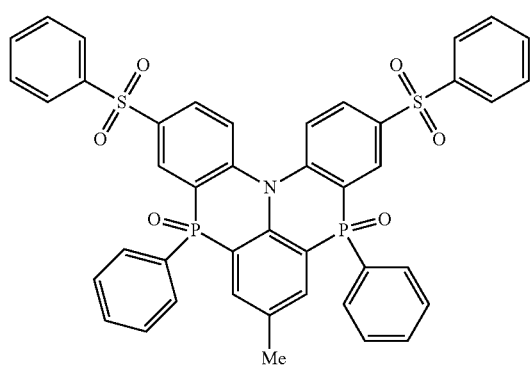

-continued
(1-7-285)
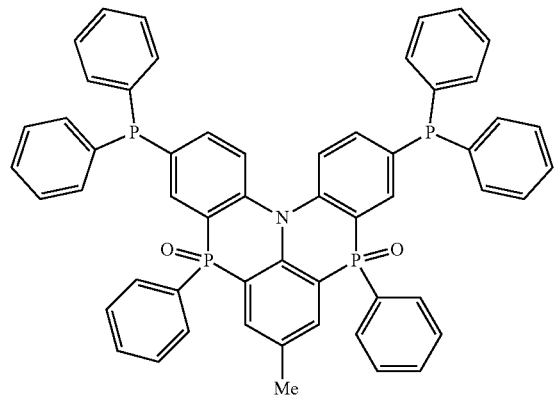
(1-7-286)
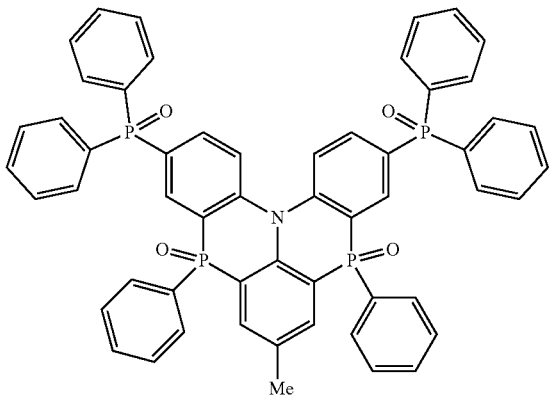
(1-7-287)
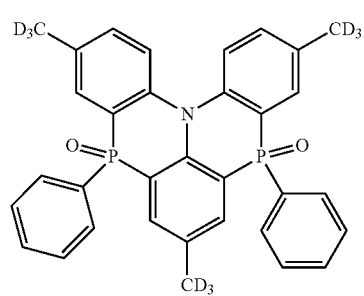
(1-7-288)
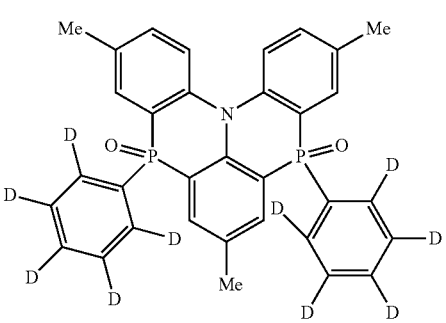
(1-7-289)
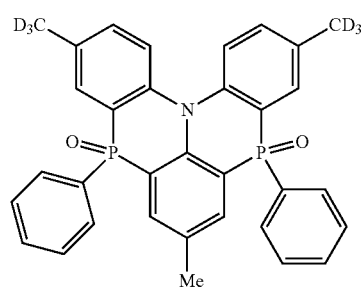
(1-7-290)
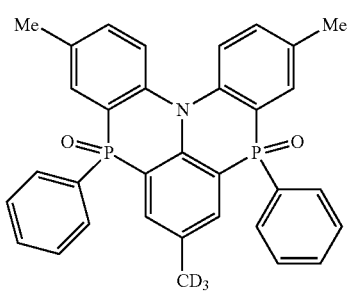
(1-7-291)
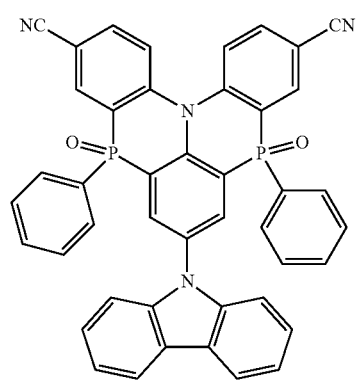
(1-7-292)
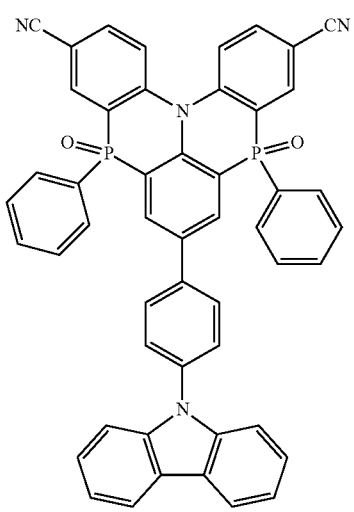

-continued
(1-7-293)
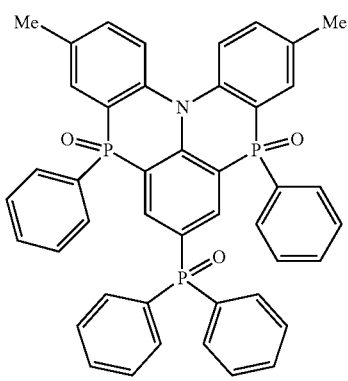
(1-7-294)
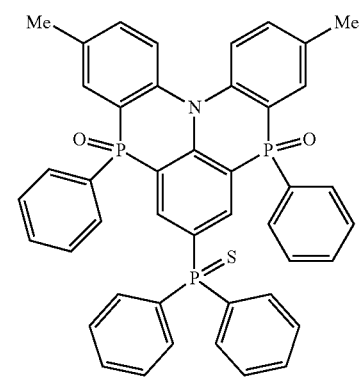
(1-7-300)
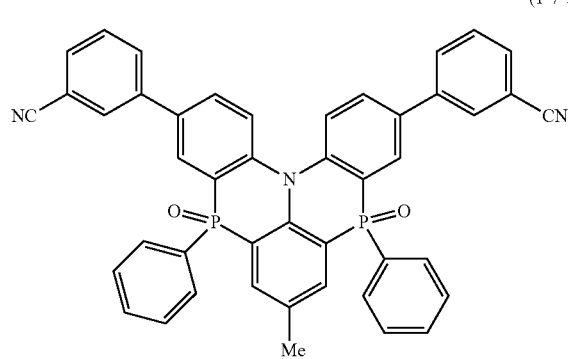
(1-7-301)
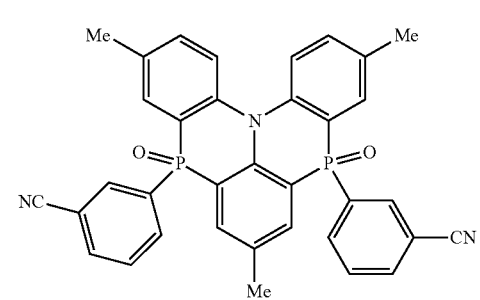
(1-7-302)
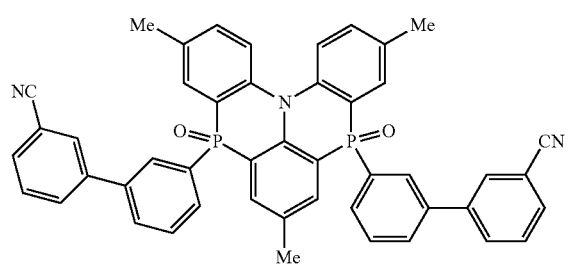
(1-7-303)
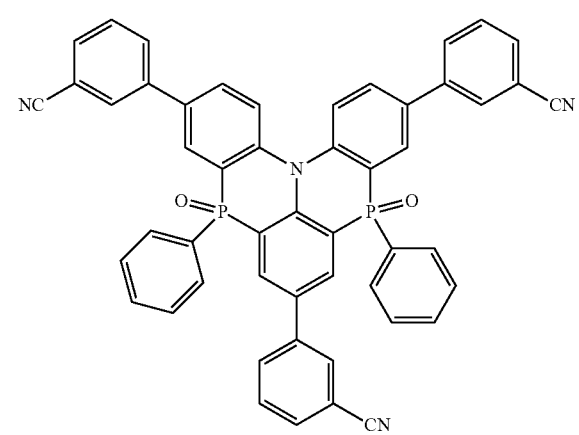
(1-7-304)
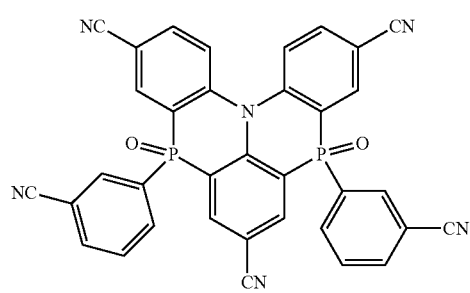
(1-7-305)
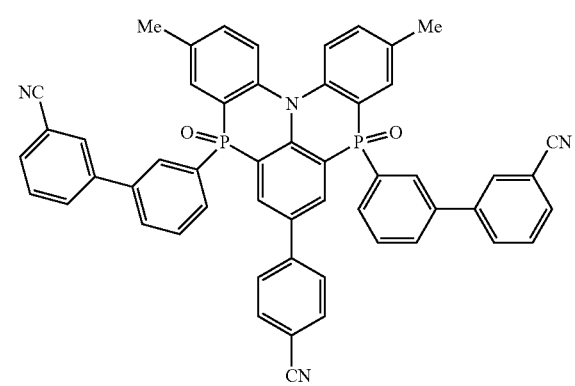

-continued
(1-7-306)
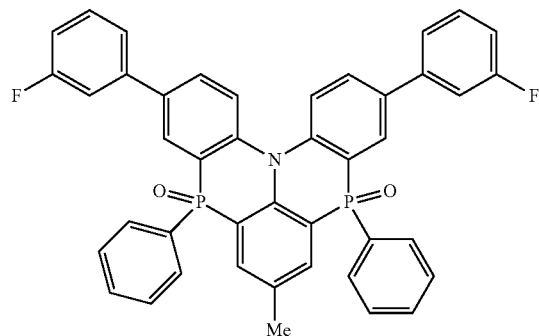
(1-7-307)
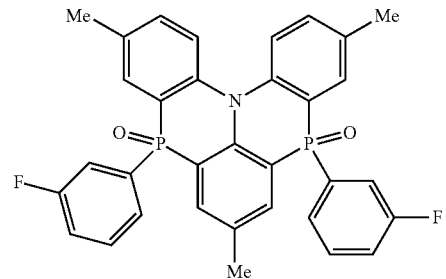
(1-7-308)
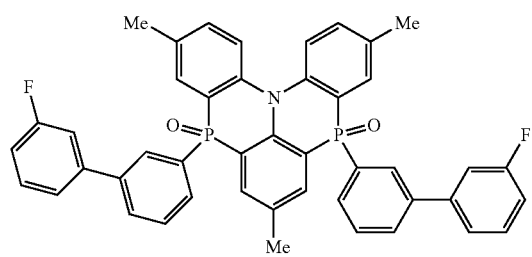
(1-7-309)
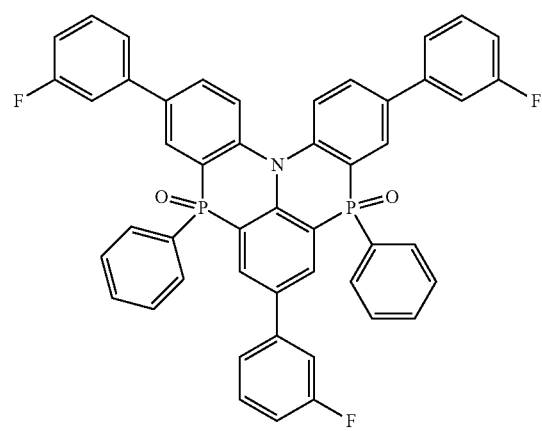
(1-7-310)
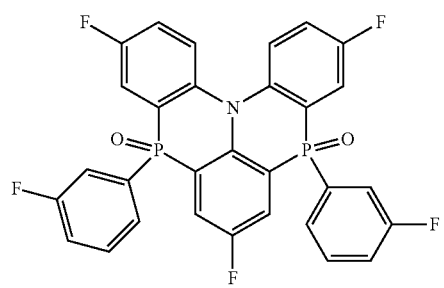
(1-7-311)
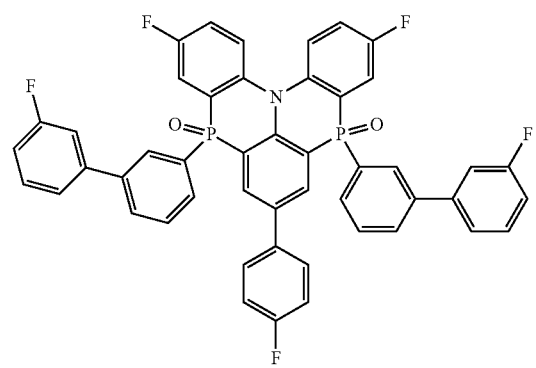
(1-7-315)
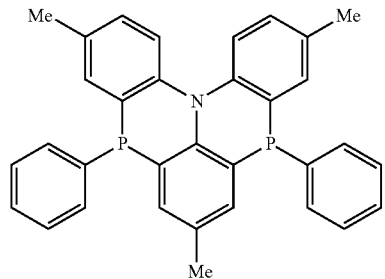
(1-7-316)
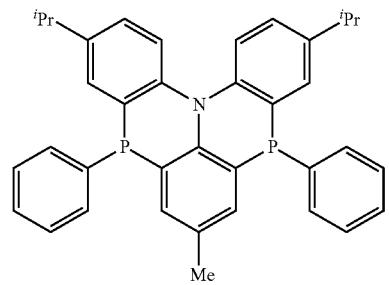

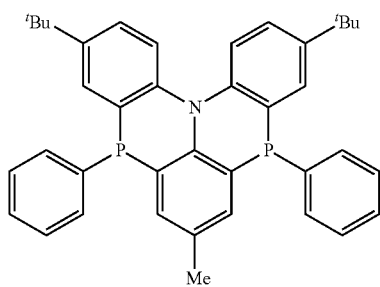
(1-7-317)
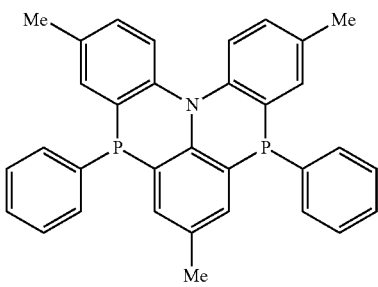
(1-7-318)
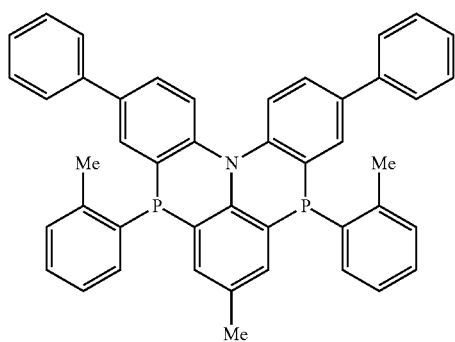
(1-7-319)
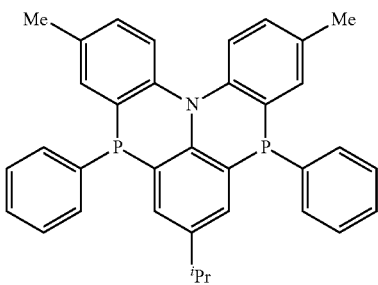
(1-7-320)
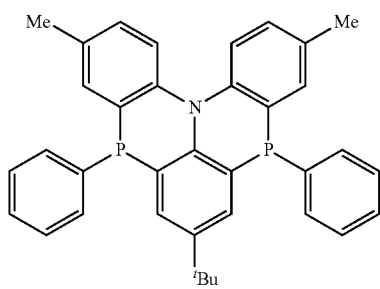
(1-7-321)
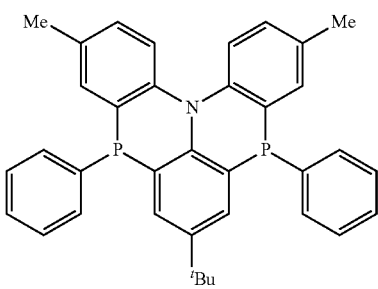
(1-7-322)
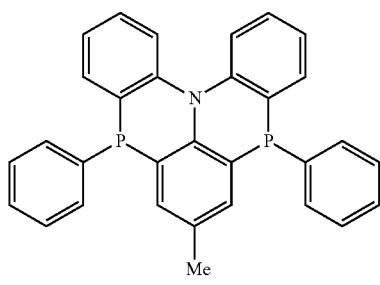
(1-7-323)
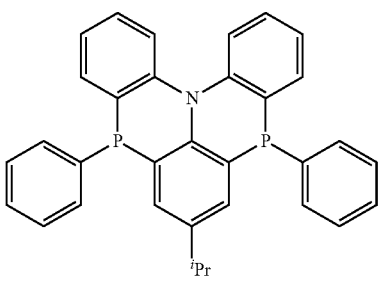
(1-7-324)
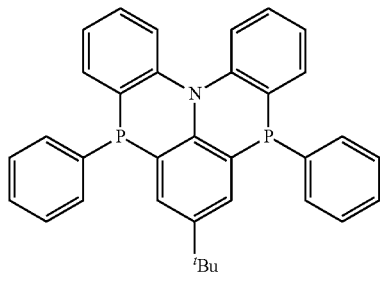
(1-7-325)
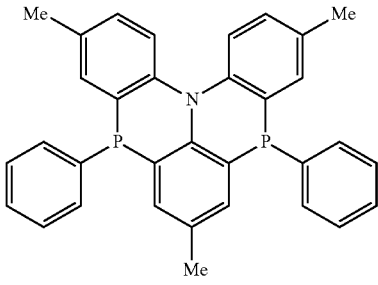
(1-7-326)

(1-7-327)
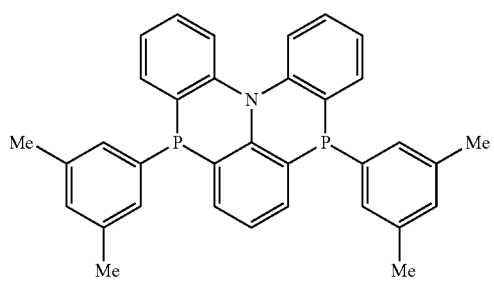
(1-7-328)
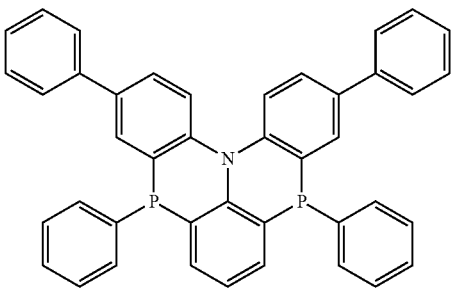
(1-7-329)
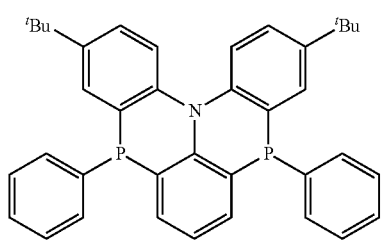
(1-7-330)
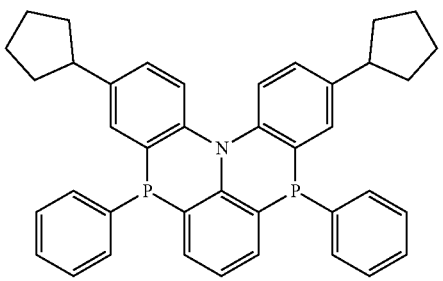
(1-7-331)
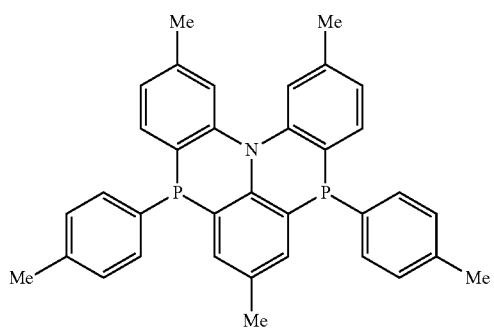
(1-7-332)
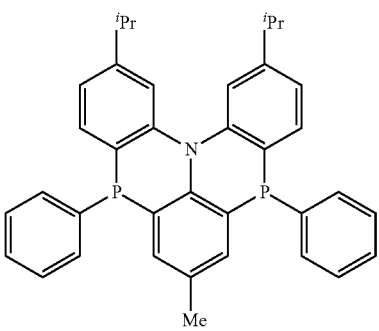
(1-7-333)
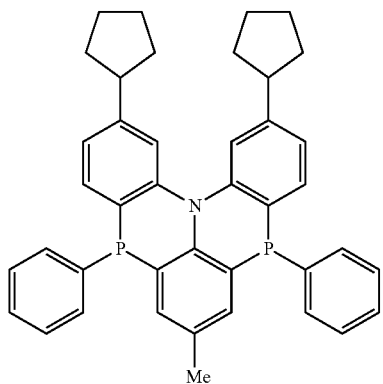
(1-7-334)
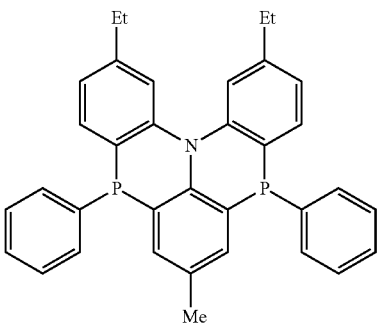
(1-7-335)
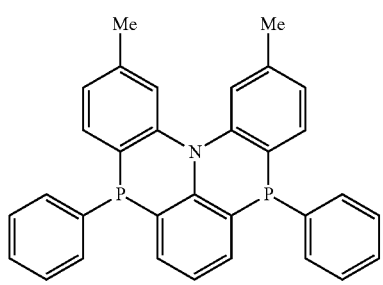
(1-7-336)
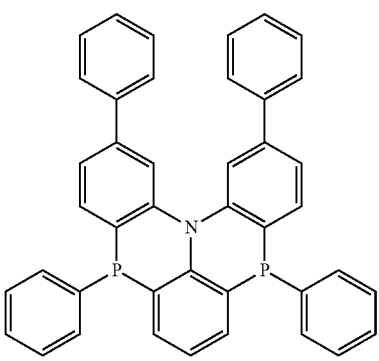

-continued
(1-7-337)
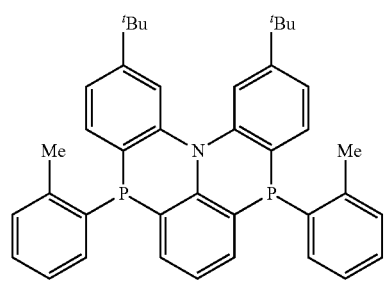
(1-7-338)
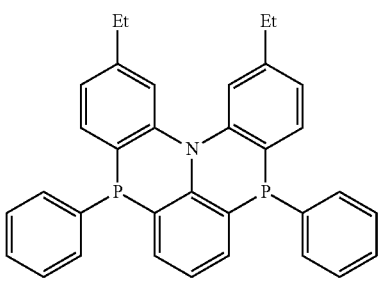
(1-7-345)
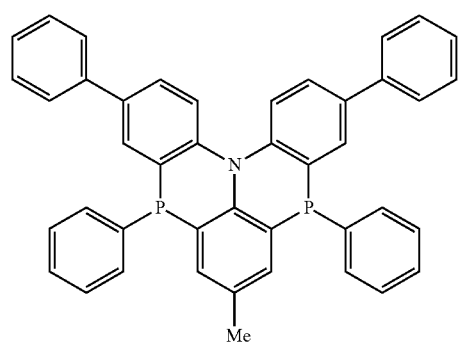
(1-7-346)
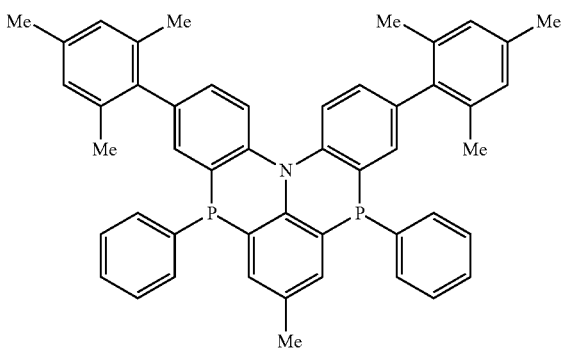
(1-7-347)
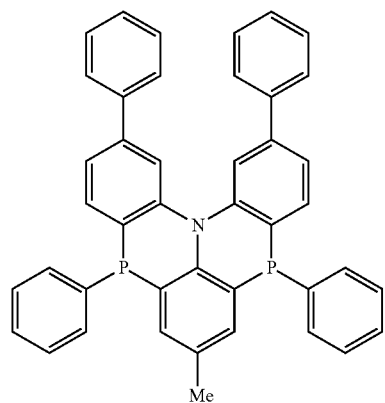
(1-7-348)
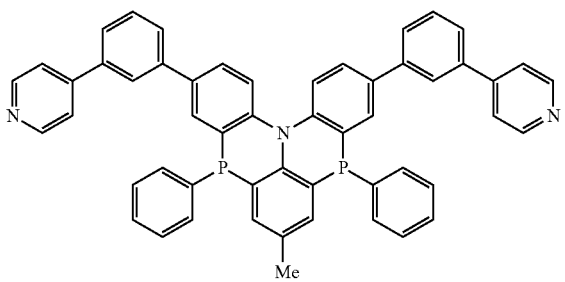
(1-7-349)
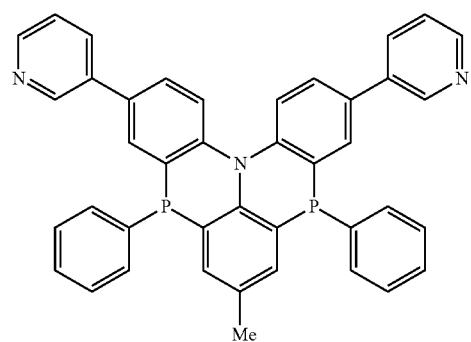
(1-7-350)
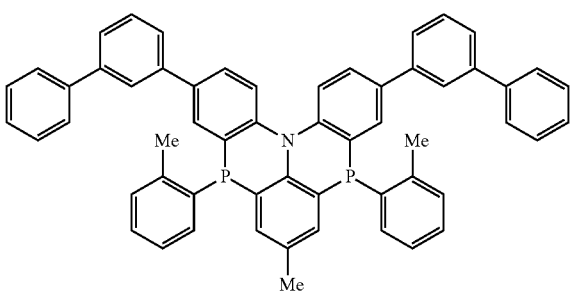

(1-7-351)
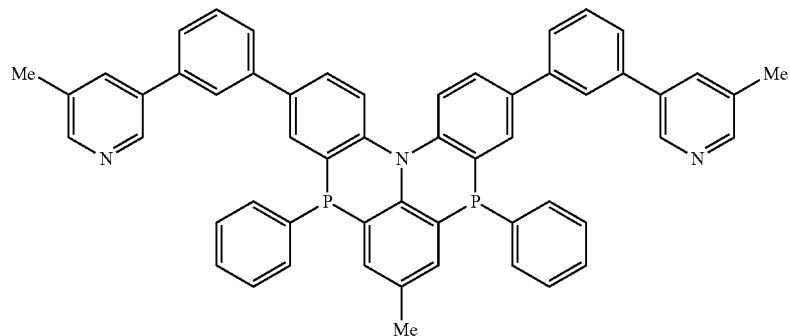
(1-7-352)
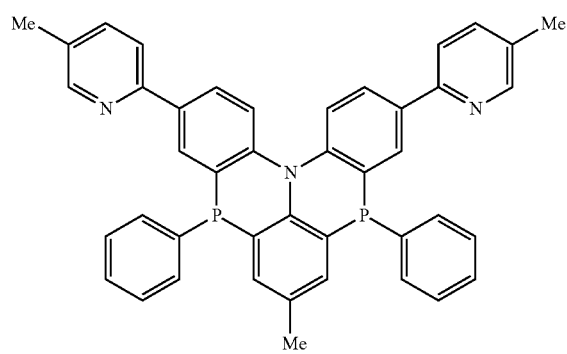
(1-7-353)
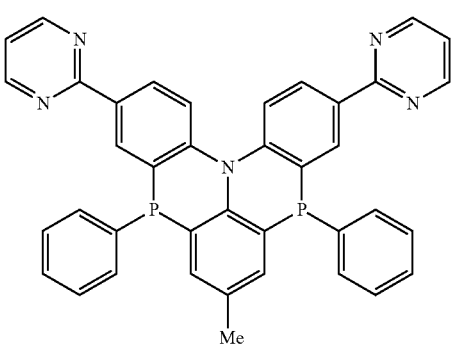
(1-7-354)
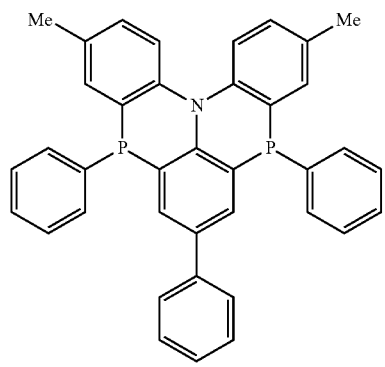
(1-7-355)
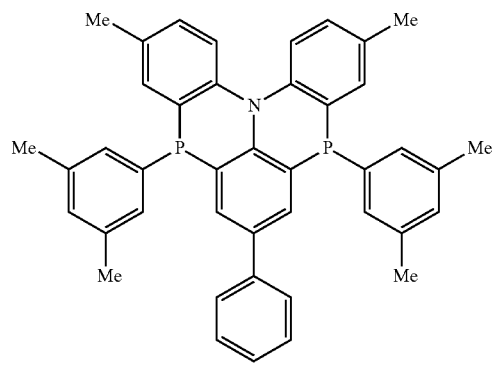
(1-7-356)
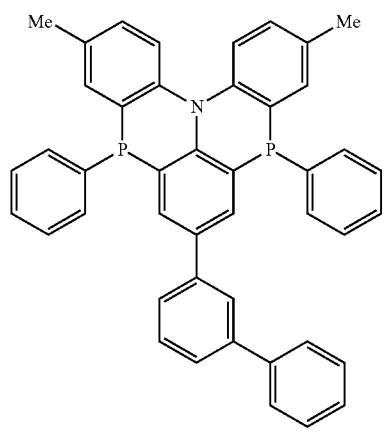
(1-7-357)
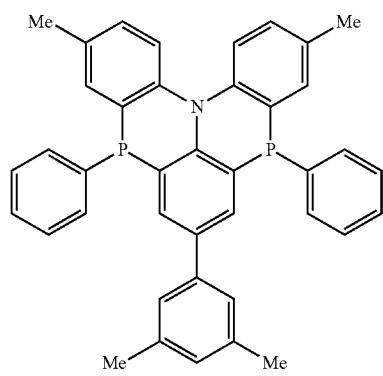

-continued
(1-7-358) 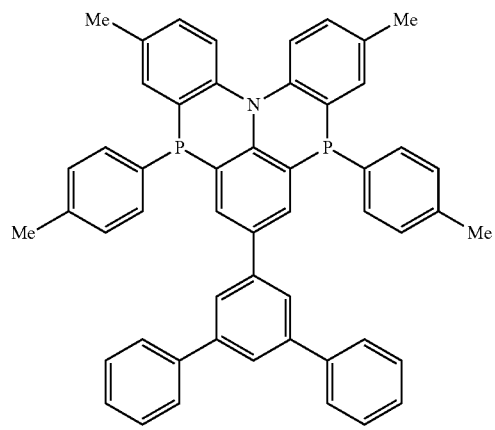
(1-7-359) 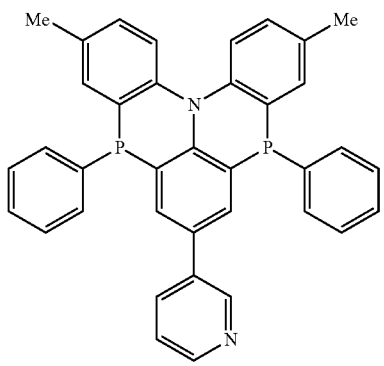
(1-7-360) 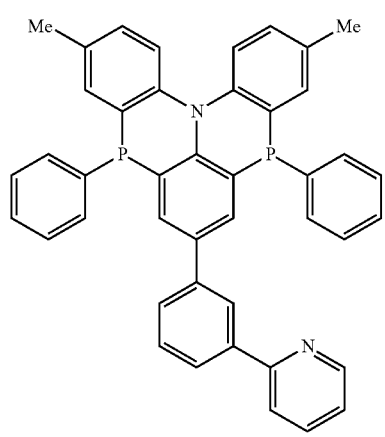
(1-7-361) 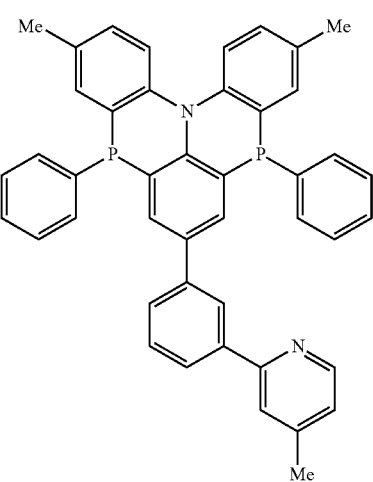
(1-7-362) 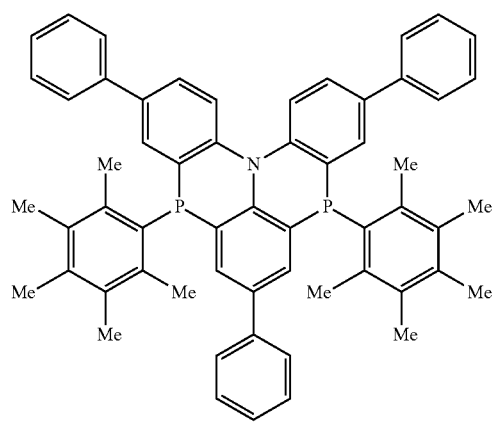
(1-7-363) 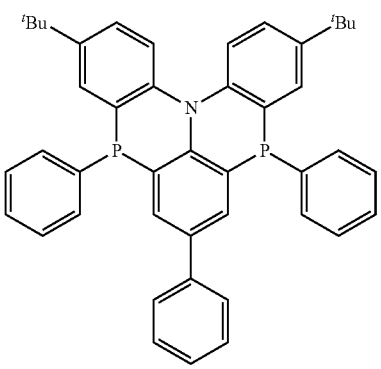
(1-7-364) 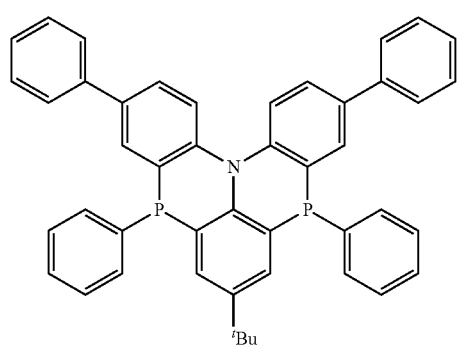
(1-8-1) 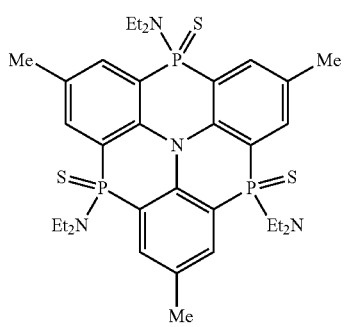

-continued
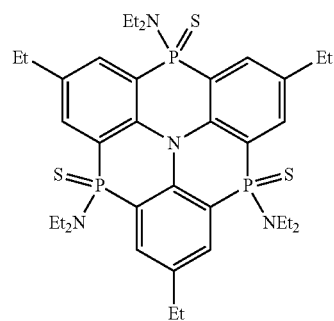
(1-8-2)
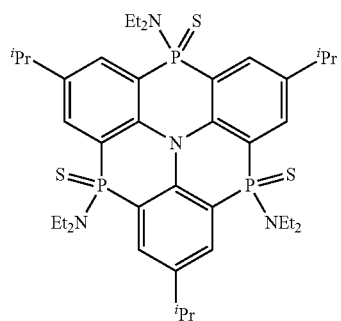
(1-8-3)
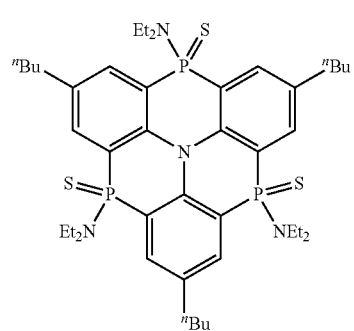
(1-8-4)
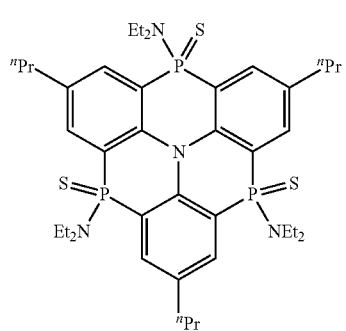
(1-8-5)
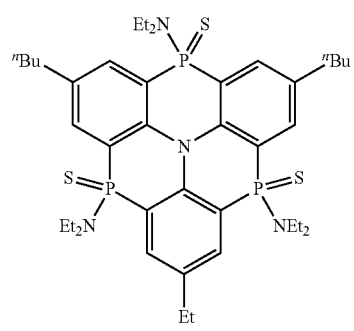
(1-8-6)
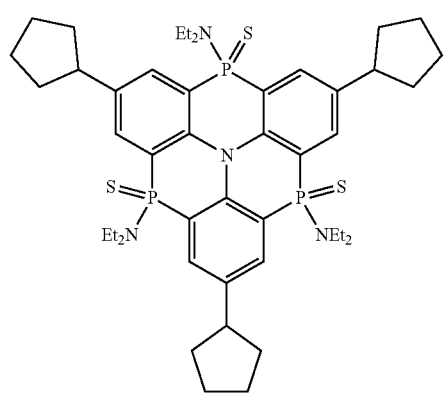
(1-8-7)
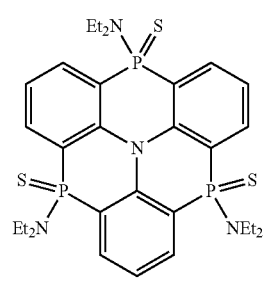
(1-8-8)
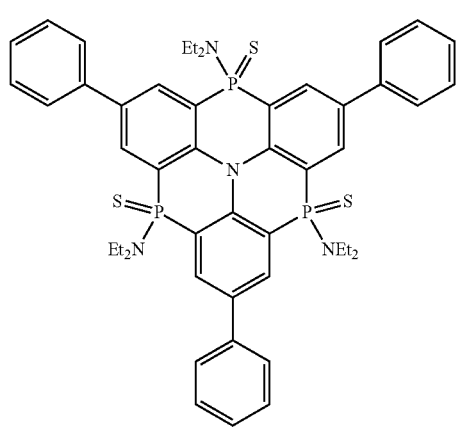
(1-8-9)

-continued
(1-8-10)
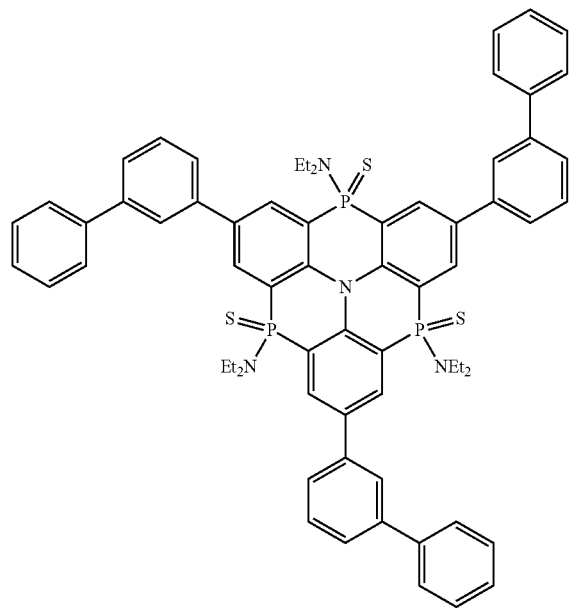
(1-8-11)
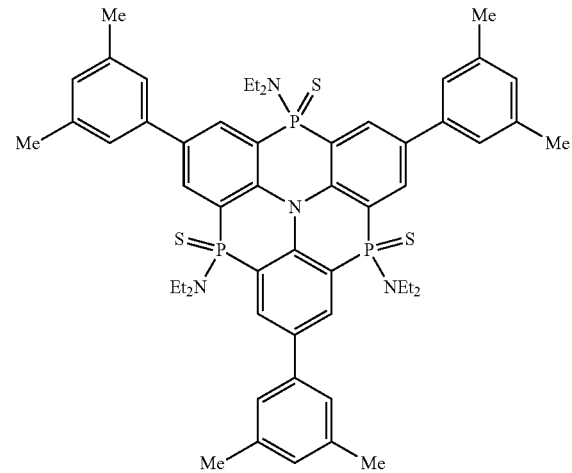
(1-8-12)
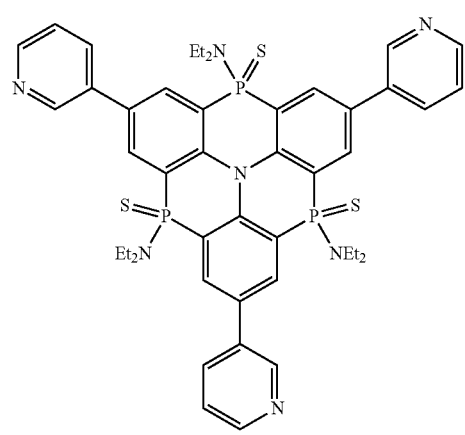
(1-8-13)
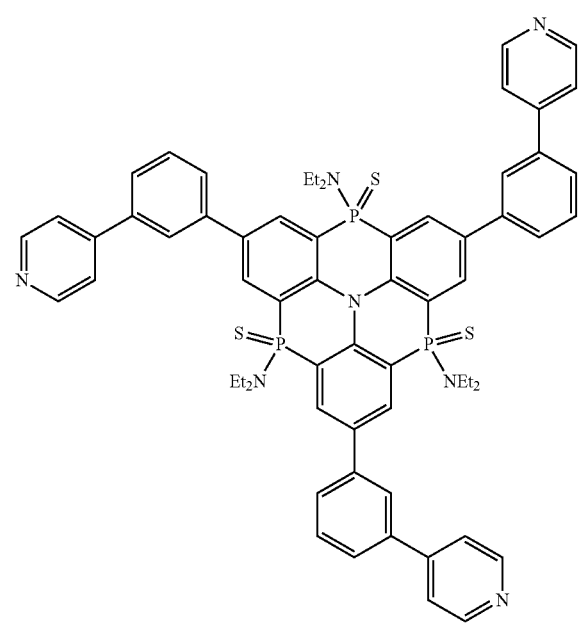

-continued
(1-8-14) 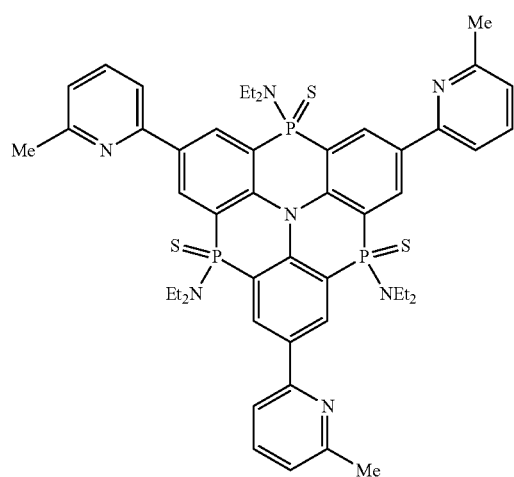
(1-8-20) 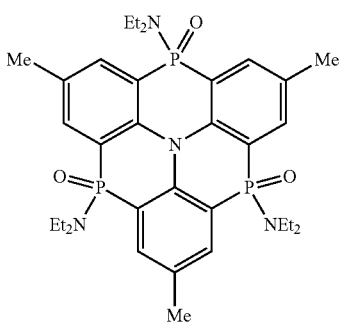
(1-8-21) 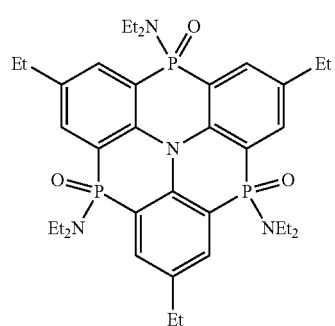
(1-8-22) 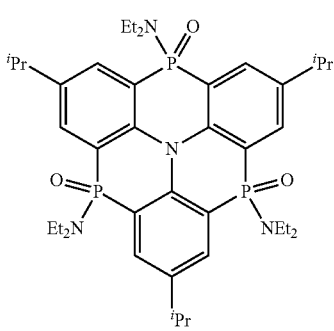
(1-8-23) 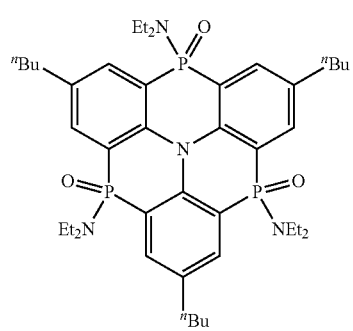
(1-8-24) 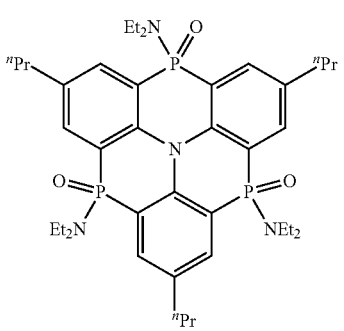
(1-8-25) 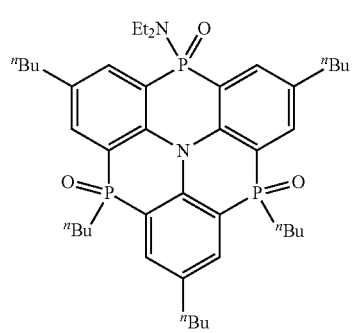
(1-8-26) 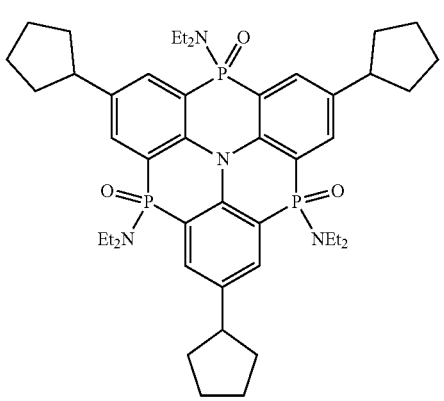

(1-8-27) 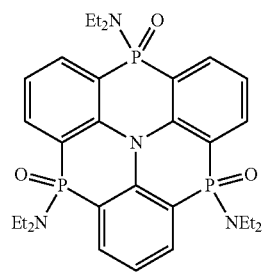
(1-8-28) 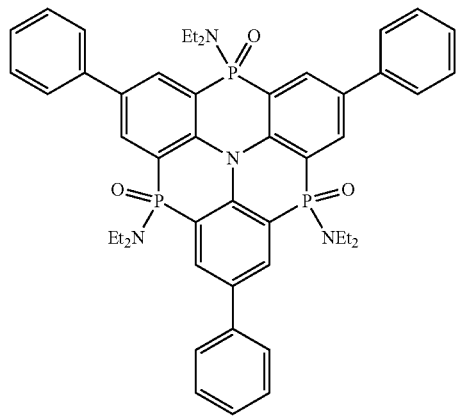
(1-8-29) 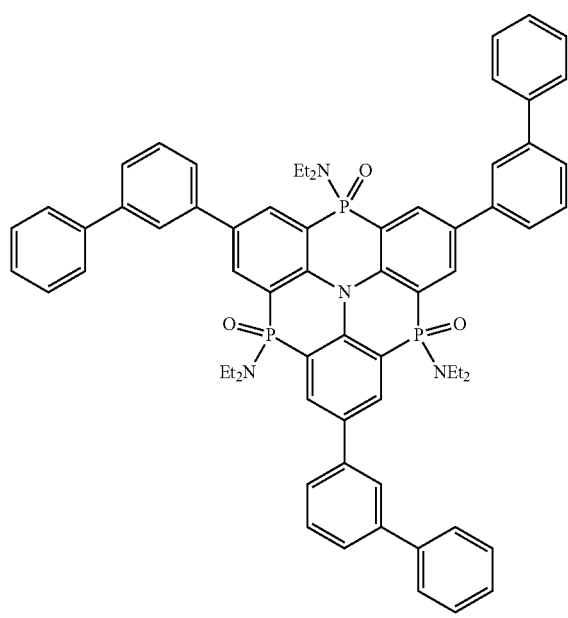
(1-8-30) 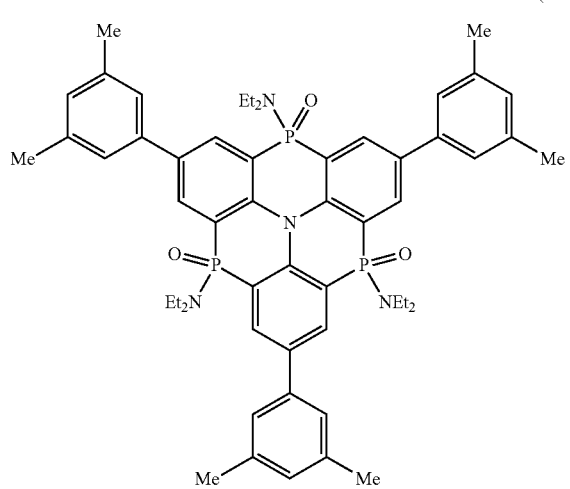

-continued
(1-8-31)
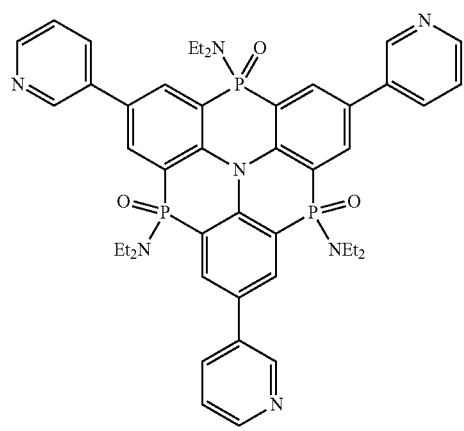
(1-8-32)
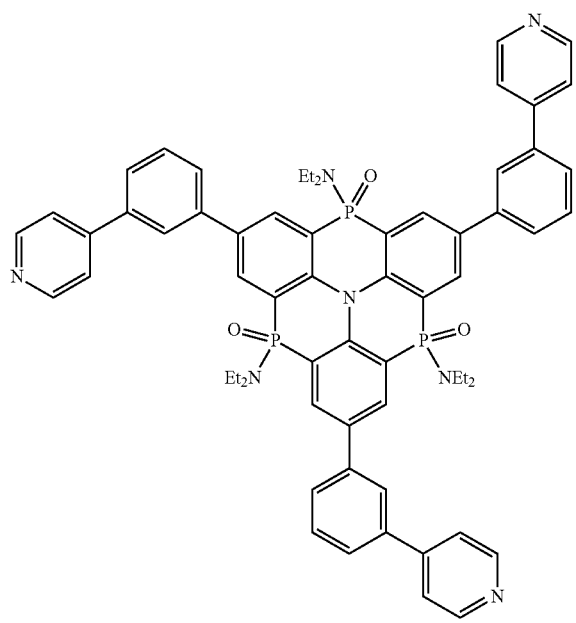
(1-8-33)
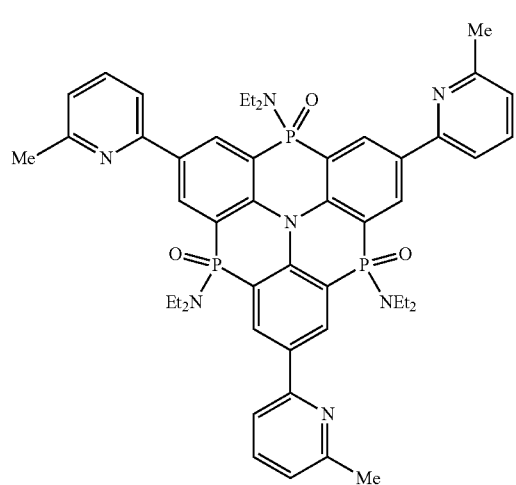
(1-8-41)
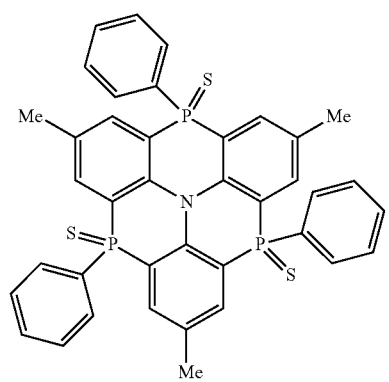
(1-8-42)
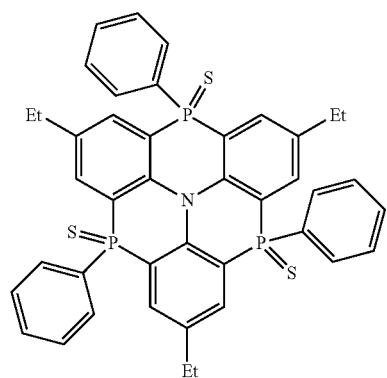
(1-8-43)
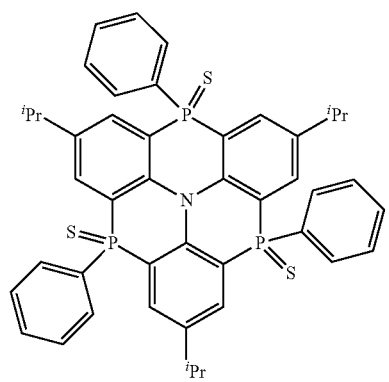

-continued
(1-8-44)
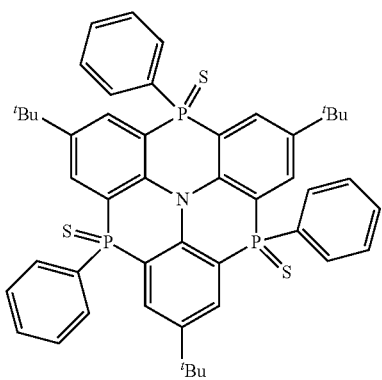
(1-8-45)
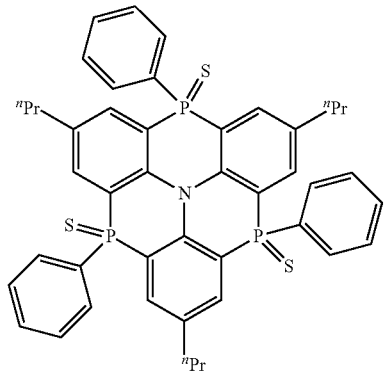
(1-8-46)
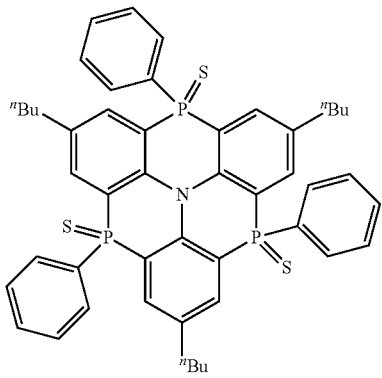
(1-8-47)
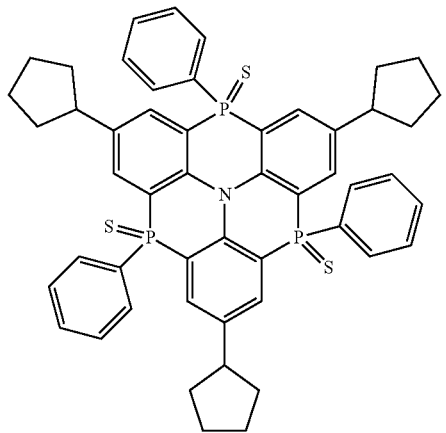
(1-8-48)
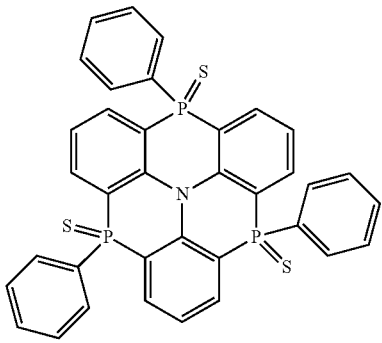
(1-8-49)
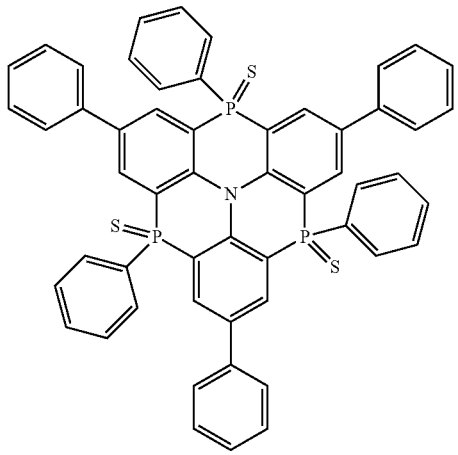

(1-8-50)
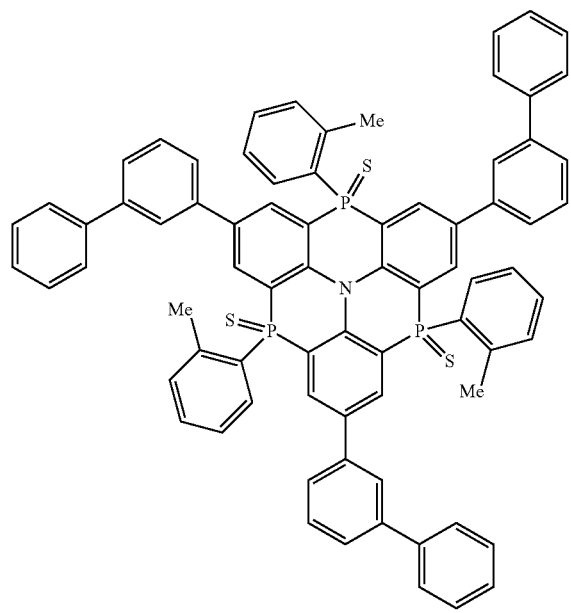
(1-8-51)
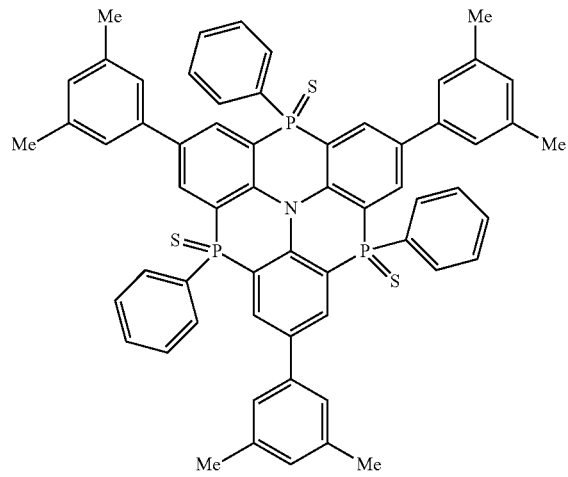
(1-8-52)
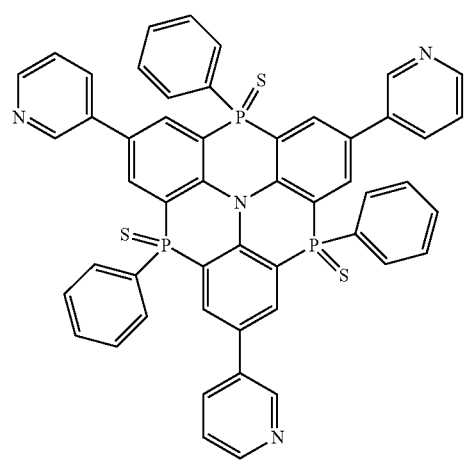
(1-8-53)
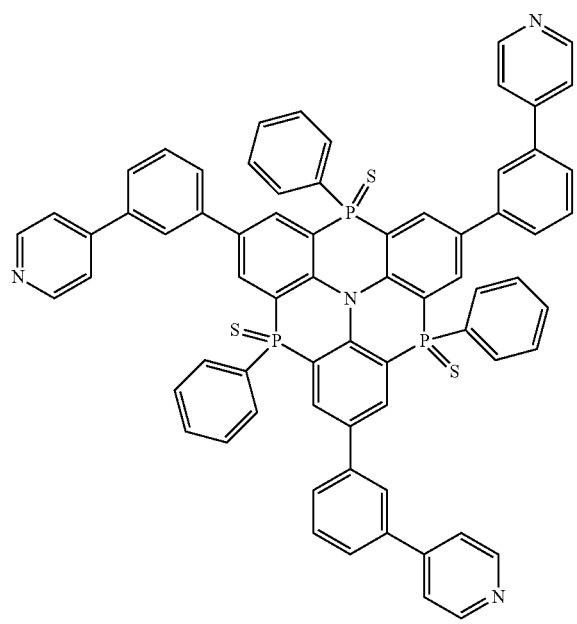

-continued
(1-8-54)
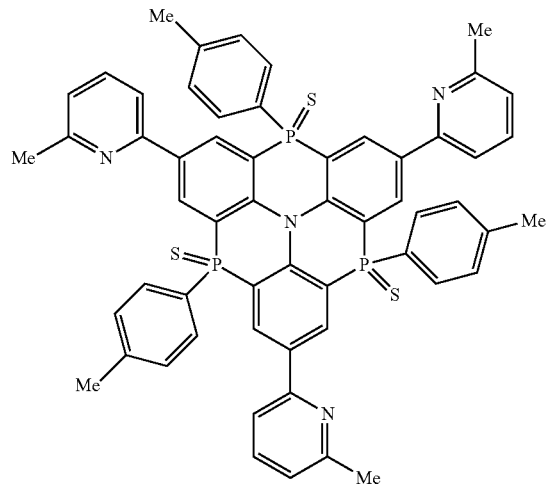
(1-8-60)
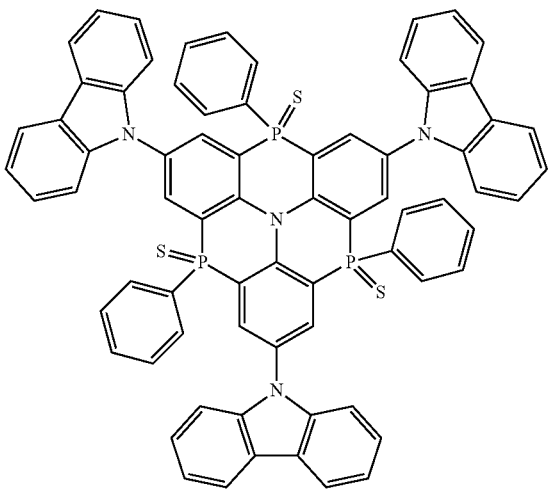
(1-8-61)
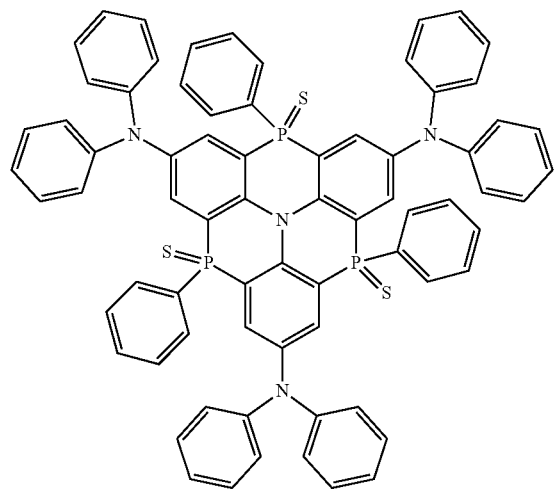
(1-8-62)
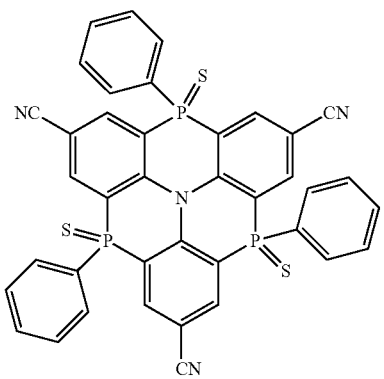
(1-8-63)
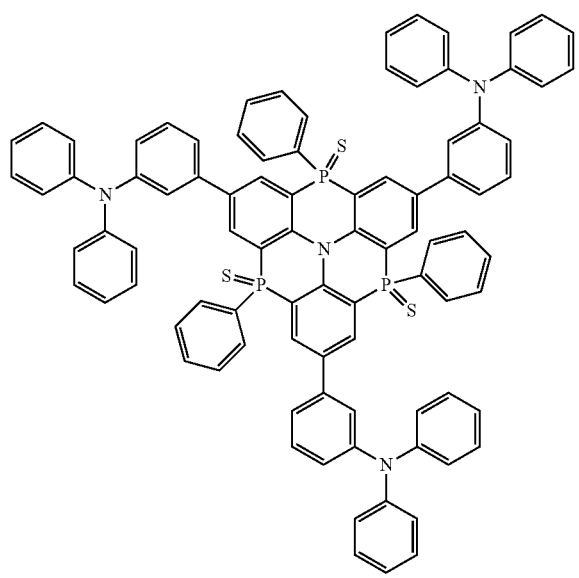
(1-8-64)
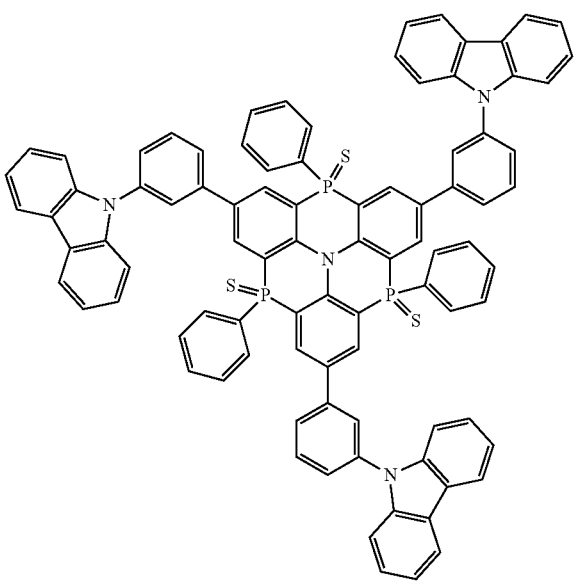

(1-8-65)
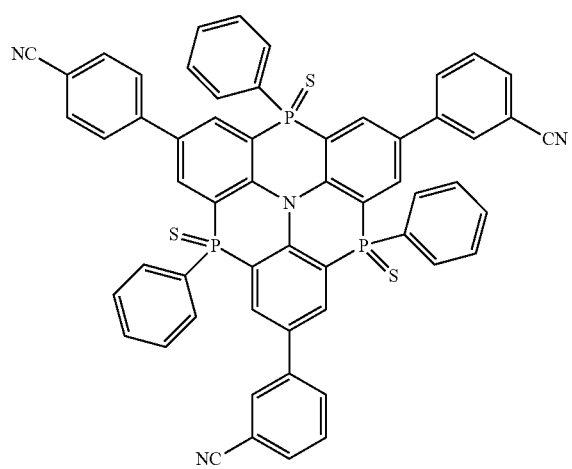
(1-8-66)
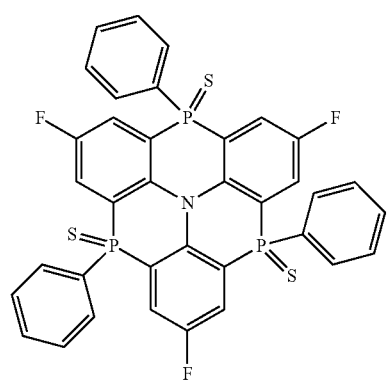
(1-8-67)
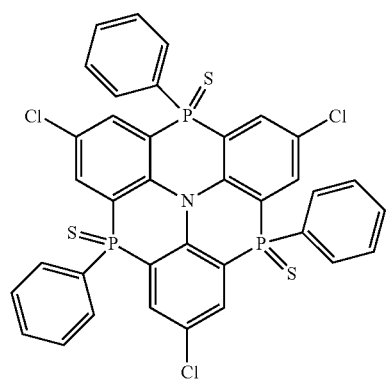
(1-8-68)
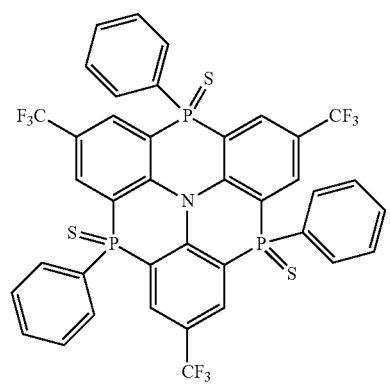
(1-8-69)
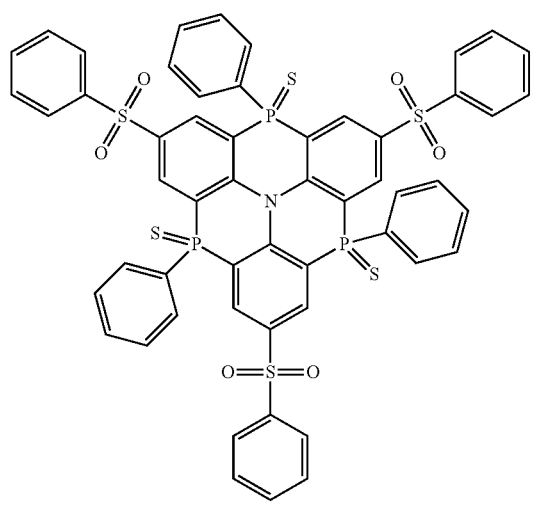
(1-8-70)
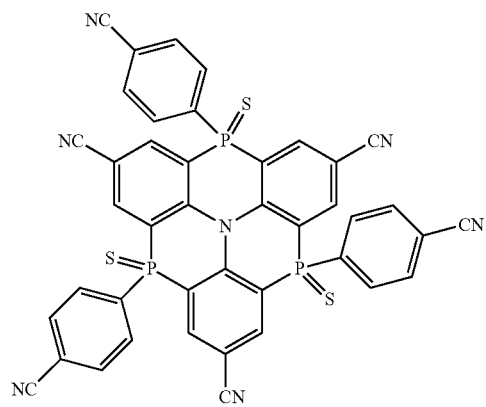

-continued
(1-8-71)
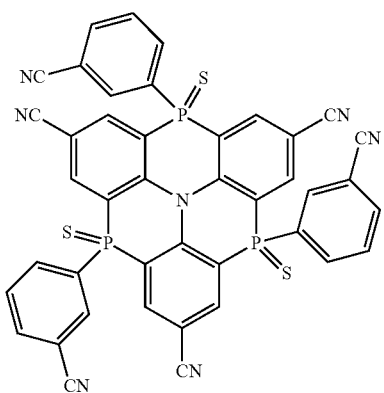
(1-8-72)
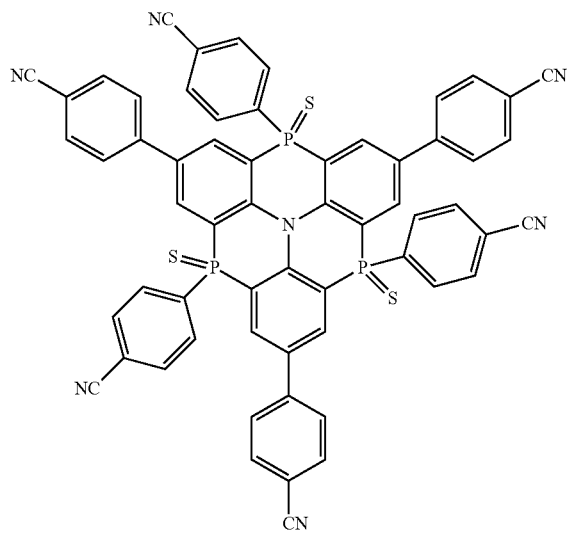
(1-8-73)
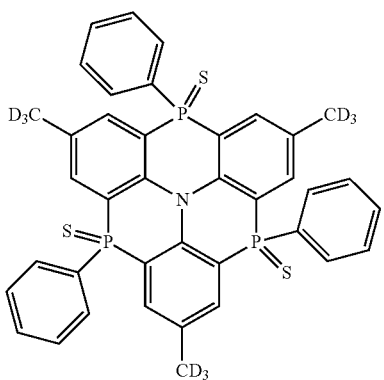
(1-8-74)
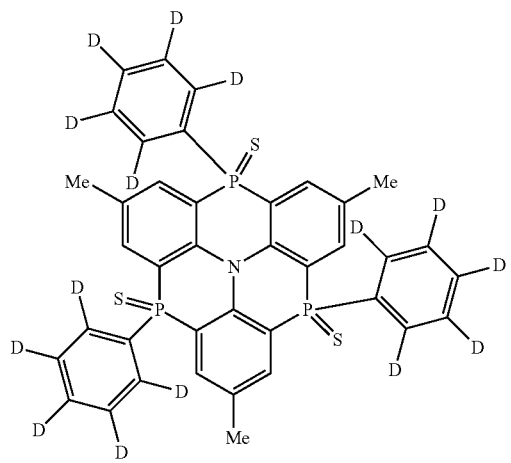
(1-8-75)
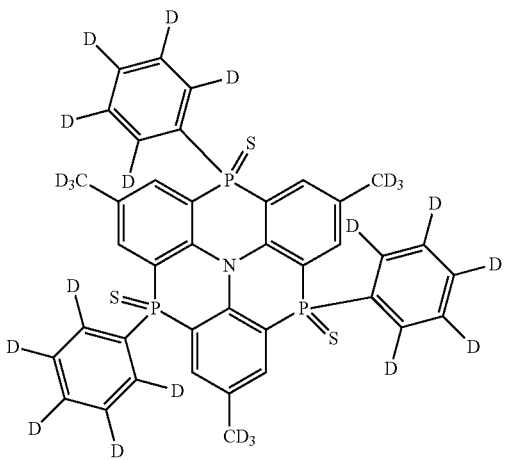
(1-8-85)
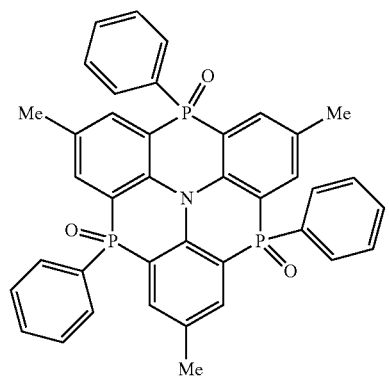

-continued
(1-8-86)
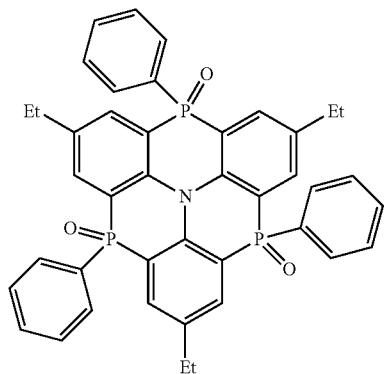
(1-8-87)
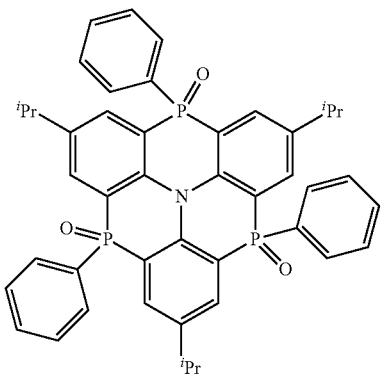
(1-8-88)
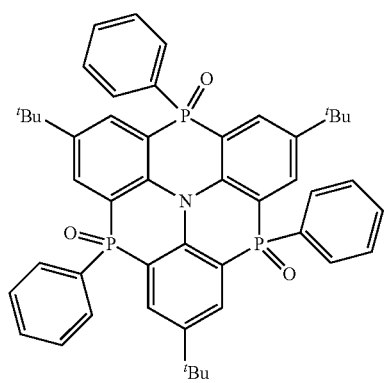
(1-8-89)
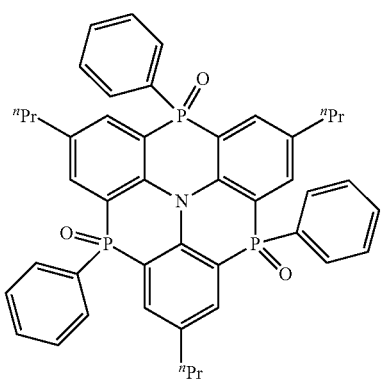
(1-8-90)
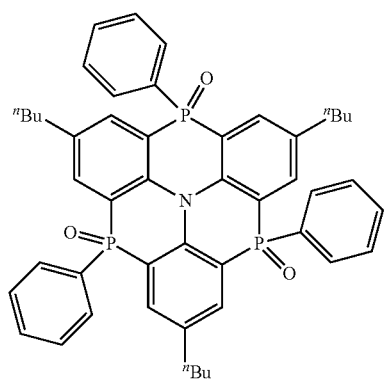
(1-8-91)
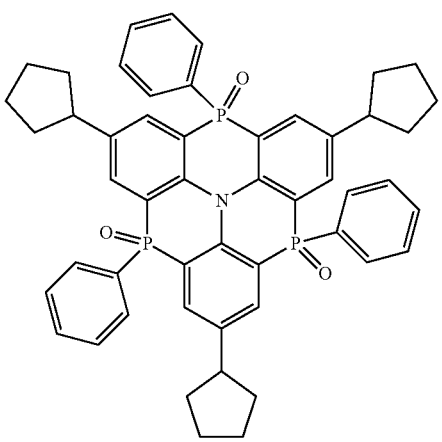
(1-8-92)
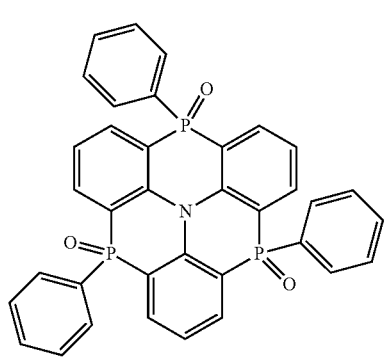
(1-8-93)
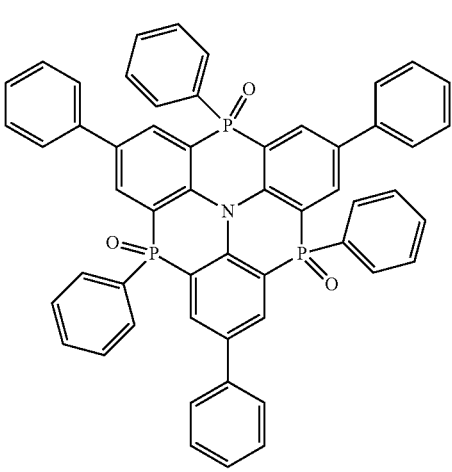

-continued
(1-8-94)
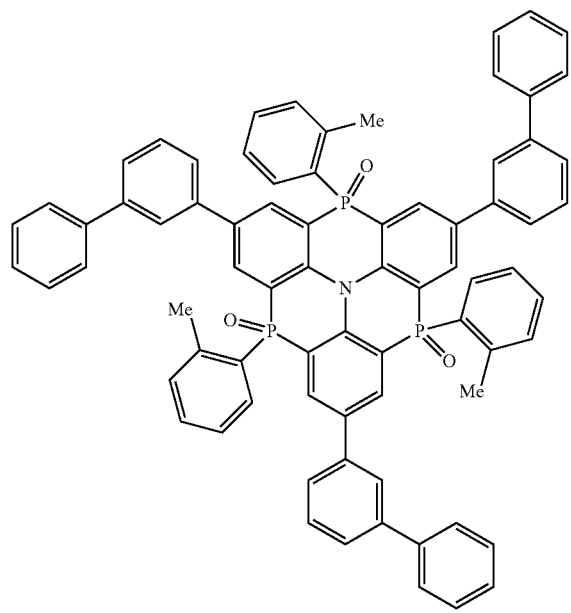
(1-8-95)
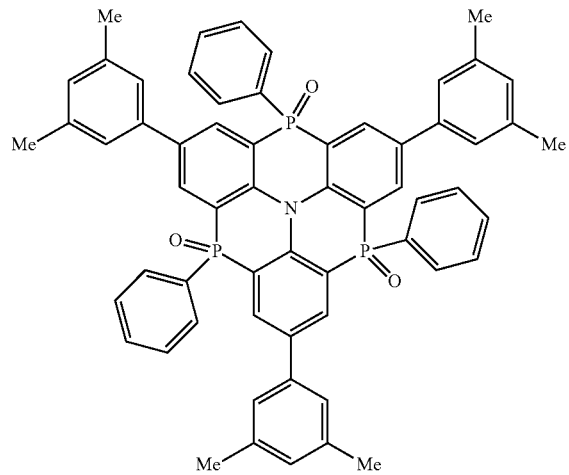
(1-8-96)
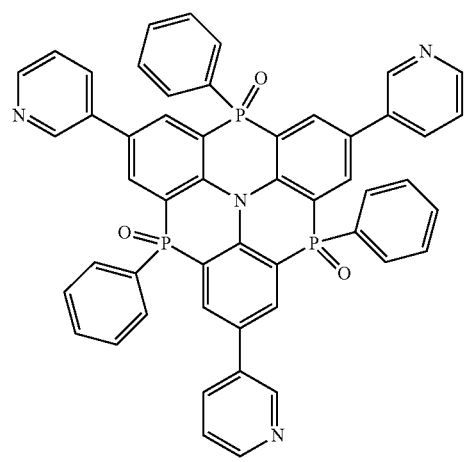
(1-8-97)
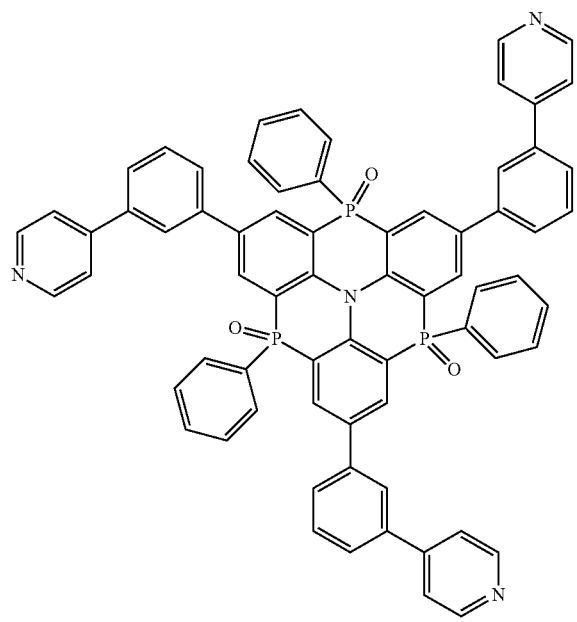

-continued
(1-8-98)
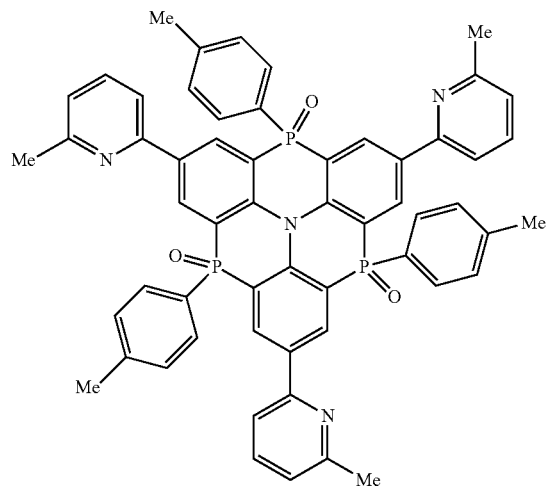
(1-8-105)
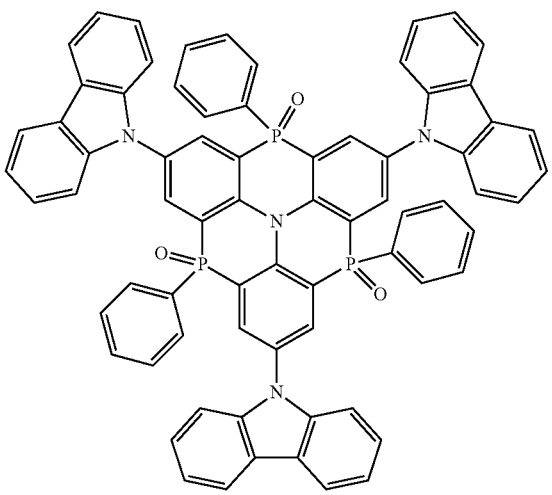
(1-8-106)
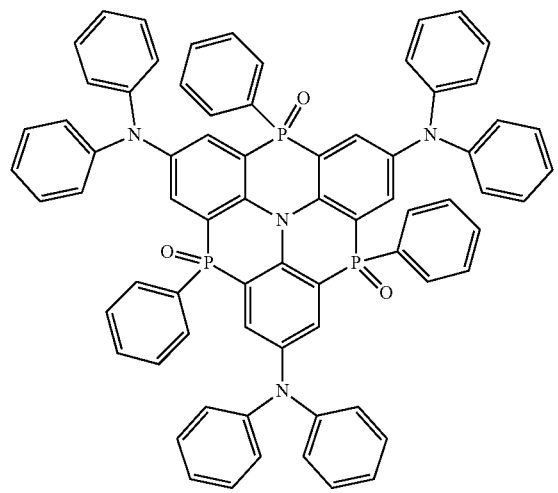
(1-8-107)
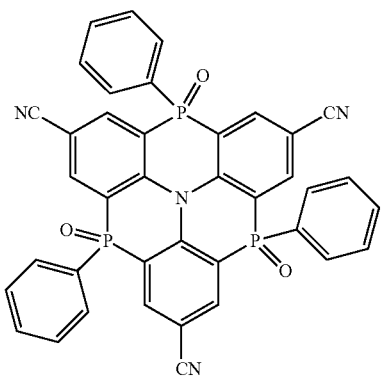
(1-8-108)
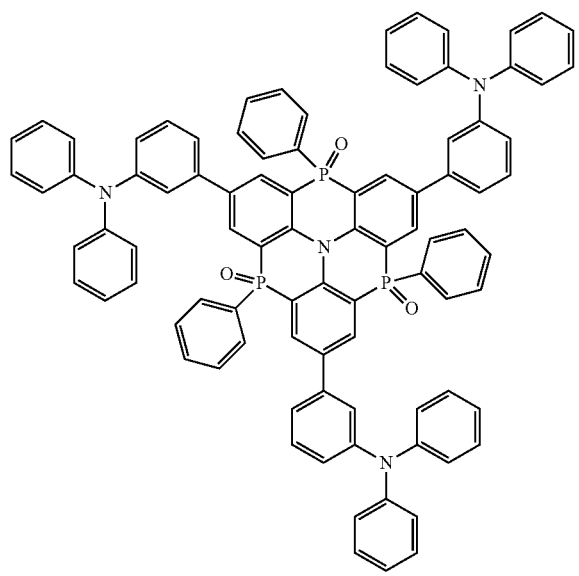
(1-8-109)
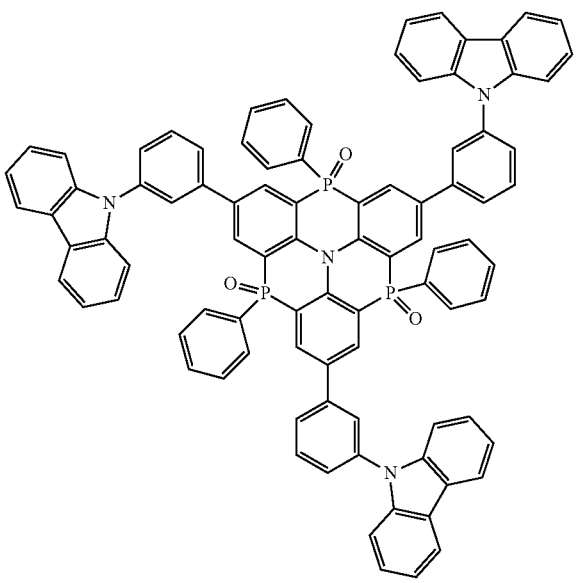

-continued
(1-8-110)
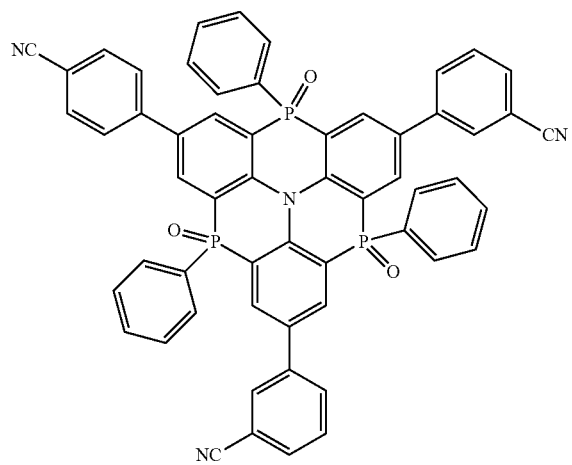
(1-8-111)
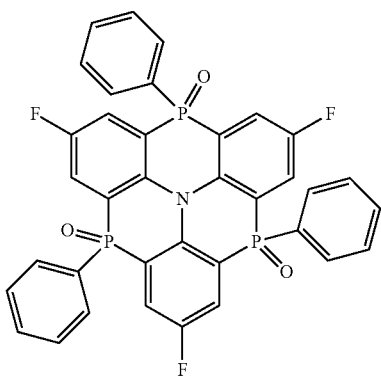
(1-8-112)
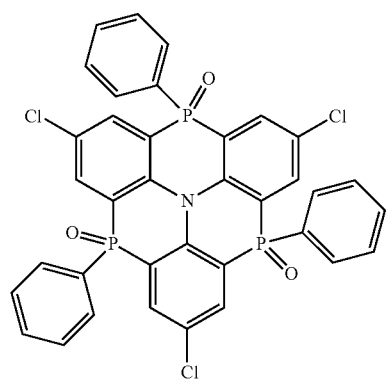
(1-8-113)
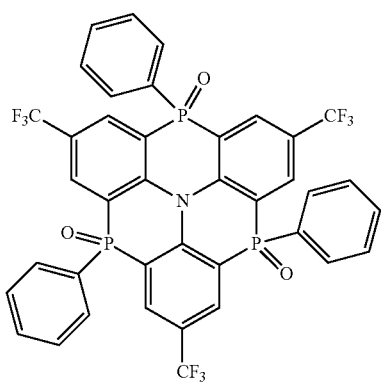
(1-8-114)
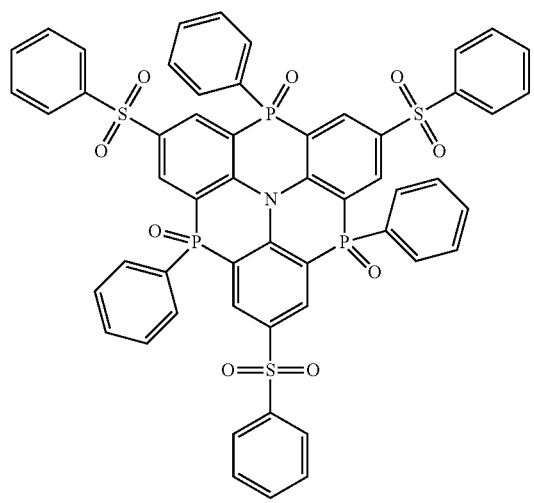
(1-8-115)
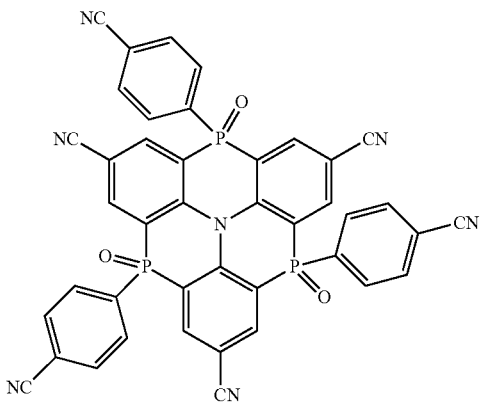

(1-8-116)
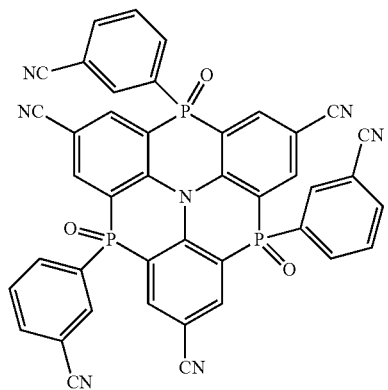
(1-8-117)
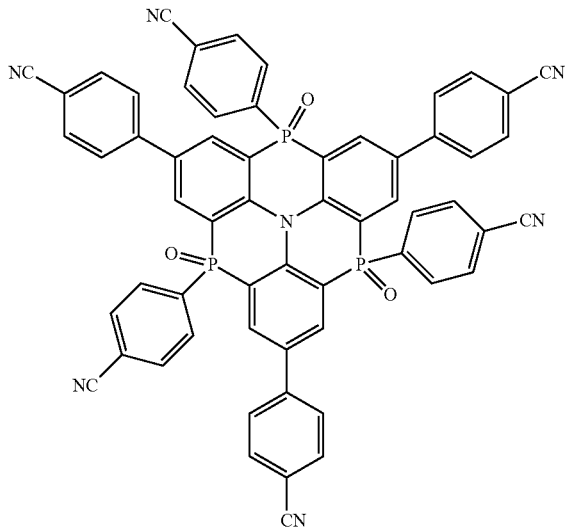
(1-8-118)
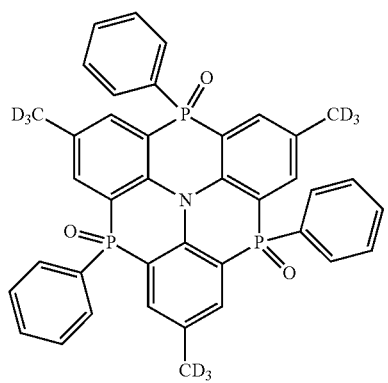
(1-8-119)
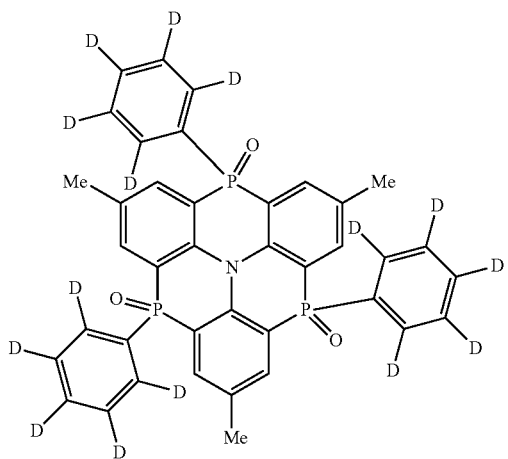
(1-8-120)
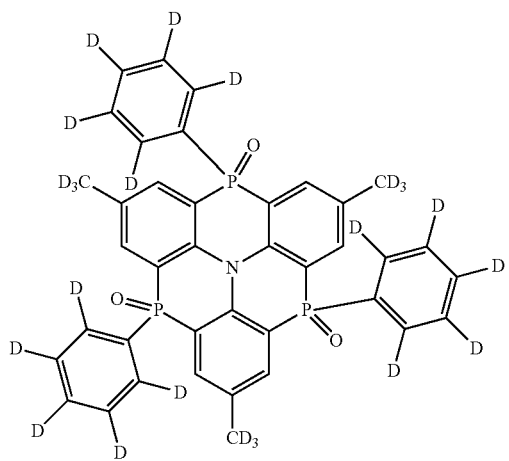
(1-8-130)
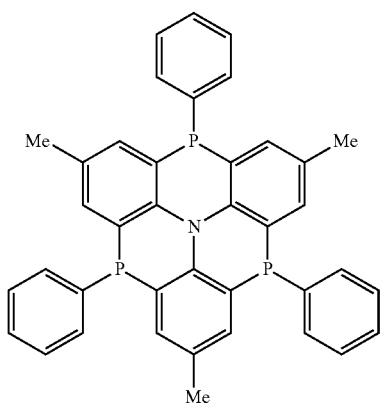

-continued
(1-8-131)
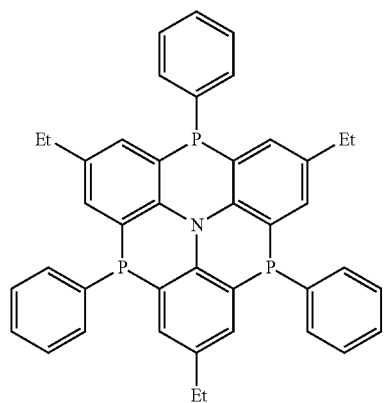
(1-8-132)
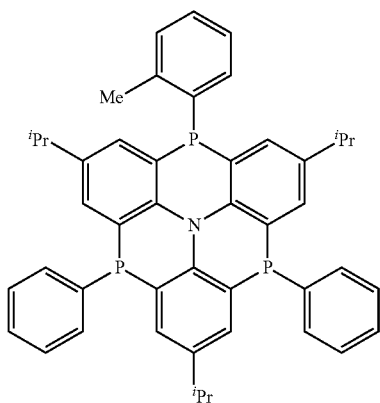
(1-8-133)
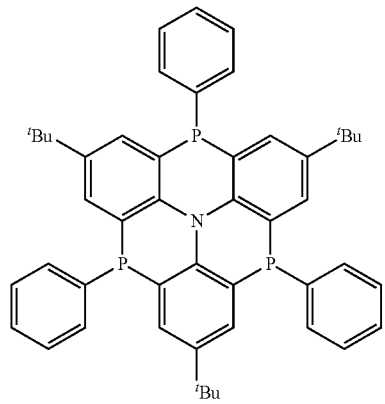
(1-8-134)
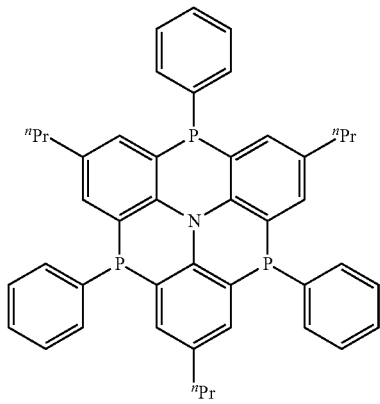
(1-8-135)
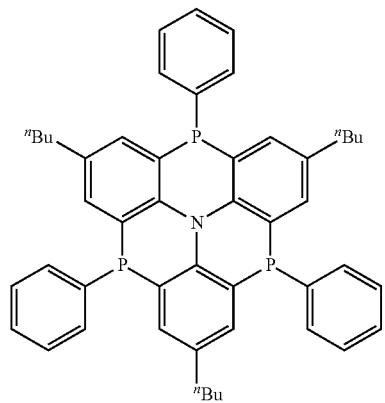
(1-8-136)
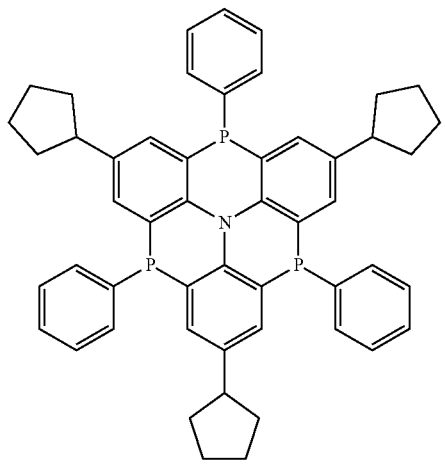

283 284
-continued
(1-8-137)
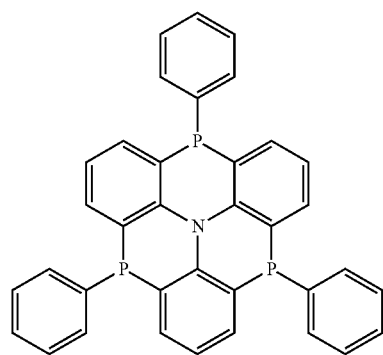
(1-8-138)
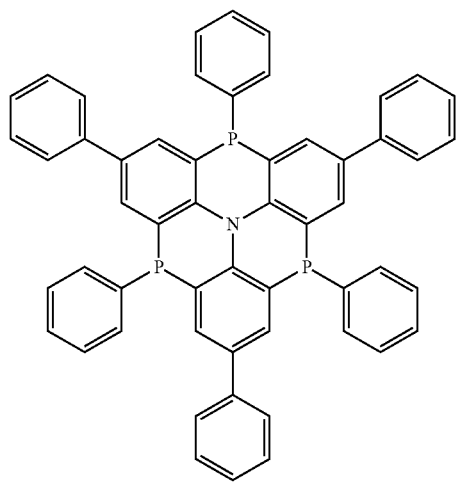
(1-8-139)
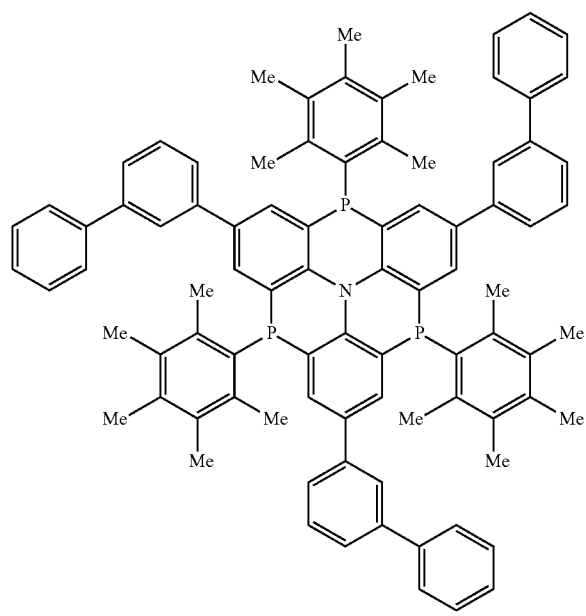
(1-8-140)
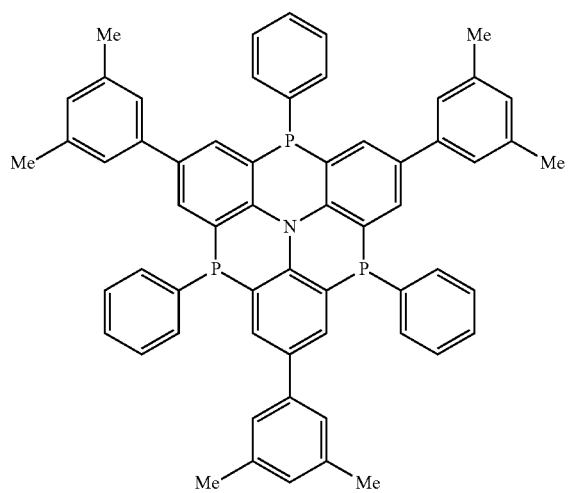

-continued
(1-8-141)
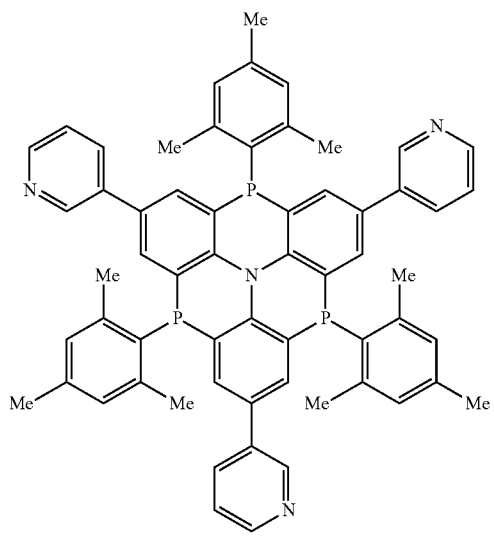
(1-8-142)
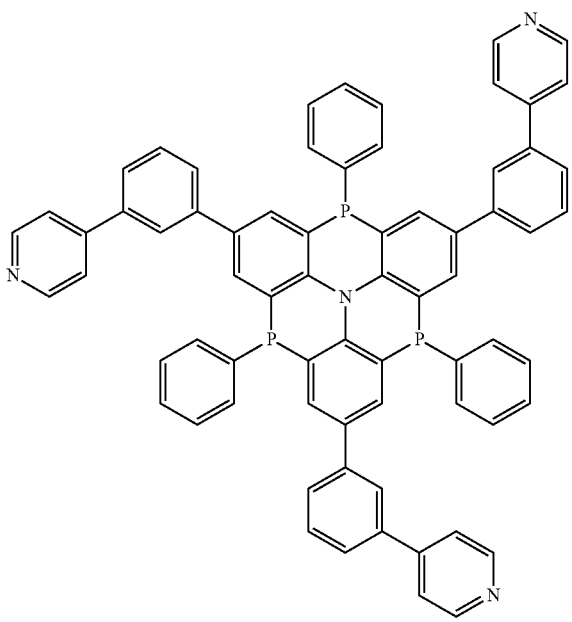
(1-8-143)
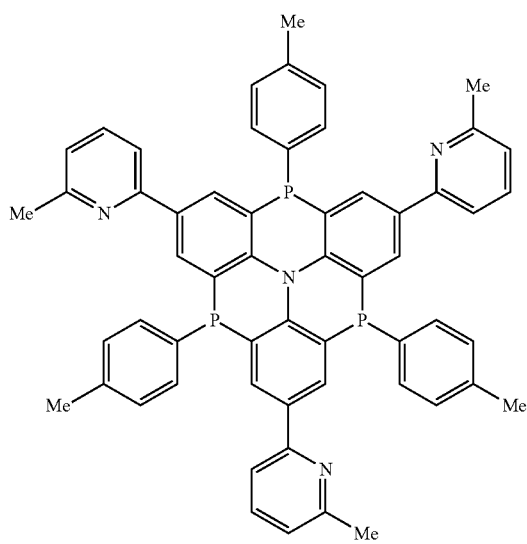
(1-10-1)
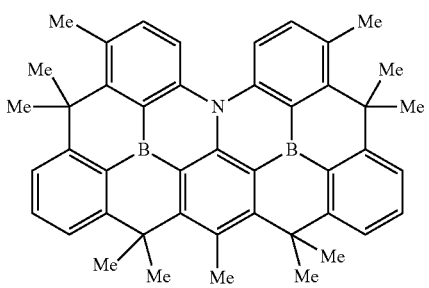
(1-10-2)
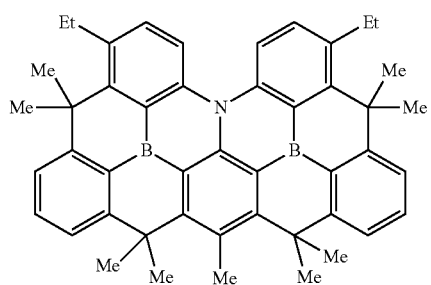
(1-10-3)
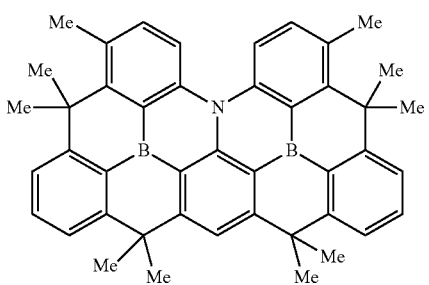

(1-10-4)
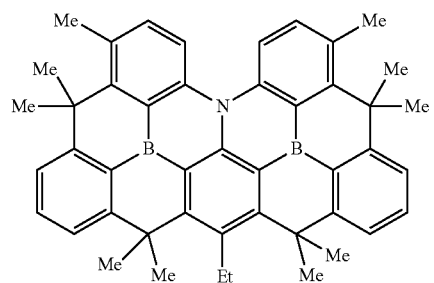
(1-10-5)
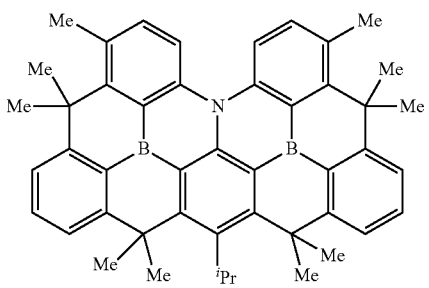
(1-10-6)
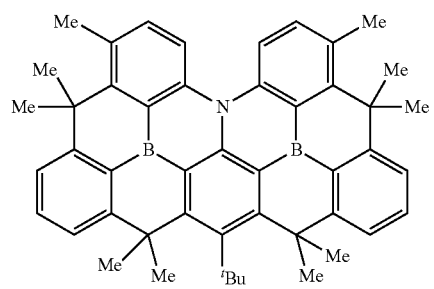
(1-10-7)
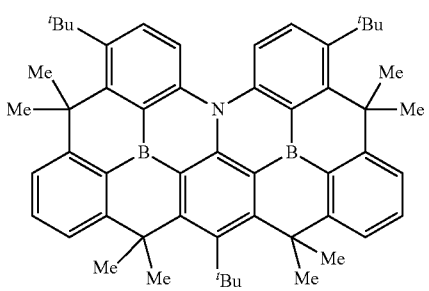
(1-10-8)
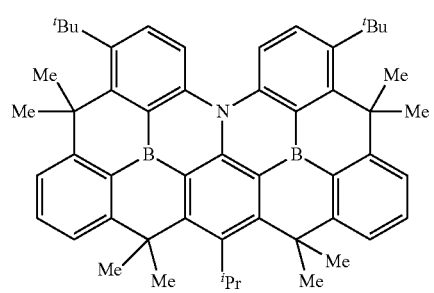
(1-10-9)
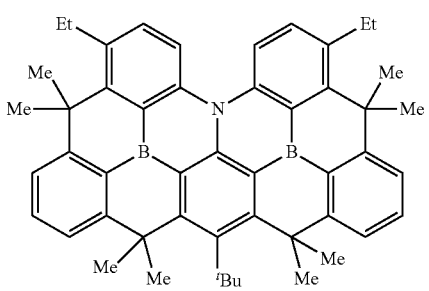
(1-10-10)
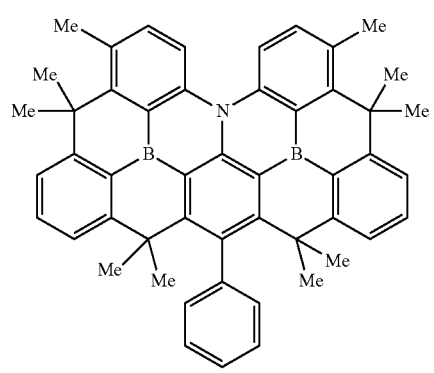
(1-10-11)
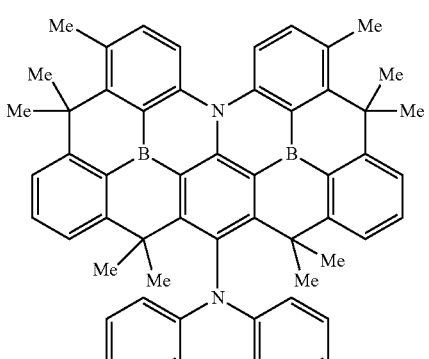
(1-10-12)
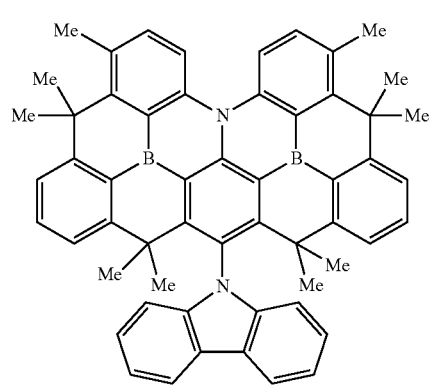
(1-10-13)
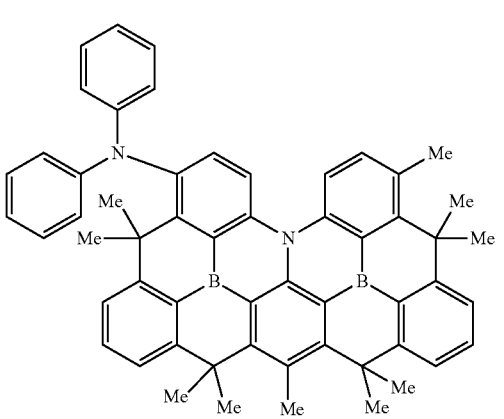

-continued
(1-10-14)
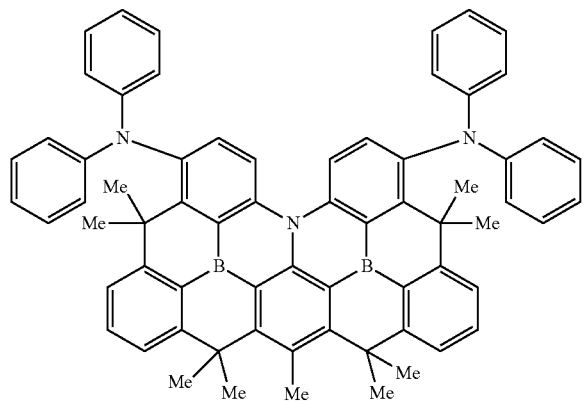
(1-10-15)
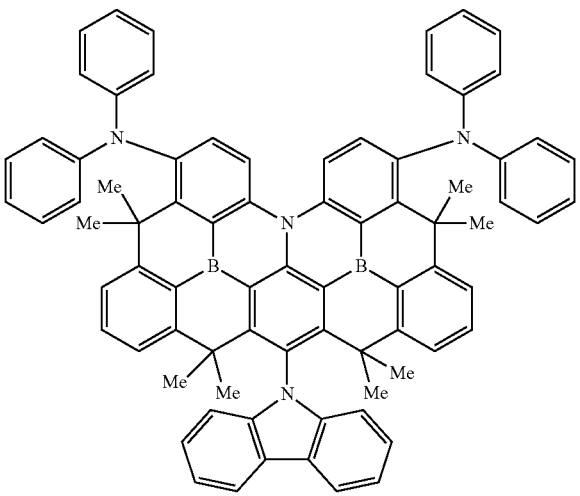
(1-101)
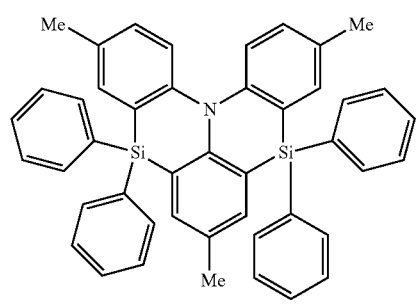
(1-102)
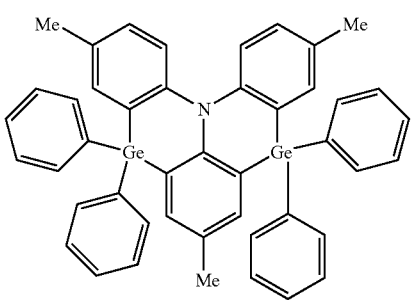
(1-103)
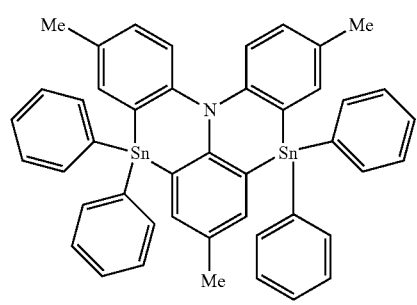
(1-104)
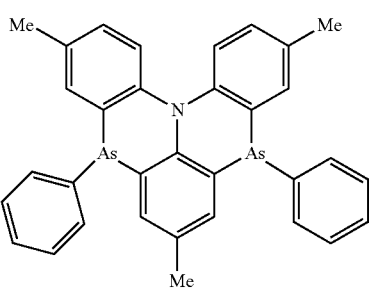
(1-105)
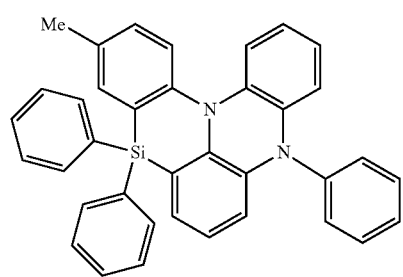
(1-106)
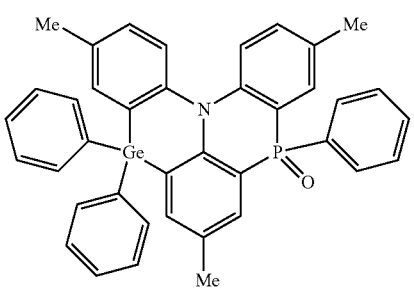

-continued
(1-107)
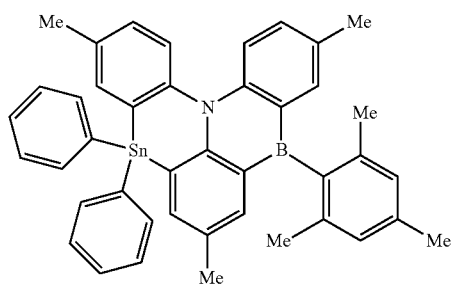
(1-108)
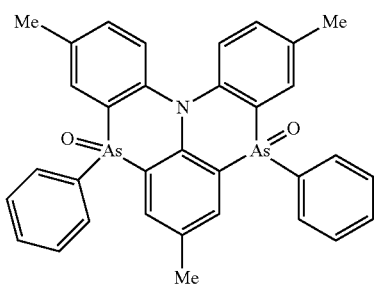
(1-109)
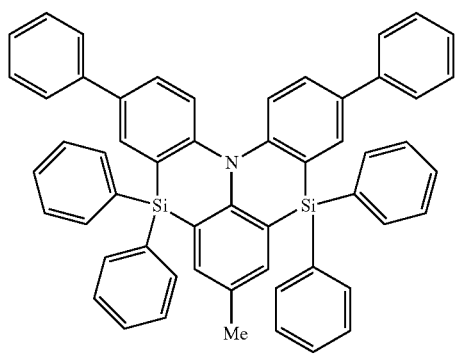
(1-110)
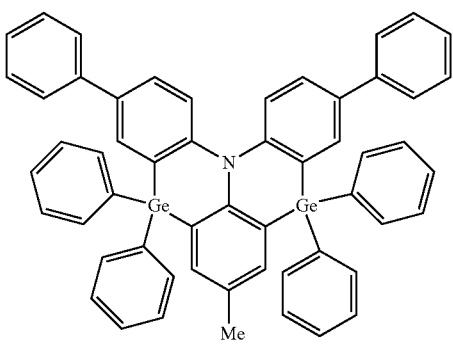
(1-111)
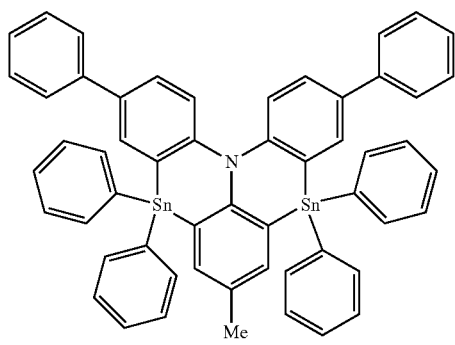
(1-112)
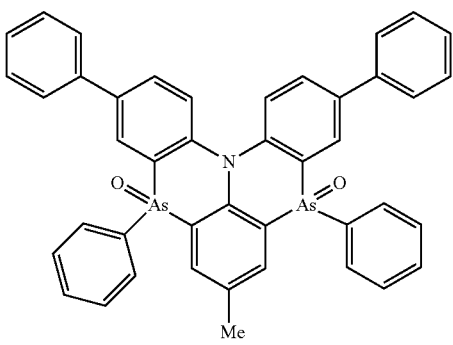
(1-113)
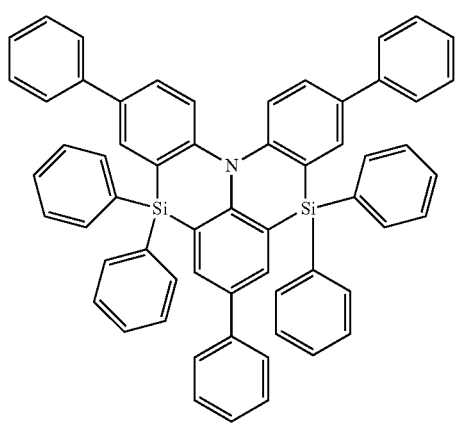
(1-114)
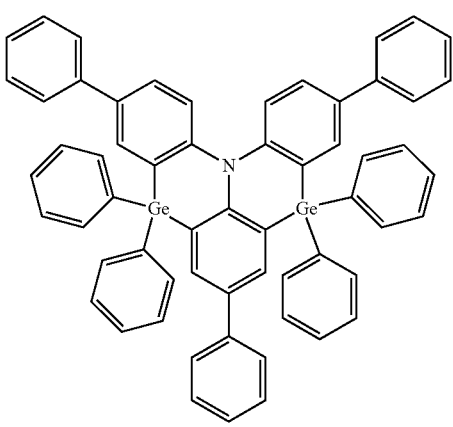

(1-115)

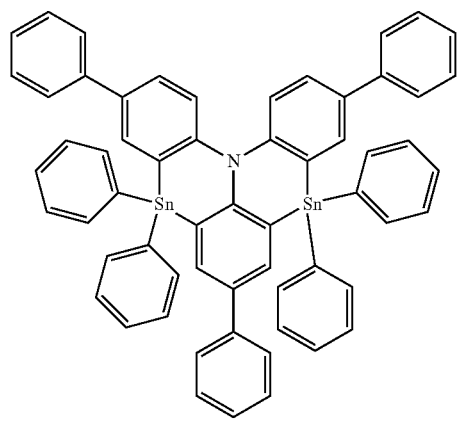

(1-116)

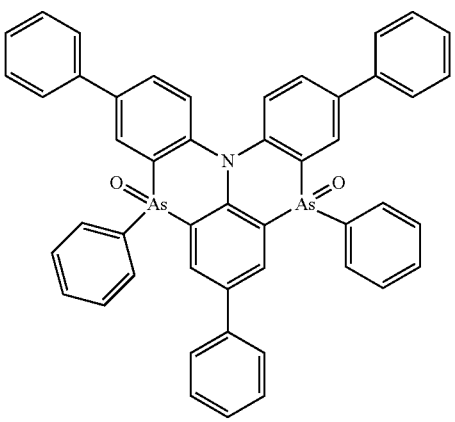

In the above examples, the compounds of formulas (1-3-1) to (1-3-222), (1-4-1) to (1-4-96), (1-5-1) to (1-5-201), (1-6-1) to (1-6-216), (1-7-1) to (1-7-286), (1-7-291) to (1-7-364), (1-8-1) to (1-8-72), (1-8-85) to (1-7-117), and (1-8-130) to (1-8-143) are preferable.

2. Method for Manufacturing Polycyclic Aromatic Compound

For manufacturing a polycyclic aromatic compound represented by general formula (1) or (2), basically, first, ring A (ring a), ring B (ring b), and ring C (ring c) are bonded to the central nitrogen atom to manufacture an intermediate (first reaction). In the first reaction, for example, a general reaction such as a Buchwald-Heartwig reaction can be used.

As illustrated in the following scheme (1), a halogen atom such as a bromine atom is introduced into the intermediate in a subsequent second reaction. For the halogenation (bromination) reaction illustrated in the following scheme (1), a general halogenation reagent such as N-bromosuccinimide or bromine can be used. Note that the definitions of symbols of rings A to E, rings a to e, $R^1$ to $R^{20}$, $R_b$, Ar, and the like used in the following reaction schemes (1) to (8-2) are the same as those of the above symbols in formulas (1) to (8).

Scheme (1)

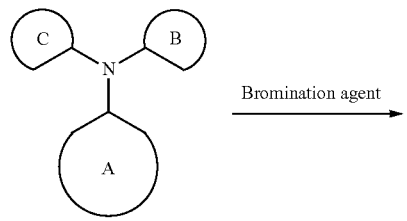

Intermediate

Bromination agent

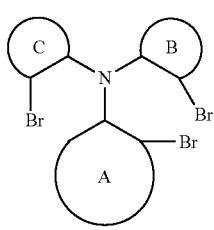

Halogenated intermediate

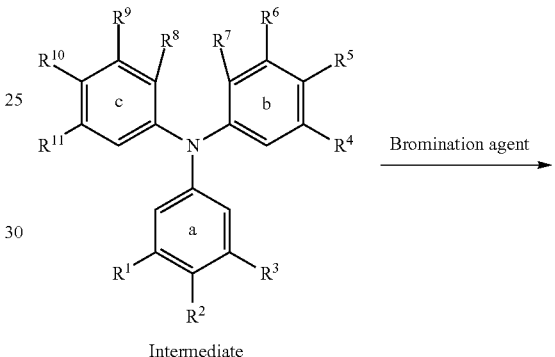

Intermediate

Bromination agent

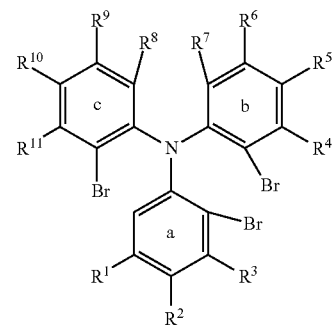

Halogenated intermediate

As illustrated in the following scheme (2), the third reaction introduces $X^1$ and $X^2$ for bonding ring A (ring a), ring B (ring b), and ring C (ring c). As an example, a case where each of $X^1$ and $X^2$ is a divalent group represented by formula (X-1) is illustrated below. First, using the halogenated intermediate as a raw material, a halogen atom at a position where $X^1$ and $X^2$ are to be bonded is subjected to halogen-lithium exchange with n-butyllithium, sec-butyllithium, t-butyllithium, or the like. Subsequently, boron trichloride, boron tribromide, or the like is added to perform metal exchanging of lithium-boron, and then a base such as 1,2,2,6,6-pentamethylpiperidine is added to cause a tandem bora Friedel-Crafts reaction. Subsequently, by adding a nucleophilic reagent such as an aryl Grignard reagent, an aryl group is introduced onto a boron atom to obtain a target product.

Scheme (2)

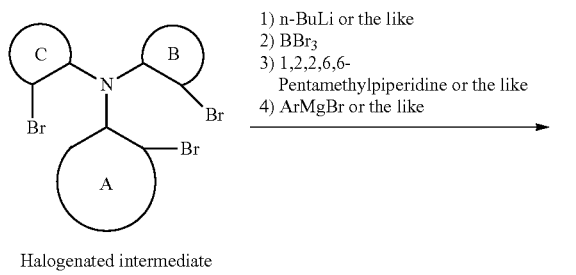

Halogenated intermediate 1) n-BuLi or the like
2) BBr₃
3) 1,2,2,6,6-Pentamethylpiperidine or the like
4) ArMgBr or the like

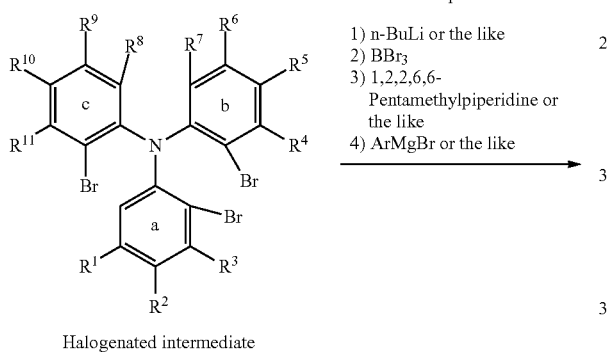

General formula (3)-based compound 1) n-BuLi or the like
2) BBr₃
3) 1,2,2,6,6-Pentamethylpiperidine or the like
4) ArMgBr or the like

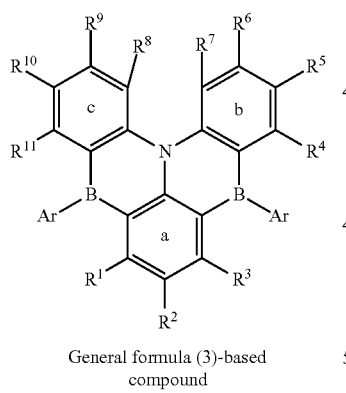

Halogenated intermediate

General formula (3)-based compound

In the above scheme, a lithium atom is introduced into a desired position by halogen-metal exchange, but a lithium atom can be introduced to a desired position also by ortho-metalation.

According to this method, even in a case where a halogen atom cannot be introduced into a desired position of the intermediate due to an influence of a substituent or the like, a target product can be synthesized, and this method is useful.

By appropriately selecting the synthesis method described above, appropriately selecting the synthesis method described above, and appropriately selecting a raw material to be used, a polycyclic aromatic compound having a substituent at a desired position, in which each of $X^1$ and $X^2$ is a divalent group represented by formula (X-1), can be synthesized.

Next, a method for synthesizing a polycyclic aromatic compound represented by general formula (4), in which each of $X^1$ and $X^2$ is a divalent group represented by formula (X-1) and "a linking group via a carbon atom" is further present in a molecule thereof, will be described (scheme (3) below). As a first reaction, as illustrated in the above scheme (2), a tandem bora Friedel-Crafts reaction is caused. Subsequently, a Grignard reagent of an aryl having a double bond in a side chain, serving as a precursor of a "linking group via a carbon atom", is reacted to manufacture an intermediate (first reaction). Examples of this reagent include a 2-isopropenylphenyl Grignard reagent.

Scheme (3)

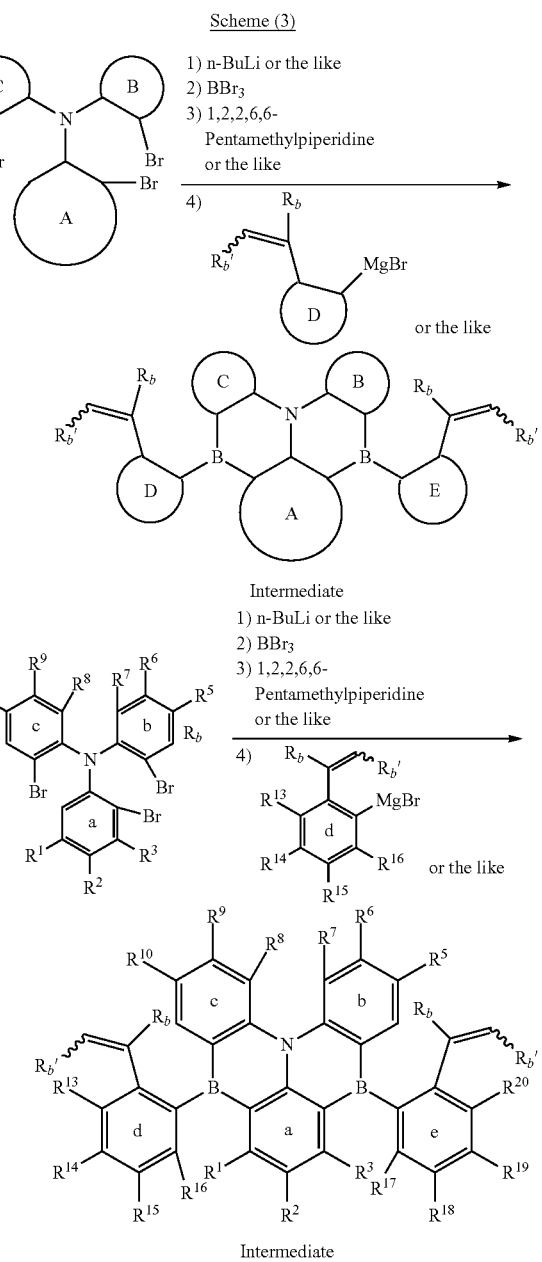

Subsequently, as a second reaction, as illustrated in the following scheme (4), the intermediate having an such as scandium trifluoromethanesulfonate (Sc(OTf)$_3$) to obtain a target product having a "linking group via a carbon atom" in a molecule the thereof.

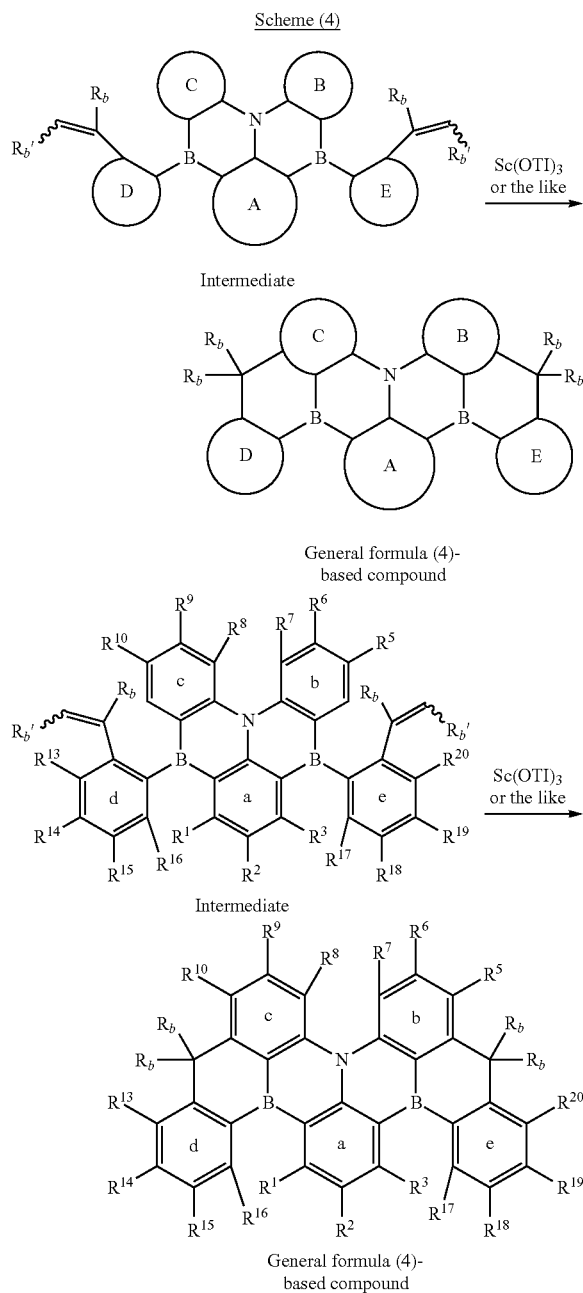

In the above scheme (4), E-isomer and Z-isomer can exist in a side chain of a double bond of the intermediate except for a case of an isopropenyl group, but any one of E-isomer, Z-isomer, and a mixture of isomers at any ratio can be used. Note that the wavy line between $R_b'$ and the double bond in the above scheme (4) means that any of E-isomer, Z-isomer, and a mixture of isomers at any ratio may be included.

In the above scheme (4), $R_b'$ represents an alkyl in which the carbon number or the like is adjusted such that the two alkyl substituents on carbon atoms of a "linking group via a carbon atom" are the same $R_b$ after the reaction of the above scheme (4) or a hydrogen atom. For example, when $R_b$ represents a methyl group, $R_b'$ represents a hydrogen atom, and carbon atoms of a "linking group via a carbon atom" of a target product are substituted by two methyls.

Next, as an example, an example of synthesis of polycyclic aromatic compounds represented by the above general formula (5) and (6), in which $X^1$ represents a divalent group represented by formula (X-2) and $X^2$ is a divalent group represented by formula (X-1), is illustrated in the following schemes (5) and (6). First, in a first reaction not illustrated in the scheme, a general reaction such as a Buchwald-Hartwig reaction using, for example, 6,13-dihydrodibenzo[b,i]phenazine as a raw material can be used. In a second reaction illustrated in the following schemes (5) and (6), a tandem hetero-Friedel-Crafts reaction can be used.

In the second reaction, as illustrated in the following scheme (5), a triarylboron reagent such as triphenylborane and boron tribromide are added to the arylated diamino compound obtained in the first reaction to cause a tandem hetero Friedel-Crafts reaction. Subsequently, a nucleophilic reagent such as an aryl Grignard reagent is added to introduce an aryl group onto a boron atom. A target product having the group represented by formula (X-1) and the group represented by formula (X-2) can be thereby obtained.

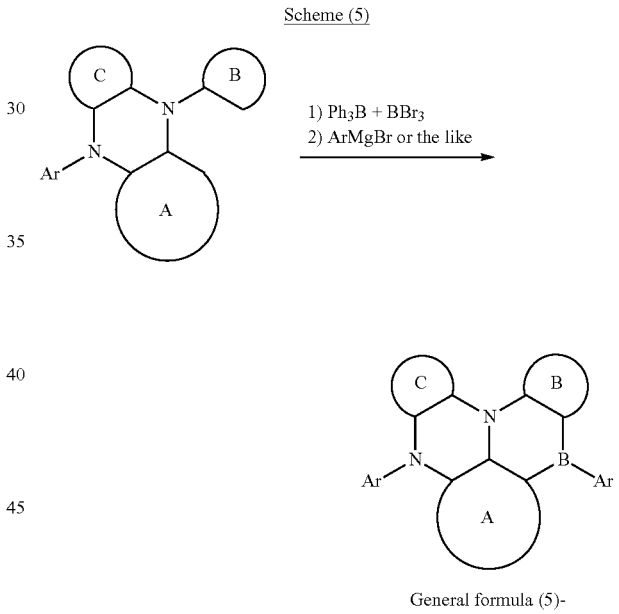

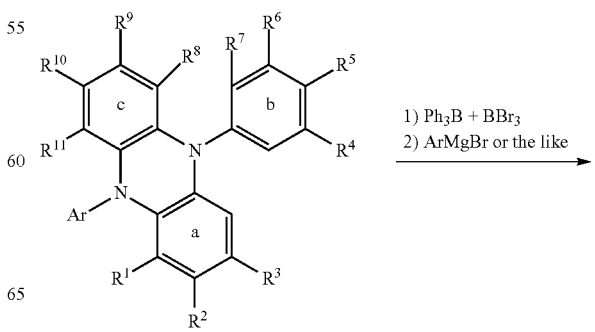

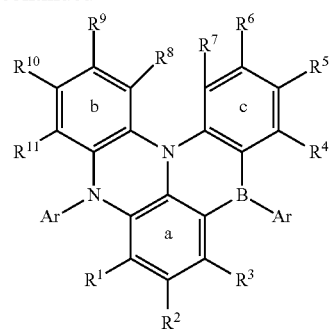

General formula (5)-
based compound

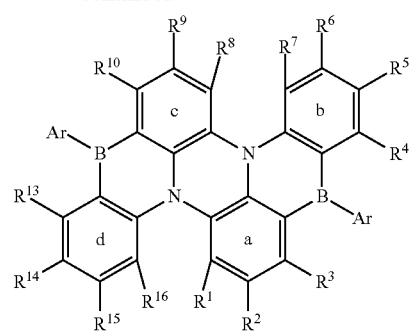

General formula (6)-
based compound

In the above general formula (5)-based compound, in order to synthesize a compound in which Ar is further bonded to a ring by "a linking group via a boron atom", as illustrated in the following scheme (6), boron triiodide is added to the arylated diamino compound obtained by the first reaction to cause a tandem hetero-Friedel-Crafts reaction. Subsequently, a nucleophilic reagent such as an aryl Grignard reagent is added to introduce an aryl group onto a boron atom. A target product can be thereby obtained.

By appropriately selecting the above synthesis method and appropriately selecting a raw material to be used, it is possible to synthesize a polycyclic aromatic compound having a substituent at a desired position, represented by general formula (5) or (6).

Next, as an example, a method for synthesizing a polycyclic aromatic compound represented by general formula (7), in which each of $X^1$ and $X^2$ is a divalent group represented by any one of formulas (X-3) to (X-7), will be described. As a first reaction, as illustrated in the following scheme (7-1), a halogen atom of an intermediate halogenated with a bromine atom or the like, obtained by the method illustrated in the above scheme (1), is subjected to halogen-lithium exchange with n-butyllithium, sec-butyl lithium, t-butyl lithium, or the like. Subsequently, about 2 equivalents of a compound having a phosphorus-halogen bond such as bisdiethylamino chlorophosphine is added, and then sulfur is further added to obtain a precursor compound. Incidentally, by adjusting the equivalent of a phosphorus-based reagent to be used, the number of phosphorus-based substituents to be introduced can be controlled.

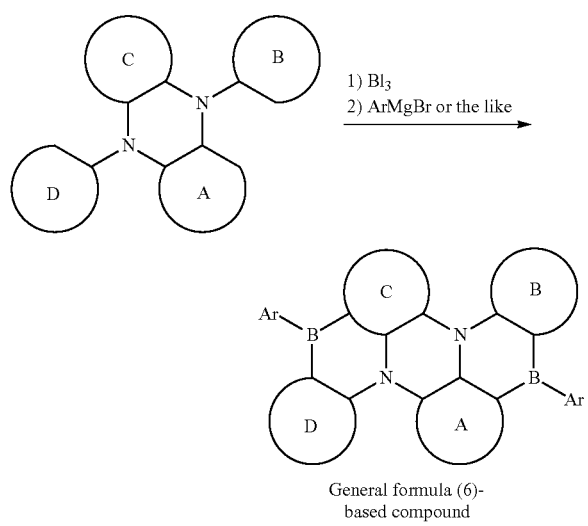

Scheme (6)

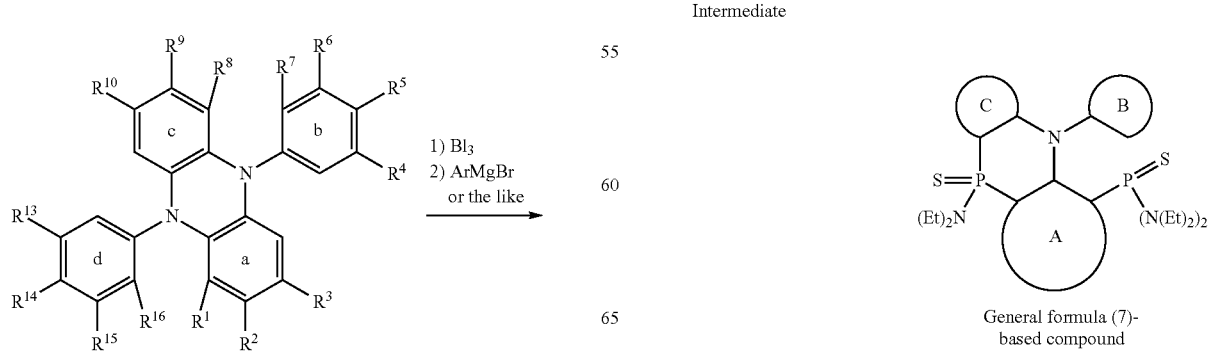

Scheme (7-1)

General formula (7)-
based compound

-continued

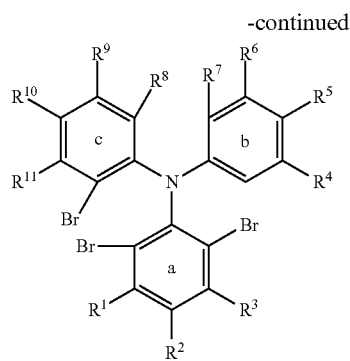

Intermediate 1) n-BuLi or the like
2) Bisdiethylamino chlorophosphine (about 2 equivalents)
3) Sulfur

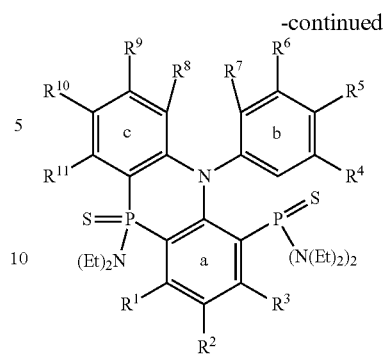

(Precursor)

Aluminum trichloride

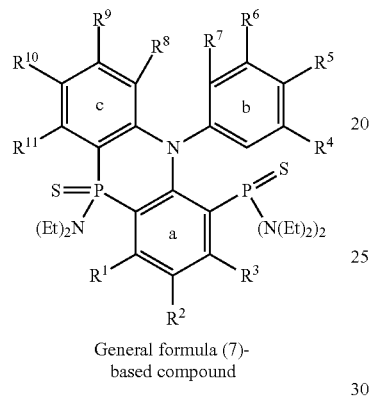

General formula (7)-based compound

Subsequently, as illustrated in the following scheme (7-2), the precursor compound obtained in the first reaction is reacted with a Lewis acid such as aluminum trichloride to cause a tandem hetero-Friedel-Crafts reaction, and a target compound can be obtained (second reaction).

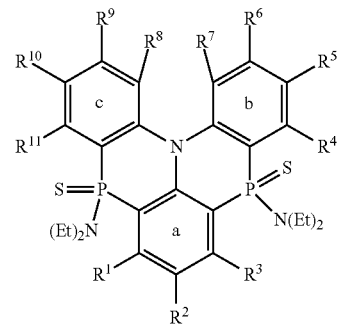

General formula (7)-based compound

Scheme (7-2)

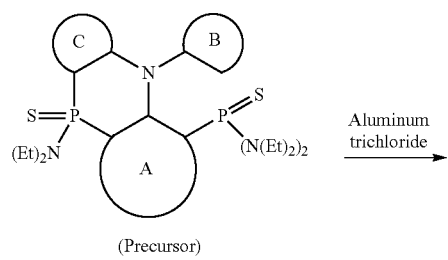

(Precursor)

Aluminum trichloride

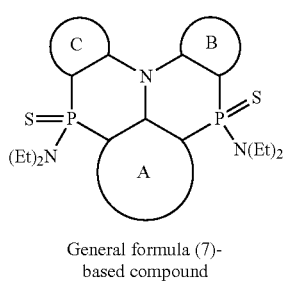

General formula (7)-based compound

By appropriately selecting the synthesis method described above and appropriately selecting a raw material to be used, a polycyclic aromatic compound having a substituent at a desired position, in which each of $X^1$ and $X^2$ is a divalent group represented by any one of formulas (X-3) to (X-7), represented by general formula (7), can be synthesized.

Next, as an example, a method for synthesizing a polycyclic aromatic compound represented by general formula (8), in which each of $X^1$ and $X^2$ is a divalent group represented by any one of formulas (X-3) to (X-7) and $X^3$ for bonding ring B and ring C (ring b and ring c) is a divalent group represented by any one of formulas (X-3) to (X-7), will be described. As a first reaction, as illustrated in the following scheme (8-1), a halogen atom of an intermediate halogenated with a bromine atom or the like, obtained by the method illustrated in the above scheme (1), is subjected to halogen-lithium exchange with n-butyllithium, sec-butyl lithium, t-butyl lithium, or the like. Subsequently, about 4 equivalents of a compound having a phosphorus-halogen bond such as bisdiethylamino chlorophosphine is added, and then sulfur is further added to obtain a precursor compound. Incidentally, by adjusting the equivalent of a phosphorus-based reagent to be used, the number of phosphorus-based substituents to be introduced can be controlled.

Scheme (8-1)

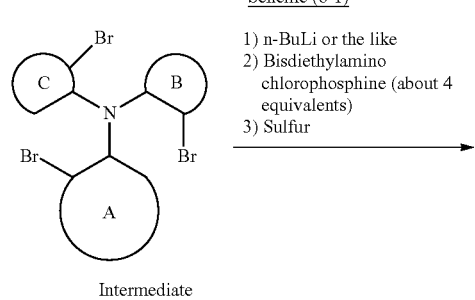

Intermediate 1) n-BuLi or the like
2) Bisdiethylamino chlorophosphine (about 4 equivalents)
3) Sulfur
→

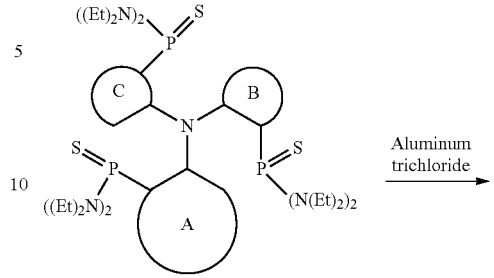

(Precursor)

Aluminum trichloride →

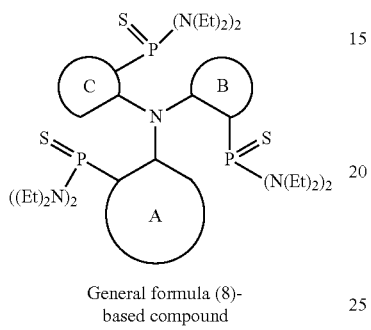

General formula (8)-based compound

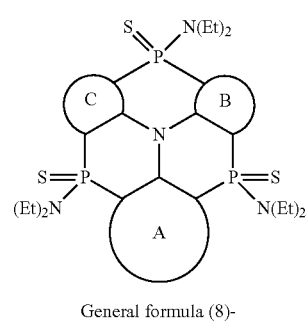

General formula (8)-based compound

Scheme (8-2)

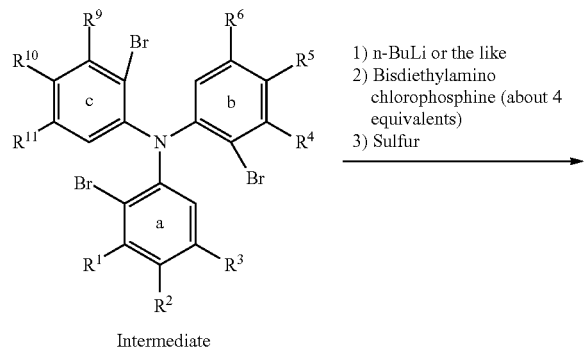

Intermediate 1) n-BuLi or the like
2) Bisdiethylamino chlorophosphine (about 4 equivalents)
3) Sulfur
→

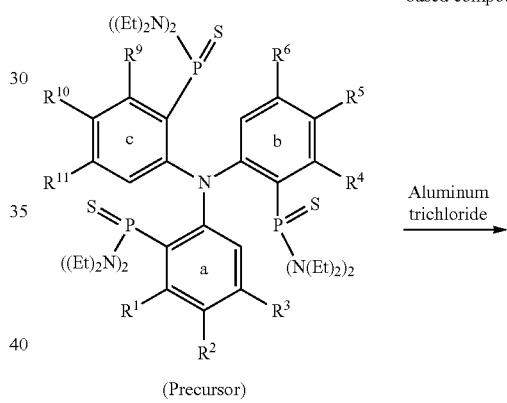

(Precursor)

Aluminum trichloride →

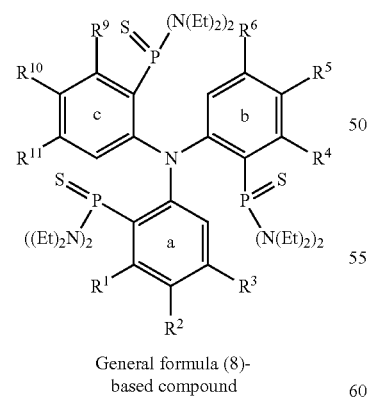

General formula (8)-based compound

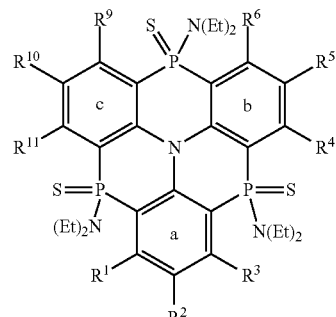

General formula (8)-based compound

Subsequently, as illustrated in the following scheme (8-2), the precursor compound obtained in the first reaction is reacted with a Lewis acid such as aluminum trichloride to cause a tandem hetero-Friedel-Crafts reaction, and a target compound can be obtained (second reaction).

Next, by appropriately selecting the synthesis method described above and appropriately selecting a raw material to be used, a polycyclic aromatic compound having a substituent at a desired position, in which each of $X^1$ and $X^2$ is a divalent group represented by any one of formulas (X-3) to (X-7), and $X^3$ for bonding ring B and ring C (ring b and ring c) is a divalent group represented by any one of formulas (X-3) to (X-7), represented by general formula (8), can be synthesized.

In the above schemes (7-1) and (8-1), use of bisdiethylamino chlorophosphine as a compound having a phosphorus-halogen bond has been exemplified. However, by using a compounds having a phosphorus-halogen bond with various other substituents in place thereof, a substituent other than a diethylamino group can be introduced.

In the above schemes (7-2) and (8-2), a synthesis example of a compound having a phosphorus-sulfur double bond has been illustrated. However, for example, a sulfur atom can be converted into an oxygen atom by a method described in WO 2015/102118 A or WO 2010/104047 A. By eliminating the sulfur atom or the oxygen atom, it is possible to perform conversion to a corresponding phosphine compound.

In the above schemes (1) to (8-2), a case where each of $X^1$, $X^2$, and $X^3$ represents a boron atom, a nitrogen atom, or a phosphorus atom has been exemplified. However, in addition, also in a case of another element such as silicon, germanium, tin, or arsenic, synthesis can be performed similarly by using a Friedel Crafts reaction of a hetero atom (tandem hetero Friedel Crafts reaction) as described in, for example, WO 2012/121398 A or WO 2010/104047 A. It is generally known that elements in the same group of the Periodic Table exhibit similar reactivity. Therefore, for example, a reaction possible with phosphorus is also possible with arsenic in the same group.

Note that examples of a reagent used for halogen-lithium exchange or ortho-metalation in the above schemes (1) to (8-2) include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Note that examples of a base used for the above schemes (1) to (8-2) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (Ar represents an aryl such as phenyl).

Examples of a Lewis acid used for the above schemes (1) to (8-2) include $AlCl_3$, $AlBr_3$, $AlF_3$, $BF_3 \cdot OEt_2$, $BCl_3$, $BBr_3$, $GaCl_3$, $GaBr_3$, $InCl_3$, $InBr_3$, $In(OTf)_3$, $SnCl_4$, $SnBr_4$, $AgOTf$, $ScCl_3$, $Sc(OTf)_3$, $ZnCl_2$, $ZnBr_2$, $Zn(OTf)_2$, $MgCl_2$, $MgBr_2$, $Mg(OTf)_2$, $LiOTf$, $NaOTf$, $KOTf$, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In addition, the polycyclic aromatic compound of the present invention includes a compound in which at least some of hydrogen atoms are substituted by cyanos, a compound in which at least some of hydrogen atoms are substituted by deuterium atoms, and a compound in which at least some of hydrogen atoms are substituted by halogen atoms such as fluorine atoms or chlorine atoms. Such a compound or the like can be synthesized in a similar manner to the above using a raw material having a desired site cyanated, deuterated, fluorinated, or chlorinated.

The polycyclic aromatic compound according to the present invention can be used as a material for an organic device. Examples of the organic device include an organic electroluminescent element, an organic field effect transistor, and an organic thin film solar cell.

3. Organic Electroluminescent Element

The polycyclic aromatic compound according to the present invention can be used as, for example, a material for an organic electroluminescent element. Hereinafter, an organic EL element according to the present embodiment will be described in detail based on the drawings. FIG. 1 is a schematic cross-sectional view illustrating the organic EL element according to the present embodiment.

<Structure of Organic Electroluminescent Element>

An organic electroluminescent element 100 illustrated in FIG. 1 includes a substrate 101, a positive electrode 102 disposed on the substrate 101, a hole injection layer 103 disposed on the positive electrode 102, a hole transport layer 104 disposed on the hole injection layer 103, a light emitting layer 105 disposed on the hole transport layer 104, an electron transport layer 106 disposed on the light emitting layer 105, an electron injection layer 107 disposed on the electron transport layer 106, and a negative electrode 108 disposed on the electron injection layer 107.

Incidentally, the organic electroluminescent element 100 may be configured, by reversing the manufacturing order, to include, for example, the substrate 101, the negative electrode 108 disposed on the substrate 101, the electron injection layer 107 disposed on the negative electrode 108, the electron transport layer 106 disposed on the electron injection layer 107, the light emitting layer 105 disposed on the electron transport layer 106, the hole transport layer 104 disposed on the light emitting layer 105, the hole injection layer 103 disposed on the hole transport layer 104, and the positive electrode 102 disposed on the hole injection layer 103.

Not all of the above layers are essential. The configuration includes the positive electrode 102, the light emitting layer 105, and the negative electrode 108 as a minimum constituent unit, and optionally includes the hole injection layer 103, the hole transport layer 104, the electron transport layer 106, and the electron injection layer 107. Each of the above layers may be formed of a single layer or a plurality of layers.

A form of layers constituting the organic electroluminescent element may be, in addition to the above configuration form of "substrate/positive electrode/hole injection layer/hole transport layer/light emitting layer/electron transport layer/electron injection layer/negative electrode", a configuration form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 serves as a support of the organic electroluminescent element 100, and usually, quartz, glass, a metal, a plastic, and the like are used. The substrate 101 is formed into a plate shape, a film shape, or a sheet shape according to a purpose, and for example, a glass plate, a metal plate, a metal foil, a plastic film, and a plastic sheet are used therefor. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. An upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic Electroluminescent Element>

The positive electrode 102 plays a role of injecting a hole into the light emitting layer 105. Incidentally, in a case where the hole injection layer 103 and/or the hole transport layer 104 are/is disposed between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer including polythiophene such as poly(3-methylthiophene), polypyrrole, and polyaniline. In addition to these compounds, a material can be appropriately selected for use from materials used as a positive electrode of an organic electroluminescent element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 into the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport material.

A hole injection/transport substance needs to efficiently inject/transport a hole coming from a positive electrode between electrodes to which an electric field is applied, and desirably has a high hole injection efficiency and transports an injected hole efficiently. For this purpose, a substance which has low ionization potential, large hole mobility, and further has excellent stability, and in which impurities serving as traps are not easily generated at the time of manufacturing and at the time of use, is preferable.

As a material to form the hole injection layer 103 and the hole transport layer 104, a polycyclic aromatic compound represented by the above general formula (1) can be used. Furthermore, any compound can be selected for use from compounds that have been conventionally used as charge transport materials for holes in a photoconductive material, p-type semiconductors, and known compounds used in a hole injection layer and a hole transport layer of an organic electroluminescent element. Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-diphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film needed for manufacturing a luminescent element, can inject a hole from a positive electrode, and can transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, literature "M. Pfeiffer, A. Beyer, T. Fritz, K. Leo, Appl. Phys. Lett., 73(22), 3202-3204 (1998)" and literature "J. Blochwitz, M. Pheiffer, T. Fritz, K. Leo, Appl. Phys. Lett., 73(6), 729-731 (1998)"). These compounds generate a so-called hole by an electron migrating process in an electron-donating type base substance (hole transport substance). Electroconductivity of the base substance depends on the number and mobility of the holes fairly significantly. Known examples of a matrix substance having a hole transport characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape and exhibits a strong light emission (fluorescence) efficiency in a solid state. In the present invention, as a material for the light emitting layer, a polycyclic aromatic compound represented by the above general formula (1) can be used.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. Regarding a doping method, doping can be performed by a co-deposition method with a host material, or alternatively, a dopant material may be mixed in advance with a host material, and then vapor deposition may be performed simultaneously.

The amount of use of a host material depends on the kind of the host material, and is only required to be determined according to a characteristic of the host material. The reference of the amount of use of a host material is preferably from 50 to 99.999% by weight, more preferably from 80 to 99.95% by weight, and still more preferably from 90 to 99.9% by weight with respect to the total amount of a material for a light emitting layer. A polycyclic aromatic compound represented by the above general formula (1) can also be used as a host material.

The amount of use of the dopant material depends on the kind of the dopant material, and may be determined according to a characteristic of the dopant material. The reference of the amount of use of a dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon. A polycyclic aromatic compound represented by the above general formula (1) can also be used as a dopant material.

Examples of the host material that can be used in combination with a polycyclic aromatic compound represented by the above general formula (1) include a fused ring derivative of anthracene, pyrene, or the like conventionally known as a luminous body, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

Furthermore, the dopant material that can be used in combination with a polycyclic aromatic compound represented by the above general formula (1) is not particularly limited, and existing compounds can be used. The dopant material can be selected from various materials depending on the desired color of emitted light. Specific examples of the dopant material include a condensed ring derivative of phenanthrene, anthracene, pyrene, tetracene, pentacene, perylene, naphthopyrene, dibenzopyrene, rubrene, chrysene, or the like, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

If the examples are listed for each color of emitted light, examples of blue to bluish green dopant materials include an aromatic hydrocarbon compound such as naphthalene, anthracene, phenanthrene, pyrene, triphenylene, perylene, fluorene, indene, or chrysene, and derivatives thereof, an aromatic heterocyclic compound such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, and derivatives thereof, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole, and metal complexes thereof, and an aromatic amine derivative represented by N,N'-diphenyl-N,N'-di(3-methylphenyl)-4,4'-diphenyl-1,1'-diamine.

Furthermore, examples of a green to yellow dopant material include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples of the green-yellow dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green dopant material.

Furthermore, examples of an orange to red dopant material include a naphthalimide derivative such as bis(diisopropylphenyl)perylene tetracarboxylic acid imide, a perinone derivative, a rare earth complex such as a Eu complex containing acetylacetone, benzoylacetone, phenanthroline, or the like as a ligand, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazine derivative, and a thiadiazolopyrene derivative. Furthermore, suitable examples of the orange to red dopant material include compounds obtained by introducing a substituent capable of shifting a wavelength to a longer wavelength, such as an aryl, a heteroaryl, an arylvinyl, an amino, or a cyano to the above compounds listed as examples of the blue to bluish green and green to yellow dopant materials.

In addition to the above compounds, a dopant can be appropriately selected for use from compounds and the like described in "Kagaku Kogyo (Chemical Industry)", June 2004, p. 13, and reference literatures and the like described therein.

Among the dopant materials described above, an amine having a stilbene structure, a perylene derivative, a borane derivative, an aromatic amine derivative, a coumarin derivative, a pyran derivative, and a pyrene derivative are particularly preferable.

An amine having a stilbene structure is represented by the following formula, for example.

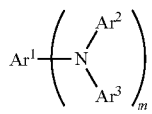

In the formula, $Ar^1$ represents an m-valent group derived from an aryl having 6 to 30 carbon atoms, $Ar^2$ and $Ar^3$ each independently represent an aryl having 6 to 30 carbon atoms, at least one of $Ar^1$ to $Ar^3$ has a stilbene structure, $Ar^1$ to $Ar^3$ may be substituted, and m represents an integer of 1 to 4.

The amine having a stilbene structure is more preferably a diaminostilbene represented by the following formula.

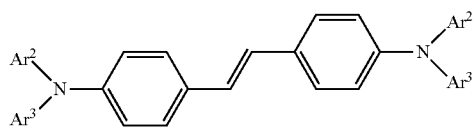

In the formula, $Ar^2$ and Ar each independently represent an aryl having 6 to 30 carbon atoms, and $Ar^2$ and $Ar^3$ may be substituted.

Specific examples of the aryl having 6 to 30 carbon atoms include benzene, naphthalene, acenaphthylene, fluorene, phenalene, phenanthrene, anthracene, fluoranthene, triphenylene, pyrene, chrysene, naphthacene, perylene, stilbene, distyrylbenzene, distyrylbiphenyl, and distyrylfluorene.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4''-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Furthermore, amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl) perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Furthermore, perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl) anthracene, 9-phenyl-10-(dimesitylboryl) anthracene, 4-(9'-anthryl) dimesitylborylnaphthalene, 4-(10'-phenyl-9'-anthryl) dimesitylborylnaphthalene, 9-(dimesitylboryl) anthracene, 9-(4'-biphenylyl)-10-(dimesitylboryl) anthracene, and 9-(4'-(N-carbazolyl)phenyl)-10-(dimesitylboryl) anthracene.

Furthermore, a borane derivative described in WO 2000/40586 A or the like may also be used.

An aromatic amine derivative is represented by the following formula, for example.

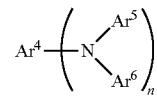

In the formula, $Ar^4$ represents an n-valent group derived from an aryl having 6 to 30 carbon atoms, $Ar^5$ and $Ar^6$ each independently represent an aryl having 6 to 30 carbon atoms, $Ar^4$ to $Ar^6$ may be substituted, and n represents an integer of 1 to 4.

Particularly, an aromatic amine derivative in which $Ar^4$ represents a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted, and n represents 2, is more preferable.

Specific examples of the aryl having 6 to 30 carbon atoms include benzene, naphthalene, acenaphthylene, fluorene phenalene, phenanthrene, anthracene, fluoranthene, triphenylene, pyrene, chrysene, naphthacene, perylene, and pentacene.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra (m-tolyl)chrysene-6,12-diamine, N,N,N',N'-tetrakis(4-isopropylphenyl)chrysene-6,12-diamine, N,N,N',N'-tetra (naphthalen-2-yl)chrysene-6,12-diamine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Furthermore, examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropylphenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis(biphenyl-4-yl)-N,N'-diphenylpyrene-1,8-diamine, and $N^1,N^6$-diphenyl-N, $N^6$-bis(4-trimethylsilanyl-phenyl)-1H,8H-pyrene-1,6-diamine.

Furthermore, examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl)anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl)anthracene.

Furthermore, examples thereof further include [4-(4-diphenylamino-phenyl)naphthalen-1-yl]-diphenylamine, [6-(4-diphenylamino-phenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis[6-diphenylaminonaphthalen-2-yl]-p-terphenyl.

Furthermore, an aromatic amine derivative described in JP 2006-156888 A or the like may also be used.

Examples of the coumarin derivative include coumarin-6 and coumarin-334.

Furthermore, a coumarin derivative described in JP 2004-43646 A, JP 2001-76876 A, JP 6-298758 A, or the like may also be used.

Examples of the pyran derivative include DCM and DCJTB described below.

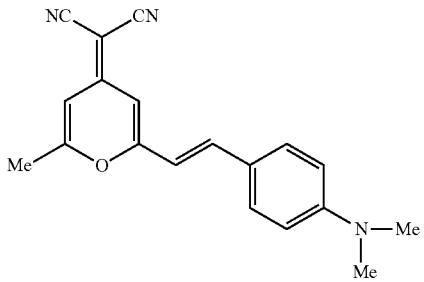

DCM

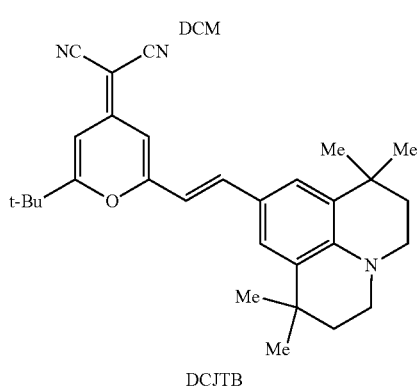

DCJTB

Furthermore, a pyran derivative described in JP 2005-126399 A, JP 2005-097283 A, JP 2002-234892 A, JP 2001-220577 A, JP 2001-081090 A, JP 2001-052869 A, or the like may also be used.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108 or an electron injected from the negative electrode 108 through the electron injection layer 107 into the light emitting layer 105. The electron transport layer 106 and the electron injection layer 107 are each formed by laminating and mixing one or more kinds of electron transport/injection materials, or by a mixture of an electron transport/injection material and a polymeric binder.

The electron injection/transport layer manages injection of an electron from a negative electrode and further manages transport of an electron, and desirably has a high electron injection efficiency and can efficiently transport an injected electron. For this purpose, a substance which has high electron affinity and large electron mobility, and further has excellent stability, and in which impurities serving as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing luminous efficiency is equal to that of a material having high electron transporting ability. Therefore, the electron injection/transport layer according to the present embodiment may also include a function of a layer that can efficiently prevent migration of a hole.

As the material to form the electron transport layer 106 or the electron injection layer 107 (electron transport material), a polycyclic aromatic compound represented by the above general formula (1) can be used. Furthermore, the material can be arbitrarily selected for use from compounds that have been conventionally used as electron transfer compounds in a photoconductive material, and known compounds used in an electron injection layer and an electron transport layer of an organic electroluminescent element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2''-terpyridinyl))benzene and the like), a naphthyridine derivative (bis(l-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the materials described above, a quinolinol-based metal complex, a bipyridine derivative, a phenanthroline derivative, and a borane derivative are preferable.

The quinolinol-based metal complex is a compound represented by the following general formula (E-1).

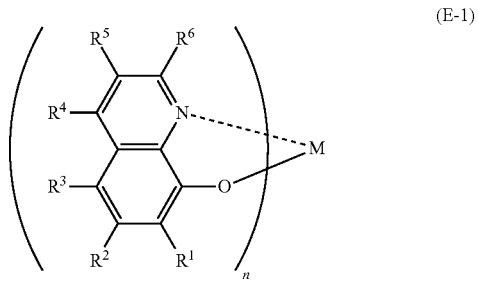

(E-1)

In the formula, $R^1$ to $R^6$ each represent a hydrogen atom or a substituent, M represents Li, Al, Ga, Be, or Zn, and n represents an integer of 1 to 3.

Specific examples of the quinolinol-based metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis(2-methyl-8-quinolinolato) (phenolato) aluminum, bis(2-methyl-8-quinolinolato) (2-methylphenolato) aluminum, bis(2-methyl-8-quinolinolato) (3-methylphenolato) aluminum, bis(2-methyl-8-quinolinolato) (4-methylphenolato) aluminum, bis(2-methyl-8-quinolinolato) (2-phenylphenolato) aluminum, bis(2-methyl-8-quinolinolato) (3-phenylphenolato) aluminum, bis(2-methyl-8-quinolinolato) (4-phenylphenolato) aluminum, bis(2-methyl-8-quinolinolato) (2,3-dimethylphenolato) aluminum, bis(2-methyl-8-quinolinolato) (2,6-dimethylphenolato) aluminum, bis(2-methyl-8-quinolinolato) (3,4-dimethylphenolato) aluminum, bis(2-methyl-8-quinolinolato) (3,5-dimethylphenolato) aluminum, bis(2-methyl-8-quinolinolato) (3,5-di-t-butylphenolato) aluminum, bis(2-methyl-8-quinolinolato) (2,6-diphenylphenolato) aluminum, bis(2-methyl-8-quinolinolato) (2,4,6-triphenylphenolato) aluminum, bis(2-methyl-8-quinolinolato) (2,4,6-trimethylphenolato) aluminum, bis(2-methyl-8-quinolinolato)(2,4,5,6-tetramethylphenolato) aluminum, bis(2-methyl-8-quinolinolato) (l-naphtholato) aluminum, bis(2-methyl-8-quinolinolato) (2-naphtholato) aluminum, bis(2,4-dimethyl-8-quinolinolato) (2-phenylphenolato) aluminum, bis(2,4-dimethyl-8-quinolinolato) (3-phenylphenolato) aluminum, bis(2,4-dimethyl-8-quinolinolato) (4-phenylphenolato) aluminum, bis(2,4-dimethyl-8-quinolinolato) (3,5-dimethylphenolato) aluminum, bis(2,4-dimethyl-8-quinolinolato) (3,5-di-t-butylphenolato) aluminum, bis(2-methyl-8-quinolinolato) aluminum-p-oxo-bis(2-methyl-8-quinolinolato) aluminum, bis(2,4-dimethyl-8-quinolinolato) aluminum-p-oxo-bis(2,4-dimethyl-8-quinolinolato) aluminum, bis(2-methyl-4-ethyl-8-quinolinolato) aluminum-μ-oxo-bis(2-methyl-4-ethyl-8-quinolinolato) aluminum, bis(2-methyl-4-methoxy-8-quinolinolato) aluminum-μ-oxo-bis(2-methyl-4-methoxy-8-quinolinolato) aluminum, bis(2-methyl-5-cyano-8-quinolinolato) aluminum-μ-oxo-bis(2-methyl-5-cyano-8-quinolinolato) aluminum, bis(2-methyl-5- trifluoromethyl-8-quinolinolato) aluminum-μ-oxo-bis(2-methyl-5-trifluoromethyl-8-quinolinolato) aluminum, and bis(10-hydroxybenzo[h]quinoline) beryllium.

The bipyridine derivative is a compound represented by the following general formula (E-2).

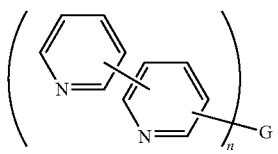
(E-2)

In the formula, G represents a simple bond or an n-valent linking group, and n represents an integer of 2 to 8. A carbon atom not used for a pyridine-pyridine bond or a pyridine-G bond may be substituted.

Examples of G in general formula (E-2) include groups represented by the following structural formulas. Note that R's in the following structural formulas each independently represent a hydrogen atom, a methyl, an ethyl, an isopropyl, a cyclohexyl, a phenyl, a 1-naphthyl, a 2-naphthyl, a biphenylyl, or a terphenylyl.

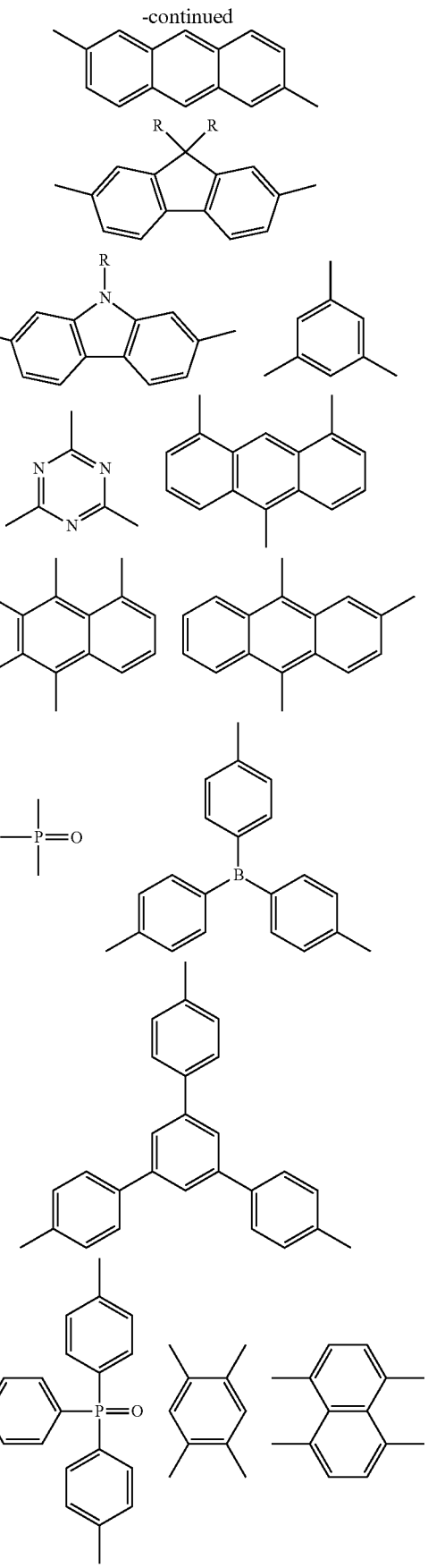

-continued

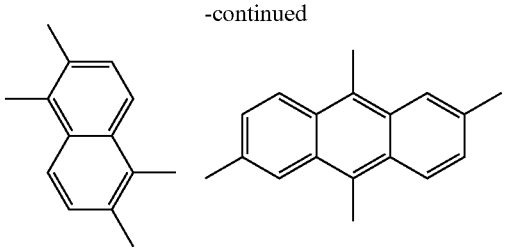

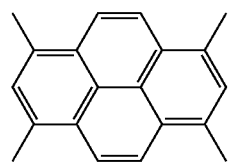

Specific examples of the pyridine derivative include 2,5-bis (2,2'-pyridin-6-yl)-1,1-dimethyl-3,4-diphenylsilole, 2,5-bis (2,2'-pyridin-6-yl)-1,1-dimethyl-3,4-dimesitylsilole, 2,5-bis (2,2'-pyridin-5-yl)-1,1-dimethyl-3,4-diphenylsilole, 2,5-bis (2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di (2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2-phenylanthracene, 9,10-di(3,4'-pyridin-5-yl)-2-phenylanthracene, 3,4-diphenyl-2,5-di(2,2'-pyridin-6-yl)thiophene, 3,4-diphenyl-2,5-di(2,3'-pyridin-5-yl)thiophene, and 6',6''-di(2-pyridyl)-2,2':4',4'':2'',2'''-quaterpyridine.

The phenanthroline derivative is a compound represented by the following general formula (E-3-1) or (E-3-2).

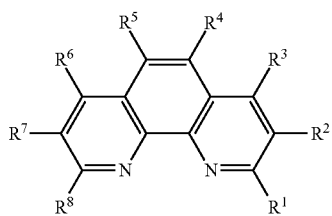 (E-3-1)

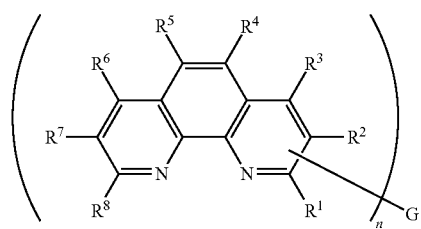 (E-3-2)

In the formula, $R^1$ to $R^8$ each represent a hydrogen atom or a substituent, adjacent groups may be bonded to each other to form a fused ring, G represents a simple bond or an n-valent linking group, and n represents an integer of 2 to 8.

Examples of G of general formula (E-3-2) include the same groups as those described in the section of the bipyridine derivative.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, and 1,3-bis(2-phenyl-1,10-phenanthrolin-9-yl)benzene.

Particularly, a case of using a phenanthroline derivative in an electron transport layer or an electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

The borane derivative is a compound represented by the following general formula (E-4), specific examples of which are disclosed in JP 2007-27587 A.

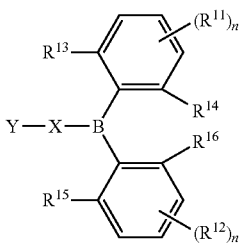 (E-4)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3.

Among compounds represented by the above general formula (E-4), a compound represented by the following general formula (E-4-1) is preferable, and compounds represented by the following general formulas (E-4-1-1) to (E-4-1-4) are more preferable. Specific examples of the compounds include 9-[4-(4-dimesitylborylnaphthalen-1-yl)phenyl]carbazole and 9-[4-(4-dimesitylborylnaphthalen-1-yl)naphthalen-1-yl]carbazole.

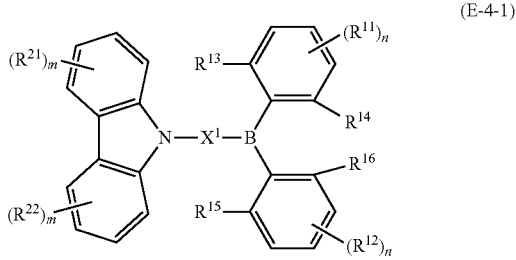
(E-4-1)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and a cyano, $X^1$ represents an optionally substituted arylene having 20 or fewer carbon atoms, n's each independently represent an integer of 0 to 3, and m's each independently represent an integer of 0 to 4.

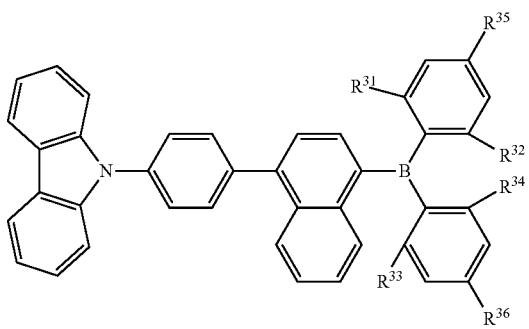
(E-4-1-1)

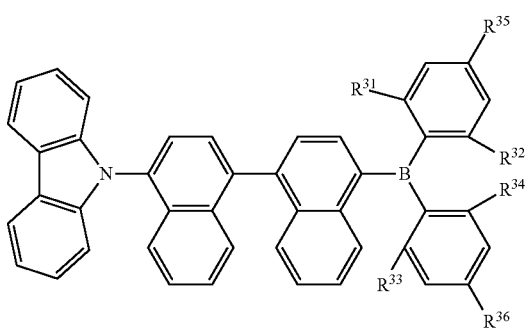
(E-4-1-2)

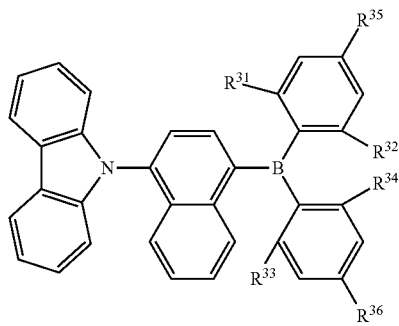
(E-4-1-3)

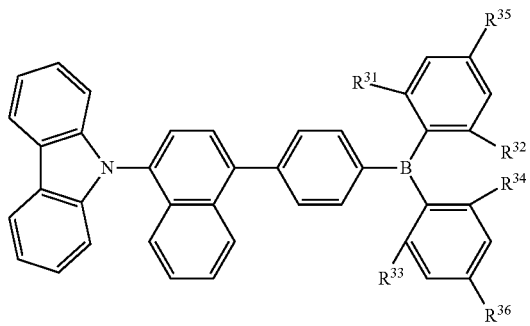
(E-4-1-4)

In each of the formulas, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

Among compounds represented by the above general formula (E-4), a compound represented by the following general formula (E-4-2) is preferable, and a compound represented by the following general formula (E-4-2-1) is more preferable.

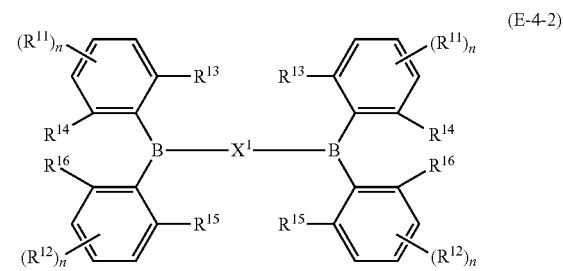
(E-4-2)

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3.

(E-4-2-1)

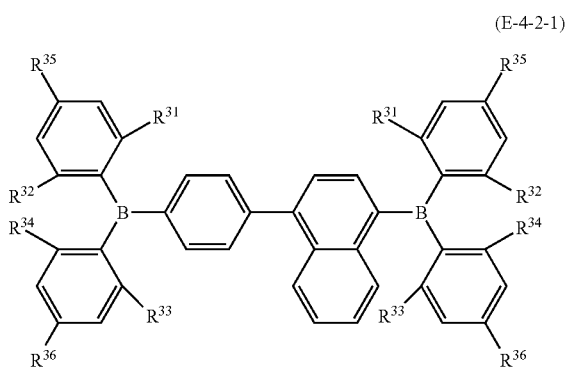

In the formula, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

Among compounds represented by the above general formula (E-4), a compound represented by the following general formula (E-4-3) is preferable, and a compound represented by the following general formula (E-4-3-1) or (E-4-3-2) is more preferable.

(E-4-3)

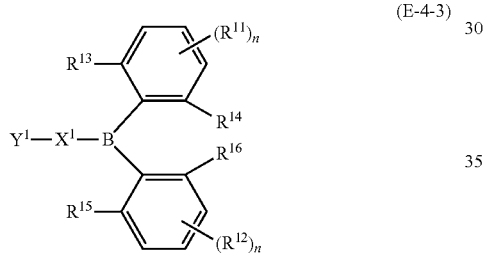

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and a cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3.

(E-4-3-1)

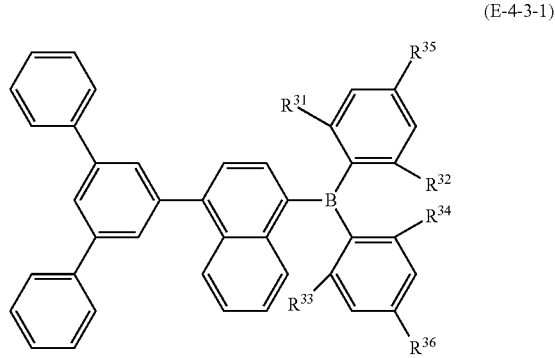

(E-4-3-2)

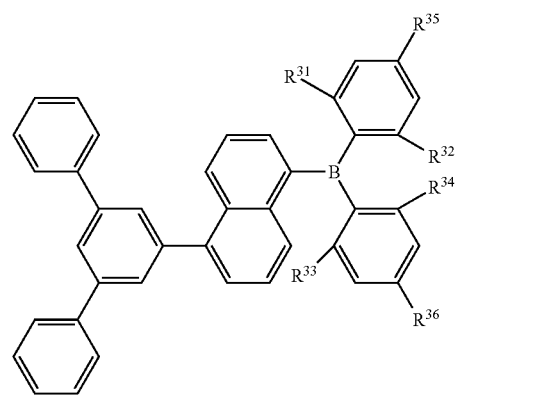

In each of the formulas, $R^{31}$ to $R^{34}$ each independently represent any one of a methyl, an isopropyl, and a phenyl, and $R^{35}$ and $R^{36}$ each independently represent any one of a hydrogen atom, a methyl, an isopropyl, and a phenyl.

The benzimidazole derivative is a compound represented by the following general formula (E-5).

(E--5)

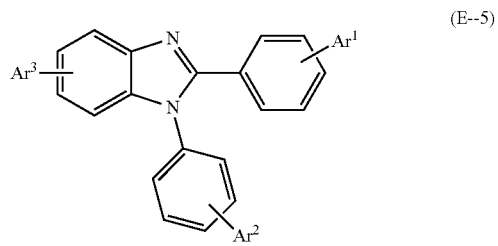

In the formula, $Ar^1$ to $Ar^3$ each independently represent a hydrogen atom or an optionally substituted aryl having 6 to 30 carbon atoms. Particularly, a benzimidazole derivative in which $Ar^1$ represents an anthryl which may be substituted is preferable.

Specific examples of the aryl having 6 to 30 carbon atoms include a phenyl, a 1-naphthyl, a 2-naphthyl, an acenaphthylen-1-yl, an acenaphthylen-3-yl, an acenaphthylen-4-yl, an acenaphthylen-5-yl, a fluoren-1-yl, a fluoren-2-yl, a fluoren-3-yl, a fluoren-4-yl, a fluoren-9-yl, a phenalen-1-yl, a phenalen-2-yl, a 1-phenanthryl, a 2-phenanthryl, a 3-phenanthryl, a 4-phenanthryl, a 9-phenanthryl, a 1-anthryl, a 2-anthryl, a 9-anthryl, a fluoranthen-1-yl, a fluoranthen-2-yl, a fluoranthen-3-yl, a fluoranthen-7-yl, a fluoranthen-8-yl, a triphenylen-1-yl, a triphenylen-2-yl, a pyren-1-yl, a pyren-2-yl, a pyren-4-yl, a chrysen-1-yl, a chrysen-2-yl, a chrysen-3-yl, a chrysen-4-yl, a chrysen-5-yl, a chrysen-6-yl, a naphthacen-1-yl, a naphthacen-2-yl, a naphthacen-5-yl, a perylen-1-yl, a perylen-2-yl, a perylen-3-yl, a pentacen-1-yl, a pentacen-2-yl, a pentacen-5-yl, and a pentacen-6-yl.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthalen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d] imidazole, 2-(4-(9,10-di(naphthalen-2-yl)anthracen-2-yl)

phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

The electron transport layer or the electron injection layer may further contain a substance capable of reducing a material to form the electron transport layer or the electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV), and an alkaline earth metal such as Ca (work function 2.9 eV), Sr (work function 2.0 to 2.5 eV), or Ba (work function 2.52 eV). A reducing substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with $R_b$, or a combination of Cs with Na and K, is preferable. By inclusion of Cs, reducing ability can be efficiently exhibited, and emission luminance of an organic EL element is enhanced or a lifetime thereof is lengthened by adding Cs to a material to form an electron transport layer or an electron injection layer.

<Negative Electrode in Organic Electroluminescent Element>

The negative electrode 108 plays a role of injecting an electron into the light emitting layer 105 through the electron injection layer 107 and the electron transport layer 106.

A material to form the negative electrode 108 is not particularly limited as long as being a substance capable of efficiently injecting an electron into an organic layer. However, a material similar to the materials to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing an electron injection efficiency, lithium, sodium, potassium, cesium, calcium, magnesium, or an alloy containing these low work function-metals is effective. However, many of these low work function-metals are generally unstable in air. In order to ameliorate this problem, for example, a method using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. A method for manufacturing these electrodes is not particularly limited as long as being able to obtain conduction, and examples thereof include resistance heating vapor deposition, electron beam vapor deposition, sputtering, ion plating, and coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin, as a polymer binder.

<Method for Manufacturing Organic Electroluminescent Element>

Each layer constituting an organic electroluminescent element can be formed by forming thin films of materials to constitute each layer by a method such as a vapor deposition method, resistance heating vapor deposition, electron beam vapor deposition, sputtering, a molecular lamination method, a printing method, a spin coating method, a casting method, or a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In a case of forming a thin film using a vapor deposition method, vapor deposition conditions depend on the kind of a material, an intended crystal structure of a film, an association structure, and the like. It is preferable to appropriately set the vapor deposition conditions generally in ranges of a boat heating temperature of +50 to +400° C., a degree of vacuum of $10^{-6}$ to $10^{-3}$ Pa, a vapor deposition rate of 0.01 to 50 nm/sec, a substrate temperature of −150 to +300° C., and a film thickness of 2 nm to 5 μm.

Next, as an example of a method for manufacturing an organic electroluminescent element, a method for manufacturing an organic electroluminescent element formed of positive electrode/hole injection layer/hole transport layer/light emitting layer including host material and dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is further formed by a vapor deposition method or the like to obtain a negative electrode. An intended organic electroluminescent element is thereby obtained. Incidentally, in manufacturing the above organic electroluminescent element, it is also possible to manufacture the element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic electroluminescent element thus obtained, it is only required to apply the voltage by using a positive electrode as a positive polarity and using a negative electrode as a negative polarity. By applying a voltage of about 2 to 40 V, light emission can be observed from a transparent or semi-transparent electrode side (the positive electrode or the negative electrode, or both the electrodes). This organic electroluminescent element also emits light also in a case where a pulse current or an alternating current is applied. Note that a waveform of an alternating current applied may be any waveform.

<Application Examples of Organic Electroluminescent Element>

The present invention can be also applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present embodiment to a known driving apparatus, and can be driven by appropriately using a known driving method such as direct driving, pulse driving, or alternating driving.

Examples of the display apparatus include panel displays such as color flat panel displays; and flexible displays such as flexible organic electroluminescent (EL) displays (see, for example, JP 10-335066 A, JP 2003-321546 A, JP 2004-281086 A, and the like). Examples of a display method of the display include a matrix method and/or a segment method. Note that the matrix display and the segment display may co-exist in the same panel.

The matrix refers to a system in which pixels for display are arranged two-dimensionally as in a lattice form or a mosaic form, and characters or images are displayed by an assembly of pixels. The shape or size of a pixel depends on intended use. For example, for display of images and characters of a personal computer, a monitor, or a television, square pixels each having a size of 300 μm or less on each side are usually used, and in a case of a large-sized display such as a display panel, pixels having a size in the order of millimeters on each side are used. In a case of monochromic display, it is only required to arrange pixels of the same color. However, in a case of color display, display is performed by arranging pixels of red, green, and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method or the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

4. Other Organic Devices

The polycyclic aromatic compound according to an aspect of the present invention can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) flowing between the source electrode and the drain electrode. The field effect transistor can be easily miniaturized compared with a simple transistor (bipolar transistor), and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to an aspect of the present invention, and it is only required that a gate electrode is further provided so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer (2) Substrate/gate electrode/insulator layer/organic semiconductor active layer/source electrode and drain electrode (3) Substrate/organic semiconductor active layer/source electrode and drain electrode/insulator layer/gate electrode (4) Substrate/source electrode and drain electrode/organic semiconductor active layer/insulator layer/gate electrode An organic field effect transistor thus configured can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side, and has an n-type semiconductor layer on the negative electrode side. The polycyclic aromatic compound according to an aspect of the present invention can be used as a material for a hole transport layer, a p-type semiconductor layer, an n-type semiconductor layer, or an electron transport layer, depending on physical properties thereof. The polycyclic aromatic compound according to an aspect of the present invention can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

EXAMPLES

Hereinafter, the present invention will be specifically described with reference to Examples, but the present invention is not limited by these Examples in any way. Compounds synthesized in Examples are illustrated below. In the chemical structural formulas, Mes represents a mesityl group.

(1-3-1)
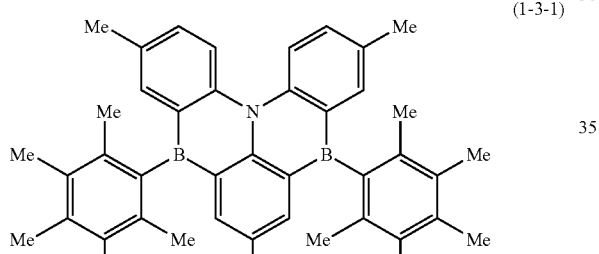

(1-3-2)
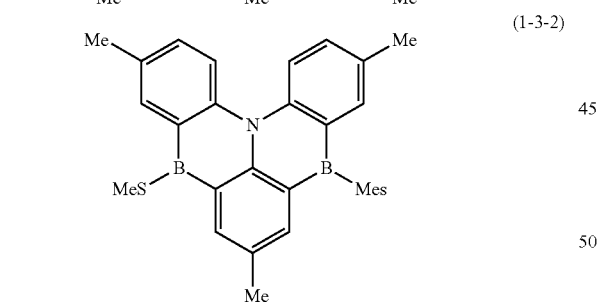

(1-5-1)
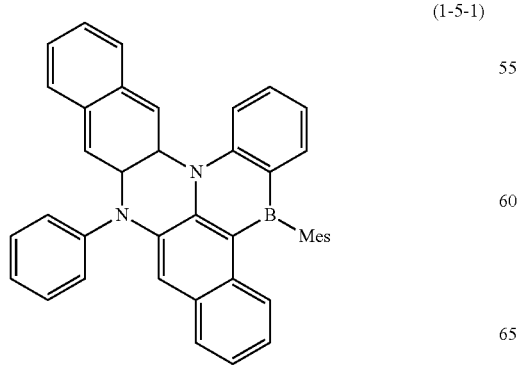

(1-5-4)
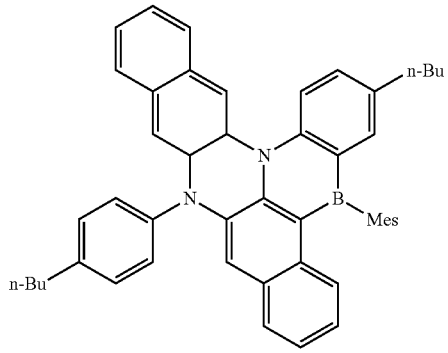

(1-6-1)
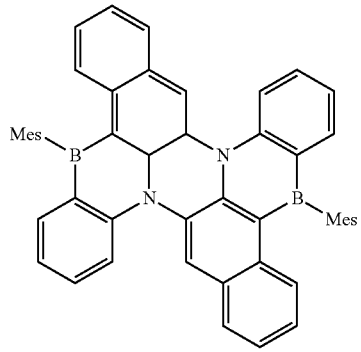

(1-6-4)
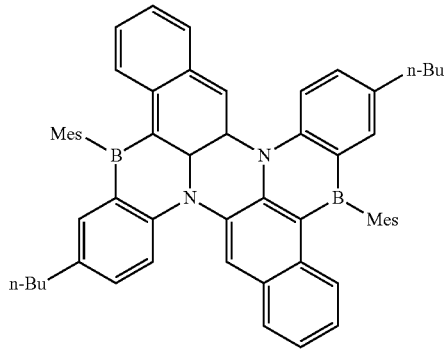

(1-6-2)
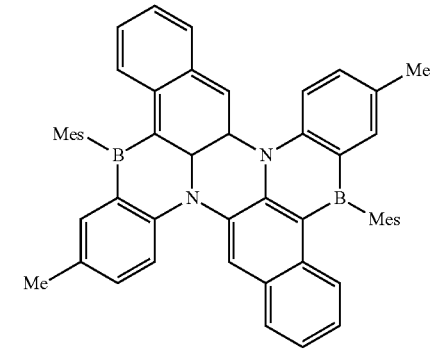

-continued

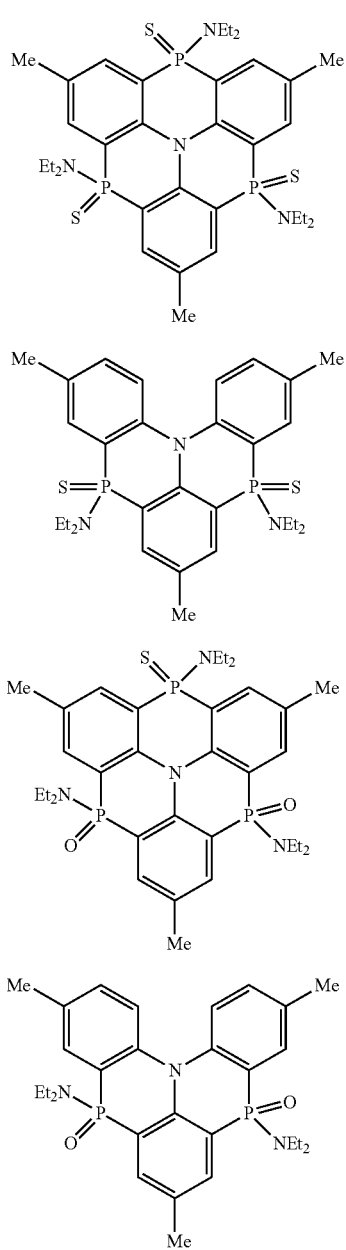

Synthesis Example (1)

5,9-Bis(2,3,4,5,6-pentamethylphenyl)-3,7,11-trimethyl-5,9-dihydro-13b-aza-5,9-diboranaphtho[3,2,1-de]anthracene

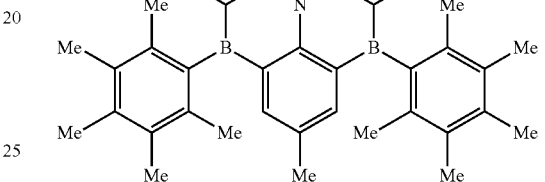

Tert-butyllithium (16 mL, 1.9 M, 30 mmol) was added to tris(2-bromo-4-methylphenyl) amine (2.62 g, 5.0 mmol) and tert-butylbenzene (20 mL) under a nitrogen atmosphere at −40° C., and the resulting mixture was stirred at room temperature for one hour. Boron tribromide (1.00 mL, 11 mmol) and tert-butylbenzene (5.0 mL) were added at 0° C., and the resulting mixture was stirred at room temperature for one hour. Thereafter, 1,2,2,6,6-pentamethylpiperidine (1.80 mL, 9.9 mmol) was added. The resulting mixture was heated at 160° C. for 15 hours. Thereafter, a pentamethylphenyl Grignard reagent (35.1 mL, 0.48 M, 17 mmol) was added at room temperature, and the resulting mixture was stirred at room temperature for two hours. The solvent was concentrated under reduced pressure. Thereafter, a phosphate buffer solution (pH 6, 25 mL) was added, extraction was performed with toluene, and then the solvent was distilled off under reduced pressure. The obtained crude product was isolated and purified by GPC (eluent: toluene) to obtain a yellow solid compound of formula (1-3-1) (0.34 g, yield 11%).

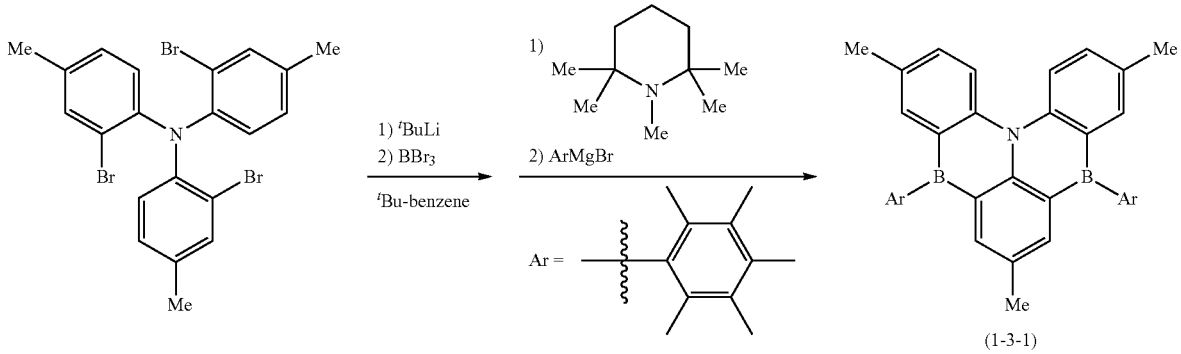

The structure of the compound thus obtained was identified with an NMR spectrum.

$^1$H NMR (6 ppm in CDCl$_3$); δ=1.92 (s, 6H), 2.07 (s, 6H), 2.32 (s, 3H), 2.25 (s, 6H), 2.33 (s, 6H), 2.38 (s, 6H), 2.39 (s, 6H), 7.34 (dd, 2H), 7.63 (d, 2H), 7.91 (s, 2H), 8.12 (d, 2H).

HRMS(DART) calcd for C$_{43}$H$_{48}$B$_2$N [(M+H)$^+$]: 600.3987, found: 600.4000

Synthesis Example (2)

5,9-Dimesityl-3,7,11-trimethyl-5,9-dihydro-13b-aza-5,9-diboranaphtho[3,2,1-de]anthracene

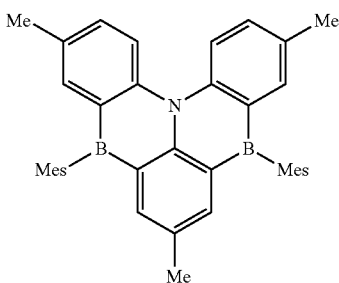

(1-3-2)

Tert-butyllithium (16 mL, 1.9 M, 30 mmol) was added to tris(2-bromo-4-methylphenyl) amine (2.60 g, 5.0 mmol) and tert-butylbenzene (20 mL) under a nitrogen atmosphere at −40° C., and the resulting mixture was stirred at room temperature for one hour. Boron tribromide (1.00 mL, 11 mmol) and tert-butylbenzene (4.0 mL) were added at 0° C., and the resulting mixture was stirred at room temperature for one hour. Thereafter, 1,2,2,6,6-pentamethylpiperidine (1.80 mL, 9.9 mmol) was added. The resulting mixture was heated at 160° C. for 15 hours. Thereafter, a mesityl Grignard reagent (12.5 mL, 1.20 M, 15 mmol) was added at room temperature, and the resulting mixture was stirred at room temperature for two hours. The solvent was concentrated under reduced pressure. Thereafter, a phosphate buffer solution (pH 6, 25 mL) was added, extraction was performed with toluene, and then the solvent was distilled off under reduced pressure. The obtained crude product was isolated and purified by GPC (eluent: toluene) to obtain a yellow solid compound of formula (1-3-2) (0.79 g, yield 22%).

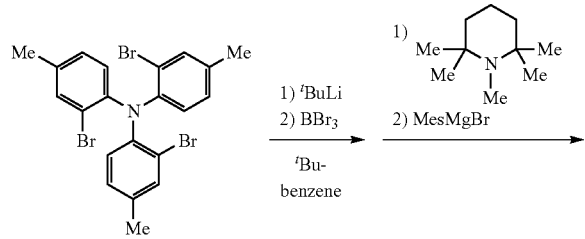

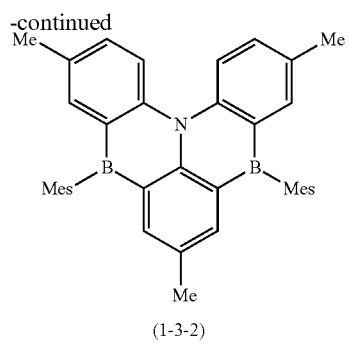

(1-3-2)

The structure of the compound thus obtained was identified with an NMR spectrum.

$^1$H NMR (6 ppm in CDCl$_3$); δ=2.01 (s, 6H), 2.11 (s, 6H), 2.34 (s, 3H), 2.39 (s, 6H), 2.44 (s, 6H), 6.96 (s, 2H), 7.03 (s, 2H), 7.37 (dd, 2H), 7.62 (d, 2H), 7.93 (s, 2H), 8.15 (d, 2H).

$^{13}$C NMR (δ ppm in CDCl$_3$) 20.6, 20.7 (2C), 21.4 (2C), 23.2 (2C), 23.3 (2C), 122.8 (2C), 126.9 (4C), 127.1 (brs, 2C), 130.0, 131.5 (brs, 2C), 132.3 (2C), 132.4 (2C), 135.4 (2C), 136.6 (2C), 139.0 (2C), 139.1 (2C), 139.5 (brs, 2C), 144.0 (2C), 144.5 (2C), 144.8.

HRMS(DART) calcd for C$_{39}$H$_{40}$B$_2$N [(M+H)$^+$]: 544.3358, found: 544.3360

Synthesis Example (3)

5-Mesityl-11-phenyl-5,11-dihydrodibenzo[b,i]benzo[5,6][1,4]azaborino[3,2,1-de]phenazine

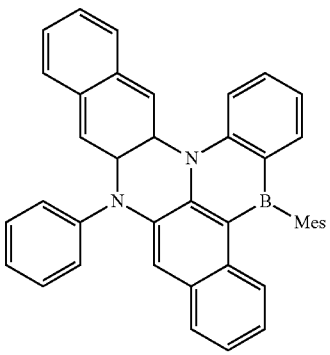

(1-5-1)

Bromobenzene (2.96 mL, 28 mmol), sodium tert-butoxide (3.75 g, 39 mmol), tri tert-butylphosphine (0.165 g, 0.81 mmol), bis(dibenzylideneacetone) palladium(0) (0.294 g, 0.51 mmol), and 6,13-dihydrodibenzo[b,i]phenazine (3.62 g, 13 mmol) were added to 1,4-dioxane (220 mL) under a nitrogen atmosphere at room temperature, and the resulting mixture was heated and stirred at 90° C. for 34 hours. The reaction solution was cooled to room temperature and caused to pass through a silica gel short pass column (eluent: dichloromethane). The solvent was distilled off under reduced pressure. Thereafter, the crude product was washed with a mixed solution (hexane/toluene=1/1 (volume ratio)) to obtain 6,13-diphenyl-6,13-dihydrodibenzo[b,i]phenazine as a yellow powder (5.18 g, yield 93%).

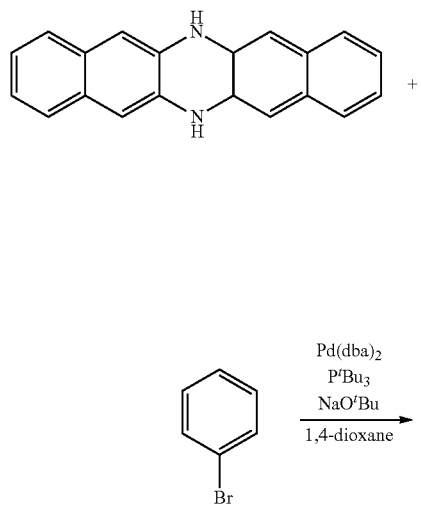

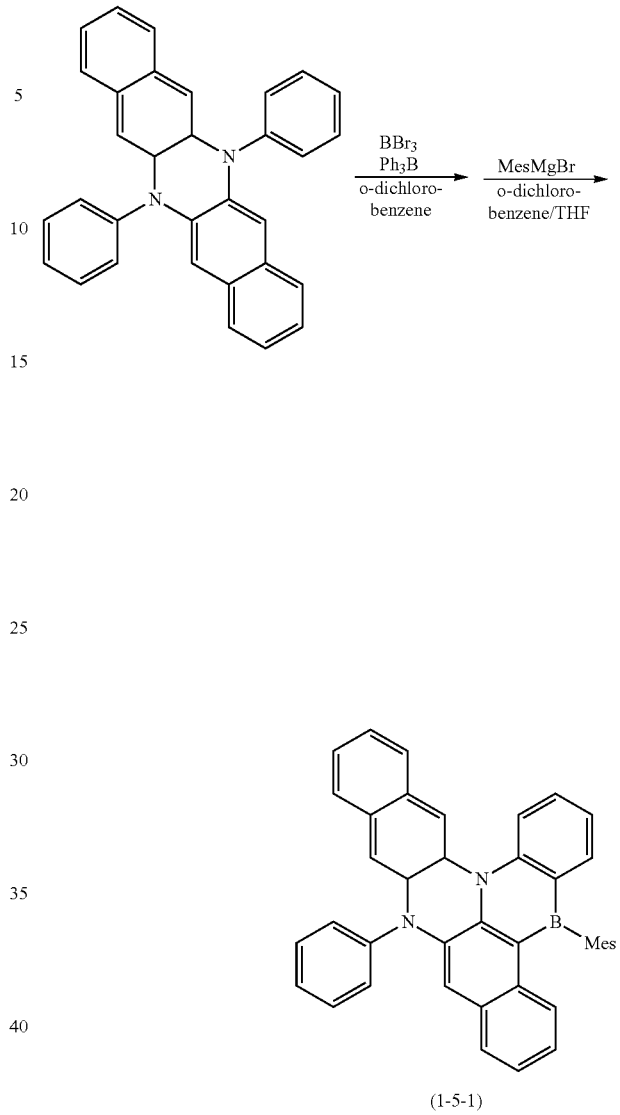

The structure of the compound thus obtained was identified with an NMR spectrum.

$^1$H NMR (δ ppm in CDCl$_3$); 5.98 (s, 4H), 6.50 (dd, 4H), 6.60 (dd, 4H), 6.71-6.89 (m, 10H).

$^{13}$C NMR (δ ppm in CDCl$_3$); 108.4 (4C), 123.9 (4C), 126.0 (4C), 128.4 (2C), 130.7 (2C), 130.9 (4C), 131.3 (4C), 135.5 (4C), 140.2 (4C).

Next, boron tribromide (0.380 mL, 4.0 mmol) was added to 6,13-diphenyl-6,13-dihydrodibenzo[b,i]phenazine (0.218 g, 0.50 mmol), triphenylborane (0.969 g, 4.0 mmol), and orthodichlorobenzene (5.0 mL) under a nitrogen atmosphere at room temperature, and the resulting mixture was heated in a pressure-resistant container at 260° C. for 15 hours. Thereafter, the mixture was cooled to room temperature, and a mesityl Grignard reagent tetrahydrofuran solution (12.0 mL, 1.00 M, 12.0 mmol) was added. The resulting mixture was heated at room temperature for one hour. Thereafter, a phosphate buffer solution (pH 6, 20 mL) was added to the reaction solution, extraction was performed with toluene (100 mL), and then the solvent was distilled off under reduced pressure. The obtained crude product was purified by silica gel column chromatography (eluent: hexane/toluene=4/1 (volume ratio)) and then washed with hexane to be isolated and purified. As a result, a yellow solid compound of formula (1-5-1) was obtained (30.8 mg, yield 11%).

The structure of the compound thus obtained was identified with an NMR spectrum.

$^1$H NMR (δ ppm in CDCl$_3$); 2.01 (s, 3H), 2.02 (s, 3H), 2.46 (s, 3H), 6.63 (s, 1H), 6.66 (s, 1H), 6.97 (s, 1H), 7.01-7.06 (m, 2H), 7.17-7.31 (m, 4H), 7.36 (d, 1H), 7.45 (d, 1H), 7.53-7.62 (m, 4H), 7.67 (t, 1H), 7.76-7.81 (m, 3H), 7.83 (s, 1H), 8.15 (d, 1H), 8.27 (d, 1H).

$^{13}$C NMR (δ ppm in CDCl$_3$); 21.4, 22.6, 22.7, 109.2, 113.5, 119.1, 119.2, 122.5, 123.9, 124.8, 124.9, 126.0, 126.1, 126.6, 126.7, 126.9, 127.4, 127.5 (2C), 130.0, 130.8 (2C), 131.0, 131.1, 131.3 (2C), 131.9 (2C), 133.2, 135.8, 136.4, 137.0, 137.4, 137.8, 139.5, 139.8, 140.4, 143.3, The NMR signal of the carbon α to the boron was not observed. HRMS (EI) m/z [M]$^+$ calcd for C$_{41}$H$_{31}$BN$_2$ 563.267, observed 563.267

Synthesis Example (4)

3-Butyl-11-(4-butylphenyl)-5-mesityl-5,5a,10a,11-tetrahydrodibenzo[b,i]benzo[5,6][1,4]azaborino[3,2,1-de]phenazine

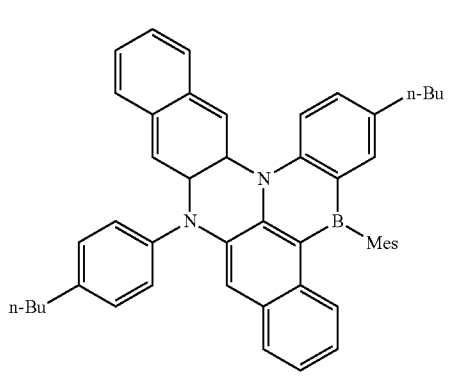
(1-5-4)

1-Bromo-4-n-butylbenzene (6.0 mL, 34 mmol), sodium tert-butoxide (4.61 g, 48 mmol), tri tert-butylphosphine (0.200 g, 0.99 mmol), bis(dibenzylideneacetone) palladium (0) (0.369 g, 0.64 mmol), and 6,13-dihydrodibenzo[b,i]phenazine (4.52 g, 16 mmol) were added to 1,4-dioxane (150 mL) under a nitrogen atmosphere at room temperature, and the resulting mixture was heated and stirred at 90° C. for 34 hours. The reaction solution was cooled to room temperature and caused to pass through a silica gel short pass column (eluent: toluene). The solvent was distilled off under reduced pressure. Thereafter, the crude product was washed with hexane to obtain 6,13-bis(4-n-butylphenyl)-6,13-dihydrodibenzo[b,i]phenazine as a yellow powder (7.37 g, yield 84%).

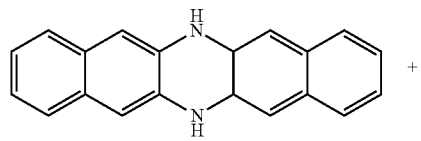
+

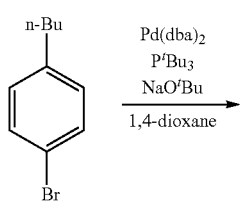

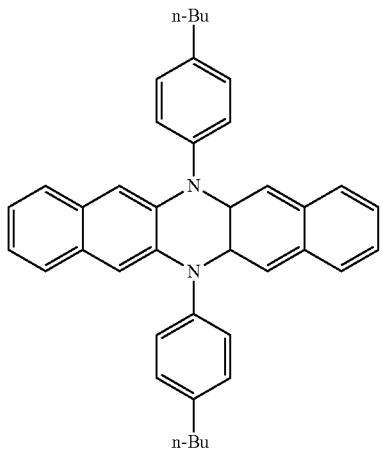

The structure of the compound thus obtained was identified with an NMR spectrum.

$^{1}$H NMR (δppm in CDCl$_3$); 1.03 (t, 6H), 1.49 (sext, 4H), 1.78 (quint, 4H), 2.80 (t, 4H), 5.98 (s, 4H), 6.97 (dd, 4H), 7.11 (dd, 4H), 7.36 (d, 4H), 7.51 (d, 4H).

$^{13}$C NMR (dppm in CDCl$_3$); 14.0 (2C), 22.5 (2C), 33.5 (2C), 35.5 (2C), 107.7 (4C), 123.6 (4C), 125.7 (4C), 130.0 (2C), 130.3 (4C), 131.4 (4C), 135.3 (2C), 137.2 (4C), 143.7 (4C).

Next, boron tribromide (0.220 mL, 2.4 mmol) was added to 6,13-bis(4-n-butylphenyl)-6,13-dihydrodibenzo[b,i]phenazine (0.164 g, 0.30 mmol), triphenylborane (0.583 g, 2.4 mmol), and orthodichlorobenzene (3.0 mL) under a nitrogen atmosphere at room temperature, and the resulting mixture was heated in a pressure-resistant container at 260° C. for 15 hours. Thereafter, the mixture was cooled to room temperature, and a mesityl Grignard reagent tetrahydrofuran solution (7.20 mL, 1.00 M, 7.2 mmol) was added. The resulting mixture was heated at 70° C. for one hour. Thereafter, a phosphate buffer solution (pH 6, 10 mL) was added to the reaction solution, extraction was performed with toluene (50 mL), and then the solvent was distilled off under reduced pressure. The obtained crude product was isolated and purified by GPC (eluent: toluene) to obtain a yellow solid compound of formula (1-5-4) (19.0 mg, yield 9%).

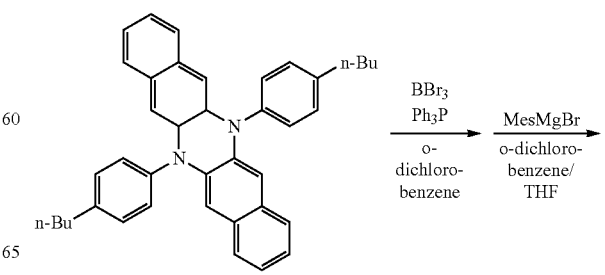

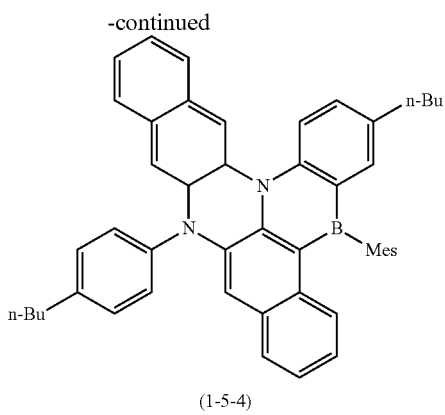

(1-5-4)

The structure of the compound thus obtained was identified with an NMR spectrum.

$^1$H NMR (δ ppm in CDCl$_3$); 0.91 (t, 3H), 1.05 (t, 3H), 1.49 (sext, 2H), 1.53 (sext, 2H), 1.60 (quint, 2H), 1.81 (quint, 2H), 2.00 (s, 3H), 2.03 (s, 3H), 2.46 (s, 3H), 2.66 (t, 2H), 2.84 (t, 2H), 6.63 (s, 1H), 6.64 (s, 1H), 6.96 (s, 1H), 7.00 (ddd, 1H), 7.04 (s, 1H), 7.14-7.30 (m, 3H), 7.35 (d, 1H), 7.41 (dd, 1H), 7.43-7.50 (m, 3H), 7.53-7.59 (m, 4H), 7.81 (s, 1H), 8.06 (d, 1H), 8.20 (d, 1H).

$^{13}$C NMR (δ ppm in CDCl$_3$); 3.9, 14.1, 21.4, 22.3, 22.6, 22.6, 22.7, 33.5, 33.8, 35.1, 35.6, 109.0, 113.2, 118.9, 119.2, 123.7, 124.6, 124.7, 125.8, 126.1, 126.6, 126.7, 126.9, 127.4, 127.5, 127.5, 129.1, 130.2, 130.3 (2C), 131.2 (2C), 131.8 (2C), 133.2, 134.4, 136.2, 136.8, 136.9, 137.2, 137.3, 137.7, 139.9, 140.3, 141.4, 143.9, The NMR signal of the carbon α to the boron was not observed.

HRMS (EI) m/z [M]$^+$ calcd for C$_{49}$H$_{47}$BN$_2$ 674.3841, observed 674.3840

Synthesis Example (5)

5,16-Dimesityl-5H,6H-dibenzo[b, i]benzo[5,6][1,4]azaborino[3,2,1-de]benzo[5,6][1,4]azaborino[3,2,1-kl]phenazine

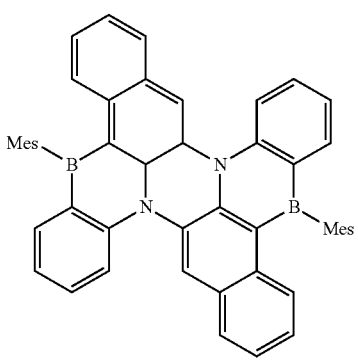

(1-6-1)

Bromobenzene (2.96 mL, 28 mmol), sodium tert-butoxide (3.75 g, 39 mmol), tri tert-butylphosphine (0.165 g, 0.81 mmol), bis(dibenzylideneacetone) palladium(0) (0.294 g, 0.51 mmol), and 6,13-dihydrodibenzo[b,i]phenazine (3.62 g, 13 mmol) were added to 1,4-dioxane (220 mL) under a nitrogen atmosphere at room temperature, and the resulting mixture was heated and stirred at 90° C. for 34 hours. The reaction solution was cooled to room temperature and caused to pass through a silica gel short pass column (eluent: dichloromethane). The solvent was distilled off under reduced pressure. Thereafter, the crude product was washed with a mixed solution (hexane:toluene=1:1 (volume ratio)) to obtain 6,13-diphenyl-6,13-dihydrodibenzo[b,i]phenazine as a yellow powder (5.18 g, yield 93%).

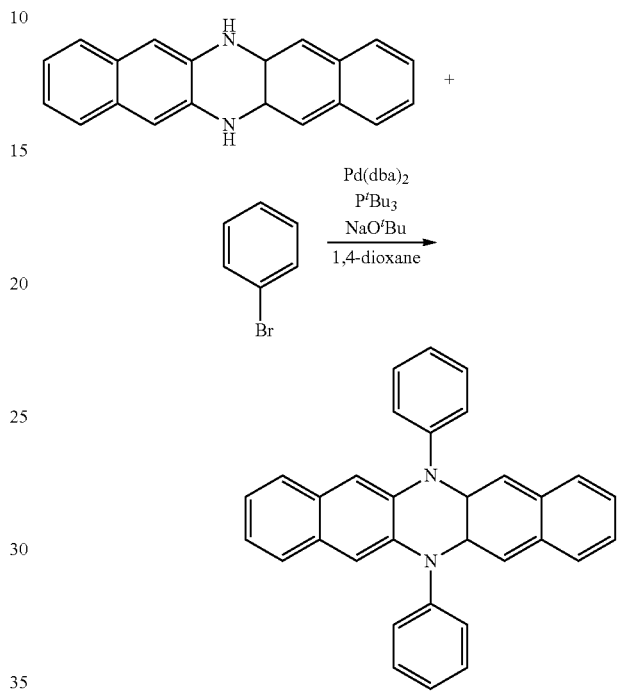

The structure of the compound thus obtained was identified with an NMR spectrum.

$^1$H NMR (δppm in CDCl$_3$); 5.98 (s, 4H), 6.50 (dd 4H), 6.60 (dd, 4H), 6.71-6.89 (m, 10H).

$^{13}$C NMR (δ ppm in CDCl$_3$); 108.4 (4C), 123.9 (4C), 126.0 (4C), 128.4 (2C), 130.7 (2C), 130.9 (4C), 131.3 (4C), 135.5 (4C), 140.2 (4C).

Next, boron triiodide (0.784 g, 4.0 mmol) was added to 6,13-diphenyl-6,13-dihydrodibenzo[b,i]phenazine (0.218 g, 0.50 mmol) and 1,2,4-trichlorobenzene (5.0 mL) under a nitrogen atmosphere at room temperature, and the resulting mixture was stirred at 180° C. for 20 hours. Thereafter, the mixture was cooled to room temperature, and a mesityl Grignard reagent tetrahydrofuran solution (11.0 mL, 0.73 M, 8.0 mmol) was added. The resulting mixture was heated at 60° C. for one hour. Thereafter, a phosphate buffer solution (pH 6, 20 mL) was added to the reaction solution, extraction was performed with toluene (100 mL), and then the solvent was distilled off under reduced pressure. The reaction mixture was caused to pass through a silica gel short pass column (eluent: toluene), and then the solvent was distilled off under reduced pressure. The obtained crude product was caused to pass through a Florisil short pass column (eluent: hexane), and then the solvent was distilled off under reduced pressure. The resulting product washed with acetonitrile to be isolated and purified. As a result, a yellow solid compound of formula (1-6-1) was obtained (42.5 mg, yield 12%).

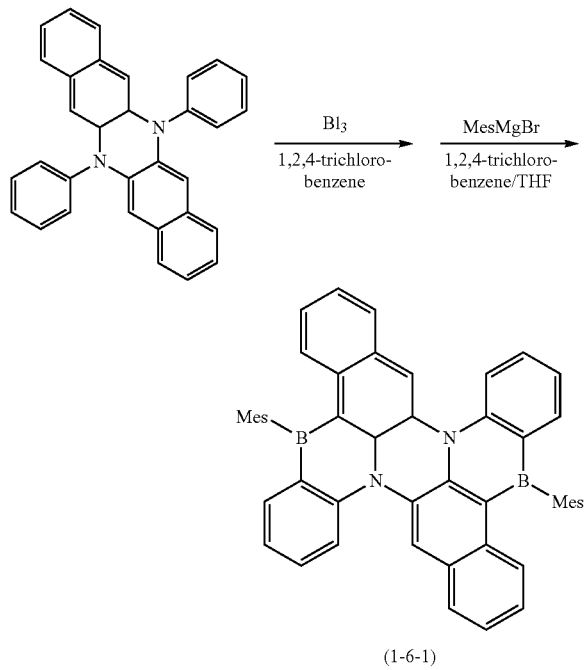

The structure of the compound thus obtained was identified with an NMR spectrum.

¹H NMR (δ ppm in CDCl₃); 1.99 (s, 6H), 2.16 (s, 6H), 2.49 (s, 6H), 7.00 (s, 2H), 7.10 (s, 2H), 7.27-7.31 (m, 4H), 7.38 (t, 2H), 7.60 (ddd, 2H), 7.68 (d, 2H), 7.86 (dd, 2H), 8.15 (s, 2H), 8.17 (d, 2H), 8.28 (d, 2H).

¹³C NMR (δ ppm in CDCl₃); 21.4 (2C), 22.7 (2C), 22.8 (2C), 118.8 (2C), 122.7 (2C), 124.3 (2C), 125.0 (2C), 126.9 (2C), 127.3 (2C), 127.6 (4C), 127.8 (2C), 129.5 (2C), 131.8 (2C), 132.3 (2C), 135.5 (2C), 136.6 (2C), 136.7 (2C), 137.5 (2C), 137.8 (2C), 143.1 (2C), 144.0 (2C), The NMR signal of the carbon α to the boron was not observed.

HRMS (MALDI-TOF/MS) m/z [M]⁺ calcd for $C_{50}H_{40}B_2N_2$ 690.337, observed 690.338

Synthesis Example (6)

3,14-Dibutyl-5,16-dimesityl-5H,6H-dibenzo[b,i]benzo[5,6][1,4]azaborino[3,2,1-de]benzo[5,6][1,4]azaborino[3,2,1-kl]phenazine

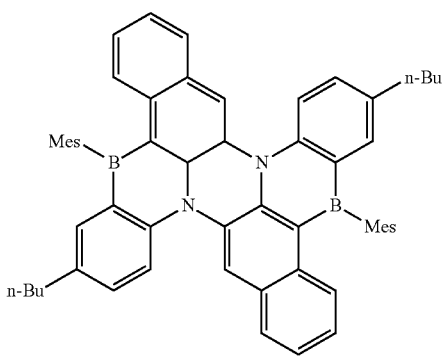

1-Bromo-4-n-butylbenzene (6.0 mL, 34 mmol), sodium tert-butoxide (4.61 g, 48 mmol), tri tert-butylphosphine (0.200 g, 0.99 mmol), bis(dibenzylideneacetone) palladium (0) (0.369 g, 0.64 mmol), and 6,13-dihydrodibenzo[b,i]phenazine (4.52 g, 16 mmol) were added to 1,4-dioxane (150 mL) under a nitrogen atmosphere at room temperature, and the resulting mixture was heated and stirred at 90° C. for 34 hours. The reaction solution was cooled to room temperature and caused to pass through a silica gel short pass column (eluent: toluene). The solvent was distilled off under reduced pressure. Thereafter, the crude product was washed with hexane to obtain 6,13-bis(4-n-butylphenyl)-6,13-dihydrodibenzo[b,i]phenazine as a yellow powder (7.37 g, yield 84%).

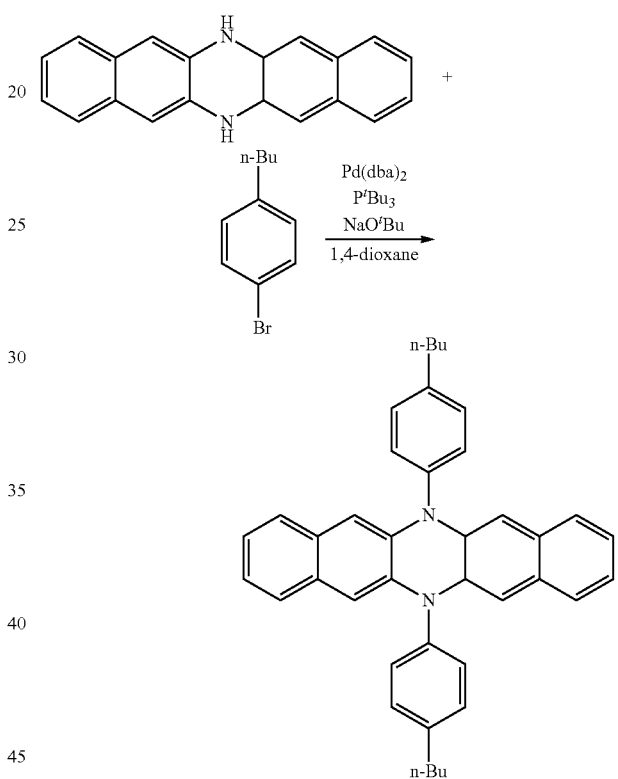

The structure of the compound thus obtained was identified with an NMR spectrum.

¹H NMR (δ ppm in CDCl₃); 1.03 (t, 6H), 1.49 (sext, 4H), 1.78 (quint, 4H), 2.80 (t, 4H), 5.98 (s, 4H), 6.97 (dd, 4H), 7.11 (dd, 4H), 7.36 (d, 4H), 7.51 (d, 4H).

¹³C NMR (δ ppm in CDCl₃); 14.0 (2C), 22.5 (2C), 33.5 (2C), 35.5 (2C), 107.7 (4C), 123.6 (4C), 125.7 (4C), 130.0 (2C), 130.3 (4C), 131.4 (4C), 135.3 (2C), 137.2 (4C), 143.7 (4C).

Next, boron triiodide (0.471 mg, 1.2 mmol) was added to 6,13-bis(4-n-butylphenyl)-6,13-dihydrodibenzo[b,i]phenazine (0.164 g, 0.30 mmol) and 1,2,4-trichlorobenzene (3.0 mL) under a nitrogen atmosphere at room temperature, and the resulting mixture was stirred at 180° C. for 20 hours. Thereafter, the resulting solution was cooled to room temperature, a mesityl Grignard reagent tetrahydrofuran solution (4.66 mL, 1.03 M, 4.8 mmol) was added, and the resulting mixture was heated at 60° C. for one hour. The reaction mixture was filtered using a Florisil short pass column (eluent: toluene), and the solvent was distilled off under reduced pressure. The crude product was washed with acetonitrile, and then isolated and purified by silica gel column chromatography (eluent: hexane/toluene). As a result, a yellow solid compound of formula (1-6-4) was obtained (24.3 mg, yield 10%).

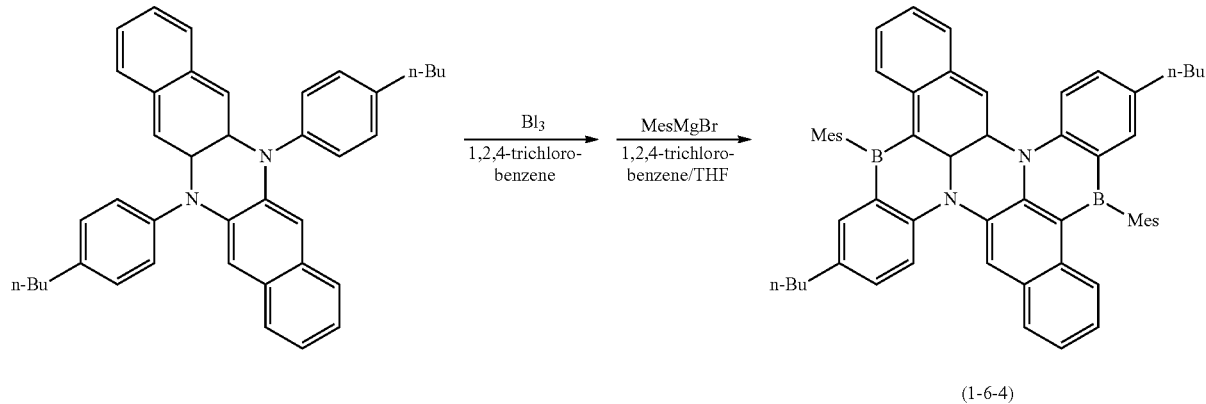

The structure of the compound thus obtained was identified with an NMR spectrum.

$^1$H NMR (δ ppm in CDCl$_3$); 0.92 (t, 6H), 1.36 (sext, 4H), 1.61 (quint, 4H), 1.97 (s, 6H), 2.17 (s, 6H), 2.50 (s, 6H), 2.67 (t, 4H), 7.00 (s, 2H), 7.10 (s, 2H), 7.25 (ddd, 2H), 7.36 (ddd, 2H), 7.43 (s, 2H), 7.64 (d, 2H), 7.67 (d, 2H), 8.09 (d, 2H), 8.12 (s, 2H), 8.20 (d, 2H). $^{13}$C NMR (δ ppm in CDCl$_3$); 14.1 (2C), 21.6 (2C), 22.4 (2C), 22.7 (2C), 22.9 (2C), 33.9 (2C), 35.2 (2C), 118.9 (2C), 124.0 (2C), 124.9 (2C), 127.1 (2C), 127.2 (2C), 127.7 (2C), 127.8 (2C), 129.6 (2C), 131.4 (2C), 132.6 (2C), 132.7 (2C), 135.3 (2C), 135.6 (2C), 136.6 (2C), 137.2 (2C), 137.9 (2C), 141.6 (2C), 143.8 (2C), 143.9 (2C), The NMR signal of the carbon α to the boron was not observed.

HRMS (EI) m/z [M]$^+$ calcd for C$_{58}$H$_{58}$B$_2$N$_2$ 802.4645, observed 802.4648

Synthesis Example (7)

3,14-Dimethyl-5,16-dimesityl-5H,6H-dibenzo[b,i]benzo[5,6][1,4]azaborino[3,2,1-de]benzo[5,6][1,4]azaborino[3,2,1-kl]phenazine

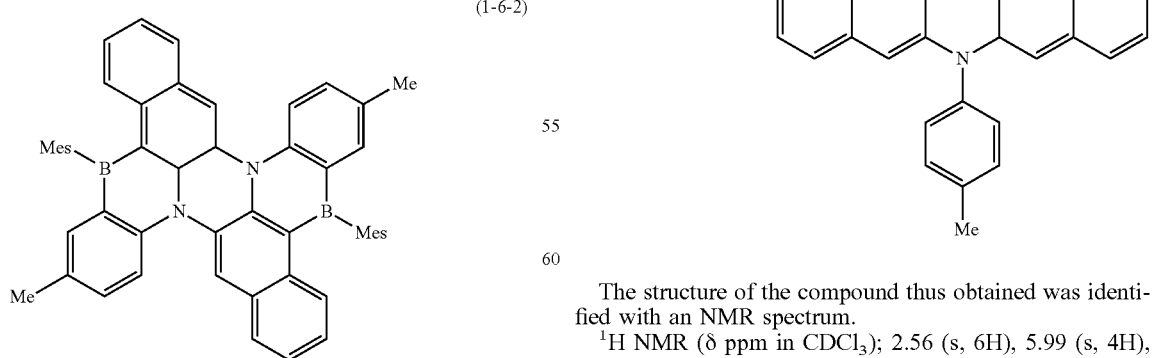

(1-6-2)

4-Bromotoluene (5.39 g, 32 mmol), sodium tert-butoxide (5.77 g, 60 mmol), tri tert-butylphosphine (0.152 g, 0.75 mmol), bis(dibenzylideneacetone) palladium(0) (0.440 g, 0.75 mmol), and 6,13-dihydrodibenzo[b,i]phenazine (4.23 g, 15 mmol) were added to 1,4-dioxane (150 mL) under a nitrogen atmosphere at room temperature, and the resulting mixture was heated and stirred at 90° C. for 34 hours. The reaction solution was cooled to room temperature and washed with dimethylsulfoxide, water, acetone, and hexane to obtain 6,13-di-p-tolyl-6,13-dihydrodibenzo[b,i]phenazine as a yellow powder (5.91 g, yield 85%).

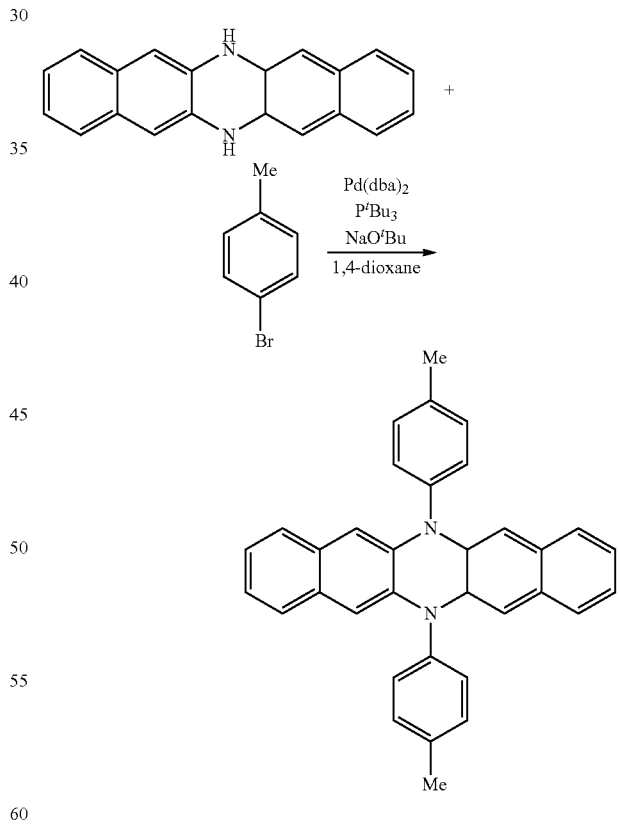

The structure of the compound thus obtained was identified with an NMR spectrum.

$^1$H NMR (δ ppm in CDCl$_3$); 2.56 (s, 6H), 5.99 (s, 4H), 6.97 (dd, 4H), 7.12 (dd, 4H), 7.35 (d, 4H), 7.53 (d, 4H). $^{13}$C NMR (δppm in CDCl$_3$); 21.5 (2C), 107.7 (4C), 123.7 (4C), 125.6 (4C), 130.0 (2C), 130.4 (4C), 132.2 (4C), 132.8 (4C), 135.4 (2C), 138.6 (4C).

Next, boron triiodide (0.784 g, 4.0 mmol) was added to 6,13-di-p-tolyl-6,13-dihydrodibenzo[b,i]phenazine (0.231 g, 0.50 mmol) and 1,2,4-trichlorobenzene (5.0 mL) under a nitrogen atmosphere at room temperature, and the resulting mixture was stirred at 180° C. for 20 hours. Thereafter, the mixture was cooled to room temperature, and a mesityl Grignard reagent tetrahydrofuran solution (11.0 mL, 0.73 M, 8.0 mmol) was added. The resulting mixture was heated at 60° C. for one hour. Thereafter, a phosphate buffer solution (pH 6, 20 mL) was added to the reaction solution, extraction was performed with toluene (60 mL), and then the solvent was distilled off under reduced pressure. The reaction mixture was filtered using a Florisil short pass column (eluent: toluene), and the solvent was distilled off under reduced pressure. The obtained crude product was filtered using a Florisil short pass column (eluent: hexane). Thereafter, the solvent was distilled off under reduced pressure, and the resulting product was washed with acetonitrile to be isolated and purified. As a result, a yellow solid compound of formula (1-6-2) was obtained (0.104 g, yield 29%).

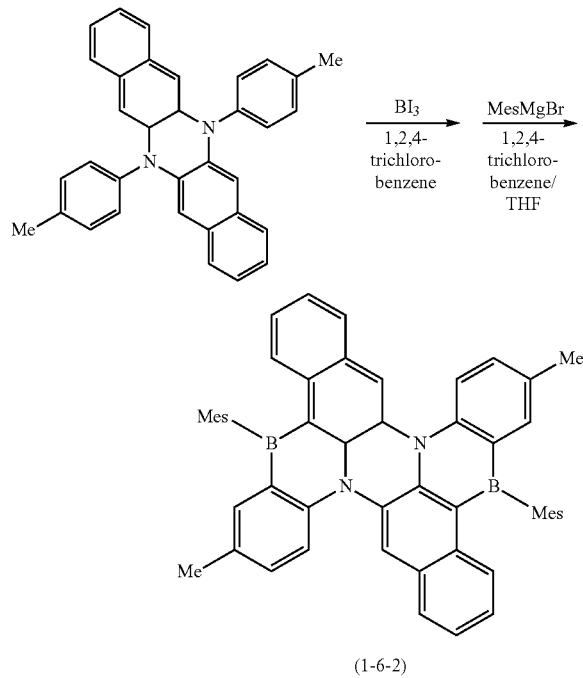

(1-6-2)

The structure of the compound thus obtained was identified with an NMR spectrum.

$^1$H NMR (δ ppm in CDCl$_3$); 1.97 (s, 6H), 2.17 (s, 6H), 2.42 (s, 6H), 2.50 (s, 6H), 7.00 (s, 2H), 7.09 (s, 2H), 7.25 (ddd, 2H), 7.36 (t, 2H), 7.43 (dd, 2H), 7.63 (s, 2H), 7.66 (d, 2H), 8.09 (d, 2H), 8.11 (s, 2H), 8.21 (d, 2H).

$^{13}$C NMR (δ ppm in CDCl$_3$); 21.3 (2C), 21.6 (2C), 22.8 (2C), 22.9 (2C), 118.9 (2C), 124.1 (2C), 125.0 (2C), 127.0 (2C), 127.2 (2C), 127.7 (2C), 127.7 (2C), 127.8 (2C), 129.6 (2C), 132.2 (2C), 132.6 (2C), 133.4 (2C), 135.6 (2C), 135.7 (2C), 136.6 (2C), 137.6 (2C), 137.9 (2C), 141.2 (2C), 144.0 (2C), The NMR signal of the carbon α to the boron was not observed.

HRMS (MALDI-TOF/MS) m/z [M]$^+$ calcd for C$_{52}$H$_{44}$B$_2$N$_2$ 718.369, observed 718.370

Synthesis Example (8)

4,8,12-Tris(diethylamino)-2,6,10-trimethyl-8,12-dihydro-4H-3a$^2$-aza-4,8,12-triphosphadibenzo[cd,mn]pyrene-4,8,12-trisulfide

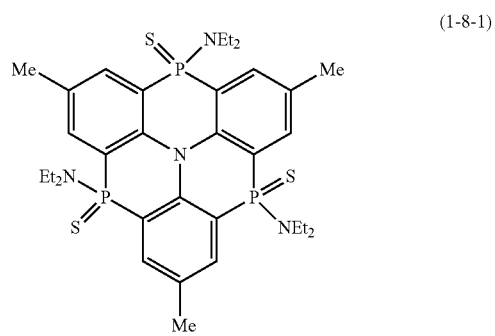

(1-8-1)

Butyllithium (9.63 mL, 1.6 M, 15 mmol) was added to tris(2-bromo-4-methylphenyl) amine (2.62 g, 5.0 mmol) and toluene (50 mL) under a nitrogen atmosphere at 0° C., and the resulting mixture was stirred at 50° C. for one hour. The solvent was distilled off under reduced pressure. Thereafter, ether (50 ml) and bisdiethylaminochlorophosphine (4.15 mL, 19.7 mmol) were added at room temperature, and the resulting mixture was stirred for two hours. Sulfur (0.885 g, 27.5 mmol) was added at room temperature, and the resulting mixture was stirred for 16 hours. Thereafter, the reaction solution was distilled off under reduced pressure at 60° C. The resulting product was filtered using a silica gel short pass column, and the solvent was distilled off under reduced pressure to obtain a crude product. The crude product was washed with acetonitrile to obtain 1-(2-(bis(2-(bis(diethylamino) thiophosphanyl)-4-methylphenyl) amino)-5-methylphenyl)-N,N,N',N'-tetraethylphosphanediamine (1.74 g, yield 51%) as a white solid.

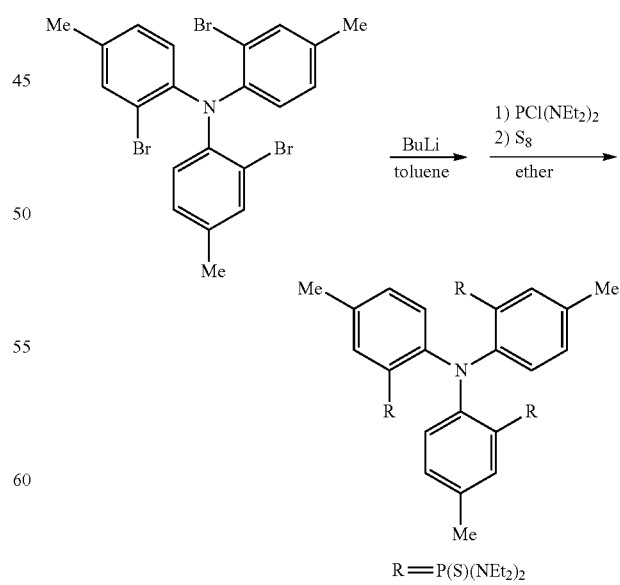

R=P(S)(NEt$_2$)$_2$

Aluminum trichloride (44.9 mg, 0.34 mmol) was added to 1-(2-(bis(2-(bis(diethylamino) thiophosphanyl)-4-methylphenyl) amino)-5-methylphenyl)-N,N,N',N'-tetraethylphosphanediamine (90.8 mg, 0.10 mmol) and o-dichlorobenzene (3.0 mL) under a nitrogen atmosphere at room temperature, and the resulting mixture was heated at 140° C. for 24 hours. The reaction solution was heated at 140° C. for 24 hours and then added to a 1,4-diazabicyclo[2,2,2]octane (0.131 g, 1.2 mmol) dichloromethane solution (2.0 mL) at room temperature, and celite filtration was performed (eluent: toluene). The solvent was distilled off under reduced pressure. Thereafter, the obtained crude product was isolated and purified by GPC (eluent: toluene) to obtain a white solid compound of formula (1-8-1) (10.8 mg, yield 16%).

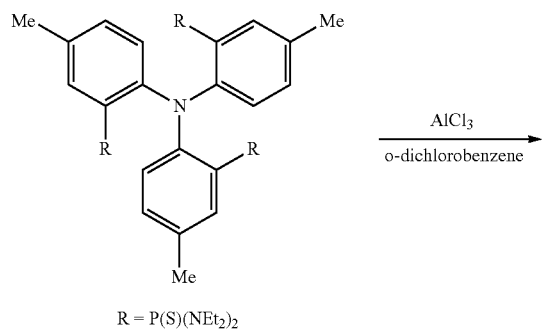

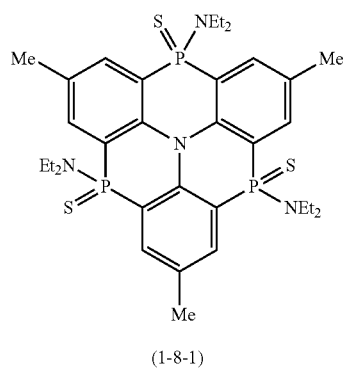

(1-8-1)

The structure of the compound thus obtained was identified with an NMR spectrum.

$^1$H NMR (δ ppm in CDCl$_3$); δ=0.78 (t, 6H), 0.86 (t, 12H), 2.53 (s, 9H), 2.86-2.98 (m, 12H), 8.12 (d, 2H), 8.19 (d, 2H), 8.28 (d, 2H).

$^{13}$C NMR (δ ppm in CDCl$_3$) 14.1 (6C), 20.2, 20.3 (2C), 39.3 (3C), 39.4 (3C), 118.6 (2C), 128.7 (2C), 130.9 (2C), 134.7, 135.1 (2C), 135.6 (4C), 136.3 (2C), 138.9, 139.6 (2C).

HRMS(DART) calcd for C$_{33}$H$_{46}$N$_4$P$_3$S$_3$ [(M+H)$^+$]: 687.2097, found: 687.2073

Synthesis Example (9)

5-(Diethylamino)-3,7,11-trimethyl-9-(pentan-3-yl)benzo[5,6][1,4]azaphosphino[3,2,1-de]phenophosphazinin-5,9-disulfide

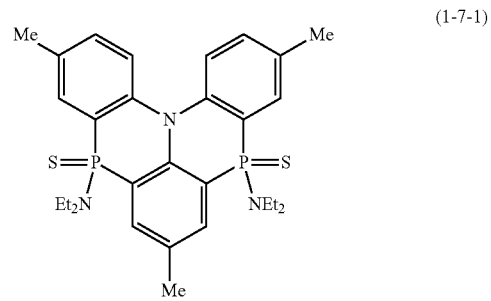

(1-7-1)

Butyllithium (5.78 mL, 1.6 M, 9.3 mmol) was added to tris(2-bromo-4-methylphenyl) amine (1.57 g, 3.0 mmol) and toluene (40 mL) under a nitrogen atmosphere at 0° C., and the resulting mixture was stirred at room temperature for 18 hours. Bisdiethylamino chlorophosphine (1.45 mL, 6.9 mmol) was added at 0° C., and the resulting mixture was stirred at room temperature for one hour and then heated and stirred at 50° C. for three hours. Sulfur (0.885 g, 27.5 mmol) was added at room temperature, and the resulting mixture was stirred for 16 hours. Thereafter, the reaction solution was distilled off under reduced pressure at 60° C. The resulting product was filtered using a silica gel short pass column, and the solvent was distilled off under reduced pressure to obtain a crude product. The crude product was washed with acetonitrile and hexane to obtain 5-(2-(bis(diethylamino) phosphanyl)-4-methylphenyl)-10-(diethylamino)-2,8-dimethyl-5H-phenophosphazine-2,10-disulfide (0.185 g, yield 9%).

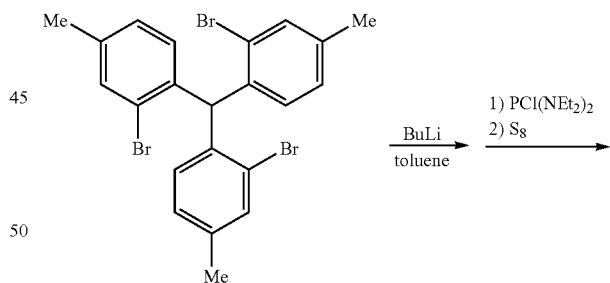

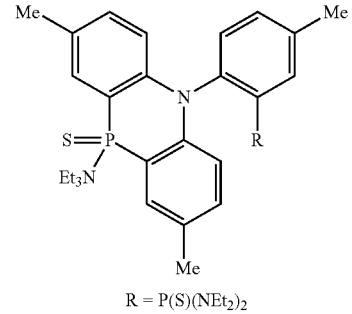

Aluminum trichloride (0.116 g, 0.90 mmol) was added to 5-(2-(bis(diethylamino) phosphanyl)-4-methylphenyl)-10-

(diethylamino)-2,8-dimethyl-5H-phenophosphazine-2,10-disulfide (0.185 g, 0.30 mmol) and o-dichlorobenzene (2.0 mL) under a nitrogen atmosphere at room temperature, and the resulting mixture was heated at 110° C. for 24 hours. The reaction solution was heated at 110° C. for 24 hours and then added to a 1,4-diazabicyclo[2,2,2]octane (0.281 g, 2.5 mmol) dichloromethane solution (2.0 mL) at room temperature, and celite filtration was performed (eluent: toluene). The solvent was distilled off under reduced pressure. Thereafter, the obtained crude product was isolated and purified by GPC (eluent: toluene) to obtain a white solid compound of formula (1-7-1) (14.1 mg, yield 9%).

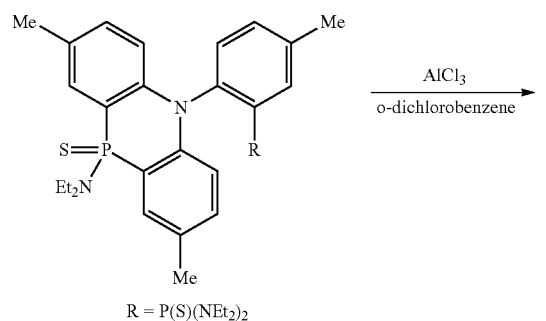

R = P(S)(NEt₂)₂

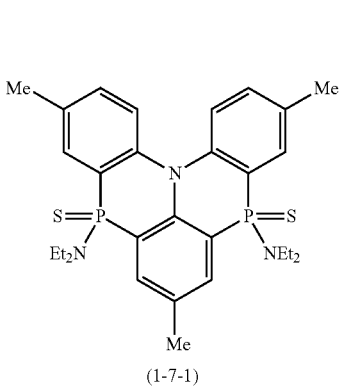

(1-7-1)

The structure of the compound thus obtained was identified with an NMR spectrum.

$^1$H NMR (δ ppm in CDCl$_3$); δ=0.71 (t, 12H), 2.44 (s, 6H), 2.53 (s, 3H), 2.77-2.82 (m, 8H), 7.14 (t, 2H), 7.20 (d, 2H), 8.12 (d, 2H), 8.29 (d, 2H).

HRMS(DART) calcd for C$_{29}$H$_{38}$N$_3$P$_2$S$_2$ [(M+H)$^+$]: 554.1982, found: 554.1982

Synthesis Example (10)

4,8,12-Tris(diethylamino)-2,6,10-trimethyl-8,12-dihydro-4H-3a²-aza-4,8,12-triphosphadibenzo[cd,mn]pyrene-4,8,12-trioxide

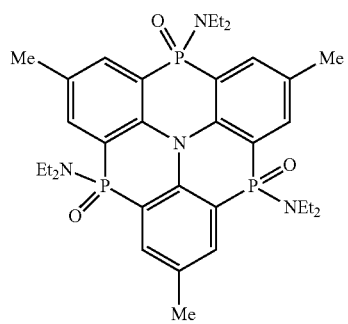

(1-8-20)

m-CPBA (82.8 mg, 77 wt % 0.48 mmol) was added to the compound of formula (1-8-1) obtained in Synthesis Example (8) (27.0 mg, 0.04 mol) and dichloromethane (1.4 mL) at −40° C., and the resulting mixture was stirred for 20 minutes. Thereafter, a saturated solution of sodium sulfite (2.0 mL) was added, and the resulting mixture was stirred for one hour. The organic layer was extracted with a saturated solution of sodium carbonate (2.0 mL) and dichloromethane, and the solvent was distilled off under reduced pressure to obtain a compound of formula (1-8-20) (23.3 mg, yield 91%) as a yellow solid.

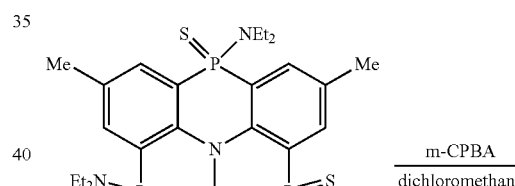

(1-8-1)

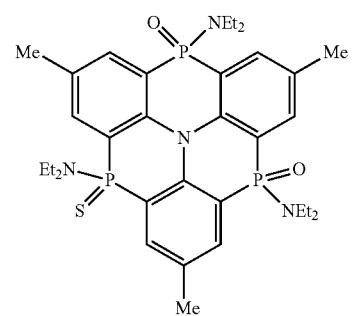

(1-8-20)

The structure of the compound thus obtained was identified with an NMR spectrum.

$^1$H NMR (δ ppm in CDCl$_3$); δ=0.78 (t, 6H), 0.89 (t, 12H), 2.51 (s, 3H), 2.52 (s, 6H), 2.72-2.81 (m, 4H), 2.85-2.93 (m, 8H), 8.05-8.11 (m, 4H), 8.12 (dd, 2H).

$^{13}$C NMR (δ ppm in CDCl$_3$) 14.0 (2C), 14.1 (4C), 20.0, 20.1 (2C), 38.2, 38.3, 38.4 (4C), 118.4 (dd, 2C), 119.3 (dd, 2C), 119.5 (dd, 2C), 134.2 (t, 3C), 134.7 (2C), 134.8 (2C), 135.0 (2C), 142.0, 142.5 (2C).

Synthesis Example (11)

Synthesis of 5-(diethylamino)-3,7,11-trimethyl-9-(pentan-3-yl) benzo[5,6][1,4]azaphosphino[3,2,1-de]phenophosphazinin-5,9-dioxide

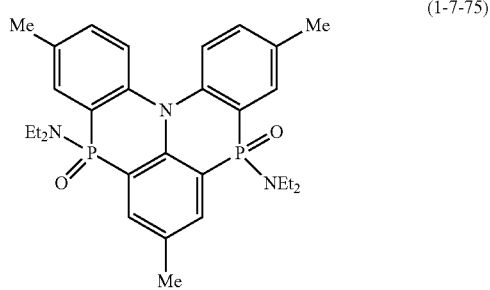

(1-7-75)

m-Chloroperbenzoic acid (m-CPBA, 138.0 mg, 77 wt %, 0.8 mmol) was added to 5-(diethylamino)-3,7,11-trimethyl-9-(pentan-3-yl) benzo[5,6][1,4]azaphosphino[3,2,1-de]phenophosphazinin-5,9-disulfide as compound (1-7-1) (54.7 mg, 0.1 mmol) and dichloromethane (7.0 mL) at −40° C., and the resulting mixture was stirred for 20 minutes. Thereafter, a saturated solution of sodium thiosulfate (5.0 mL) was added, and the resulting mixture was stirred for one hour. The organic layer was extracted with a saturated solution of sodium carbonate (5.0 mL) and dichloromethane, and the solvent was distilled off under reduced pressure to obtain a compound of formula (1-7-75) (40.0 mg, yield 78%) as a yellow solid.

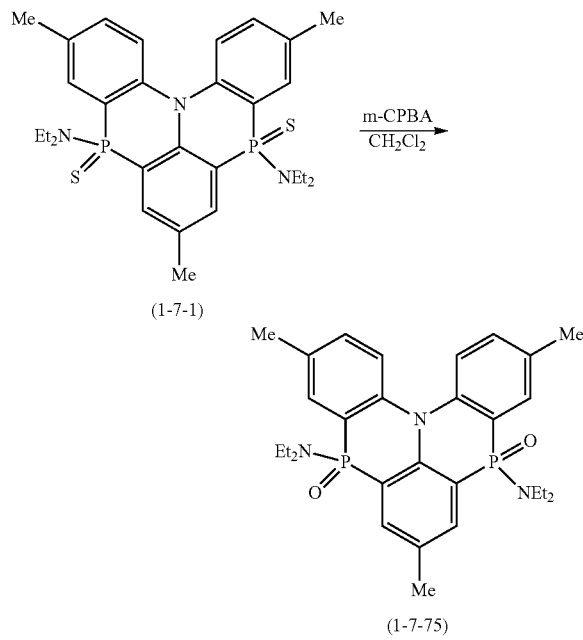

The structure of the compound thus obtained was identified with an NMR spectrum.

$^1$H NMR (δ ppm in CD$_2$Cl$_2$); δ=0.71 (t, 12H), 2.32 (s, 6H), 2.39 (s, 3H), 2.74-2.82 (m, 8H), 7.09 (dd, 2H), 7.14 (dd, 2H), 7.73 (d, 2H), 7.87 (d, 2H).

$^{13}$C NMR (δ ppm in CD$_2$Cl$_2$) 14.7 (4C), 20.7 (1C), 20.8 (2C), 38.9 (4C), 121.2 (dd, 2C), 122.1 (t, 1C), 123.0 (d, 2C), 130.6 (2C), 132.9 (2C), 133.7 (t, 2C), 134.0 (2C), 134.6 (t, 2C), 142.7 (t, 1C), 143.3 (2C).

Other compounds of the present invention can be synthesized by a method according to Synthesis Examples described above by appropriately changing the compounds of raw materials.

Next, evaluation of basic physical properties of the compound of the present invention, and manufacturing and evaluation of an organic EL element using the compound of the present invention will be described.

<Evaluation of Basic Physical Properties>

Preparation of Sample

When absorption characteristics and luminescence characteristics (fluorescence and phosphorescence) of a compound to be evaluated are evaluated, there are a case where the compound to be evaluated is dissolved in a solvent and evaluated in a solvent and a case where the compound to be evaluated is evaluated in a thin film state. Furthermore, in the case of evaluation in a thin film state, depending on a mode of use of a compound to be evaluated in an organic EL element, there are a case where only the compound to be evaluated is formed into a thin film to be evaluated and a case where the compound to be evaluated is dispersed in an appropriate matrix material, and is formed into a thin film to be evaluated. As the matrix material, commercially available PMMA (polymethyl methacrylate) or the like can be used. For example, a thin film sample dispersed in PMMA can be manufactured by dissolving PMMA and a compound to be evaluated in toluene and then forming a thin film on a quartz transparent support substrate (10 mm×10 mm) by a spin coating method. A method for manufacturing a thin film sample when the matrix material is a host material will be described below. A quartz transparent support substrate (10 mm×10 mm×1.0 mm) is fixed to a substrate holder of a commercially available vapor deposition apparatus (manufactured by Showa Shinku Co., Ltd.), and a molybdenum vapor deposition boat containing a host material and a molybdenum vapor deposition boat containing a dopant material are attached thereto. Subsequently, a vacuum chamber is depressurized to 5×10$^{-4}$ Pa, and the vapor deposition boat containing the host material and the vapor deposition boat containing the dopant material are heated simultaneously to perform vapor deposition so as to obtain an appropriate film thickness, and a mixed thin film of the host material and the dopant material is formed. The vapor deposition rate is controlled according to a set weight ratio between the host material and the dopant material.

Evaluation of Absorption Characteristics and Luminescence Characteristics

An absorption spectrum of the sample was measured using an ultraviolet-visible near-infrared spectrophotometer (Shimadzu Corporation, UV-2600). A fluorescence spectrum or a phosphorescence spectrum of the sample was measured using a spectrofluorophotometer (manufactured by Hitachi High-Technologies Corporation, F-7000). For measurement of the fluorescence spectrum, photoluminescence was measured by excitation at an appropriate excitation wavelength at room temperature. For measurement of the phosphorescence spectrum, the sample was measured while being immersed in liquid nitrogen (temperature 77 K) using an attached cooling unit. In order to observe the phosphorescence spectrum, delay time from excitation light irradiation to start of measurement was adjusted using an optical chopper. The sample was excited with an appropriate excitation wavelength and photoluminescence was measured.

Evaluation of Delayed Fluorescence

A fluorescence lifetime is measured at 300 K using a fluorescence lifetime measuring apparatus (manufactured by Hamamatsu Photonics K.K., C11367-01). Fast and slow components of a fluorescence lifetime are observed at a maximum emission wavelength measured at an appropriate excitation wavelength. In fluorescence lifetime measurement of a general organic EL material that emits fluorescence at room temperature, a slow component involving a triplet component derived from phosphorescence is rarely observed due to deactivation of the triplet component due to heat. A case where a slow component is observed in a compound to be evaluated indicates that triplet energy having a long excitation lifetime has moved to singlet energy due to thermal activation and is observed as delayed fluorescence.

<Evaluation of Organic EL Element>

The compound of the present invention is characterized by an appropriate band gap (Eg), high triplet excitation energy ($E_T$), and small ΔEST (energy difference between triplet excited state (T1) and singlet excited state (S1)). Therefore, particularly, application thereof to a light emitting layer and a charge transport layer can be expected.

Configuration of Organic EL Element

Examples of a configuration of an organic EL element using the compound of the present invention include the following configuration A and configuration B.

(Element Configuration A)

An example of a constituent material serving as a reference for each layer is indicated in the following Table 1. By replacing at least one of a material for a hole transport layer, a material for an electron blocking layer, a host material for a light emitting layer, a dopant material for a light emitting layer, and a material for an electron transport layer with the compound of the present invention, further improvement in characteristics can be expected. Note that a film thickness of each layer and a constituent material therefor can be appropriately changed according to basic physical properties of the compound of the present invention.

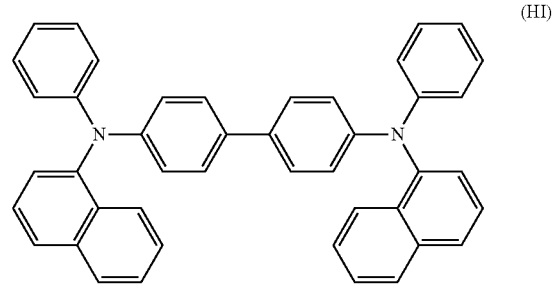
(HI)

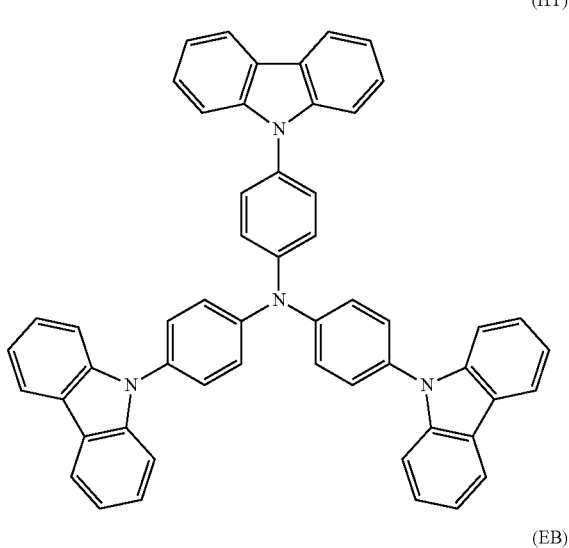
(HT)

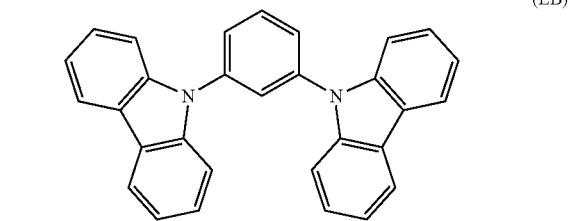
(EB)

TABLE 1

| Hole injection layer (40 nm) | Hole transport layer (15 nm) | Electron blocking layer (15 nm) | Light emitting layer (30 nm) | | Electron transport layer (40 nm) | Negative electrode (1 nm/100 nm) |
|---|---|---|---|---|---|---|
| | | | Host | Dopant | | |
| HI | HT | EB | EM-H | Firpic | ET | LiF/Al |

In Table 1, "HI" (hole injection layer material) represents N,N'-diphenyl-N,N'-dinaphthyl-4,4'-diaminobiphenyl, "HT" (hole transport layer material) represents 4,4',4"-tris(N-carbazolyl) triphenylamine, "EB" (electron blocking layer material) represents 1,3-bis(N-carbazolyl) benzene, "EM-H" (light emitting layer host material) represents 3,3'-bis(N-carbazolyl)-1,1'-biphenyl, "Firpic" (light emitting layer dopant material) represents bis[2-(4,6-difluorophenyl)pyridinato-$N,C^2$](picolinato) iridium(III), and "ET" (electron transport layer material) represents diphenyl[4-(triphenylsilyl) phenyl]phosphine oxide. Chemical structures thereof are illustrated below.

-continued

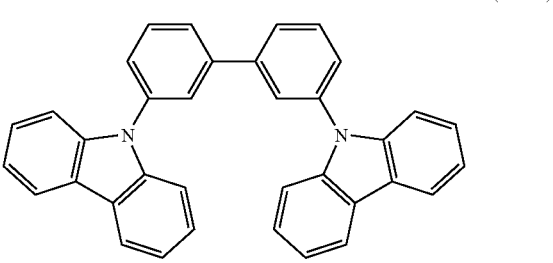
(EM-H)

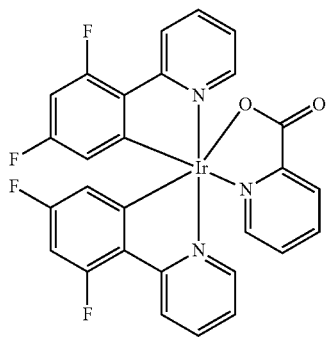
(Firpic)

In Table 2, "HI" (hole injection layer material) represents N$^4$,N$^{4'}$-diphenyl-N$^4$,N$^{4'}$-bis(9-phenyl-9H-carbazol-3-yl)-[1,1'-biphenyl]-4,4'-diamine, "HAT-CN" (hole injection layer material) represents 1,4,5,8,9,12-hexaazatriphenylene hexacarbonitrile, "HT-1" (hole transport layer material) represents N-([1,1'-biphenyl]-4-yl)-9,9-dimethyl-N-(4-(9-phenyl-9H-carbazol-3-yl) phenyl)-9H-fluorene-2-amine, "HT-2" (hole transport layer material) represents N,N-bis(4-(dibenzo[b,d]furan-4-yl) phenyl)-[1,1':4',1''-terphenyl]-4-amine, "EM-H" (light emitting layer host material) represents 9-phenyl-10-(4-phenylnaphthalen-1-yl) anthracene, "BD1" (light emitting layer dopant material) represents 7,7,-dimethyl-N$^5$,N$^9$-diphenyl-N$^5$,N$^9$-bis(4-(trimethylsilyl) phenyl)-7H-benzo[c]fluorene-5,9-diamine, and "ET" (electron transport layer material) represents 4,4'-((2-phenylanthracene-9,10-diyl) bis(4,1-phenylene)) dipyridine. Chemical structures thereof are indicated below together with "Liq".

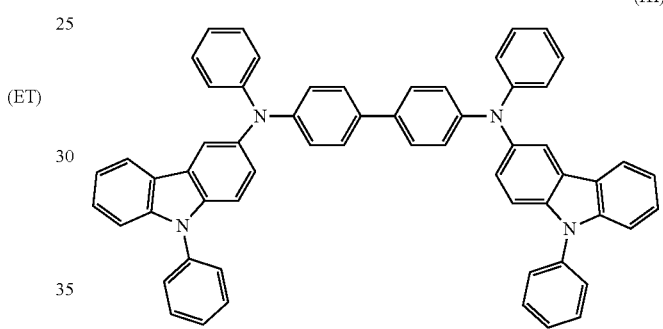
(HI)

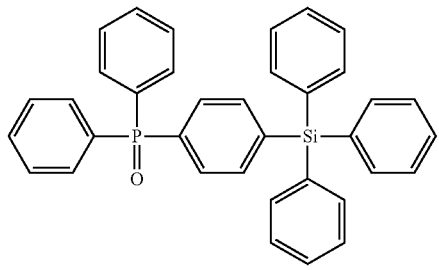
(ET)

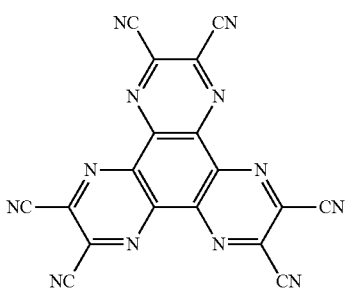
(HAT-CN)

(Element Configuration B)

An example of a constituent material serving as a reference for each layer is indicated in the following Table 2. By replacing at least one of a material for a hole transport layer 1, a material for a hole transport layer 2, a host material for a light emitting layer, a dopant material for a light emitting layer, and a material for an electron transport layer with the compound of the present invention, further improvement in characteristics can be expected. Note that a film thickness of each layer and a constituent material therefor can be appropriately changed according to basic physical properties of the compound of the present invention.

TABLE 2

| Hole injection layer 1 (40 nm) | Hole injection layer 2 (5 nm) | Hole transport layer 1 (15 nm) | Hole transport layer 2 (10 nm) | Light emitting layer (25 nm) Host | Dopant | Electron transport layer (30 nm) | Negative electrode (1 nm/100 nm) |
|---|---|---|---|---|---|---|---|
| HI | HAT-CN | HT-1 | HT-2 | EM-H | BD1 | ET | Liq/MgAg |

(HT-1)

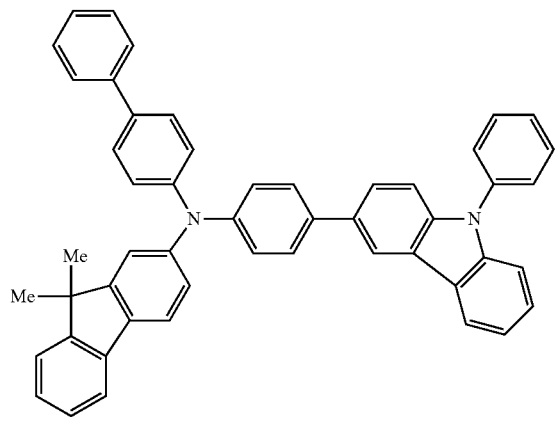

(HT-2)

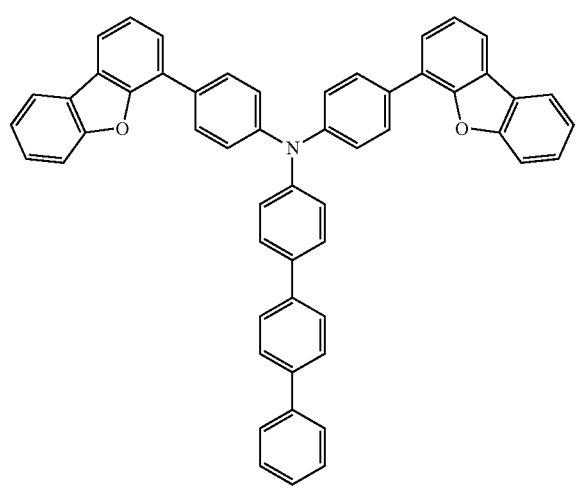

(EM-H)

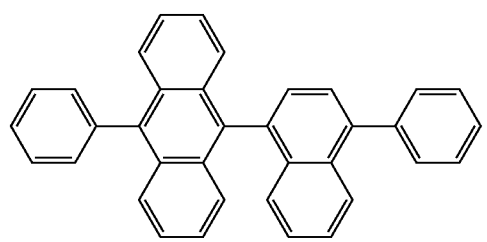

(BD1)

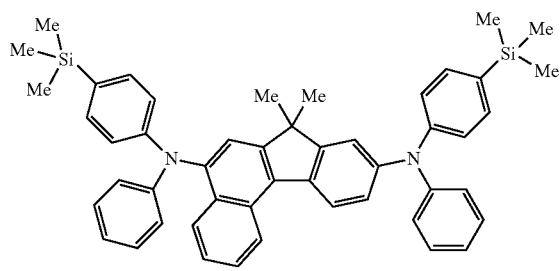

(ET)

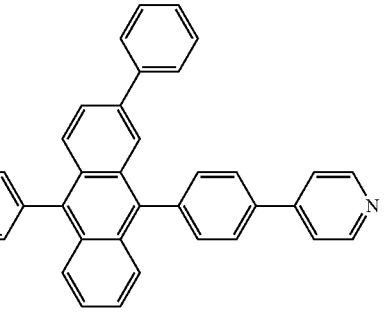

(Liq)

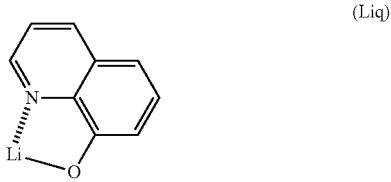

<Manufacturing Organic EL Element>

A method for manufacturing the element configuration A will be described below. A glass substrate (manufactured by Opto Science, Inc.) having a size of 26 mm×28 mm×0.7 mm, obtained by forming a film of ITO having a thickness of 100 nm by sputtering and polishing the ITO film to 50 nm, was used as a transparent support substrate. This transparent support substrate was fixed to a substrate holder of a commercially available vapor deposition apparatus (manufactured by Showa Shinku Co., Ltd.), and a vapor deposition boat made of molybdenum and containing HI (hole injection layer material), a vapor deposition boat made of molybdenum and containing HT (hole transport layer material), a vapor deposition boat made of molybdenum and containing EB (electron blocking layer material), a vapor deposition boat made of molybdenum and containing EM-H (host material), a vapor deposition boat made of molybdenum and containing Firpic (dopant material), a vapor deposition boat made of molybdenum and containing ET (electron transport layer material), a vapor deposition boat made of molybdenum and containing LiF (electron injection layer material), and a vapor deposition boat made of molybdenum and containing aluminum were attached thereto.

Layers as described below were formed sequentially on the ITO film of the transparent support substrate. The pressure in a vacuum chamber was reduced to $5 \times 10^{-4}$ Pa. Thereafter, the vapor deposition boat containing HI was first heated, and vapor deposition was performed so as to obtain a film thickness of 40 nm to form a hole injection layer. Subsequently, the vapor deposition boat containing HT was heated, and vapor deposition was performed so as to obtain a film thickness of 15 nm to form a hole transport layer. Subsequently, the vapor deposition boat containing EB was heated, and vapor deposition was performed so as to obtain a film thickness of 15 nm to form an electron blocking layer. Subsequently, the vapor deposition boat containing EM-H and the vapor deposition boat containing Firpic (dopant material) were simultaneously heated, and vapor deposition was performed so as to obtain a film thickness of 30 nm to form a light emitting layer. The vapor deposition rate was adjusted such that a weight ratio between EM-H and Firpic was approximately 95:5. Subsequently, the vapor deposition boat containing ET was heated, and vapor deposition was performed so as to obtain a film thickness of 40 nm to form an electron transport layer. The vapor deposition rate for each layer was 0.01 to 1 nm/sec.

Thereafter, the vapor deposition boat containing LiF was heated, and vapor deposition was performed at a vapor deposition rate of 0.01 to 0.1 nm/sec so as to obtain a film thickness of 1 nm. Subsequently, the vapor deposition boat containing aluminum was heated, and vapor deposition was performed so as to obtain a film thickness of 100 nm to form a negative electrode, thereby obtaining an organic EL element. At this time, a vapor deposition rate of aluminum was adjusted so as to be 1 nm to 10 nm/sec.

The element configuration B can be manufactured by optimizing conditions in a similar manner to the element configuration A.

Evaluation Items and Evaluation Method

Examples of an evaluation item include a driving voltage (V), an emission wavelength (nm), CIE chromaticity (x, y), an external quantum efficiency (%), a maximum wavelength (nm) of an emission spectrum, and a half width (nm) thereof. For these evaluation items, for example, a value at 10 cd/m$^2$ light emission can be used.

A quantum efficiency of a luminescent element includes an internal quantum efficiency and an external quantum efficiency. The internal quantum efficiency indicates a ratio at which external energy injected as electrons (or holes) into a light emitting layer of a luminescent element is purely converted into photons. Meanwhile, the external quantum efficiency is calculated based on the number of photons emitted to an outside of the luminescent element. A part of the photons generated in the light emitting layer are absorbed or reflected continuously inside the luminescent element, and are not emitted to the outside of the luminescent element. Therefore, the external quantum efficiency is lower than the internal quantum efficiency.

A method for measuring spectral radiance (emission spectrum) and an external quantum efficiency are as follows. Using a voltage/current generator R6144 manufactured by Advantest Corporation, a voltage at which luminance of an element was 10 cd/m$^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by n is the number of photons at each wavelength. Subsequently, the number of photons is integrated in the observed entire wavelength region, and this number is taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element. Note that the half width of an emission spectrum is obtained as a width between upper and lower wavelengths where the intensity is 50% with a maximum emission wavelength as the center.

Examples of Compound (1-3-2)

<Evaluation of Basic Physical Properties>

[Absorption Characteristics]

Figure 2:
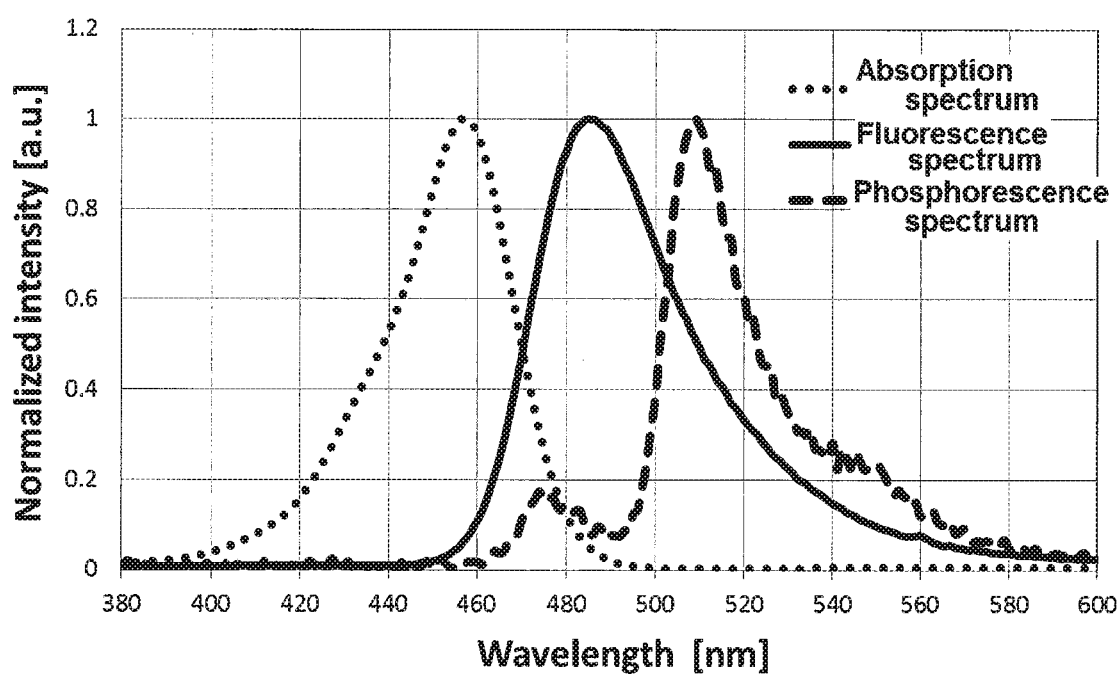
FIG. 2 is an absorption/fluorescence/phosphorescence spectrum of compound (1-3-2).

Compound (1-3-2) was dissolved in a solvent $CH_2Cl_2$ at a concentration of $2.0 \times 10^{-5}$ mol/l and an absorption spectrum was measured. As a result, an absorption edge wavelength was 479 nm, an absorption maximum wavelength was 457 nm, and a molar absorbance coefficient at the absorption maximum wavelength was 22000 cm$^{-1}$M$^{-1}$ (FIG. 2). An energy gap calculated from the absorption edge wavelength was 2.59 eV.

[Luminescence Characteristics]

A fluorescence spectrum was measured at room temperature by dissolving compound (1-3-2) in a solvent $CH_2Cl_2$ at a concentration of $2.0 \times 10^{-5}$ mol/l. A sample was excited at an excitation wavelength of 280 nm, and photoluminescence was measured. As a result, a maximum emission wavelength was 484 nm (FIG. 2), and a fluorescence quantum yield was 79%.

A phosphorescence spectrum was measured by dissolving compound (1-3-2) in 3-methylpentane. A sample was excited at an excitation wavelength of 280 nm, and photoluminescence was measured. As a result, a maximum emission wavelength was 509 nm (FIG. 2).

A difference ΔEST between lowest singlet excitation energy and lowest triplet excitation energy estimated from the maximum emission wavelengths of the measured fluorescence spectrum and phosphorescence spectrum was 0.13 eV.

As described above, compound (1-3-2) has a high fluorescence quantum yield and an appropriate energy gap, and therefore is the most suitable as a material for a light emitting layer. Furthermore, compound (1-3-2) can be expected as a thermally activated delayed fluorescent material for a light emitting layer because of having small LEST.

<Evaluation of Organic EL Element>

An element in which compound (1-3-2) is used as a dopant of a light emitting layer in the element configuration A or the element configuration B can be manufactured by the above procedure and can be evaluated.

A specific example of manufacturing an organic EL element in which compound (1-3-2) is used as a dopant of a light emitting layer will be described below. The following Table 3 illustrates a material configuration of each layer in this element. When this element was driven at a current density capable of obtaining a luminance of 100 cd/m$^2$, an external quantum efficiency was measured.

TABLE 3

| Hole injection layer | Hole transport layer 1 | Hole transport layer 2 | Light emitting layer (20 nm) | | Electron transport layer | Negative electrode (1 nm/ |
|---|---|---|---|---|---|---|
| (40 nm) | (15 nm) | (15 nm) | Host | Dopant | (40 nm) | 100 nm) |
| NPD | TcTa | mCP | mCBP | Compound (1-3-2) | TPBi | LiF/Al |

In Table 3, "NPD" represents N,N'-di(naphthylene-1-yl)-N,N'-diphenyl-[1,1'-biphenyl]-4,4'-diamine, "TcTa" represents tris(4-carbazolyl-9-ylphenyl) amine, "mCP" represents 1,3-bis(N-carbazolyl) benzene, "mCBP" represents 3,3'-di(9H-carbazolyl-9-yl)-1,1'-biphenyl, and "TPBi" represents 1,3,5-tris(1-phenyl-1H-benzo[d]imidazol-2-yl) benzene. Chemical structures thereof are illustrated below.

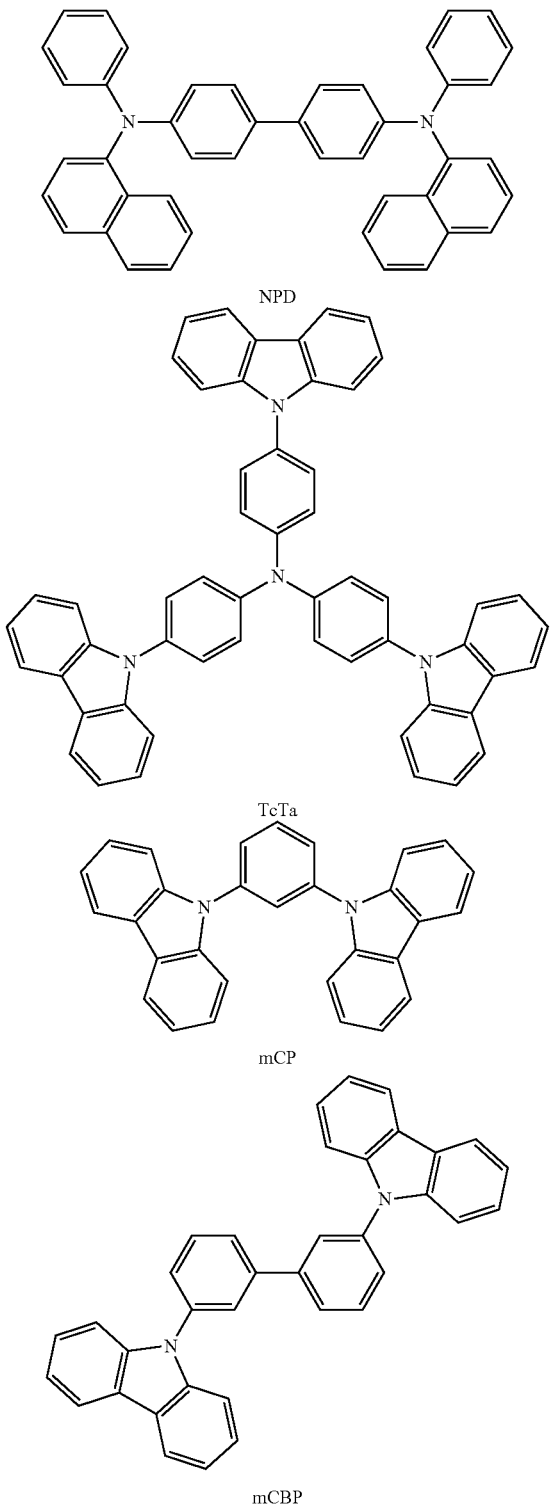

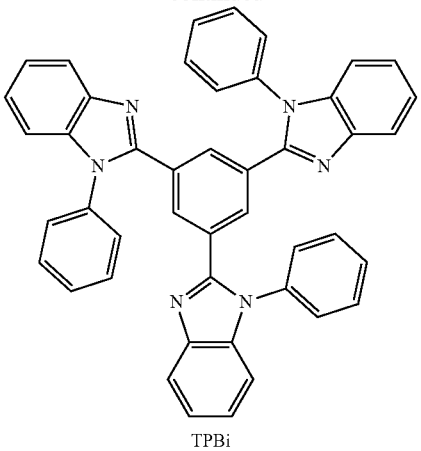

TPBi

<Element in which Compound (1-3-2) is Used as Host Material of Light Emitting Layer>

A glass substrate (manufactured by Opto Science, Inc.) having a size of 26 mm×28 mm×0.7 mm, obtained by forming a film of ITO by sputtering and polishing the ITO film to 50 nm, was used as a transparent support substrate. This transparent support substrate was fixed to a substrate holder of a commercially available vapor deposition apparatus (manufactured by Choshu Industry). Vapor deposition crucibles made of tantalum and containing NPD, TcTa, mCP, mCBP, compound (1-3-2), TPBi, and LiF, respectively, and a vapor deposition crucible made of aluminum nitride and containing aluminum were attached thereto.

Layers as described below were formed sequentially on the ITO film of the transparent support substrate. A vacuum chamber was depressurized to $2.0 \times 10^{-4}$ Pa. First, NPD was heated, and vapor deposition was performed so as to obtain a film thickness of 40 nm. Subsequently, TcTa was heated, and vapor deposition was performed so as to obtain a film thickness of 15 nm. Furthermore, mCP was heated, and vapor deposition was performed so as to obtain a film thickness of 15 nm to form a hole injection layer and hole transport layers formed of three layers. Subsequently, mCBP and compound (1-3-2) were simultaneously heated, and vapor deposition was performed so as to obtain a film thickness of 20 nm to form a light emitting layer. The vapor deposition rate was adjusted such that the weight ratio of mCBP and compound (1-3-2) would be approximately 95:5. Subsequently, TPBi was heated, and vapor deposition was performed so as to obtain a film thickness of 40 nm to form an electron transport layer. The vapor deposition rate for each layer was 0.01 to 1 nm/sec. Thereafter, LiF was heated, and vapor deposition was performed at a vapor deposition rate of 0.01 to 0.1 nm/sec so as to obtain a film thickness of 1 nm. Subsequently, aluminum was heated, and vapor deposition was performed so as to obtain a film thickness of 100 nm to form a negative electrode. At this time, vapor deposition was performed so as to obtain a vapor deposition rate of 0.1 nm to 2 nm/sec. Thus, a negative electrode was formed, and an organic EL element was obtained.

Figure 6:
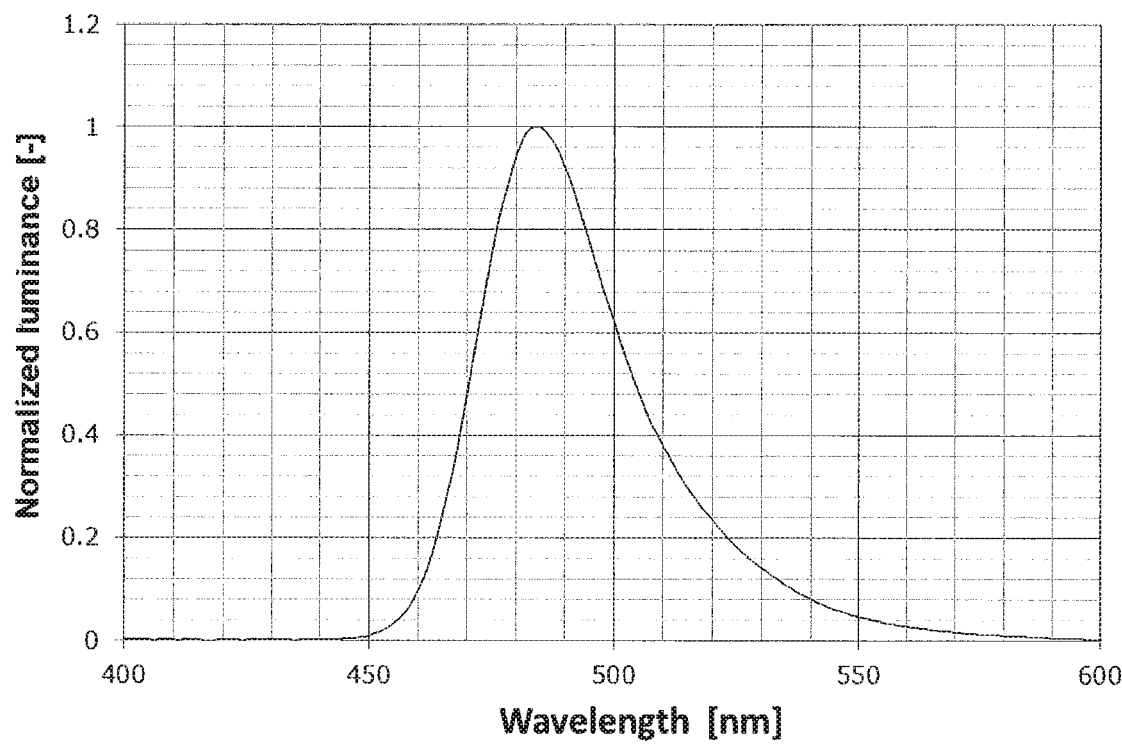
FIG. 6 is an emission spectrum of an organic EL element using compound (1-3-2).

When a direct current voltage was applied to the ITO electrode as a positive electrode and the LiF/aluminum electrode as a negative electrode, blue light emission having a peak top at about 485 nm and having a half width (FWHM) of 34 nm was obtained. The external quantum efficiency at a luminance of 100 cd/m² was 10.4%. FIG. 6 illustrates an emission spectrum of this element.

Examples of Compound (1-6-1)
<Evaluation of Basic Physical Properties>
[Absorption Characteristics]

Figure 3:
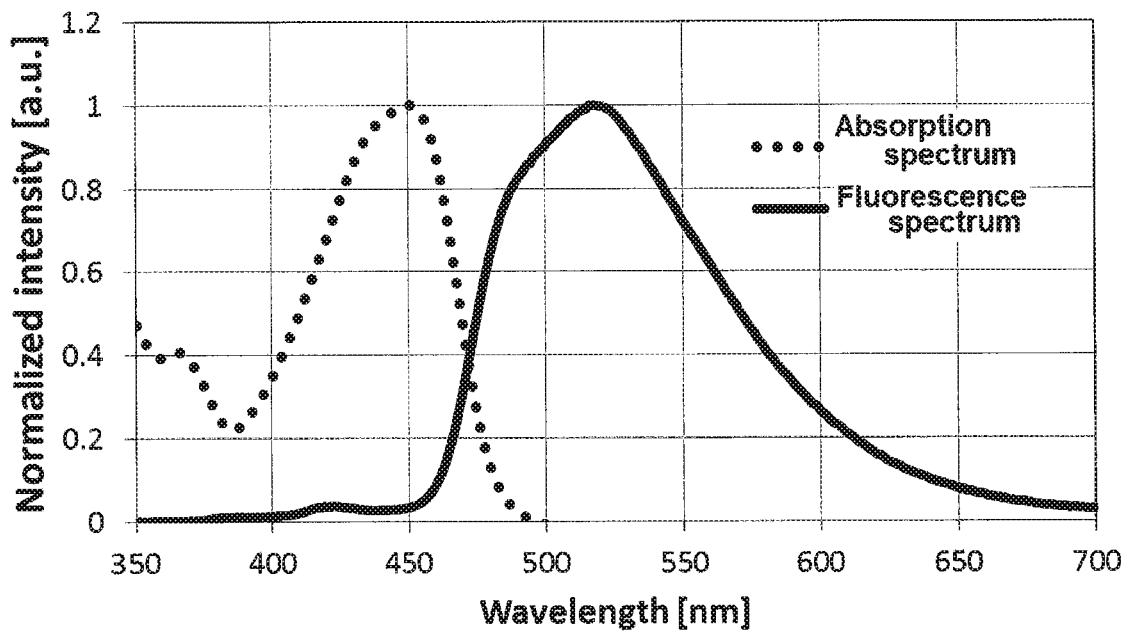
FIG. 3 is an absorption/fluorescence spectrum of compound (1-6-1).

An absorption spectrum was measured under the same conditions as those of the compound (1-3-2). As a result, an absorption edge wavelength was 480 nm, an absorption maximum wavelength was 490 nm, and a molar absorbance coefficient at the absorption maximum wavelength was 20950 cm$^{-1}$M$^{-1}$ (FIG. 3). An energy gap calculated from the absorption edge wavelength was 2.58 eV.

[Luminescence Characteristics]

A fluorescence spectrum was measured under the same conditions as those of compound (1-3-2) except that the excitation wavelength was 340 nm. As a result, the maximum emission wavelength was 518 nm (FIG. 3).

As described above, compound (1-6-1) has an appropriate energy gap, and therefore can be expected as a material for an organic EL element.

Examples of Compound (1-6-4)
<Evaluation of Basic Physical Properties>
[Absorption Characteristics]

Figure 4:
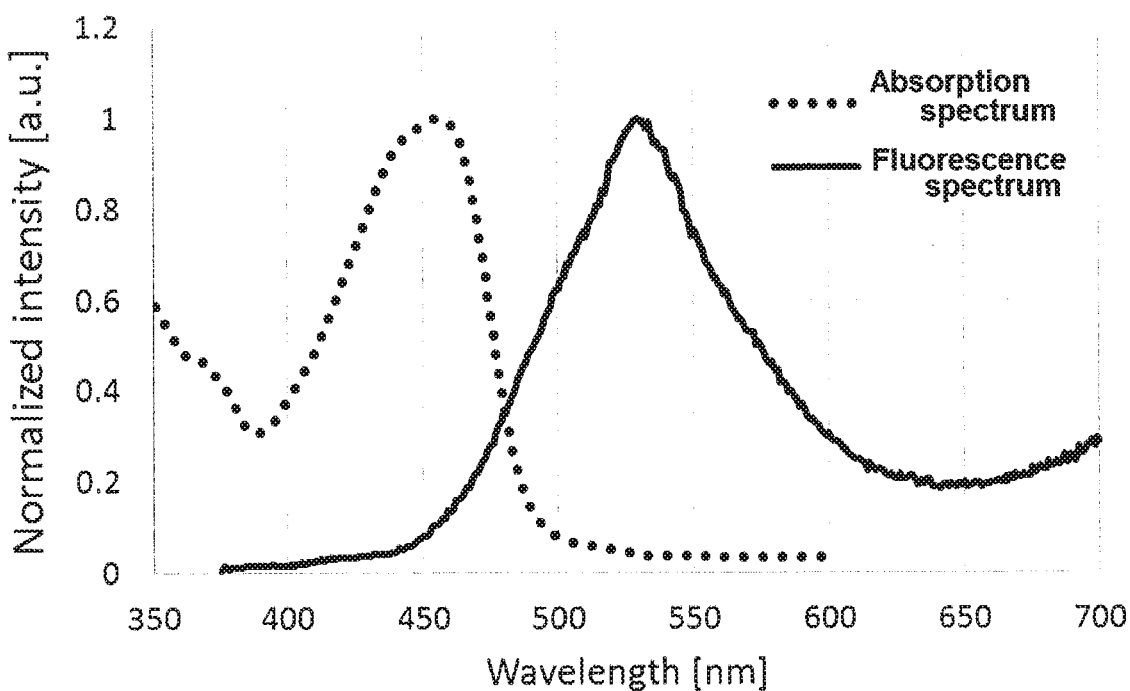
FIG. 4 is an absorption/fluorescence spectrum of compound (1-6-4).

An absorption spectrum was measured under the same conditions as those of the compound (1-3-2). As a result, an absorption edge wavelength was 488 nm, an absorption maximum wavelength was 456 nm, and a molar absorbance coefficient at the absorption maximum wavelength was 23200 cm$^{-1}$M$^{-1}$ (FIG. 4). An energy gap calculated from the absorption edge wavelength was 2.54 eV.

[Luminescence Characteristics]

A fluorescence spectrum was measured under the same conditions as those of compound (1-6-1). As a result, the maximum emission wavelength was 529 nm (FIG. 4).

As described above, compound (1-6-4) has an appropriate energy gap, and therefore can be expected as a material for an organic EL element.

Examples of Compound (1-6-2)
<Evaluation of Basic Physical Properties>
[Absorption Characteristics]

Figure 5:
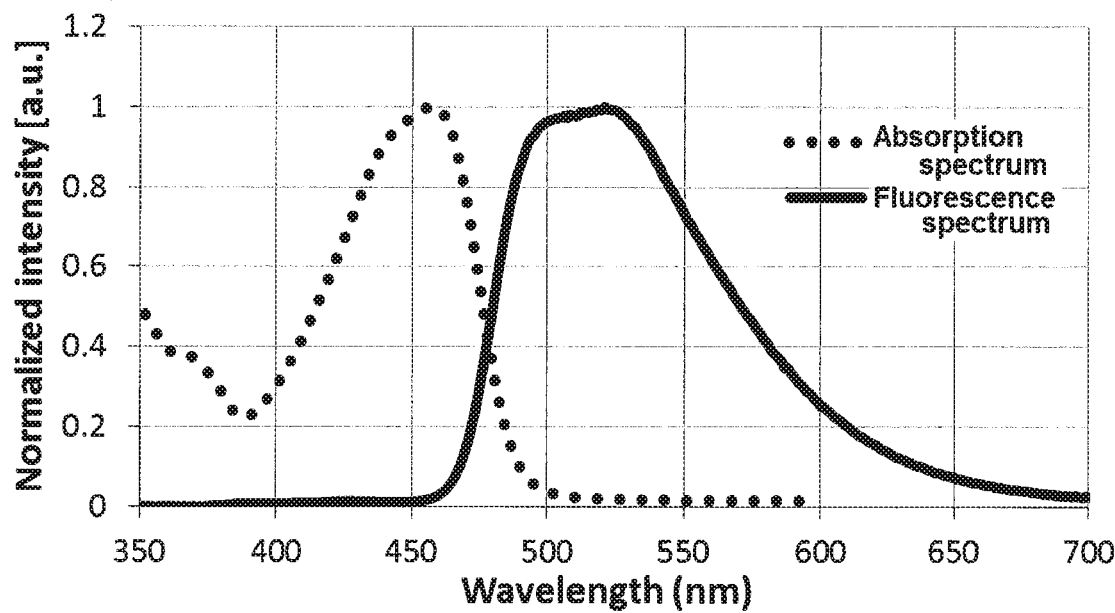
FIG. 5 is an absorption/fluorescence spectrum of compound (1-6-2).

An absorption spectrum was measured under the same conditions as those of the compound (1-3-2). As a result, an absorption edge wavelength was 487 nm, an absorption maximum wavelength was 457 nm, and a molar absorbance coefficient at the absorption maximum wavelength was 28050 cm$^{-1}$M$^{-1}$ (FIG. 5). An energy gap calculated from the absorption edge wavelength was 2.55 eV.

[Luminescence Characteristics]

A fluorescence spectrum was measured under the same conditions as those of compound (1-6-1). As a result, the maximum emission wavelength was 521 nm (FIG. 5).

As described above, compound (1-6-2) has an appropriate energy gap, and therefore can be expected as a material for an organic EL element.

INDUSTRIAL APPLICABILITY

In the present invention, by providing a novel polycyclic aromatic compound, it is possible to increase options of a material for an organic EL element. Furthermore, by using a novel polycyclic aromatic compound as a material for an organic electroluminescent element, it is possible to provide an excellent organic EL element, a display apparatus including the organic EL element, a lighting apparatus including the organic EL element, and the like.

REFERENCE SIGNS LIST

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:
1. A polycyclic aromatic compound represented by the following general formula (1):

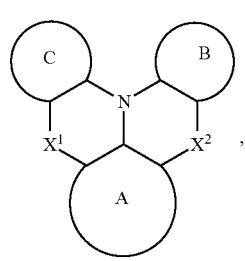

(1)

in the above formula (1),
ring A, ring B, and ring C each independently represent an aryl ring or a heteroaryl ring,
at least one hydrogen atom in ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted cycloalkyl, a substituted or unsubstituted alkoxy, a substituted or unsubstituted aryloxy, a substituted or unsubstituted arylsulfonyl, a substituted or unsubstituted diarylphosphine, a substituted or unsubstituted diarylphosphine oxide, or a substituted or unsubstituted diarylphosphine sulfide,
at least one of ring A, ring B, and ring C may be fused with a cycloalkyl,
X$^1$ and X$^2$ each independently represent a divalent group represented by any one of the following formulas (X-1) to (X-7) and (X-9) to (X-12), both X$^1$ and X$^2$ do not represent a divalent group represented by formula (X-2),

(X-1)

(X-2)

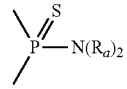

(X-3)

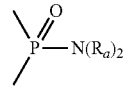

(X-4)

-continued

 (X-5)

 (X-6)

 (X-7)

 (X-9)

 (X-10)

 (X-11)

 (X-12)

in formulas (X-1) to (X-7) and (X-9) to (X-12), Ar's each independently represent a substituted or unsubstituted aryl, a substituted or unsubstituted heteroaryl, or a substituted or unsubstituted alkyl, $R_a$'s each independently represent a substituted or unsubstituted alkyl or a substituted or unsubstituted cycloalkyl, and Ar may be bonded to ring A, ring B, and/or ring C by a divalent linking group represented by any of the following formulas (L-1) to (L-9):

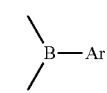 (L-1)

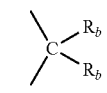 (L-2)

 (L-3)

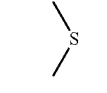 (L-4)

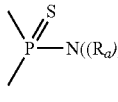 (L-5)

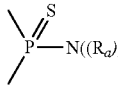 (L-6)

-continued

 (L-7)

 (L-8)

 (L-9)

provided that when at least one of $X^1$ and $X^2$ represents a divalent group represented by formula (X-6), Ar in $X^1$ and $X^2$ is not bonded to ring A, ring B, and/or ring C, ring B and ring C may be bonded to each other by a divalent group of any one of formulas (X-3) to (X-7), and at least one hydrogen atom in the polycyclic aromatic compound represented by formula (1) may be substituted by cyano, a halogen atom, or a deuterium atom.

2. The polycyclic aromatic compound described in claim 1, wherein ring A, ring B, and ring C each independently represent an aryl ring or a heteroaryl ring, at least one hydrogen atom in ring A, ring B, and ring C may be substituted by a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino, a substituted or unsubstituted alkyl, a substituted or unsubstituted alkoxy, or a substituted or unsubstituted aryloxy, each of ring A, ring B, and ring C has a 5-membered or 6-membered ring sharing a bond with a fused bicyclic structure at the center of the above formula (1) constituted by "N", $X^1$, and $X^2$, $X^1$ and $X^2$ each independently represent a divalent group represented by any one of the above formulas (X-1) to (X-7) and (X-9) to (X-12), both $X^1$ and $X^2$ do not represent a divalent group represented by formula (X-2), in formulas (X-1) to (X-7) and (X-9) to (X-12), Ar's each independently represent an aryl that may be substituted by an alkyl, a heteroaryl that may be substituted by an alkyl, or an alkyl that may be substituted by an alkyl, $R_a$'s each independently represent an alkyl or a cycloalkyl, Ar may be bonded to ring A, ring B, and/or ring C by the divalent linking group represented by formula (L-1) or (L-2) and when at least one of $X^1$ and $X^2$ represents a divalent group represented by formula (X-6), Ar in $X^1$ and $X^2$ is not bonded to ring A, ring B, and/or ring C, ring B and ring C may be bonded to each other by a divalent group of any one of formulas (X-3) to (X-7), and at least one hydrogen atom in the polycyclic aromatic compound represented by formula (1) may be substituted by cyano, a halogen atom, or a deuterium atom.

3. The polycyclic aromatic compound described in claim 1, represented by the following general formula (2):

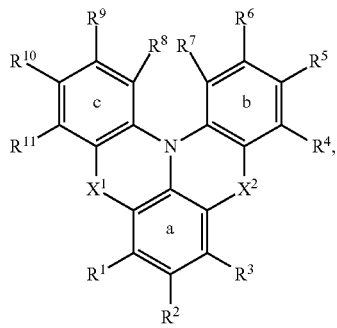

(2)

in the above formula (2), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, $X^1$ and $X^2$ each independently represent a divalent group represented by any one of the above formulas (X-1) to (X-7) and (X-9) to (X-12), both $X^1$ and $X^2$ do not represent a divalent group represented by formula (X-2), in formulas (X-1) to (X-7) and (X-9) to (X-12), Ar's each independently represent an aryl that may be substituted by an alkyl, a heteroaryl that may be substituted by an alkyl, or an alkyl that may be substituted by an alkyl, $R_a$'s each independently represent an alkyl or a cycloalkyl, Ar may be bonded to ring a, ring b, and/or ring c by the divalent linking group represented by formula (L-1) or (L-2) and when at least one of $X^1$ and $X^2$ represents a divalent group represented by formula (X-6), Ar in $X^1$ and $X^2$ is not bonded to ring a, ring b, and/or ring c, ring b and ring c may be bonded to each other by a divalent group of any one of formulas (X-3) to (X-7), and at least one hydrogen atom in the polycyclic aromatic compound represented by formula (2) may be substituted by cyano, a halogen atom, or a deuterium atom.

4. The polycyclic aromatic compound described in claim 3, represented by the following general formula (3):

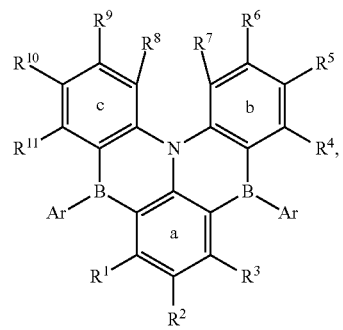

(3)

in the above formula (3), $R^1$ to $R^2$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (3) may be substituted by cyano, a halogen atom, or a deuterium atom.

5. The polycyclic aromatic compound described in claim 3, represented by the following general formula (4):

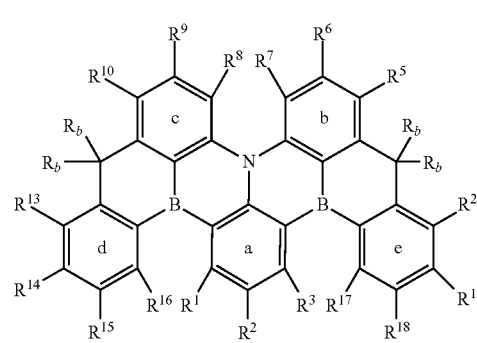

(4)

in the above formula (4), $R^1$ to $R^3$, $R^5$ to $R^{10}$, and $R^{13}$ to $R^{20}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^3$, $R^5$ to $R^{10}$, and $R^{13}$ to $R^{20}$ may be bonded to each other to form an aryl ring or a heteroaryl ring together with ring a, ring b, ring c, ring d, or ring e, at least one hydrogen atom in the ring thus formed may be substituted by an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, $R^1$ and $R^{16}$ may be bonded to each other to link ring a and ring d to each other by a linking group >C(—$R_b$)$_2$, and $R^3$ and $R^{17}$ may be bonded to each other to link ring a and ring e to each other by a linking group >C(—$R_b$)$_2$, $R_b$'s each independently represent a hydrogen atom or an alkyl, and at least one hydrogen atom in the polycyclic aromatic compound represented by formula (4) may be substituted by cyano, a halogen atom, or a deuterium atom.

6. The polycyclic aromatic compound described in claim 3, represented by the following general formula (5):

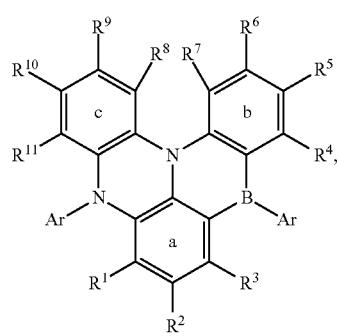

(5)

in the above formula (5), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (5) may be substituted by cyano, a halogen atom, or a deuterium atom.

7. The polycyclic aromatic compound described in claim 3, represented by the following general formula (6)

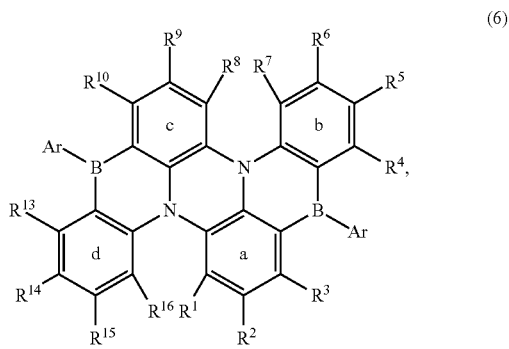

(6)

in the above formula (6)

$R^1$ to $R^{10}$ and $R^{13}$ to $R^{16}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{10}$ and $R^{13}$ to $R^{16}$ may be bonded to each other to form an aryl ring or a heteroaryl ring together with ring a, ring b, ring c, or ring d, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, Ar's each independently represent an aryl that may be substituted by an alkyl, a heteroaryl that may be substituted by an alkyl, or an alkyl that may be substituted by an alkyl, and at least one hydrogen atom in the polycyclic aromatic compound represented by formula (6) may be substituted by cyano, a halogen atom, or a deuterium atom.

8. The polycyclic aromatic compound described in claim 3, represented by the following general formula (7):

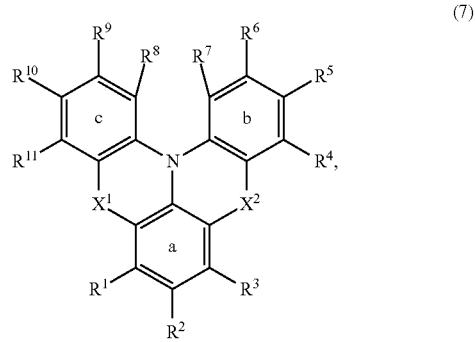

(7)

in the above formula (7)

$R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, $X^1$ and $X^2$ each independently represent a divalent group represented by any one of the above formulas (X-3) to (X-7), in formulas (X-3) to (X-7), Ar represents an aryl that may be substituted by an alkyl, a heteroaryl that may be substituted by an alkyl, or an alkyl that may be substituted by an alkyl, and $R_a$'s each independently represent an alkyl or a cycloalkyl, and at least one hydrogen atom in the polycyclic aromatic compound represented by formula (7) may be substituted by cyano, a halogen atom, or a deuterium atom.

9. The polycyclic aromatic compound described in claim 3, represented by the following general formula (8):

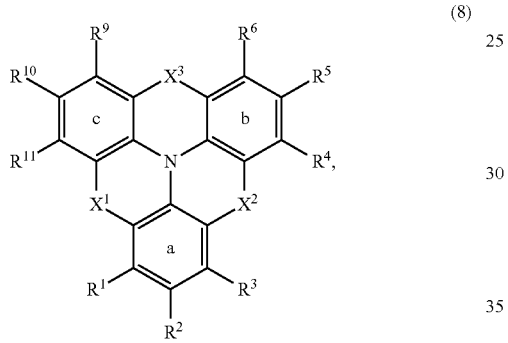

(8)

in the above formula (8), $R^1$ to $R^6$ and $R^9$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these groups may be substituted by an aryl, a heteroaryl, or an alkyl, adjacent groups among $R^1$ to $R^6$ and $R^9$ to $R^{11}$ may be bonded to each other to form an aryl ring or a heteroaryl ring together with ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these groups may be substituted by an aryl, a heteroaryl, or an alkyl, $X^1$, $X^2$, and $X^3$ each independently represent a divalent group represented by any one of the above formulas (X-3) to (X-7), in formulas (X-3) to (X-7), Ar represents an aryl that may be substituted by an alkyl, a heteroaryl that may be substituted by an alkyl, or an alkyl that may be substituted by an alkyl, and $R_a$'s each independently represent an alkyl or a cycloalkyl, and at least one hydrogen atom in the polycyclic aromatic compound represented by formula (8) may be substituted by cyano, a halogen atom, or a deuterium atom.

10. The polycyclic aromatic compound described in claim 1, represented by any one of the following chemical structural formulas:

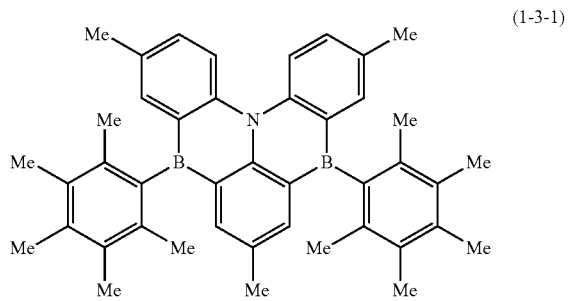

(1-3-1)

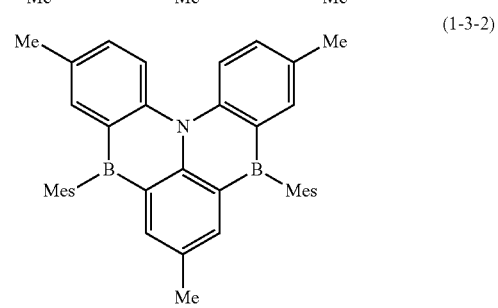

(1-3-2)

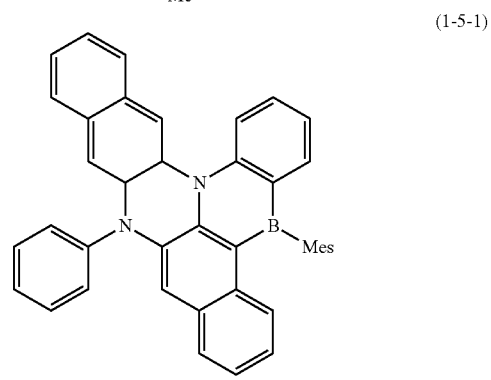

(1-5-1)

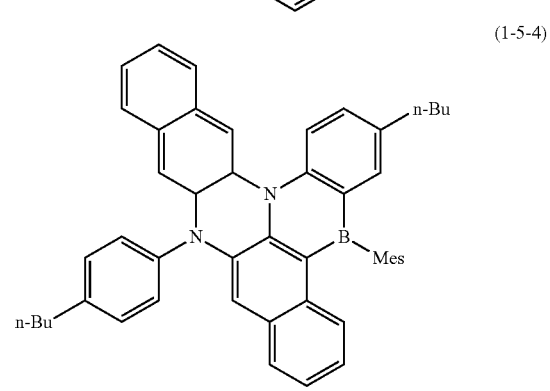

(1-5-4)

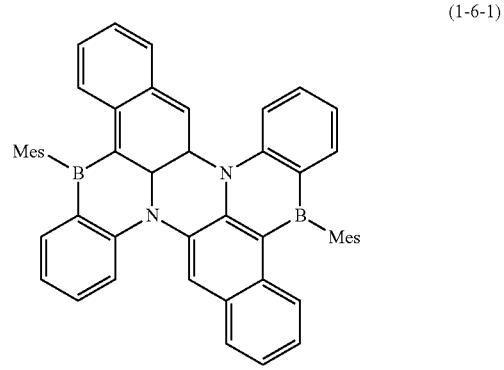

(1-6-1)

-continued (1-6-4)
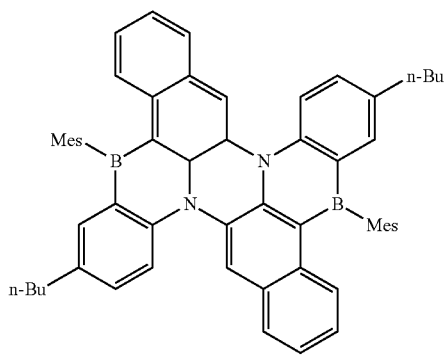

(1-6-2)
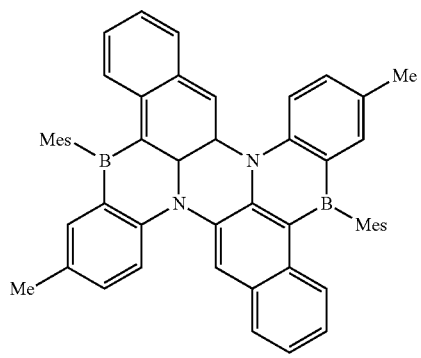

(1-8-1)
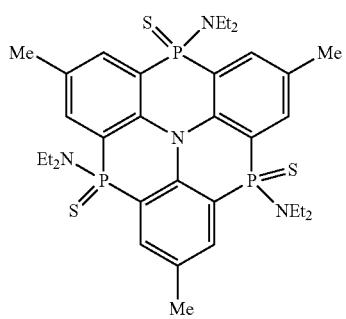

(1-7-1)
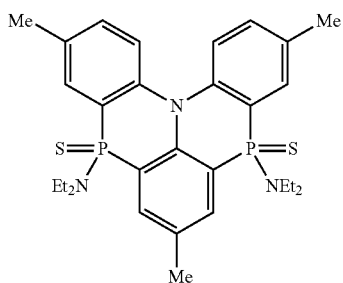

(1-8-20)
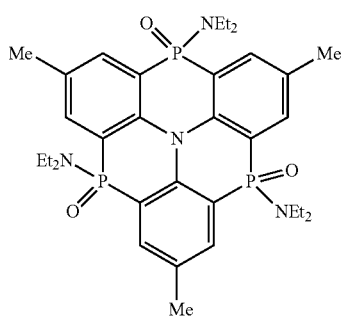

-continued (1-7-75)
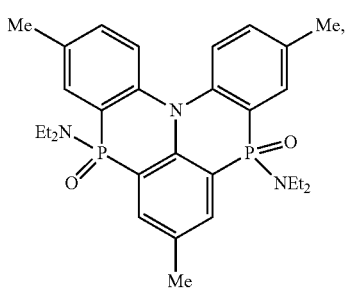

wherein Me represents a methyl group, Mes represents a mesityl group, n-Bu represents a n-butyl group and Et represents an ethyl group.

11. A material for an organic device, comprising the polycyclic aromatic compound as claimed in claim 1.

12. The material for an organic device described in claim 11, in which the material for an organic device is a material for an organic electroluminescent element, a material for an organic field effect transistor, or a material for an organic thin film solar cell.

13. The material for an organic electroluminescent element described in claim 12, in which the material for an organic electroluminescent element is a material for a light emitting layer.

14. The material for an organic electroluminescent element described in claim 12, in which the material for an organic electroluminescent element is a material for an electron injection layer or a material for an electron transport layer.

15. The material for an organic electroluminescent element described in claim 12, in which the material for an organic electroluminescent element is a material for a hole injection layer or a material for a hole transport layer.

16. An organic electroluminescent element, comprising: a pair of electrodes composed of a positive electrode and a negative electrode; and a light emitting layer disposed between the pair of electrodes and containing the material for a light emitting layer described in claim 13.

17. An organic electroluminescent element comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer described in claim 14.

18. An organic electroluminescent element comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer described in claim 15.

19. The organic electroluminescent element as claimed in claim 16, further comprising an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

20. The organic electroluminescent element described in claim 19, in which the electron transport layer and/or the electron injection layer further comprise/comprises at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

21. A display apparatus comprising the organic electroluminescent element as claimed in claim 16.

22. A lighting apparatus comprising the organic electroluminescent element as claimed in claim 16.

* * * * *